(12) United States Patent
Iwata

(10) Patent No.: US 7,064,975 B2
(45) Date of Patent: Jun. 20, 2006

(54) MAGNETIC RANDOM ACCESS MEMORY

(75) Inventor: Yoshihisa Iwata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/980,847

(22) Filed: Nov. 4, 2004

(65) Prior Publication Data
US 2005/0083734 A1    Apr. 21, 2005

Related U.S. Application Data

(62) Division of application No. 10/162,605, filed on Jun. 6, 2002.

(30) Foreign Application Priority Data
Dec. 21, 2001 (JP) .............................. 2001-390549

(51) Int. Cl.
G11C 11/14 (2006.01)
G11C 11/15 (2006.01)
G11C 5/02 (2006.01)
G11C 5/06 (2006.01)

(52) U.S. Cl. ...................... 365/158; 365/171; 365/173; 365/130; 365/51; 365/63; 365/66

(58) Field of Classification Search ................ 365/158, 365/171, 173, 130, 51, 63, 66
See application file for complete search history.

(56) References Cited

U.S. PATENT DOCUMENTS

| 6,055,179 A | 4/2000 | Koganei et al. |
|---|---|---|
| 6,111,783 A * | 8/2000 | Tran et al. .................. 365/171 |
| 6,445,612 B1 * | 9/2002 | Naji ............................ 365/158 |
| 6,490,190 B1 * | 12/2002 | Ramcke et al. ............. 365/158 |
| 6,611,453 B1 * | 8/2003 | Ning .......................... 365/171 |
| 2001/0035545 A1 | 11/2001 | Schueter-Woldan et al. |
| 2002/0097600 A1 | 7/2002 | Ning |

FOREIGN PATENT DOCUMENTS

| EP | 0073486 A2 * | 3/1983 |
|---|---|---|
| EP | 0 395 886 | 11/1990 |
| EP | 1 085 586 | 3/2001 |
| JP | 2001-217398 | 8/2001 |
| JP | 2001236781 A * | 8/2001 |
| JP | 2001-284679 | 10/2001 |
| JP | 2001-357666 | 12/2001 |
| WO | WO 99/18578 | 4/1999 |
| WO | WO 00/19441 | 4/2000 |

OTHER PUBLICATIONS

A JPO computer translation of JP 2001236781 (Item N above).*

(Continued)

*Primary Examiner*—Van Thu Nguyen
*Assistant Examiner*—J. H. Hur
(74) *Attorney, Agent, or Firm*—Oblon, Spivak, McClelland, Maier & Neustadt, P.C.

(57) ABSTRACT

A read block is formed from a plurality of TMR elements stacked in the vertical direction. One terminal of each TMR element in the read block is connected to a source line through a read select switch. The source line extends in the Y-direction and is connected to a ground point through a column select switch. The other terminal of each TMR element is independently connected to a corresponding one of read/write bit lines. Each read/write bit line extends in the Y-direction and is connected to a read circuit through the column select switch.

24 Claims, 104 Drawing Sheets

OTHER PUBLICATIONS

R. Scheuerlein, et al., ISSCC 2000/Session 7/Technical Digest: Emerging Memory & Device Technologies, Paper TA7.2, pp. 128-129, 94-95, and 409-410, "A 10ns Read and Write Non-Volatile Memory Array Using a Magnetic Tunnel Junction and FET Switch in Each Cell", Feb. 7, 2000.

M. Durlam, et al., ISSCC 2000/Session 7/ Technical Digest: Emerging Memory & Device Technologies, Paper TA 7.3, pp. 130-131, 96-97, and 410-411, "NonVolatile RAM Based on Magnetic Tunnel Junction Elements", Feb. 7, 2000.

\* cited by examiner

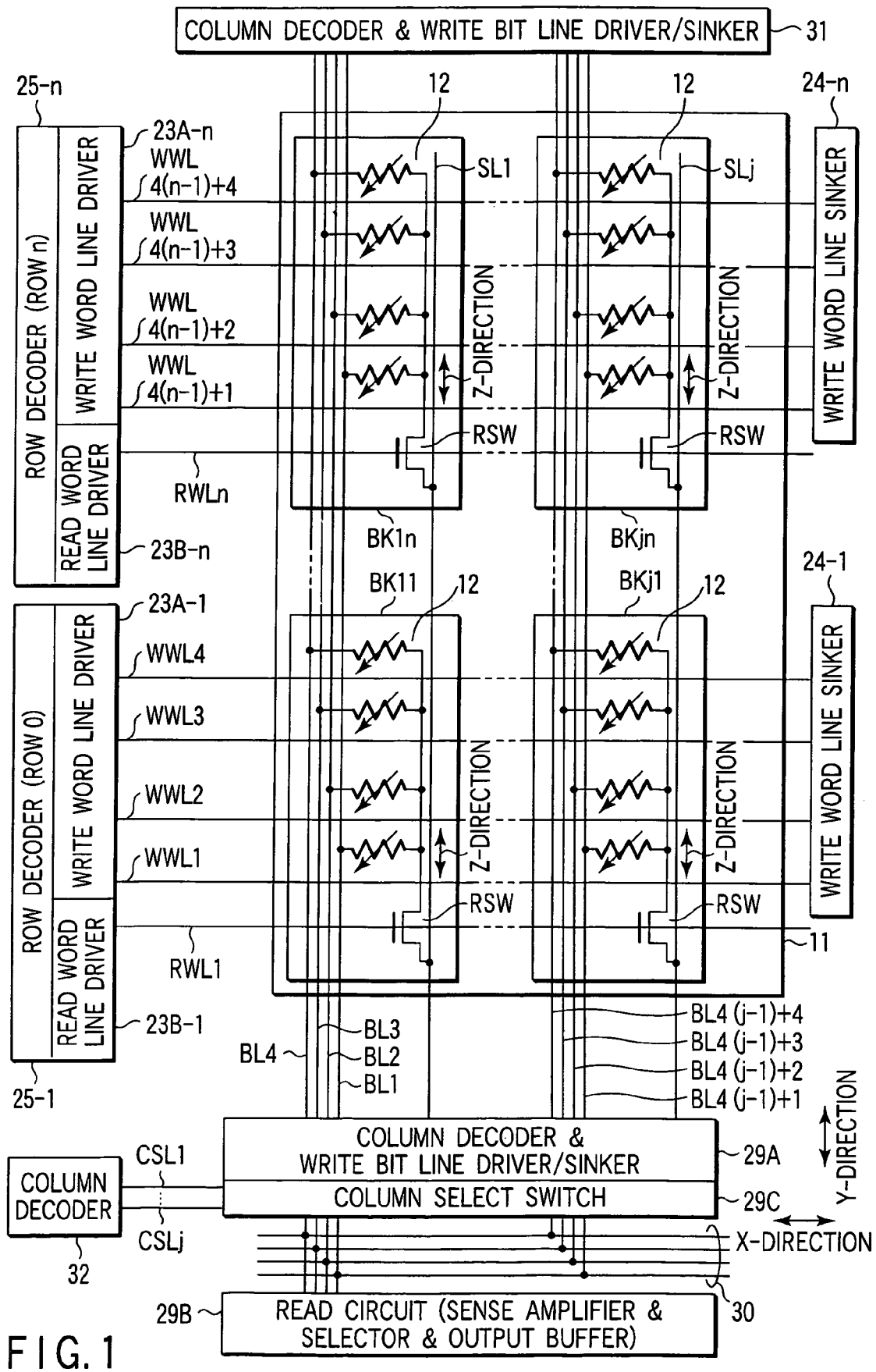
F I G. 1

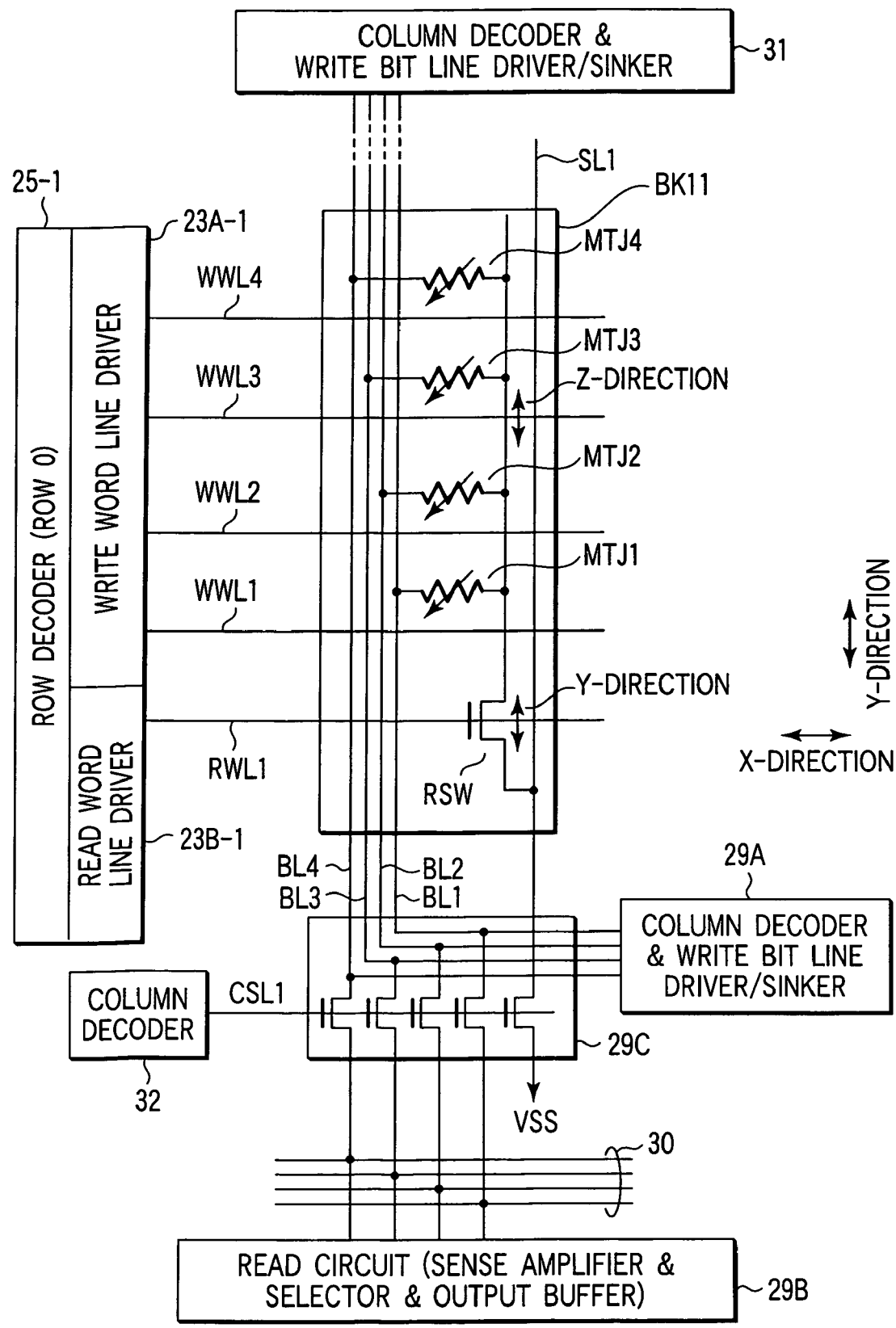
F I G. 2

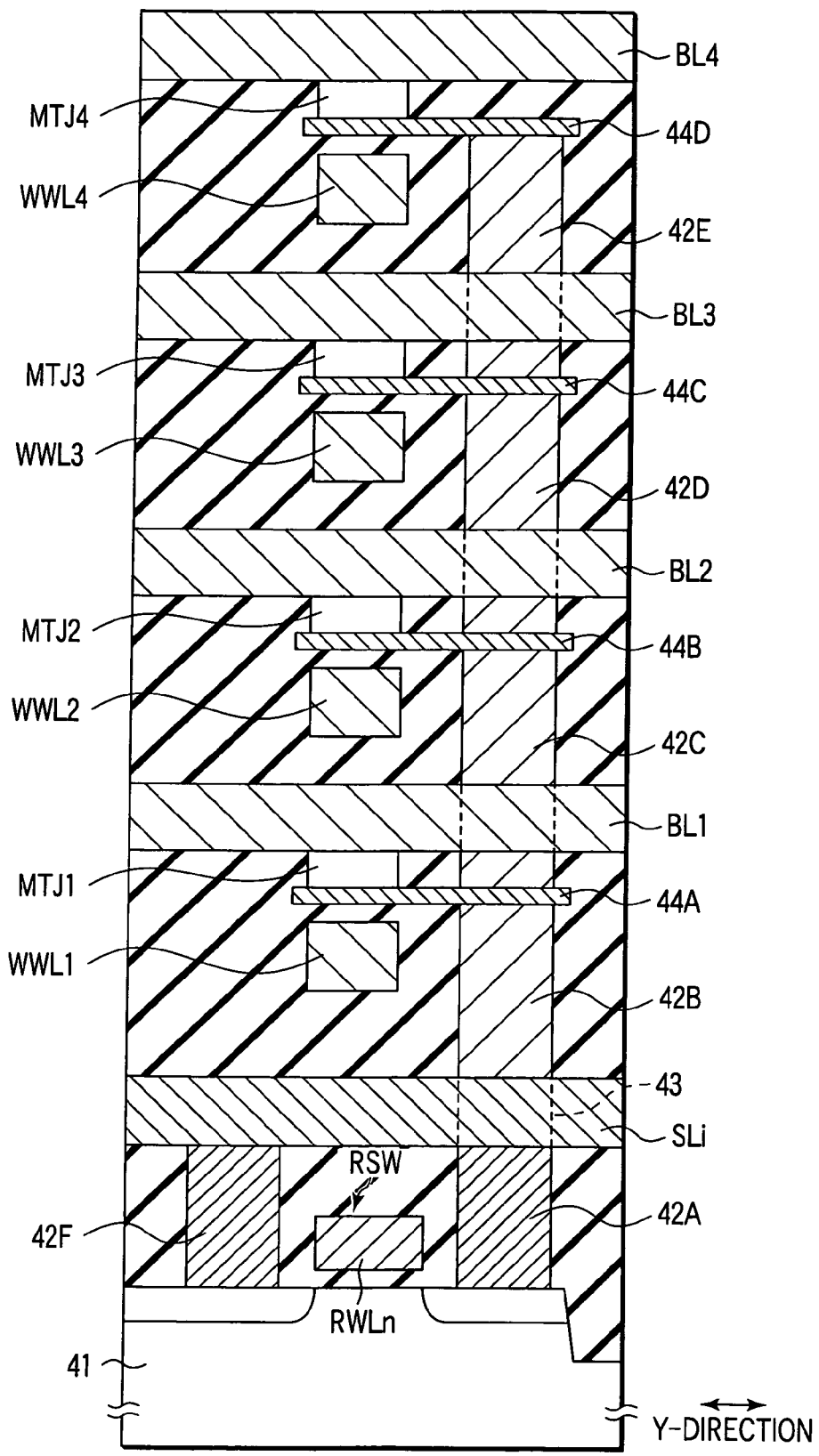
F I G. 4

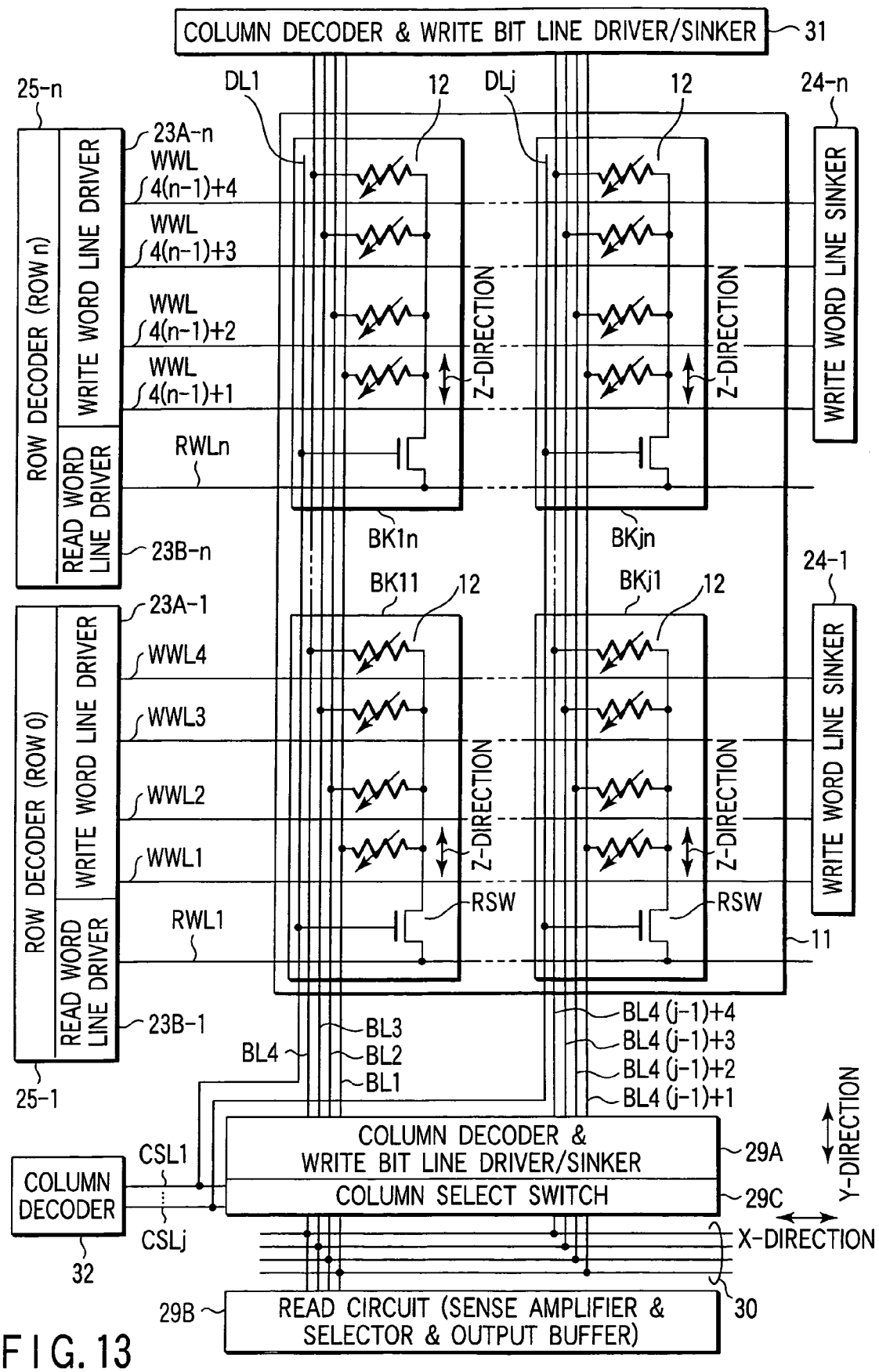
F I G. 13

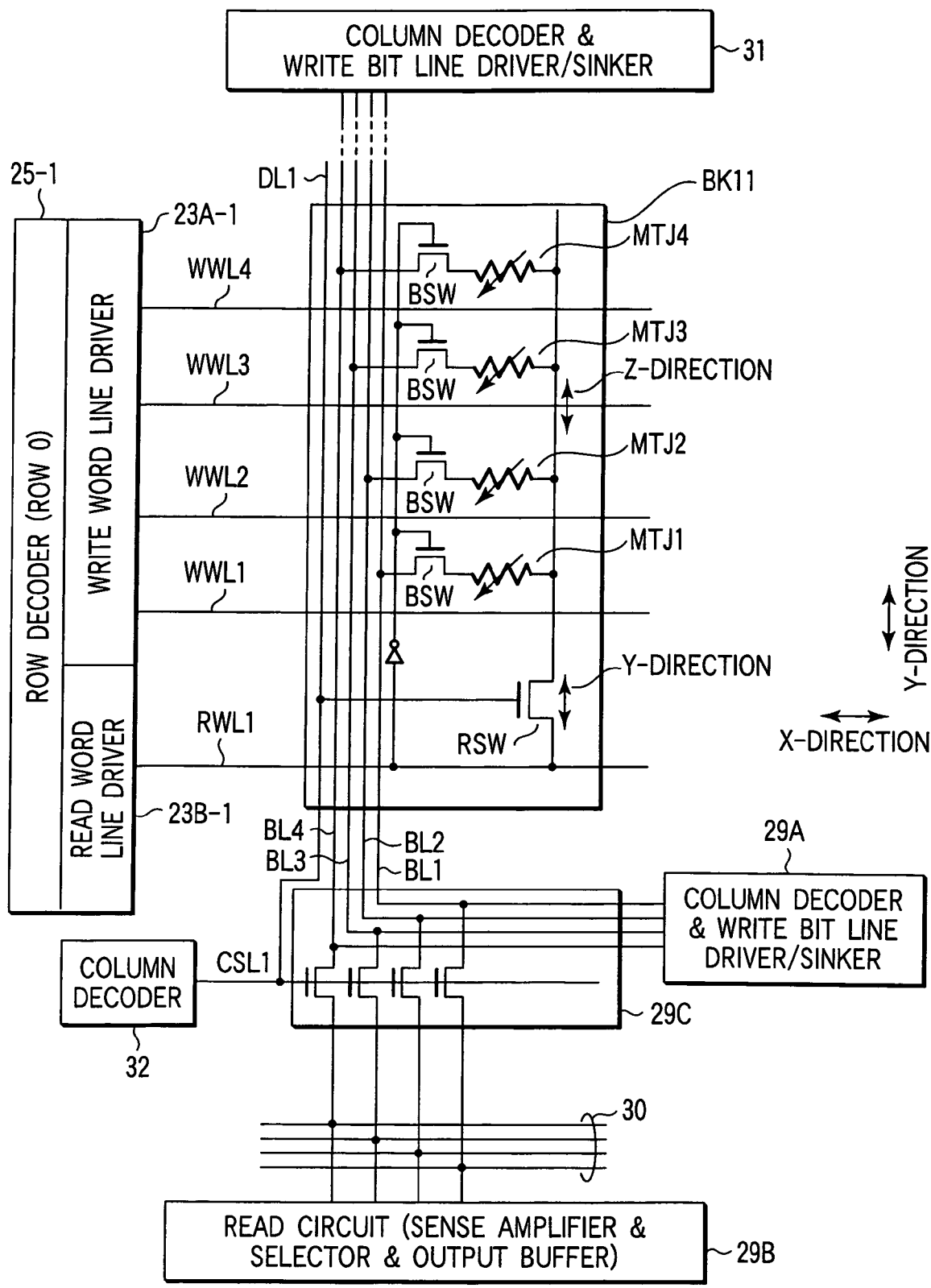
F I G. 16

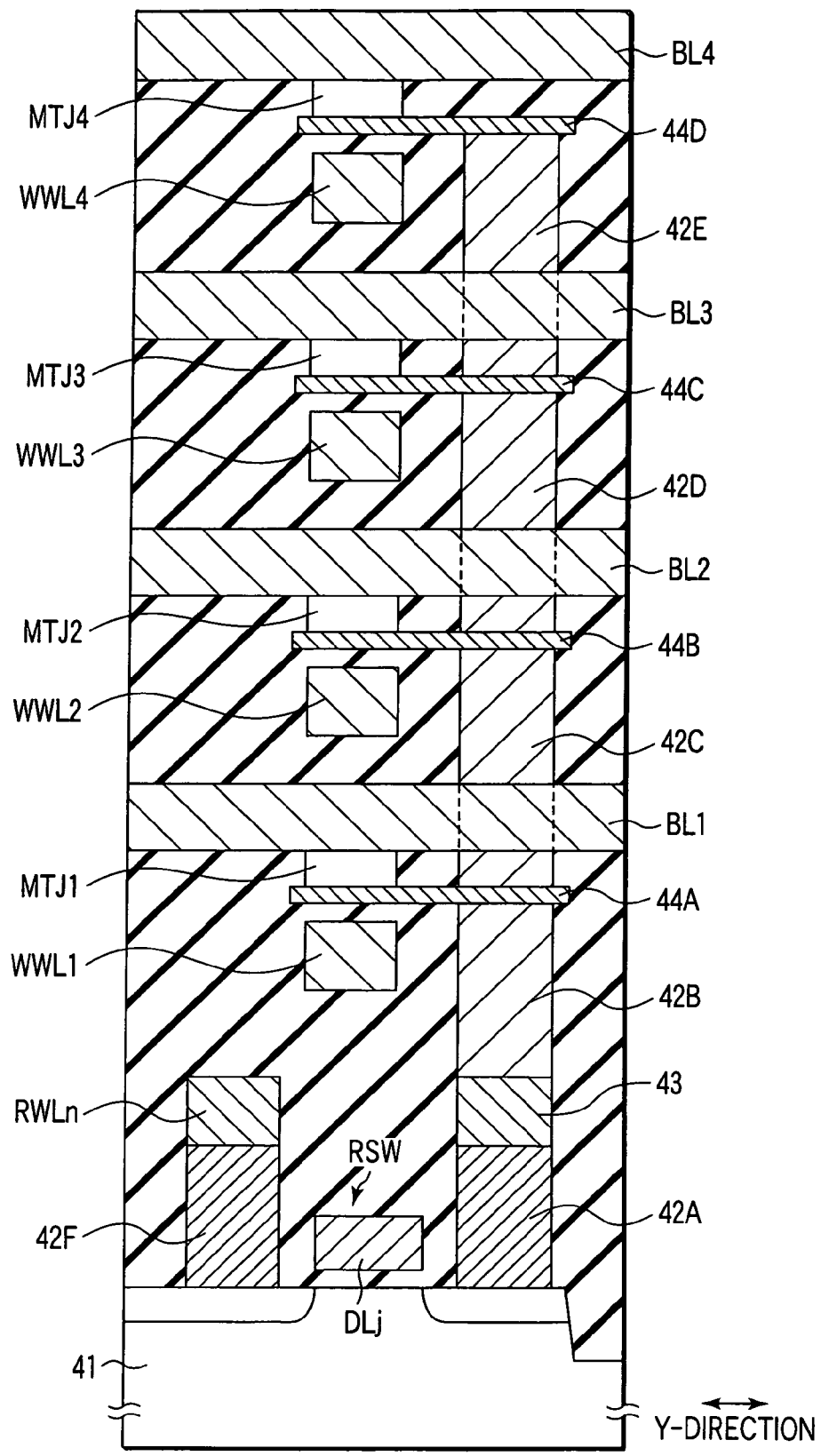
F I G. 17

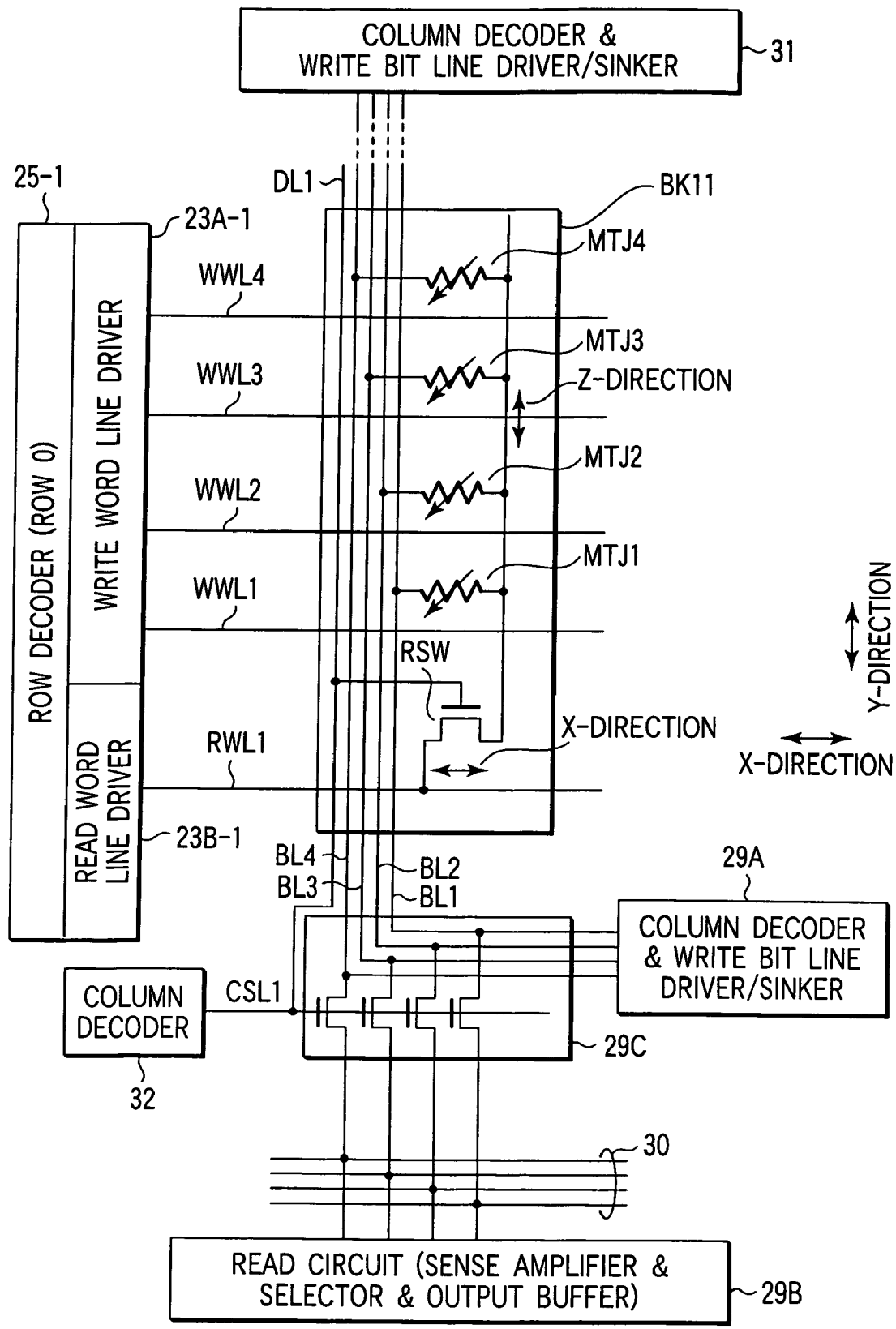
F I G. 20

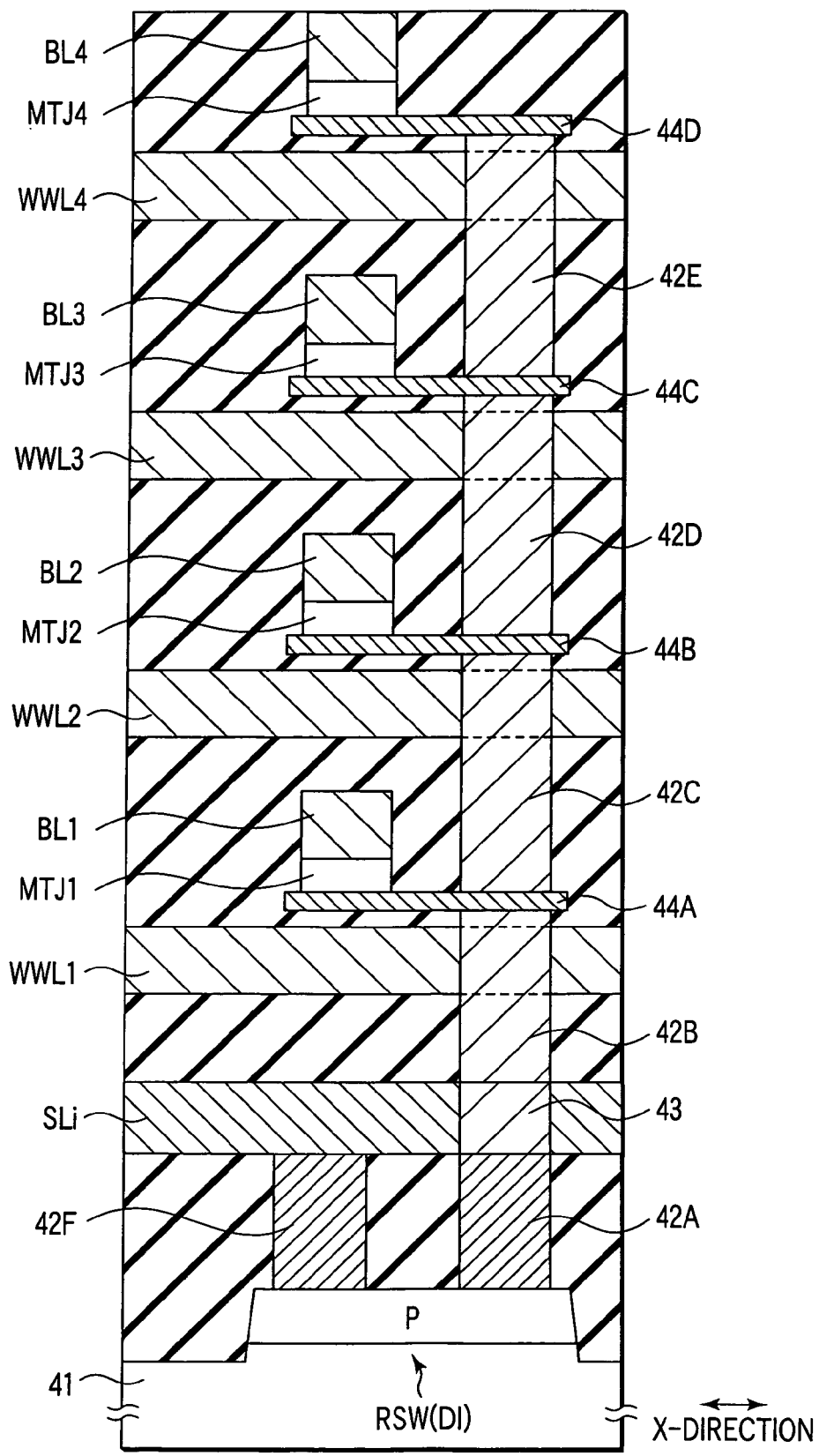
F I G. 25

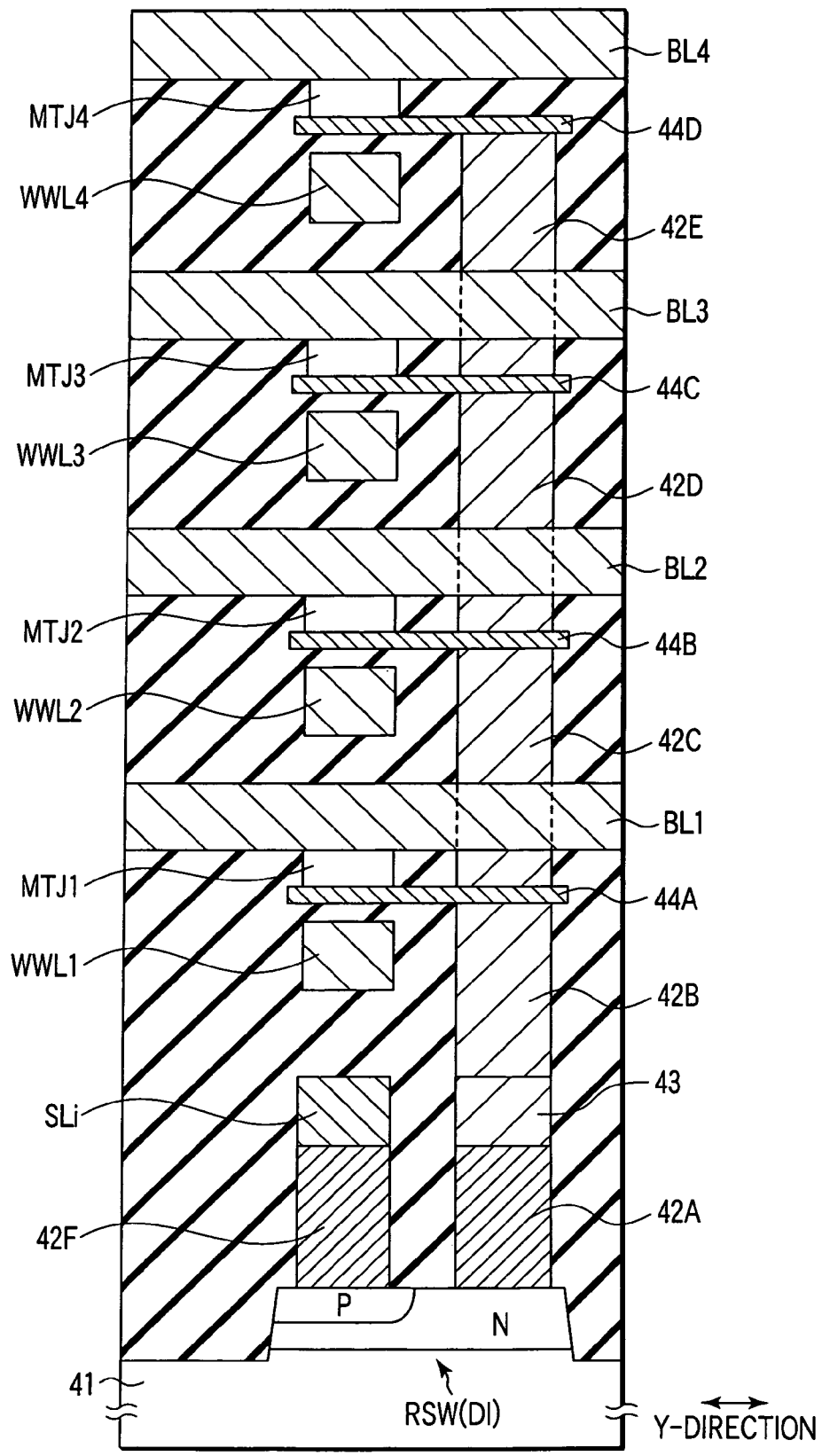
F I G. 27

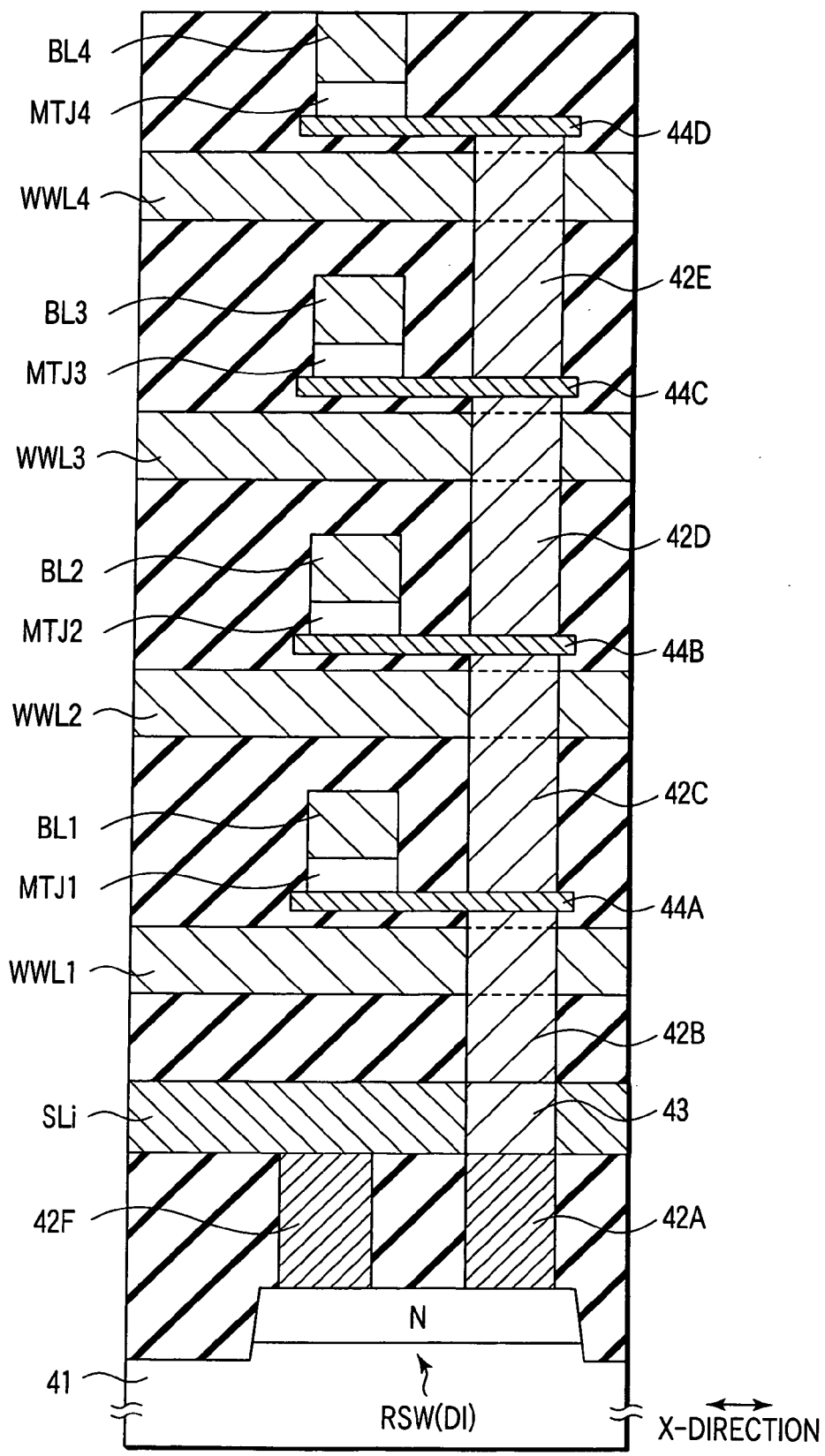
F I G. 28

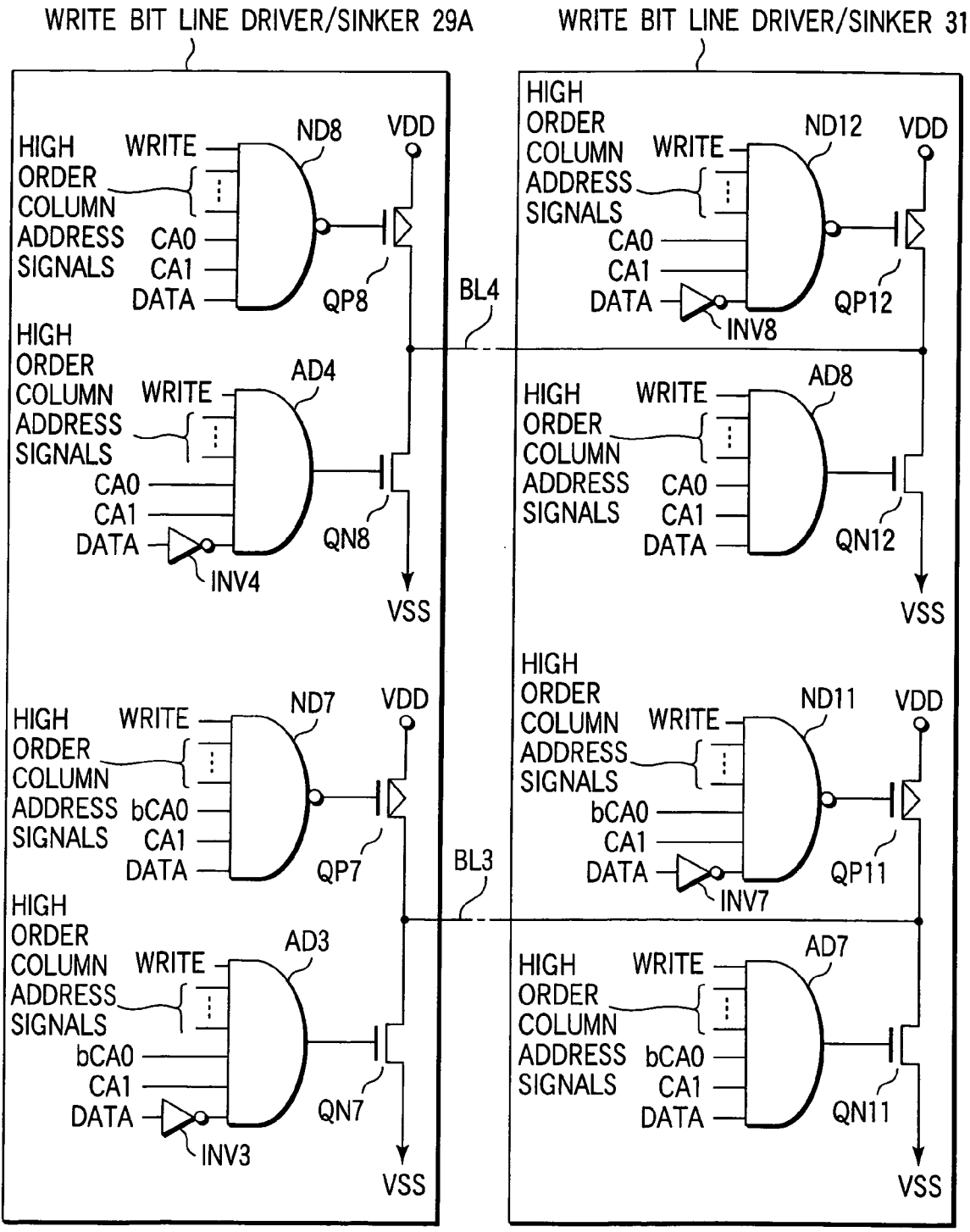
F I G. 35

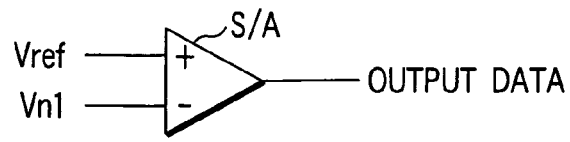
F I G. 43
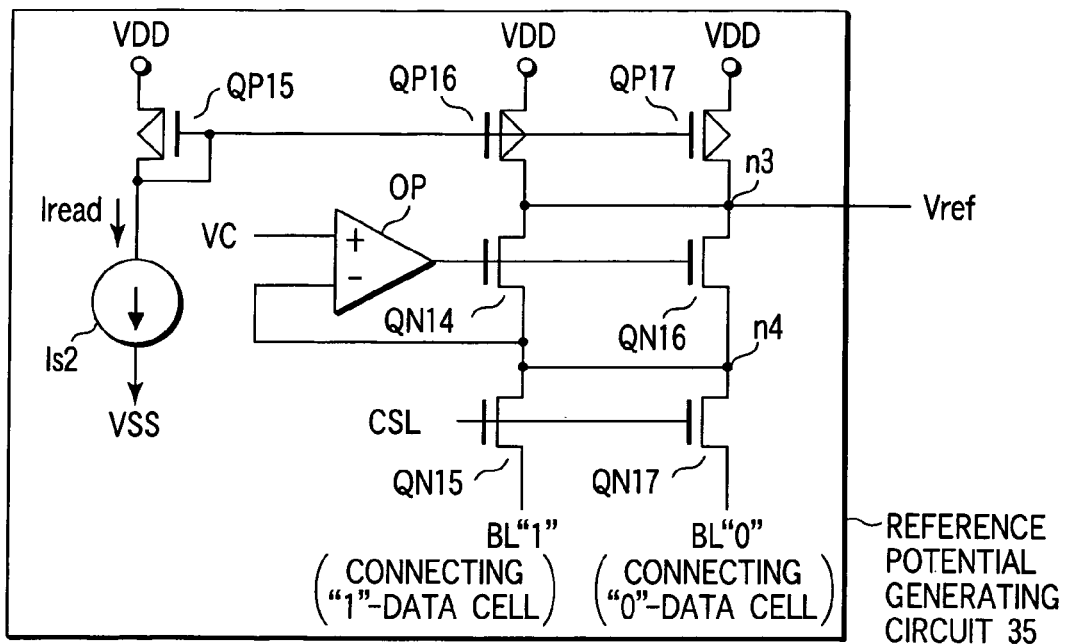
F I G. 44
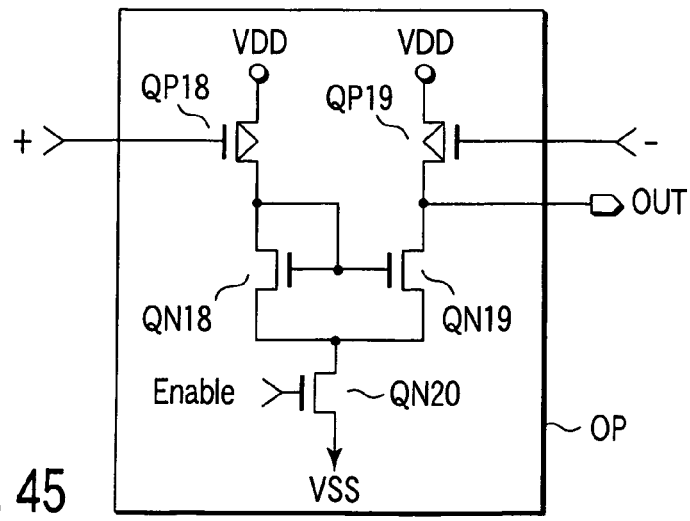
F I G. 45

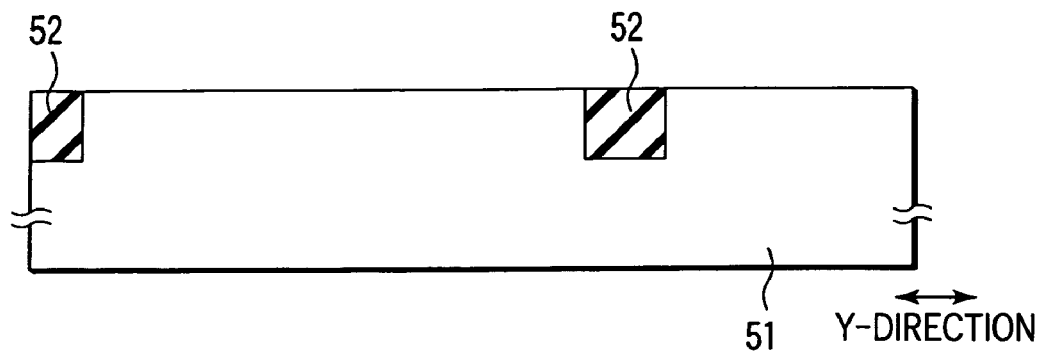
F I G. 47
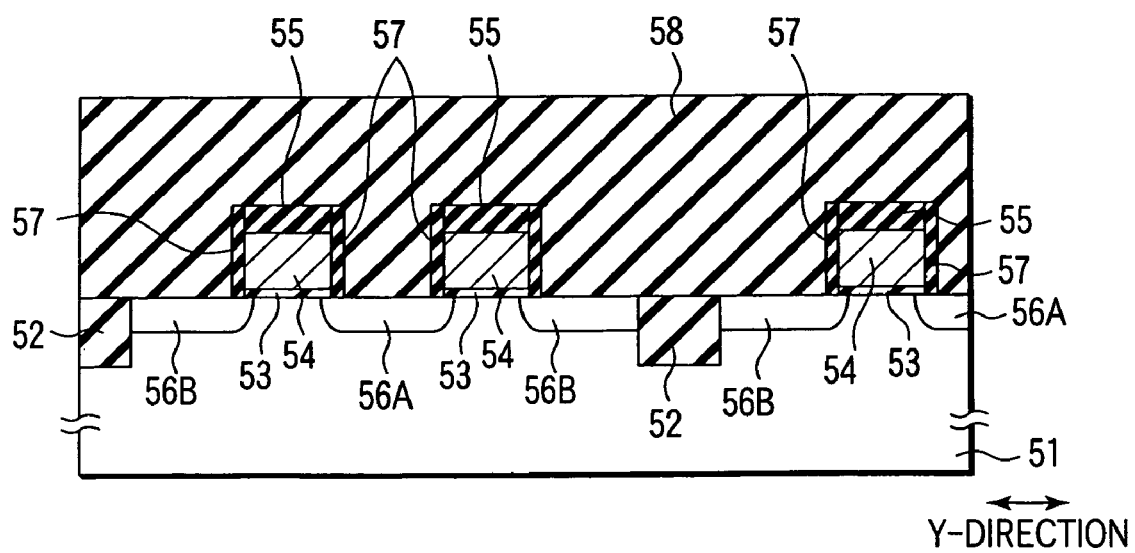
F I G. 48

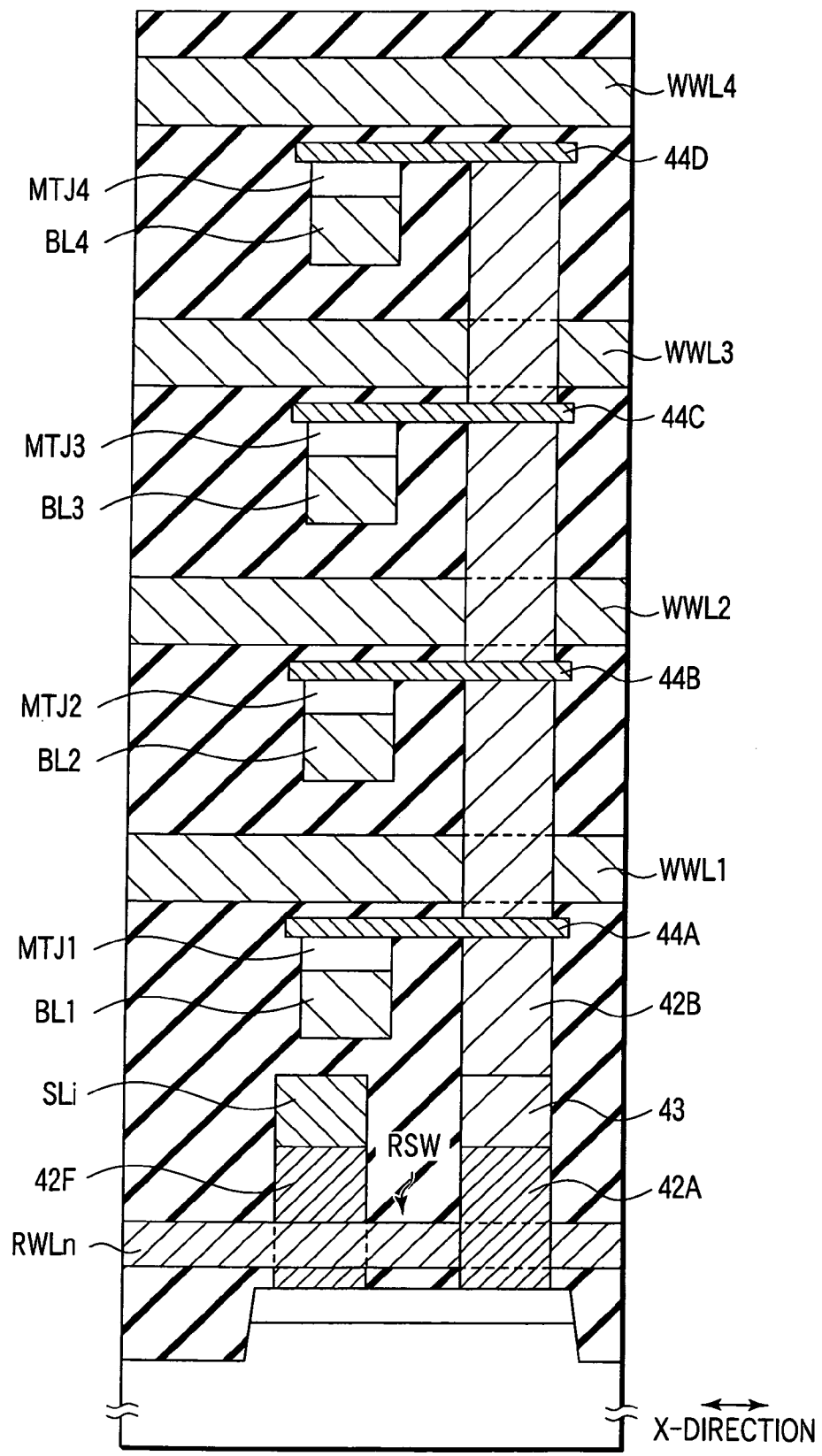
F I G. 98

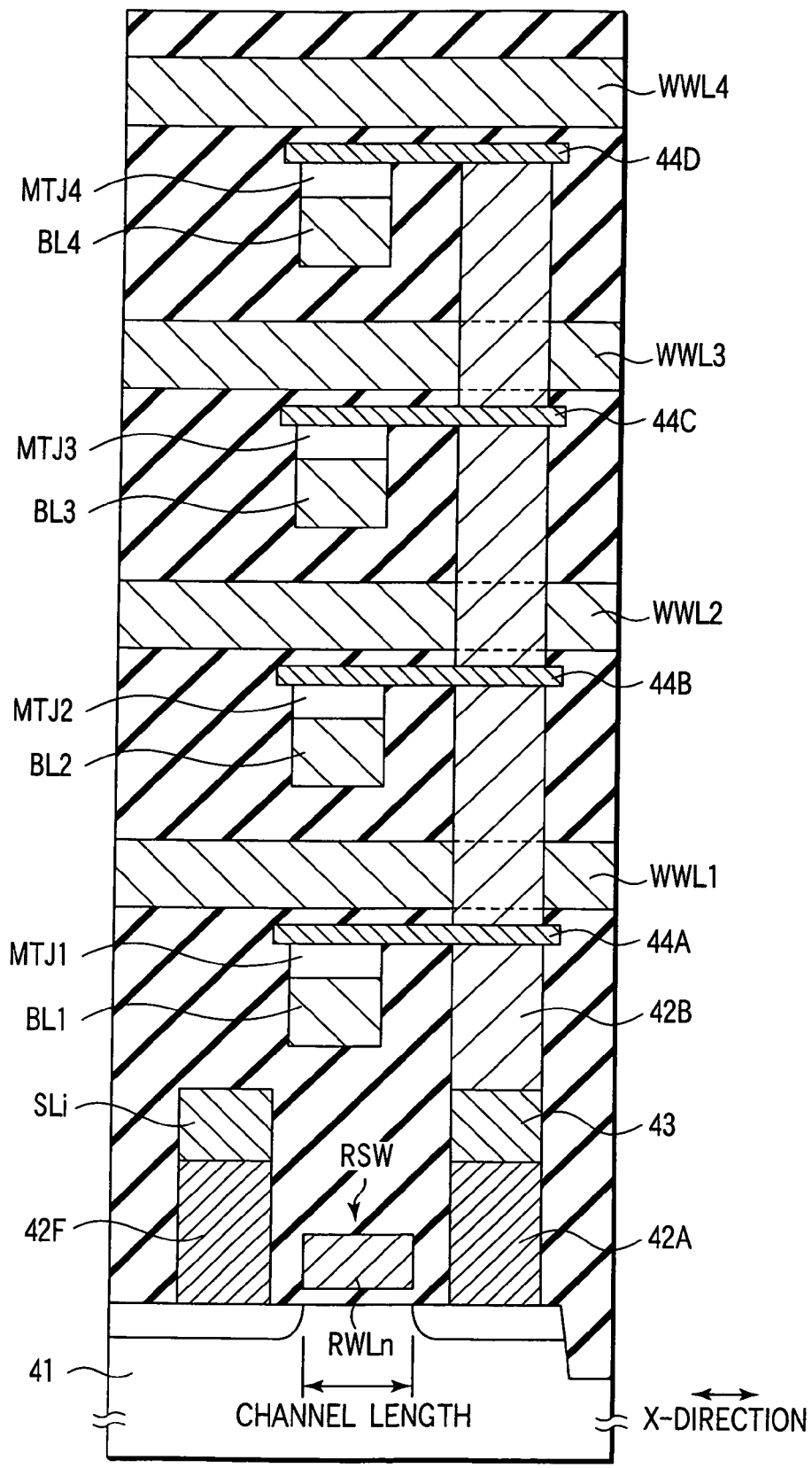
F I G. 103

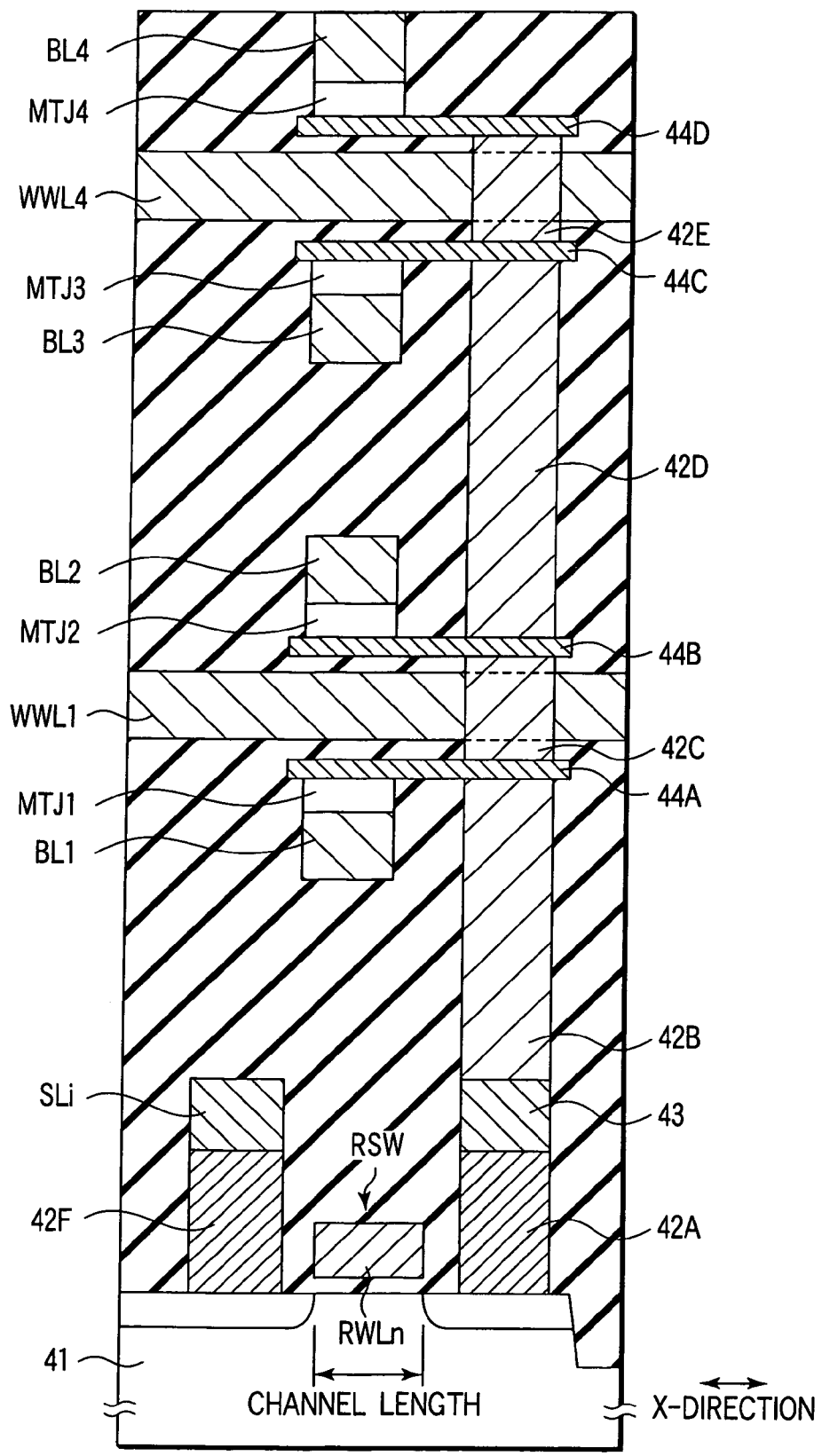
F I G. 105

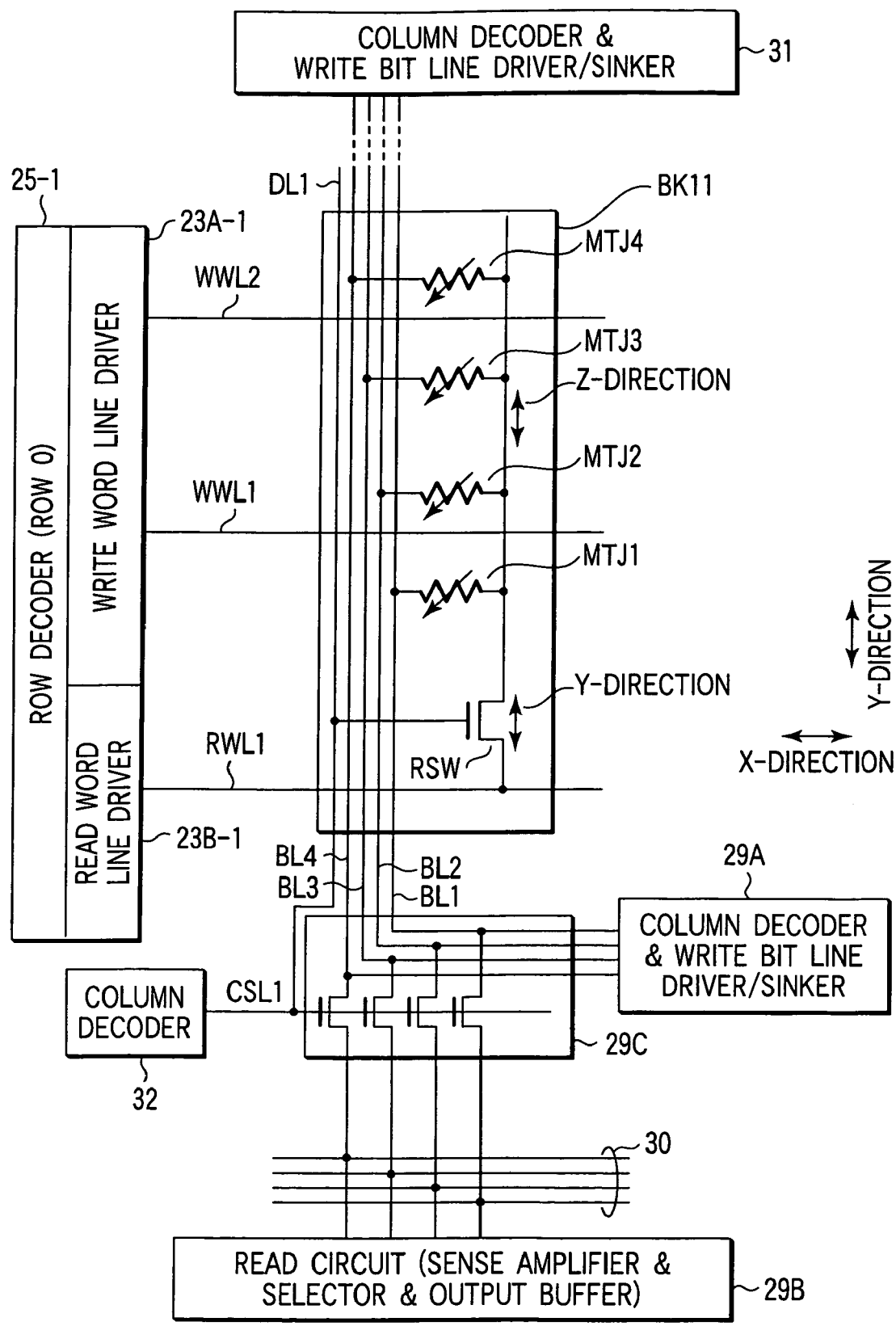
F I G. 107

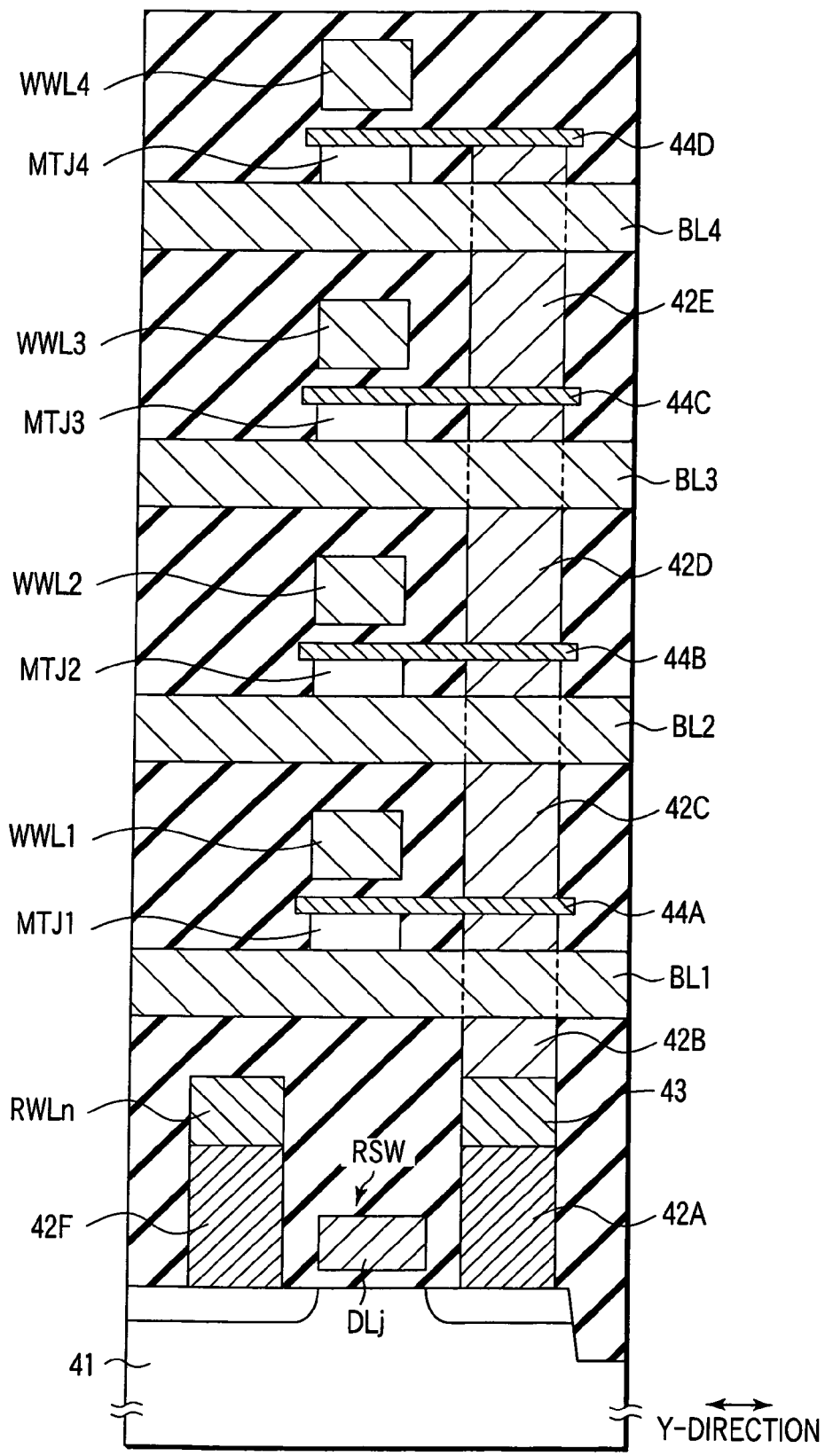
F I G. 108

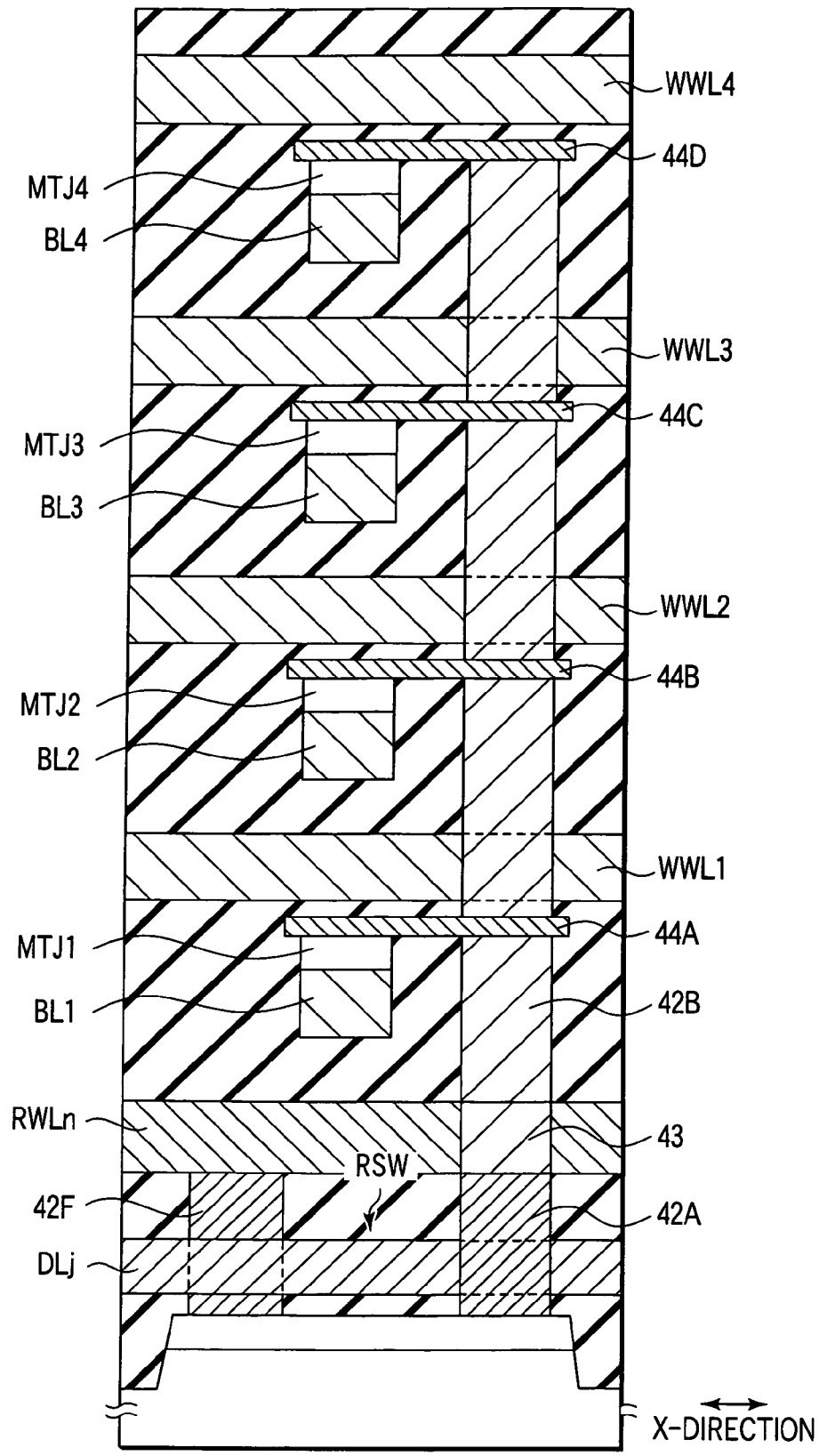
F I G. 109

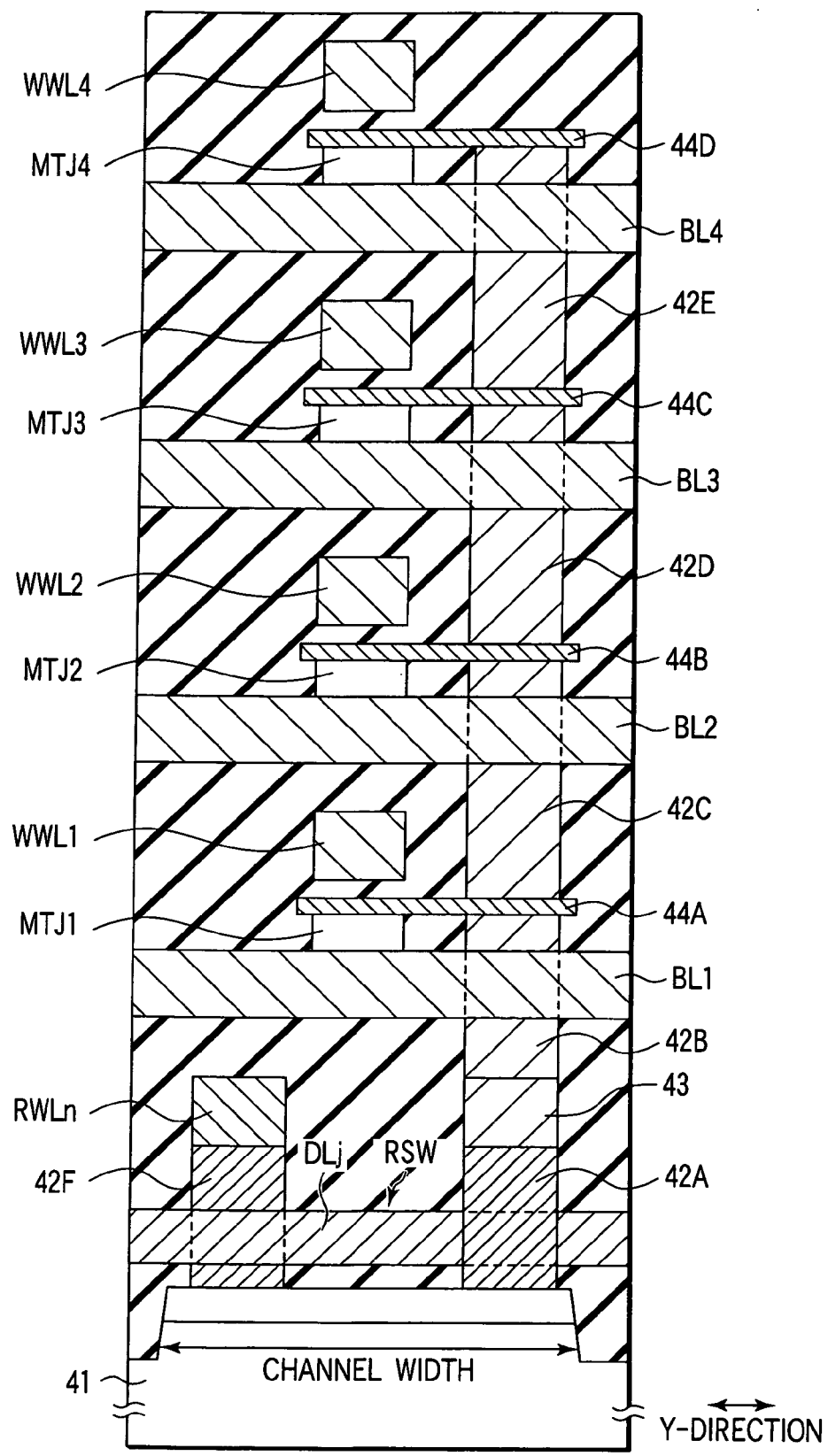
F I G. 113

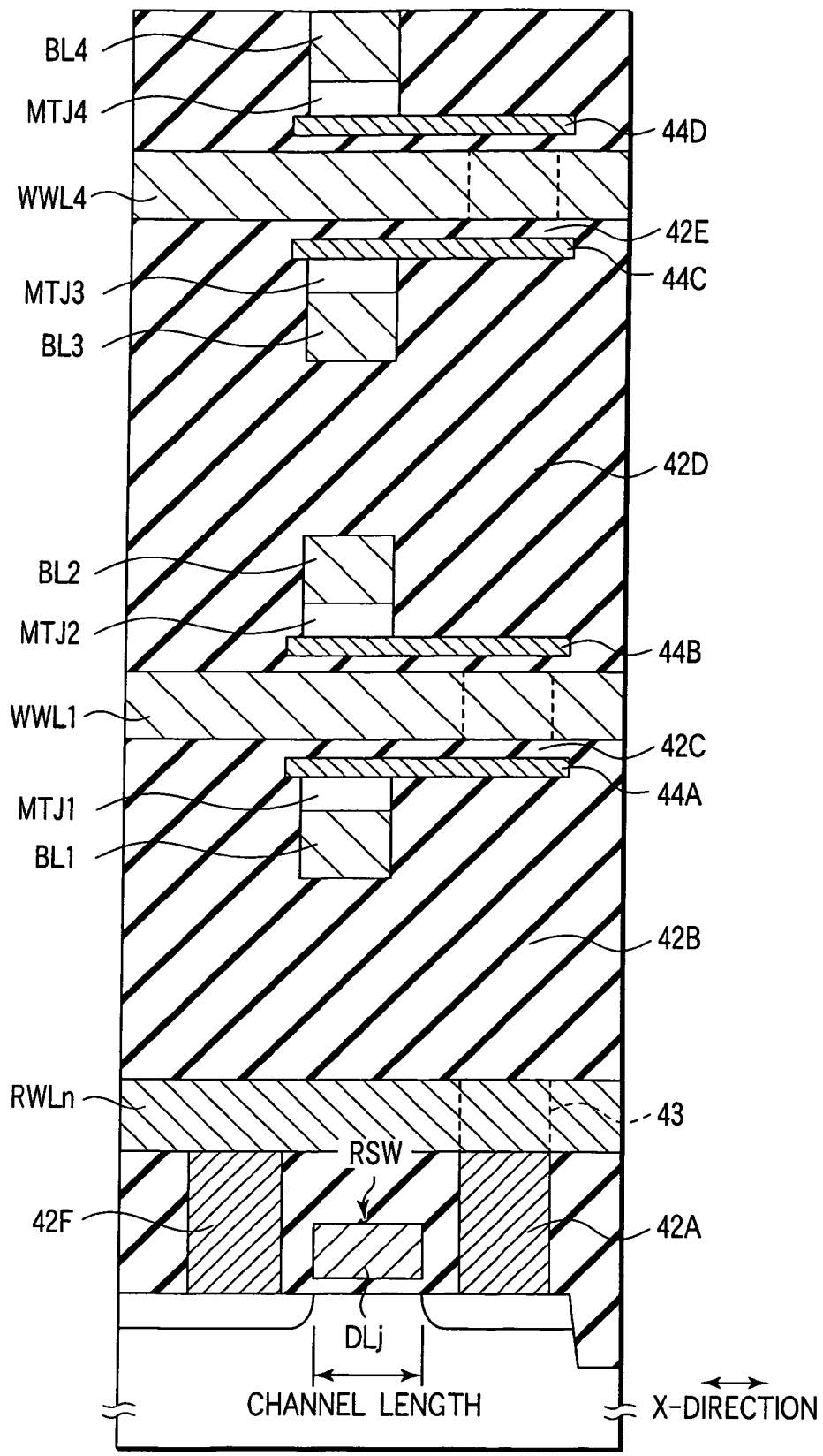
F I G. 116

MAGNETIC RANDOM ACCESS MEMORY

CROSS-REFERENCE TO RELATED APPLICATIONS

This application is a division of and claims the benefit of priority under 35 USC §120 from U.S. application Ser. No. 10/162,605, filed Jun. 6, 2002 and is based upon and claims the benefit of priority under 35 USC §119 from Japanese Patent Application No. 2001-390549, filed Dec. 21, 2001, the entire contents of which are incorporated herein by reference.

BACKGROUND OF THE INVENTION

1. Field of the Invention

The present invention relates to a magnetic random access memory (MRAM) which stores "1"- and "0"-data using a magnetoresistive effect.

2. Description of the Related Art

In recent years, many memories which store data by new principles have been proposed. One of them is a magnetic random access memory which stores "1"- and "0"-data using a tunneling magnetoresistive (to be referred to as TMR hereinafter) effect.

As a proposal for a magnetic random access memory, for example, Roy Scheuerlein et al, "A 10 ns Read and Write Non-Volatile Memory Array Using a Magnetic Tunnel Junction and FET Switch in each Cell", ISSCC2000 Technical Digest, p. 128 is known.

A magnetic random access memory stores "1"- and "0"-data using TMR elements. As the basic structure of a TMR element, an insulating layer (tunneling barrier) is sandwiched between two magnetic layers (ferromagnetic layers).

Data stored in the TMR element is determined on the basis of whether the magnetizing states of the two magnetic layers are parallel or anti-parallel. "Parallel" means that the two magnetic layers have the same magnetizing direction. "Anti-parallel" means that the two magnetic layers have opposite magnetizing directions.

Normally, one (fixed layer) of the two magnetic layers has an anti-ferromagnetic layer. The anti-ferromagnetic layer serves as a member for fixing the magnetizing direction of the fixed layer. In fact, data ("1" or "0") stored in the TMR element is determined by the magnetizing direction of the other (free layer) of the two magnetic layers.

When the magnetizing states in the TMR element are parallel, the resistance of the insulating layer (tunneling barrier) sandwiched between the two magnetic layers of the TMR element is minimized. For example, this state is defined as a "1"-state. When the magnetizing states in the TMR element are anti-parallel, the resistance of the insulating layer (tunneling barrier) sandwiched between the two magnetic layers of the TMR element is maximized. For example, this state is defined as a "0"-state.

Currently, various kinds of cell array structures have been examined for a magnetic random access memory from the viewpoint of increasing the memory capacity or stabilizing write/read operation.

For example, currently, a cell array structure in which one memory cell is formed from one MOS transistor and one TMR element (or an MTJ (Magnetic Tunnel Junction) element) is known. Additionally, a magnetic random access memory which has such a cell array structure and stores 1-bit data using two memory cell arrays so as to realize stable read operation is also known.

However, in these magnetic random access memories, it is difficult to increase the memory capacity. This is because one MOS transistor corresponds to one TMR element in these cell array structures.

BRIEF SUMMARY OF THE INVENTION

According to an aspect of the present invention, there is provided a magnetic random access memory comprising: a plurality of memory cells which are stacked at a plurality of stages to store data using a magnetoresistive effect; a read select switch commonly connected to one terminal of each of the plurality of memory cells; and a plurality of bit lines arranged in correspondence with the plurality of memory cells and extending in a first direction, wherein each of the plurality of memory cells has the other terminal independently connected to one of the plurality of bit lines.

According to an aspect of the present invention, there is provided a read method of a magnetic random access memory, the magnetic random access memory having a read block formed from a plurality of memory cells which store data using a magnetoresistive effect, and a plurality of sense amplifiers arranged in correspondence with the plurality of memory cells, comprising: simultaneously and independently supplying a read current to the plurality of memory cells; detecting data of the plurality of memory cells by the plurality of sense amplifiers on the basis of the read current; and simultaneously outputting data of the plurality of sense amplifiers.

According to an aspect of the present invention, there is provided a manufacturing method of a magnetic random access memory, comprising: forming a read select switch on a surface region of a semiconductor substrate; forming a first write word line extending in a first direction on the read select switch; forming a first MTJ element right above the first write word line; forming, right above the first MTJ element, a first read/write bit line which is in contact with the first MTJ element and extends in a second direction perpendicular to the first direction; forming a second write word line extending in the first direction right above the first write word line; forming a second MTJ element right above the second write word line; and forming, right above the second MTJ element, a second read/write bit line which is in contact with the second MTJ element and extends in the second direction.

BRIEF DESCRIPTION OF THE SEVERAL VIEWS OF THE DRAWING

FIG. 1 is a circuit diagram related to a magnetic random access memory of Structural Example 1 of the present invention;

FIG. 2 is a circuit diagram related to the magnetic random access memory of Structural Example 1 of the present invention;

FIG. 4 is a sectional view related to the magnetic random access memory of Structural Example 1 of the present invention;

FIG. 13 is a circuit diagram related to a magnetic random access memory of Structural Example 3 of the present invention;

FIG. 16 is a circuit diagram related to a modification to the magnetic random access memory of Structural Example 3 of the present invention;

FIG. 17 is a sectional view related to the magnetic random access memory of Structural Example 3 of the present invention;

FIG. 20 is a circuit diagram related to a magnetic random access memory of Structural Example 4 of the present invention;

FIG. 25 is a sectional view related to the magnetic random access memory of Structural Example 5 of the present invention;

FIG. 27 is a sectional view related to the magnetic random access memory of Structural Example 6 of the present invention;

FIG. 28 is a sectional view related to the magnetic random access memory of Structural Example 6 of the present invention;

FIG. 35 is a view showing a circuit example of the write bit line driver/sinker;

FIG. 43 is a view showing a circuit example of the sense amplifier;

FIG. 44 is a view showing a circuit example of the reference potential generating circuit;

FIG. 45 is a view showing a circuit example of an differential amplifier, the OP in FIGS. 42 and 44 and the S/A in FIG. 43;

FIG. 47 is a sectional view showing one step of the manufacturing method of the present invention;

FIG. 48 is a sectional view showing one step of the manufacturing method of the present invention;

FIG. 98 is a sectional view showing a modification to Structural Example 1;

FIG. 103 is a sectional view showing a modification to Structural Example 2;

FIG. 105 is a sectional view showing a modification to Structural Example 1;

FIG. 107 is a circuit diagram showing a modification to Structural Example 3;

FIG. 108 is a sectional view showing a modification to Structural Example 3;

FIG. 109 is a sectional view showing a modification to Structural Example 3;

FIG. 113 is a sectional view showing a modification to Structural Example 4;

FIG. 116 is a sectional view showing a modification to Structural Example 4.

DETAILED DESCRIPTION OF THE INVENTION

Figure 3:
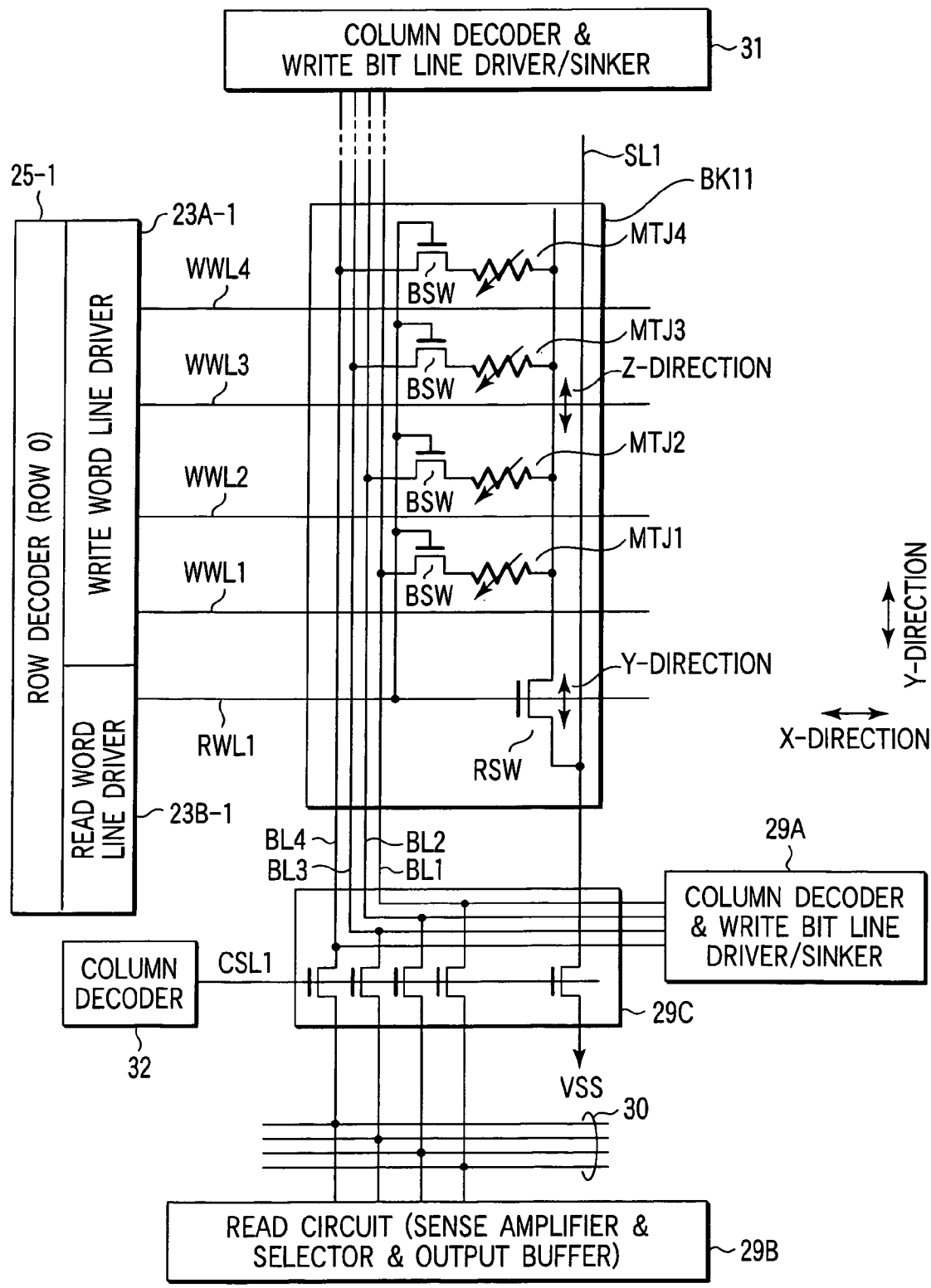
FIG. 3 is a circuit diagram related to a modification to the magnetic random access memory of Structural Example 1 of the present invention.

A magnetic random access memory of an aspect of the present invention will be described below in detail with reference to the accompanying drawings.

1. Cell Array Structure

First, a cell array structure of a magnetic random access memory of an aspect of the present invention will be described below in detail.

(1) Structural Example 1

In Structural Example 1, one read block is formed from four TMR elements. In this example, a case wherein the number of TMR elements in one read block is four will be described. However, the number of TMR elements in one read block is not limited to four and can be freely set.

① Circuit Structure

The circuit structure will be described first.

FIG. 1 shows main part of a magnetic random access memory as Structural Example 1 of the present invention. FIG. 2 shows an example of a column select switch shown in FIG. 1.

A memory cell array 11 has a plurality of TMR elements 12 arrayed in the X-, Y- and Z-directions. The Z-direction means a direction perpendicular to the X- and Y-directions, i.e., a direction perpendicular to the memory cell array plane.

In this example, the memory cell array 11 has a cell array structure formed from j TMR elements 12 arranged in the X-direction, n TMR elements 12 arranged in the Y-direction, and four TMR elements (MTJ1, MTJ2, MTJ3 and MTJ4) 12 stacked in the Z-direction.

In this example, the number of TMR elements 12 stacked in the Z-direction is four. However, the number of TMR elements is not particularly limited as long as the number is two or more.

The four TMR elements 12 stacked in the Z-direction construct one read block BKik (i=1, 2, . . . , j, k=1, 2, . . . , n). In fact, the four TMR elements 12 in the read block BKik overlap one another in the direction (Z-direction) perpendicular to the memory cell array plane.

In this example, one row is constructed by j read blocks BKik arranged in the X-direction. The memory cell array 11 has n rows. In addition, one column is constructed by n read blocks BKik arranged in the Y-direction. The memory cell array 11 has j columns.

One terminal of each of the four TMR elements 12 in the block BKik is commonly connected. The terminals are connected to a source line SLi (i=1, 2, . . . , j) through a read select switch (block select switch or row select switch) RSW formed from, e.g., a MOS transistor. The source line SLi extends in the Y-direction. For example, one source line SLi is arranged in one column.

The source line SLi is connected to a ground point VSS through, e.g., a column select switch 29C formed from a MOS transistor.

In read operation, in the selected row, the read select switches RSW in the read blocks BKik are turned on. In the selected column, the column select switch 29C is turned on. For this reason, the potential of the source line SLi becomes the ground potential VSS. That is, a read current flows only to the TMR elements 12 in the read block BKik located at the intersection between the selected row and the selected column.

In the read mode, in an unselected column, the column select switch 29C is OFF. Hence, the other terminal of each TMR element 12 in the read blocks BKik in an unselected column is short-circuited.

In this case, if read bit lines BL4(j−1)+1, BL4(j−1)+2, BL4(j−1)+3 and BL4(j−1)+4 in an unselected column have different potentials, they may influence the read operation. To prevent this, the read bit lines BL4(j−1)+1, BL4(j−1)+2, BL4(j−1)+3 and BL4(j−1)+4 in an unselected column are set at an equipotential level (e.g., ground potential).

In the read operation, the read select switches RSW in an unselected row are OFF. Hence, the other terminal of each TMR element 12 in the read blocks BKik in an unselected row is also short-circuited.

The short circuit between the TMR elements 12 in the read blocks BKik belonging to the selected column and unselected rows may influence the read operation of the TMR elements 12 in the selected read block BKik belonging to the selected row and column.

Hence, for example, as shown in FIG. 3, block select switches BSW each formed from a MOS transistor may be arranged in each read block BKik. The read bit lines BL4(j−1)+1, BL4(j−1)+2, BL4(j−1)+3 and BL4(j−1)+4 may be electrically connected only to the TMR elements 12 in the selected read block BKik belonging to the selected row and column. In addition, the read current may be supplied only to these TMR elements.

The other terminal of each of the four TMR elements 12 in the read block BKik is independently connected to a corresponding one of the read bit lines BL4(j−1)+1, BL4(j−1)+2, BL4(j−1)+3 and BL4(j−1)+4. Four read bit lines BL4(j−1)+1, BL4(j−1)+2, BL4(j−1)+3 and BL4(j−1)+4 are arranged in one column in correspondence with four TMR elements 12 in one read block BKik.

The read bit lines BL4(j−1)+1, BL4(j−1)+2, BL4(j−1)+3 and BL4(j−1)+4 extend in the Y-direction. One end of each read bit line is connected to a common data line 30 through the column select switch (MOS transistor) 29C. The common data line 30 is connected to a read circuit (including, e.g., a sense amplifier, selector, and output buffer) 29B.

A column select line signal CSLi (i=1, 2, . . . , j) is input to the column select switch 29C. A column decoder 32 outputs the column select line signal CSLi.

In this example, the read bit lines BL4(j−1)+1, BL4(j−1)+2, BL4(j−1)+3 and BL4(j−1)+4 also function as write bit lines.

That is, one end of each of the write/read bit lines BL4(j−1)+1, BL4(j−1)+2, BL4(j−1)+3 and BL4(j−1)+4 is connected to a circuit block 29A including a column decoder and write bit line driver/sinker. The other end is connected to a circuit block 31 including a column decoder and write bit line driver/sinker.

In write operation, the circuit blocks 29A and 31 are set in an operative state. A write current flows to the write/read bit lines BL4(j−1)+1, BL4(j−1)+2, BL4(j−1)+3 and BL4(j−1)+4 in accordance with write data in a direction toward the circuit block 29A or 31.

A plurality of (in this example, four) write word lines WWL4(n−1)+1, WWL4(n−1)+2, WWL4(n−1)+3 and WWL4(n−1)+4 that extend in the X-direction and are stacked in the Z-direction are arranged near the four TMR elements 12 of the read block BKik. Here, n indicates a row number (n=1, 2, . . . .)

In this example, as for the write word lines extending in the X-direction, one write word line is arranged at one stage in one row. That is, one write word line corresponds to one TMR element in the selected read block BKik. In this case, the number of write word lines in one row extending in the X-direction is the same as the number of stages of the stacked TMR elements 12.

Figure 95:
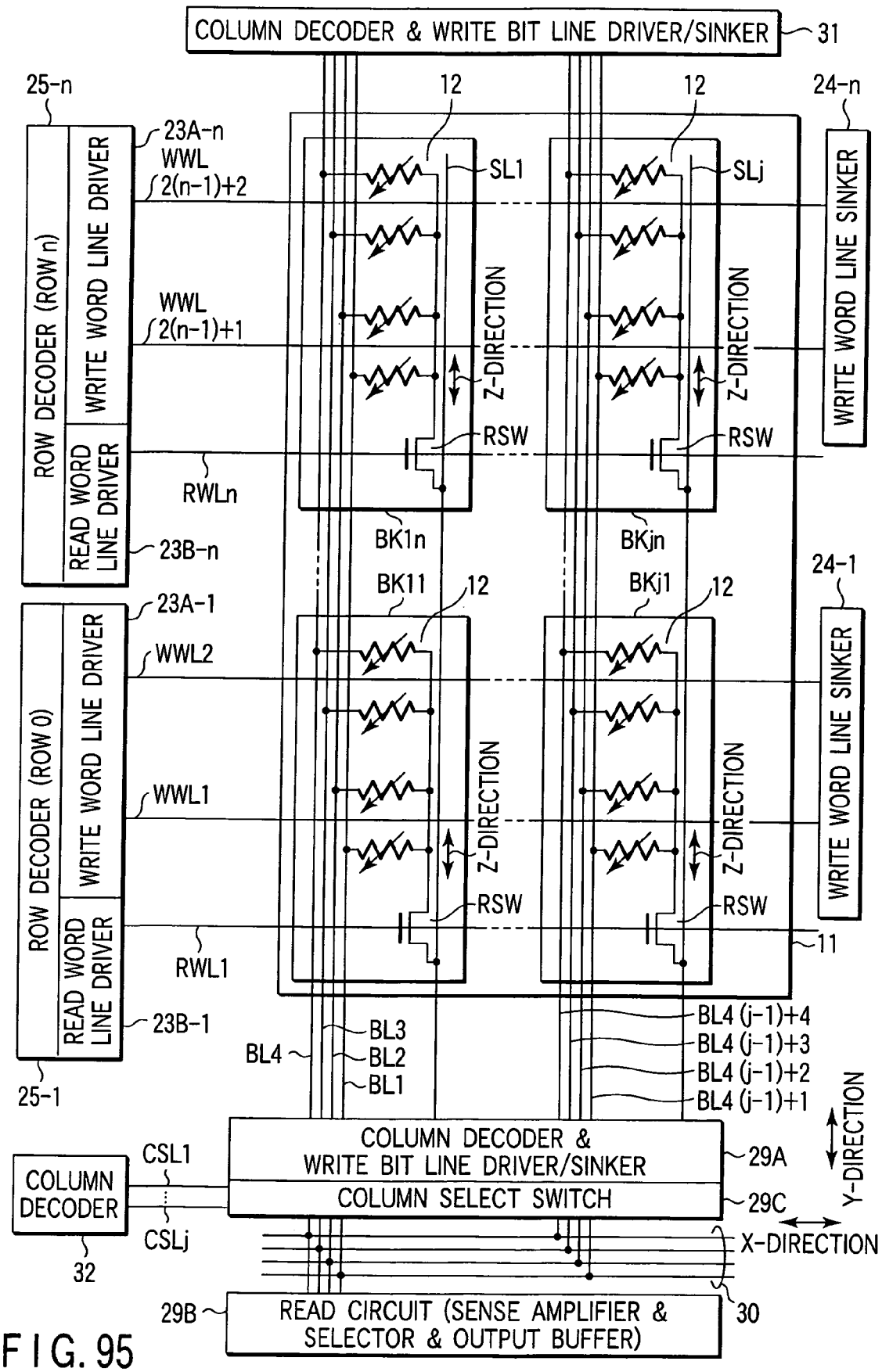
FIG. 95 is a circuit diagram showing a modification to Structural Example 1.
Figure 96:
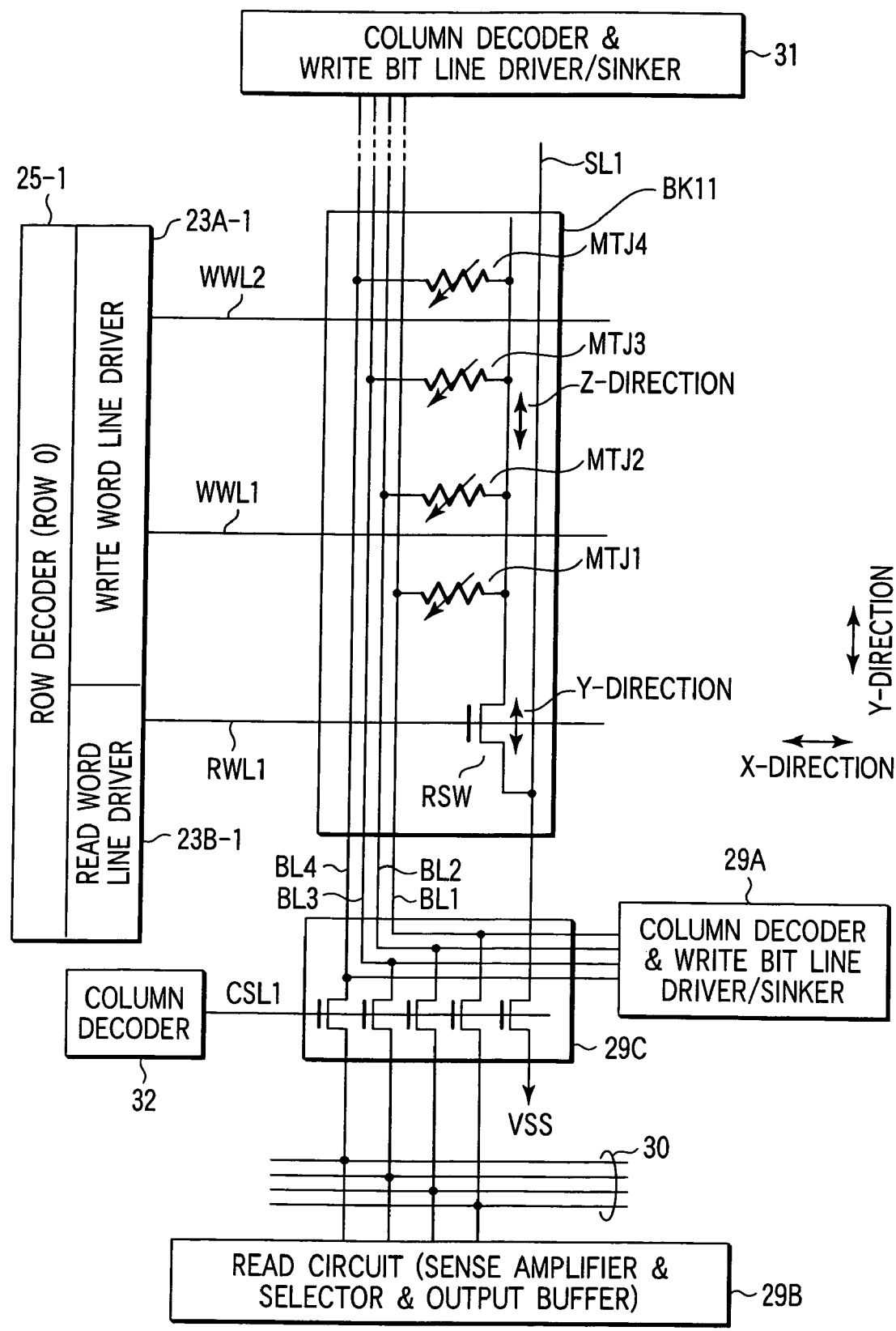
FIG. 96 is a circuit diagram showing a modification to Structural Example 1.

As shown in FIGS. 95 and 96, one write word line may be shared by a plurality of TMR elements (an upper TMR element and lower TMR element) in consideration of planarizing insulating films immediately under the TMR elements 12 or reducing the manufacturing cost.

The TMR element in the block and a detailed structure near it will be described in detail in the section about the device structure.

One end of each of the write word lines WWL4(n−1)+1, WWL4(n−1)+2, WWL4(n−1)+3 and WWL4(n−1)+4 is connected to a write word line driver 23A-n. The other end is connected to a write word line sinker 24-n.

The gate of the read select switch (MOS transistor) RSW is connected to a read word line RWLn (n=1, 2, . . . .) One read word line RWLn is arranged in one row, i.e., shared by the plurality of blocks BKik arranged in the X-direction.

For example, when one column has four blocks, the number of read word lines RWLn is four. Each read word line RWLn extends in the X-direction. One end of the read word line RWLn is connected to a read word line driver 23B-n.

When one read block BKik has a circuit structure shown in FIG. 3, the read word line RWLn is also connected to the gates of the block select switches BSW (MOS transistors).

That is, when the circuit structure shown in FIG. 3 is employed, only the read select switches RSW and block select switches BSW in the blocks BKik on the selected row, i.e., the row for which the potential of the read word line RWLn is at "H" level, are turned on.

In the write operation, a row decoder 25-n selects one of the plurality of rows on the basis of row address signals. The write word line driver 23A-n supplies write currents to the write word lines WWL4(n−1)+1, WWL4(n−1)+2, WWL4(n−1)+3 and WWL4(n−1)+4 in the selected row. The write currents are absorbed by the write word line sinker 24-n.

In the read operation, the row decoder 25-n selects one of the plurality of rows on the basis of row address signals. The read word line driver 23B-n supplies a read voltage (="H") to the read word line RWLn in the selected row.

In the magnetic random access memory of the present invention, one column is constructed by a plurality of read blocks. A plurality of TMR elements in each read block are connected to different read bit lines, respectively. Hence, data of the plurality of TMR elements in the read block can be read at once by one read step.

The plurality of TMR elements in each read block are stacked to form a plurality of stages on a semiconductor substrate. Each read bit line also functions as a write bit line. That is, since no interconnection that functions only as a write bit line need be formed in the cell array, the cell array structure can be simplified.

In each read block, the read select switch RSW and block select switches (FIG. 3) are arranged. A column select switch is connected between a source line and the ground point. In the read operation, the TMR elements in an unselected read block do not influence the read operation. Hence, the read operation stabilizes.

② Device Structure

The device structure will be described next.

Figure 5:
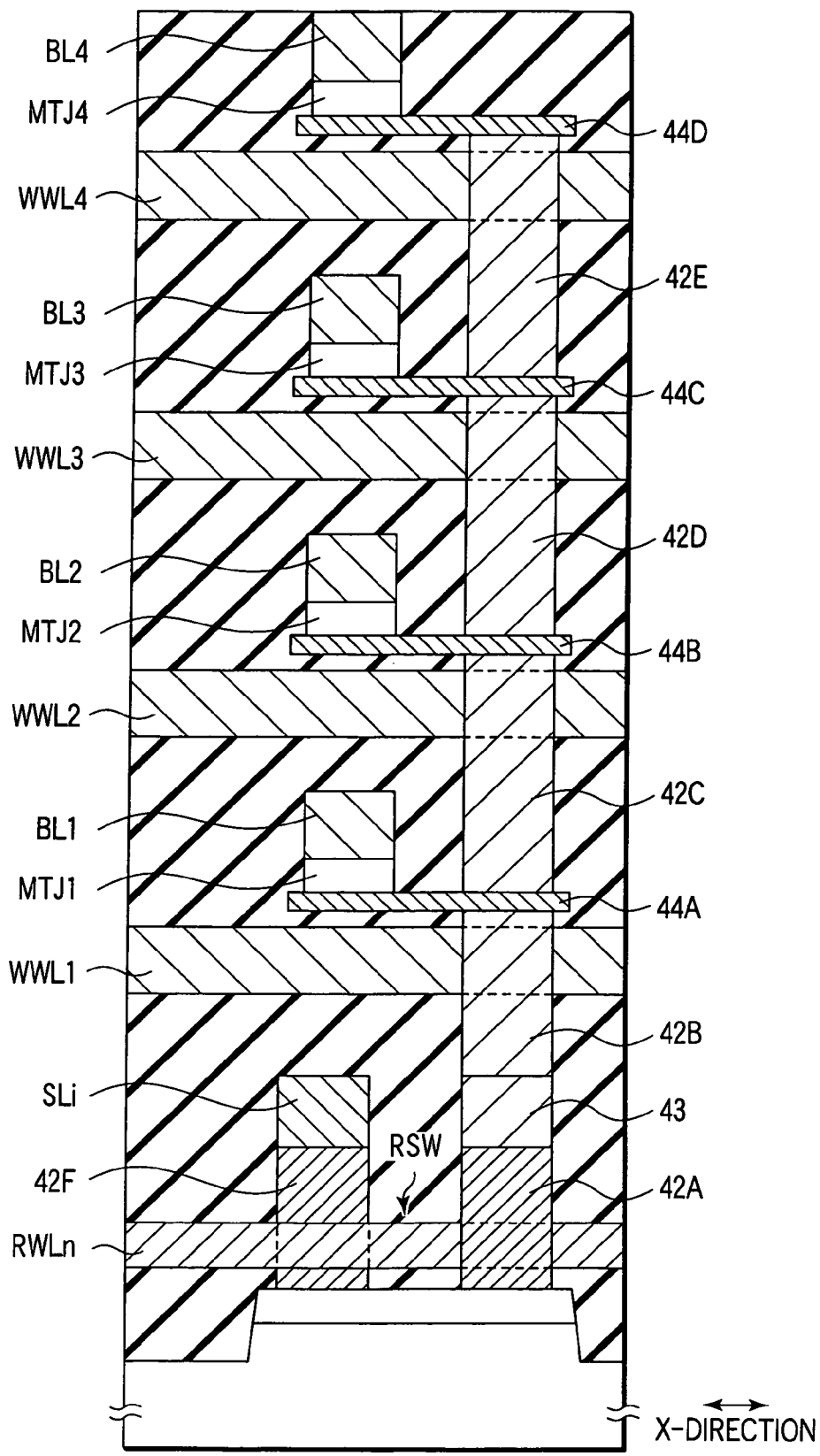
FIG. 5 is a sectional view related to the magnetic random access memory of Structural Example 1 of the present invention.

FIGS. 4 and 5 show the device structure of one block of the magnetic random access memory as Structural Example 1 of the present invention.

FIG. 4 shows the Y-direction section of one block of the magnetic random access memory. FIG. 5 shows the X-direction section of one block of the magnetic random access memory. The same reference numerals as in FIGS. 1 to 3 denote the same elements in FIGS. 4 and 5 to show the correspondence between the elements.

The read select switch (MOS transistor) RSW is arranged on the surface region of a semiconductor substrate 41. The source of the read select switch RSW is connected to the source line SLi through a contact plug 42F. The source line SLi extends straight, e.g., in the Y-direction and is connected to the ground supply through a column select switch arranged at the peripheral portion of the memory cell array region.

The gate of the read select switch (MOS transistor) RSW serves as the read word line RWLn. The read word line RWLn extends in the X-direction. The four TMR elements (MTJ (Magnetic Tunnel Junction) elements) MTJ1, MTJ2, MTJ3 and MTJ4 are stacked at a plurality of stages on the read select switch RSW.

One end (in this example, the lower end) of each of the TMR elements MTJ1, MTJ2, MTJ3 and MTJ4 is connected to a corresponding one of lower electrodes 44A, 44B, 44C and 44D. Contact plugs 42A, 42B, 42C, 42D and 42E and intermediate layer 43 electrically connect the lower electrodes 44A, 44B, 44C and 44D to each other and also electrically connect them to the drain of the read select switch RSW.

The other end (in this example, the upper end) of each of the TMR elements MTJ1, MTJ2, MTJ3 and MTJ4 is electrically connected to a corresponding one of read/write bit lines BL1, BL2, BL3 and BL4. The read/write bit lines BL1, BL2, BL3 and BL4 extend in the Y-direction.

The TMR elements MTJ1, MTJ2, MTJ3 and MTJ4 are independently connected to the read/write bit lines BL1, BL2, BL3 and BL4, respectively. That is, four read/write bit lines BL1, BL2, BL3 and BL4 are arranged in correspondence with four TMR elements MTJ1, MTJ2, MTJ3 and MTJ4.

Write word lines WWL1, WWL2, WWL3 and WWL4 are arranged immediately under the TMR elements MTJ1, MTJ2, MTJ3 and MTJ4 and near them. The write word lines WWL1, WWL2, WWL3 and WWL4 extend in the X-direction.

In this example, four write word lines WWL1, WWL2, WWL3 and WWL4 are arranged in correspondence with four TMR elements MTJ1, MTJ2, MTJ3 and MTJ4.

In this example, the read/write bit lines BL1, BL2, BL3 and BL4 extending in the Y-direction are arranged on the TMR elements MTJ1, MTJ2, MTJ3 and MTJ4. The write word lines WWL1, WWL2, WWL3 and WWL4 extending in the X-direction are arranged below the TMR elements MTJ1, MTJ2, MTJ3 and MTJ4.

However, the positional relationship of the read/write bit lines BL1, BL2, BL3 and BL4 and write word lines WWL1, WWL2, WWL3 and WWL4 with respect to the TMR elements is not limited to this.

Figure 97:
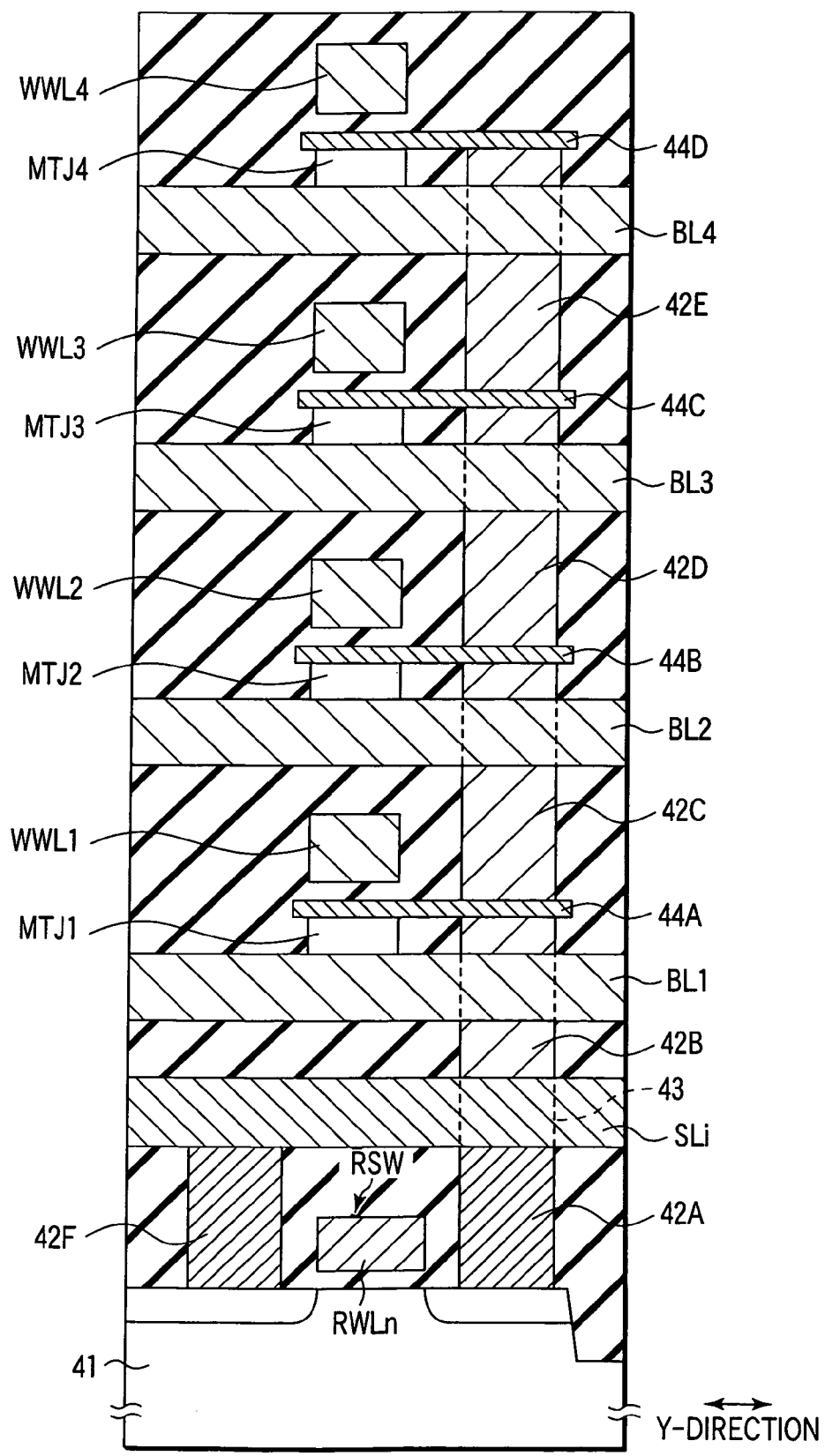
FIG. 97 is a sectional view showing a modification to Structural Example 1.

For example, as shown in FIGS. 97 and 98, the read/write bit lines BL1, BL2, BL3 and BL4 extending in the Y-direction may be arranged under the TMR elements MTJ1, MTJ2, MTJ3 and MTJ4. The write word lines WWL1, WWL2, WWL3 and WWL4 extending in the X-direction may be arranged above the TMR elements MTJ1, MTJ2, MTJ3 and MTJ4.

Figure 99:
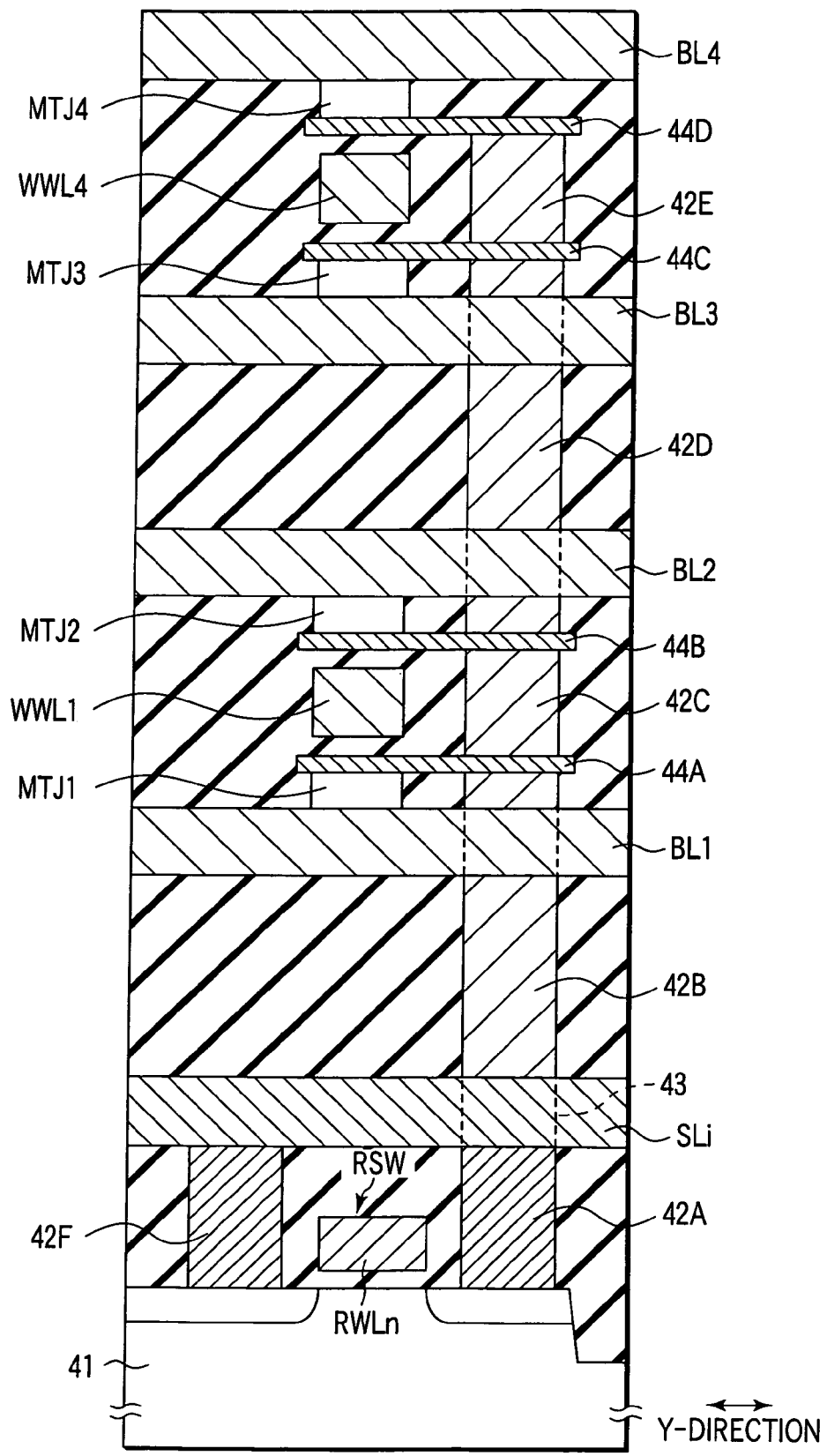
FIG. 99 is a sectional view showing a modification to Structural Example 1.
Figure 100:
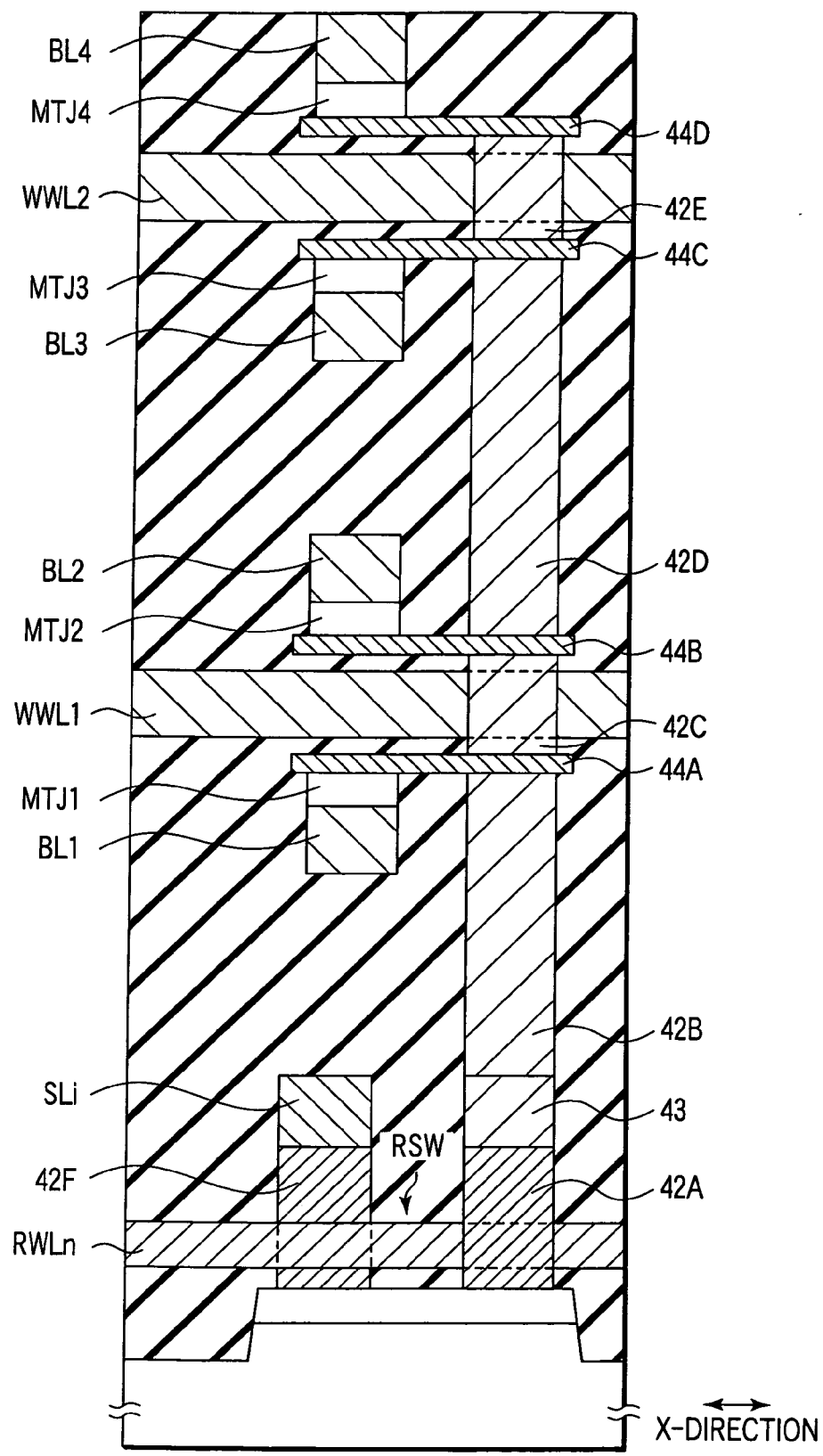
FIG. 100 is a sectional view showing a modification to Structural Example 1.

As shown in FIGS. 99 and 100, one write word line may be shared by a plurality of TMR elements (an upper TMR element and lower TMR element) in consideration of planarizing insulating films right under the TMR elements 12 or reducing the manufacturing cost.

According to such a device structure, the plurality of TMR elements MTJ1, MTJ2, MTJ3 and MTJ4 in the read block are connected to the different read/write bit lines BL1, BL2, BL3 and BL4, respectively. Hence, data of the plurality of TMR elements MTJ1, MTJ2, MTJ3 and MTJ4 in the read block can be read at once by one read step.

The plurality of TMR elements MTJ1, MTJ2, MTJ3 and MTJ4 in the read block are stacked at a plurality of stages on the semiconductor substrate 41. In addition, only the read/write bit lines BL1, BL2, BL3 and BL4 extend in the Y-direction. For this reason, even when the number of stacked TMR elements MTJ1, MTJ2, MTJ3 and MTJ4 is increased, the cell array structure is not complicated.

Figure 6:
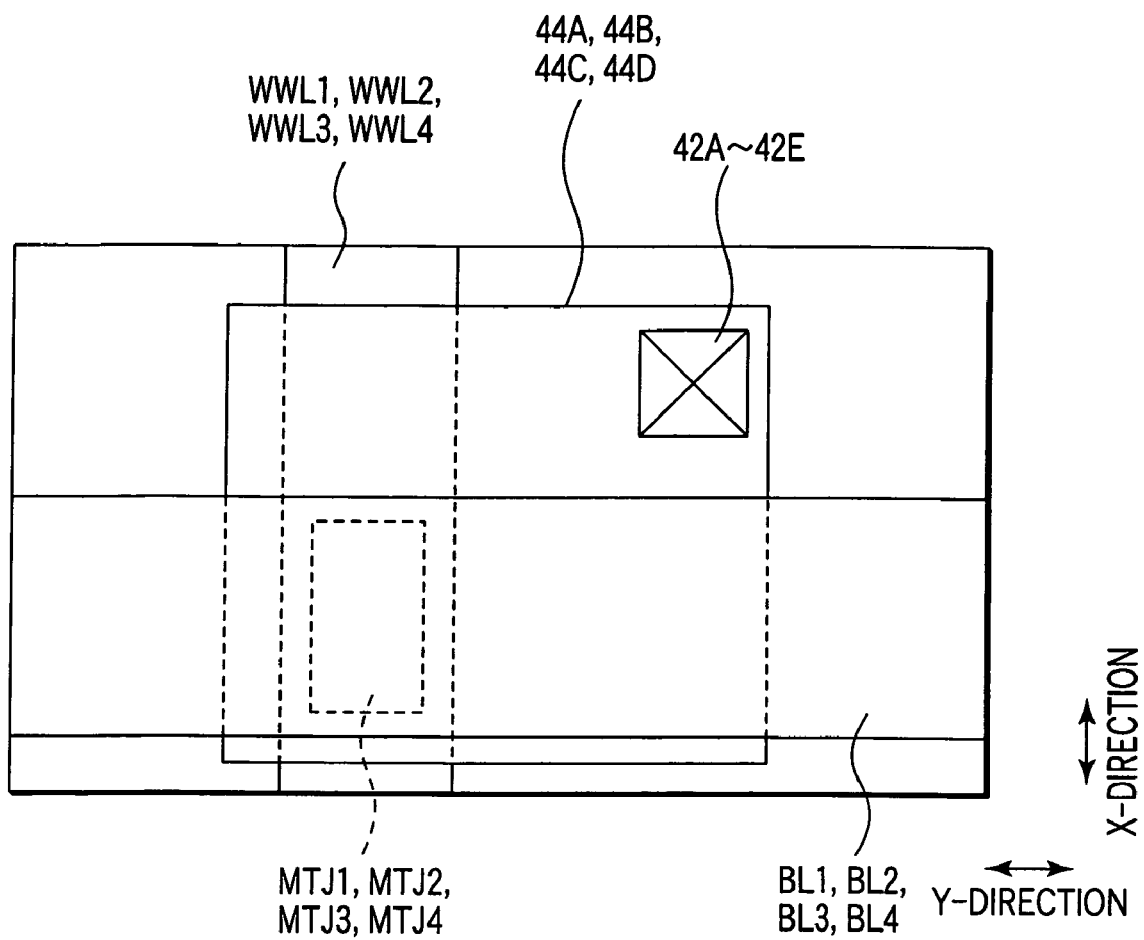
FIG. 6 is a plan view showing a TMR element of Structural Example 1 and the layout near the TMR element.

FIG. 6 shows the positional relationship between the TMR elements and the write word lines and read/write bit lines in the device structure shown in FIGS. 4 and 5.

In the device structure shown in FIGS. 4 and 5, the lower electrodes 44A, 44B, 44C and 44D, write word lines WWL1, WWL2, WWL3 and WWL4, and read/write bit lines BL1, BL2, BL3 and BL4 are arranged at the respective stages of the plurality of stacked TMR elements MTJ1, MTJ2, MTJ3 and MTJ4.

The layouts of, e.g., the stages of the TMR elements MTJ1, MTJ2, MTJ3 and MTJ4 are set to be identical.

Each of the lower electrodes 44A, 44B, 44C and 44D has, e.g., a rectangular pattern. They have contact regions corresponding to the contact plugs 42A to 42E at partial portions. The lower electrodes 44A, 44B, 44C and 44D have the TMR elements MTJ1, MTJ2, MTJ3 and MTJ4 at the remaining portions.

The TMR elements MTJ1, MTJ2, MTJ3 and MTJ4 are arranged at the intersections between the write word lines WWL1, WWL2, WWL3 and WWL4 and the read/write bit lines BL1, BL2, BL3 and BL4.

③ Structural Example of TMR Element

Figure 7:
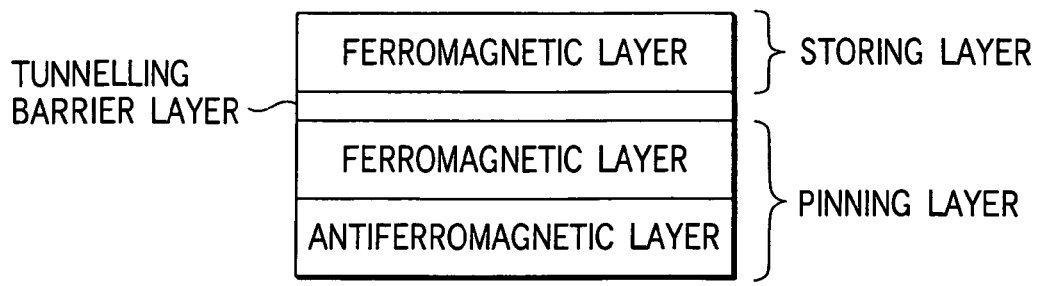
FIG. 7 is a sectional view showing a structural example of the TMR element.
Figure 8:
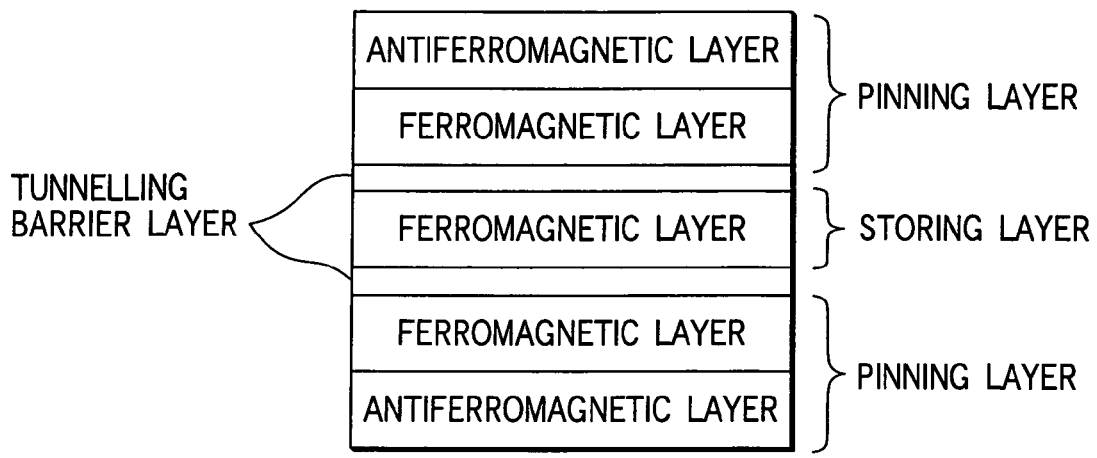
FIG. 8 is a sectional view showing a structural example of the TMR element.
Figure 9:
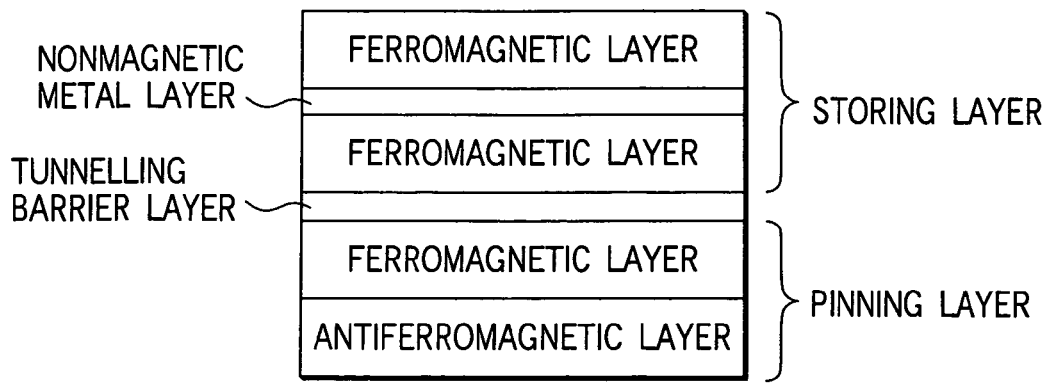
FIG. 9 is a sectional view showing a structural example of the TMR element.

FIGS. 7 to 9 show structural examples of the TMR element.

The TMR element shown in FIG. 7 has the most basic structure having two ferromagnetic layers and a tunneling barrier layer sandwiched between these layers.

An anti-ferromagnetic layer for fixing the magnetizing direction is added to a fixed layer (pinned layer) of the two ferromagnetic layers, in which the magnetizing direction is fixed. The magnetizing direction in a free layer (storing layer) of the two ferromagnetic layers, in which the magnetizing direction can be freely changed, is determined by a synthesized magnetic field formed by a write word line and write bit line.

The TMR element shown in FIG. 8 has two tunneling barrier layers in it to make the bias voltage higher than in the TMR element shown in FIG. 7.

The TMR element shown in FIG. 8 can be regarded to have a structure (double junction structure) in which two TMR elements shown in FIG. 7 are connected in series.

In this example, the TMR element has three ferromagnetic layers. Tunneling barrier layers are inserted between the ferromagnetic layers. Antiferromagnetic layers are added to the two ferromagnetic layers (pinned layers) at two ends. The middle layer in the three ferromagnetic layers serves as a free layer (storing layer) in which the magnetizing direction can be freely changed.

The TMR element shown in FIG. 9 can easily close lines of magnetic force in the ferromagnetic layer serving as a storing layer, as compared to the TMR element shown in FIG. 7.

For the TMR element of this example, it can be regarded that the storing layer of the TMR element shown in FIG. 7 is replaced with a storing layer formed from two ferromagnetic layers and a nonmagnetic metal layer (e.g., an aluminum layer) sandwiched between those layers.

When the storing layer of the TMR element has a three-layered structure made of two ferromagnetic layers and a nonmagnetic metal layer sandwiched between these layers, lines of magnetic force in the two ferromagnetic layers of the storing layer readily close. That is, since any anti-magnetic field component in the two ferromagnetic layers of the storing layer can be prevented, the MR ratio can be improved.

The structural examples of the TMR element have been described above. In the present invention (circuit structure, device structure, read operation mechanism, read circuit, and manufacturing method), the structure of the TMR element is not particularly limited. The above-described three structural examples are mere representative examples of the TMR element structure.

(2) Structural Example 2

Structural Example 2 is a modification to Structural Example 1. A characteristic feature of Structural Example 2, which is different from Structural Example 1, is the direction of a read select switch. That is, in Structural Example 2, the read select switch of Structural Example 1 is rotated by 90°.

① Circuit Structure

The circuit structure will be described first.

Figure 10:
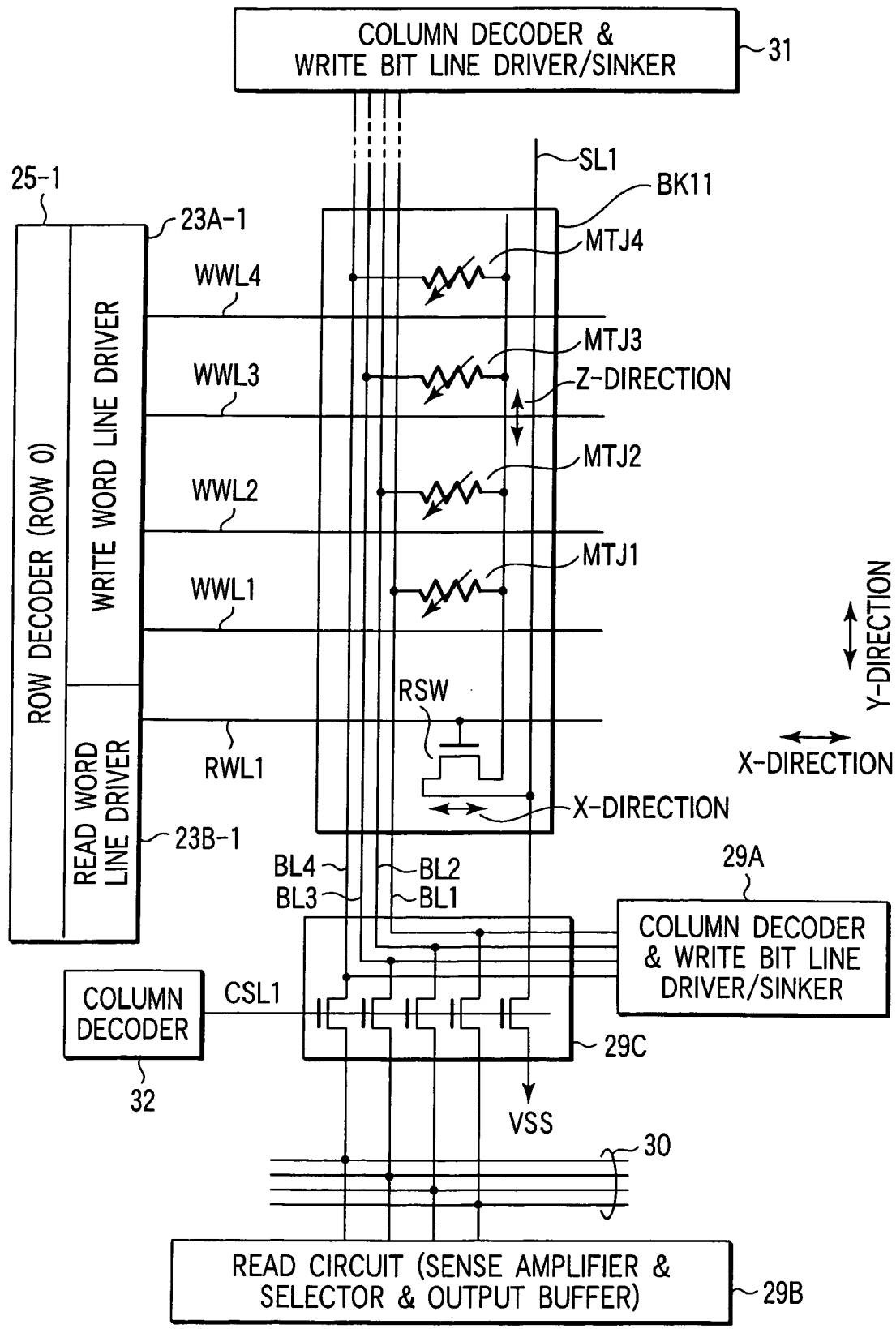
FIG. 10 is a circuit diagram related to a magnetic random access memory of Structural Example 2 of the present invention.

FIG. 10 shows main part of a magnetic random access memory as Structural Example 2 of the present invention. The circuit diagram of FIG. 10 corresponds to that of FIG. 2. The outline of the memory cell array and its peripheral portion in Structural Example 2 is the same as in FIG. 1.

One terminal of each of four TMR elements MTJ1, MTJ2, MTJ3 and MTJ4 in a block BK11 is connected to a source line SL1 through a read select switch (block select switch or row select switch) RSW formed from, e.g., a MOS transistor.

The line that connects the source and drain of the read select switch RSW is parallel to the X-direction. That is, the channel length of the read select switch RSW is the X-direction length of the channel of the read select switch RSW. The channel width is the Y-direction width of the channel of the read select switch RSW.

The gate of the read select switch RSW extends in the Y-direction and is connected, at a predetermined portion, to a read word line RWL1 that extends in the X-direction.

The source line SL1 extends in the Y-direction. For example, one source line is arranged in one column. The source line SL1 is connected to the ground supply through a column select switch 29C formed from, e.g., a MOS transistor.

Assume that the read block BK11 is selected in read operation. At this time, the read select switch RSW in the read block BK11 is turned on. In addition, the column select switch 29C is turned on. For this reason, the potential of the source line SL1 changes to the ground potential. That is, a read current flows to the TMR elements MTJ1, MTJ2, MTJ3 and MTJ4 in the read block BK11.

The other terminal of each of the four TMR elements MTJ1, MTJ2, MTJ3 and MTJ4 in the read block BK11 is independently connected to a corresponding one of read bit lines BL1, BL2, BL3 and BL4. That is, four read bit lines BL1, BL2, BL3 and BL4 are arranged in correspondence with the four TMR elements MTJ1, MTJ2, MTJ3 and MTJ4 in the read block BK11.

The read bit lines BL1, BL2, BL3 and BL4 extend in the Y-direction. One end of each read bit line is connected to a common data line 30 through the column select switch (MOS transistor) 29C. The common data line 30 is connected to a read circuit (including, e.g., a sense amplifier, selector and output buffer) 29B.

A column select line signal CSL1 is input to the column select switch 29C. A column decoder 32 outputs the column select line signal CSL1.

In this example, the read bit lines BL1, BL2, BL3 and BL4 also function as write bit lines.

That is, one end of each of the read/write bit lines BL1, BL2, BL3 and BL4 is connected to a circuit block 29A including a column decoder and write bit line driver/sinker. The other end is connected to a circuit block 31 including a column decoder and write bit line driver/sinker.

In write operation, the circuit blocks 29A and 31 are set in an operative state. A write current flows to the read/write bit lines BL1, BL2, BL3 and BL4 in accordance with write data in a direction toward the circuit block 29A or 31.

A plurality of (in this example, four) write word lines WWL1, WWL2, WWL3 and WWL4 that extend in the X-direction and are stacked in the Z-direction are arranged near the four TMR elements MTJ1, MTJ2, MTJ3 and MTJ4 of the read block BK11.

In this example, as for the write word lines extending in the X-direction, one write word line is arranged at one stage in one row. That is, one write word line corresponds to one TMR element in the read block BK11. In this case, the number of write word lines in one row extending in the X-direction is the same as the number of stages of the stacked TMR elements MTJ1, MTJ2, MTJ3 and MTJ4.

Figure 101:
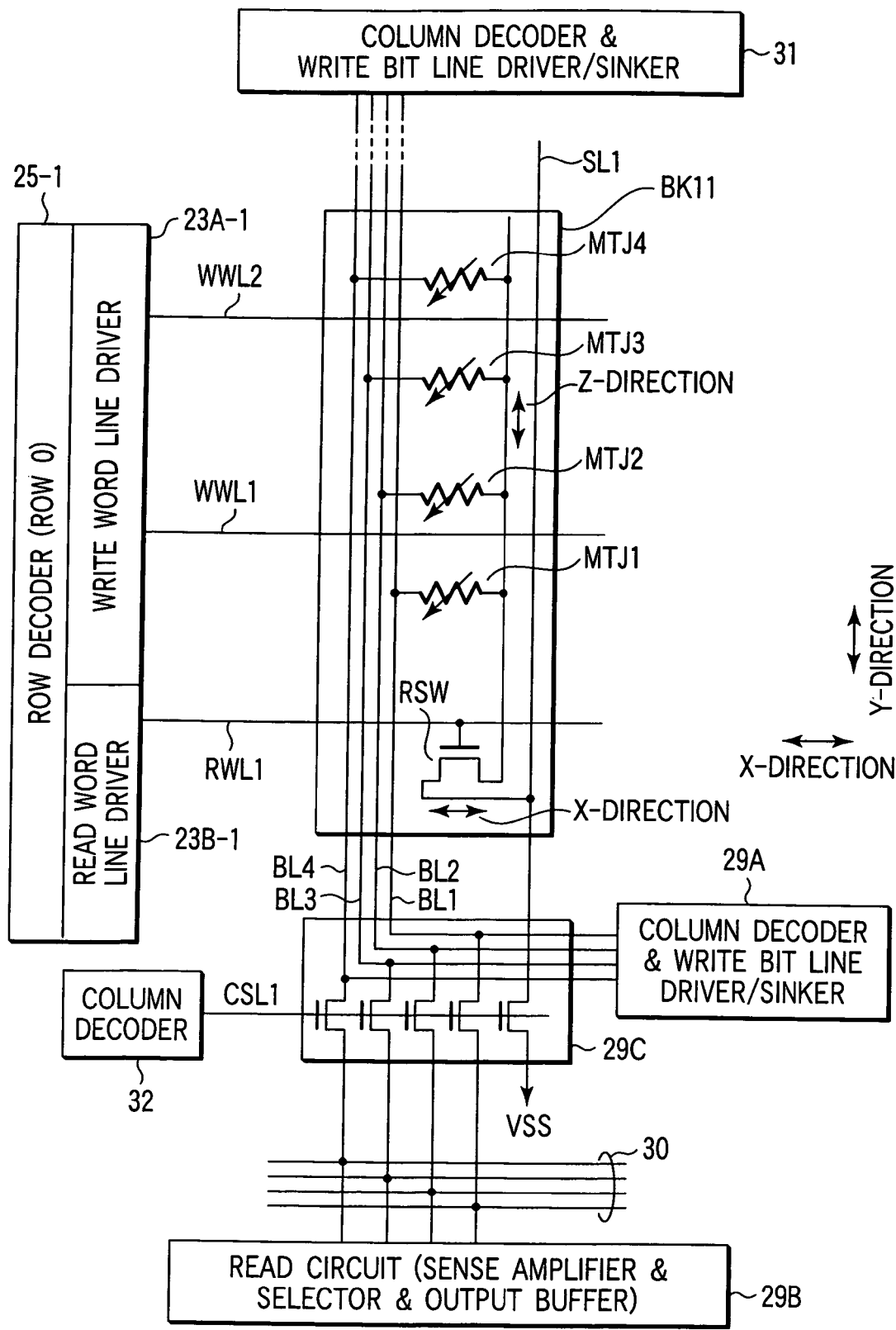
FIG. 101 is a circuit diagram showing a modification to Structural Example 2.

As shown in FIG. 101, one write word line may be shared by a plurality of TMR elements (an upper TMR element and lower TMR element) in consideration of planarizing insulating films immediately under the TMR elements MTJ1, MTJ2, MTJ3 and MTJ4 or reducing the manufacturing cost.

One end of each of the write word lines WWL1, WWL2, WWL3 and WWL4 is connected to a write word line driver 23A-n. The other end is connected to a write word line sinker 24-n.

The gate of the read select switch (MOS transistor) RSW is connected to the read word line RWL1. One read word line RWL1 is arranged in one row, i.e., shared by the plurality of blocks arranged in the X-direction.

In the write operation, a row decoder 25-1 selects one of the plurality of rows on the basis of row address signals. The write word line driver 23A-n supplies write currents to the write word lines WWL1, WWL2, WWL3 and WWL4 in the selected row. The write currents are absorbed by the write word line sinker.

In the read operation, the row decoder 25-1 selects one of the plurality of rows on the basis of row address signals. A read word line driver 23B-1 supplies a read voltage (="H") to the read word line RWL1 in the selected row.

In the magnetic random access memory of the present invention, one column is constructed by a plurality of read blocks. A plurality of TMR elements in each read block are connected to different read bit lines, respectively. Hence, data of the plurality of TMR elements in the read block can be read at once by one read step.

The plurality of TMR elements in each read block are stacked to form a plurality of stages on a semiconductor substrate. Each read bit line also functions as a write bit line. That is, since no interconnection that functions only as a write bit line need be formed in the cell array, the cell array structure can be simplified.

In each read block, the read select switch RSW is arranged. A column select switch is connected between a source line and the ground line. In the read operation, the TMR elements in an unselected read block rarely influence the read operation. Hence, the read operation stabilizes.

② Device Structure

The device structure will be described next.

Figure 11:
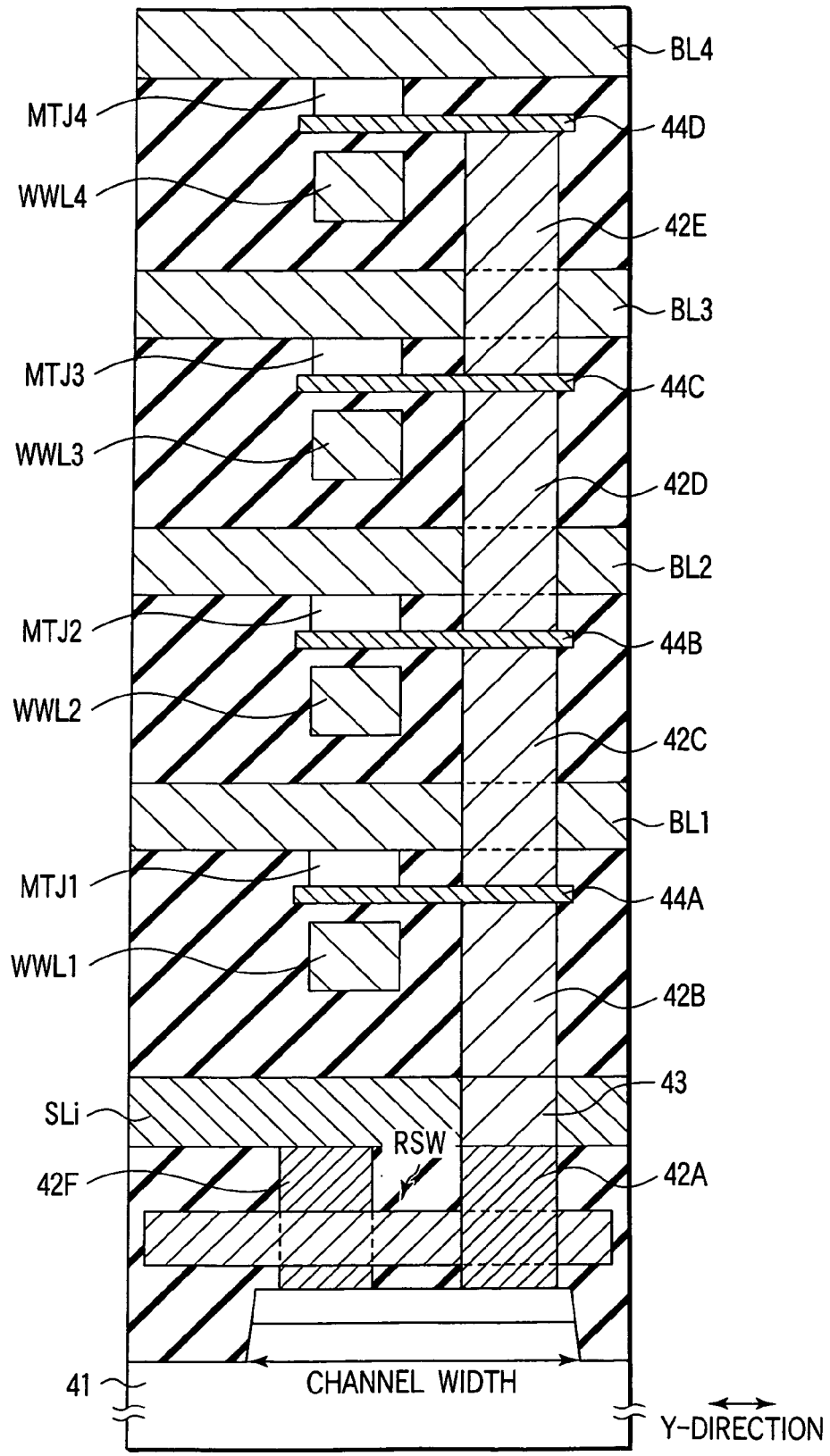
FIG. 11 is a sectional view related to the magnetic random access memory of Structural Example 2 of the present invention.
Figure 12:
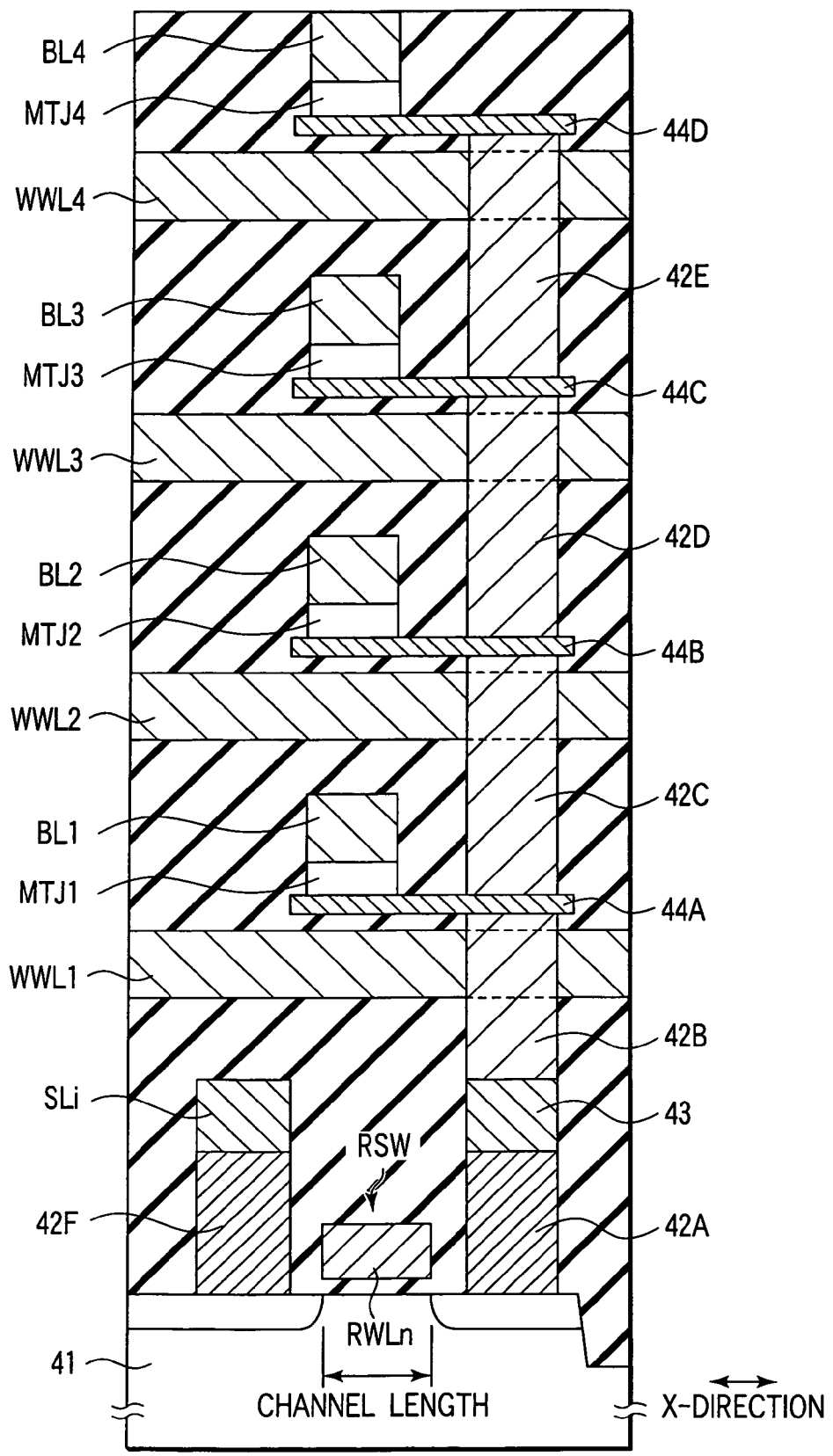
FIG. 12 is a sectional view related to the magnetic random access memory of Structural Example 2 of the present invention.

FIGS. 11 and 12 show the device structure of one block of the magnetic random access memory as Structural Example 2 of the present invention.

FIG. 11 shows the Y-direction section of one block of the magnetic random access memory. FIG. 12 shows the X-direction section of one block of the magnetic random access memory. The same reference numerals as in FIG. 9 denote the same elements in FIGS. 11 and 12 to show the correspondence between the elements.

The read select switch (MOS transistor) RSW is arranged on the surface region of a semiconductor substrate 41. The source of the read select switch RSW is connected to the source line SLi through a contact plug 42F. The source line SLi extends straight, e.g., in the Y-direction and is connected to the ground supply through a column select switch arranged at the peripheral portion of the memory cell array region.

The gate of the read select switch (MOS transistor) RSW serves as the read word line RWLn. The read word line RWLn extends in the X-direction. The four TMR elements (MTJ (Magnetic Tunnel Junction) elements) MTJ1, MTJ2, MTJ3 and MTJ4 are stacked at a plurality of stages on the read select switch RSW.

One end (in this example, the lower end) of each of the TMR elements MTJ1, MTJ2, MTJ3 and MTJ4 is connected to a corresponding one of lower electrodes 44A, 44B, 44C and 44D. Contact plugs 42A, 42B, 42C, 42D and 42E and intermediate layer 43 electrically connect the lower electrodes 44A, 44B, 44C and 44D to each other and also electrically connect them to the drain of the read select switch RSW.

The other end (in this example, the upper end) of each of the TMR elements MTJ1, MTJ2, MTJ3 and MTJ4 is electrically connected to a corresponding one of the read/write bit lines BL1, BL2, BL3 and BL4. The read/write bit lines BL1, BL2, BL3 and BL4 extend in the Y-direction.

The TMR elements MTJ1, MTJ2, MTJ3 and MTJ4 are independently connected to the read/write bit lines BL1, BL2, BL3 and BL4, respectively. That is, four read/write bit lines BL1, BL2, BL3 and BL4 are arranged in correspondence with four TMR elements MTJ1, MTJ2, MTJ3 and MTJ4.

The write word lines WWL1, WWL2, WWL3 and WWL4 are arranged right under the TMR elements MTJ1, MTJ2, MTJ3 and MTJ4 and near them. The write word lines WWL1, WWL2, WWL3 and WWL4 extend in the X-direction.

In this example, four write word lines WWL1, WWL2, WWL3 and WWL4 are arranged in correspondence with four TMR elements MTJ1, MTJ2, MTJ3 and MTJ4.

In this example, the read/write bit lines BL1, BL2, BL3 and BL4 extending in the Y-direction are arranged on the TMR elements MTJ1, MTJ2, MTJ3 and MTJ4. The write word lines WWL1, WWL2, WWL3 and WWL4 extending in the X-direction are arranged below the TMR elements MTJ1, MTJ2, MTJ3 and MTJ4.

However, the positional relationship of the read/write bit lines BL1, BL2, BL3 and BL4 and write word lines WWL1, WWL2, WWL3 and WWL4 with respect to the TMR elements is not limited to this.

Figure 102:
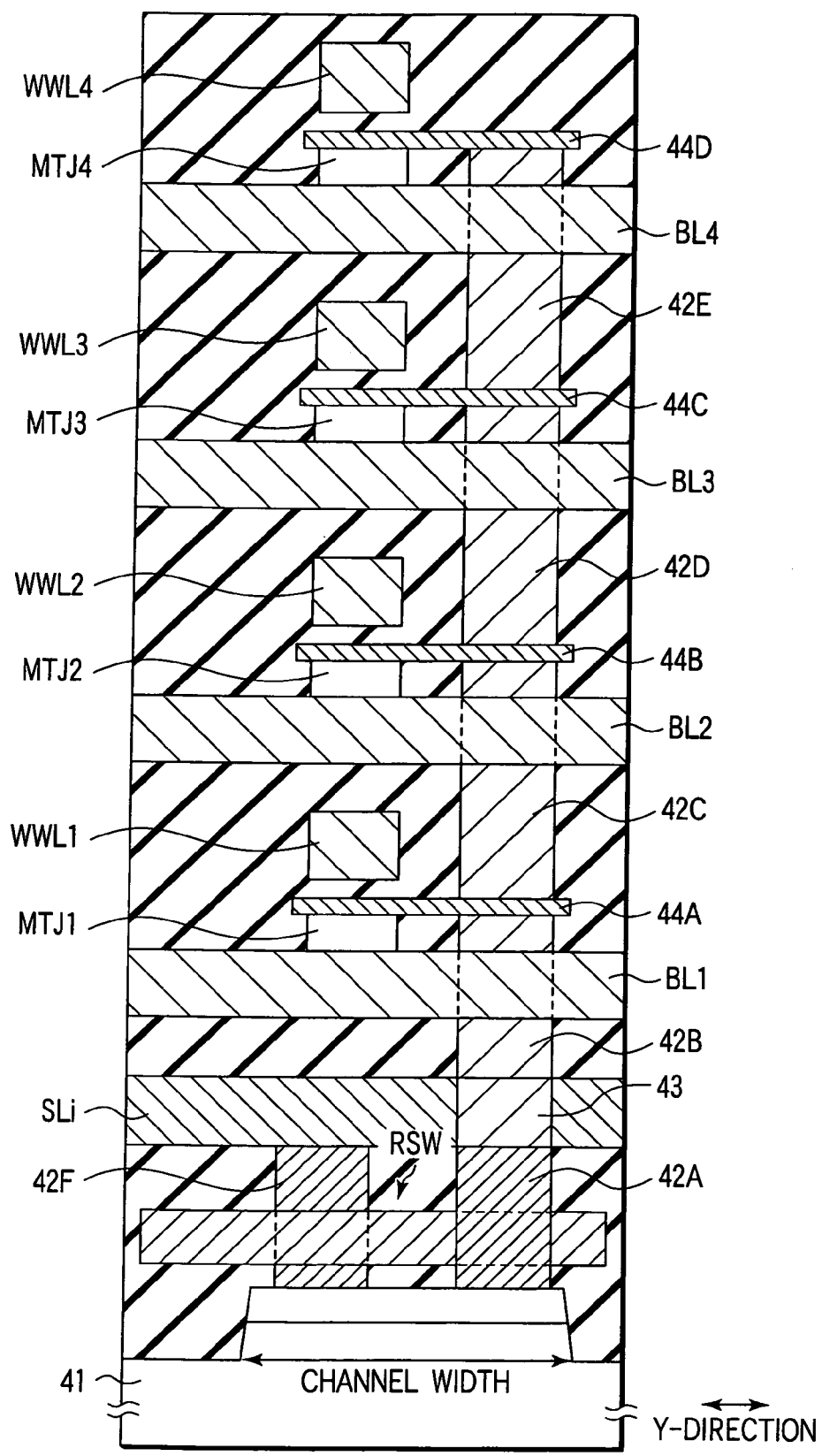
FIG. 102 is a sectional view showing a modification to Structural Example 2.

For example, as shown in FIGS. 102 and 103, the read/write bit lines BL1, BL2, BL3 and BL4 extending in the Y-direction may be arranged under the TMR elements MTJ1, MTJ2, MTJ3 and MTJ4. The write word lines WWL1, WWL2, WWL3 and WWL4 extending in the X-direction may be arranged above the TMR elements MTJ1, MTJ2, MTJ3 and MTJ4.

Figure 104:
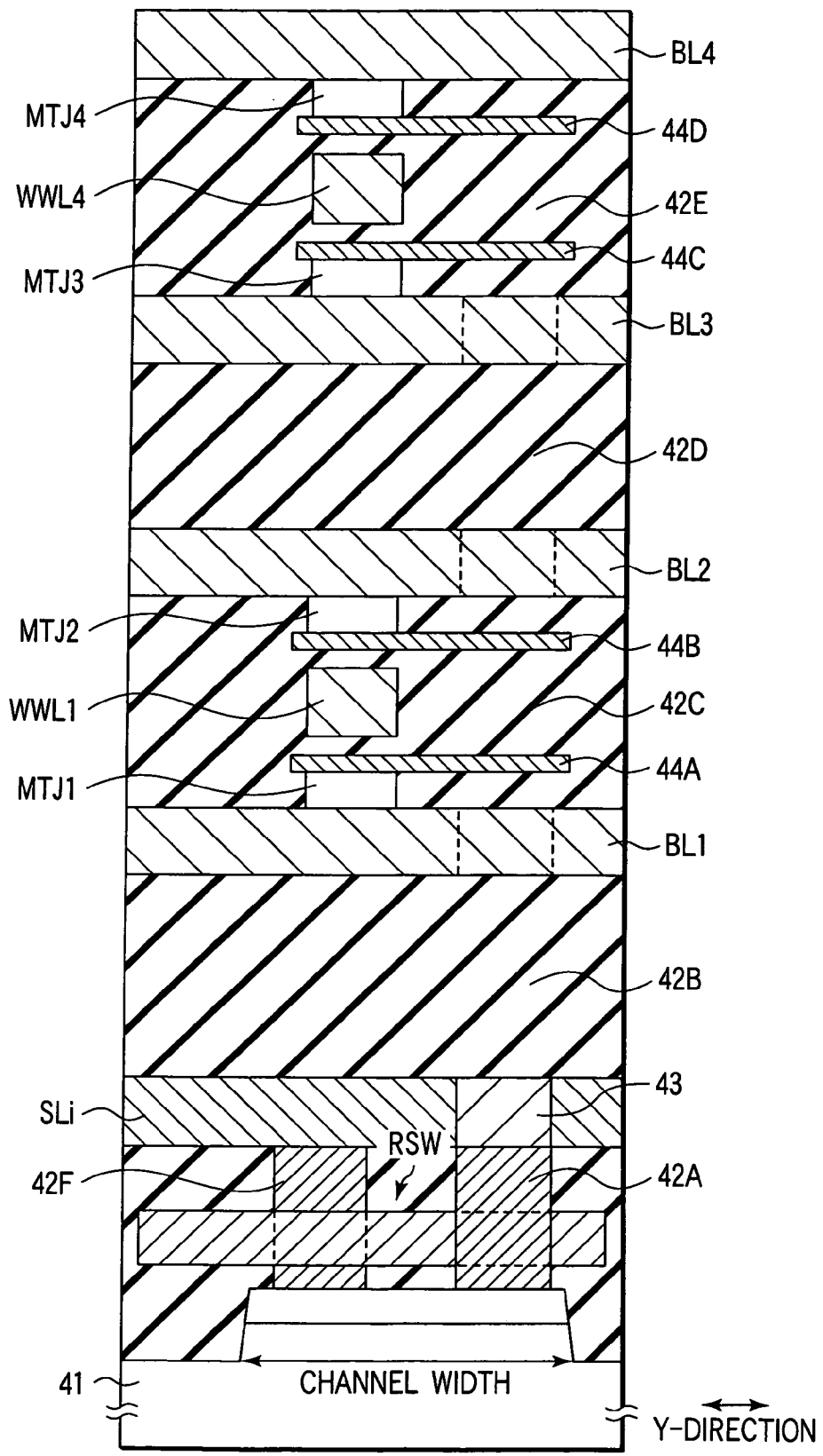
FIG. 104 is a sectional view showing a modification to Structural Example 1.

As shown in FIGS. 104 and 105, one write word line may be shared by a plurality of TMR elements (an upper TMR element and lower TMR element) in consideration of planarizing insulating films immediately under the TMR elements 12 or reducing the manufacturing cost.

According to such a device structure, the plurality of TMR elements MTJ1, MTJ2, MTJ3 and MTJ4 in the read block are connected to the different read/write bit lines BL1, BL2, BL3 and BL4, respectively. Hence, data of the plurality of TMR elements MTJ1, MTJ2, MTJ3 and MTJ4 in the read block can be read at once by one read step.

The plurality of TMR elements MTJ1, MTJ2, MTJ3 and MTJ4 in the read block are stacked at a plurality of stages on the semiconductor substrate 41. In addition, only the read/write bit lines BL1, BL2, BL3 and BL4 extend in the Y-direction. For this reason, even when the number of stacked TMR elements MTJ1, MTJ2, MTJ3 and MTJ4 is increased, the cell array structure is not complicated.

(3) Structural Example 3

Structural Example 3 is a modification to Structural Example 1. A characteristic feature of Structural Example 3, which is different from Structural Example 1, is the interconnection connected to the gate and source of a read select switch.

That is, in Structural Example 3, the gate of the read select switch is connected to a decode line, and its source is connected to a read word line. The read select switch in a read block is selected by column address signals.

① Circuit Structure

The circuit structure will be described first.

Figure 14:
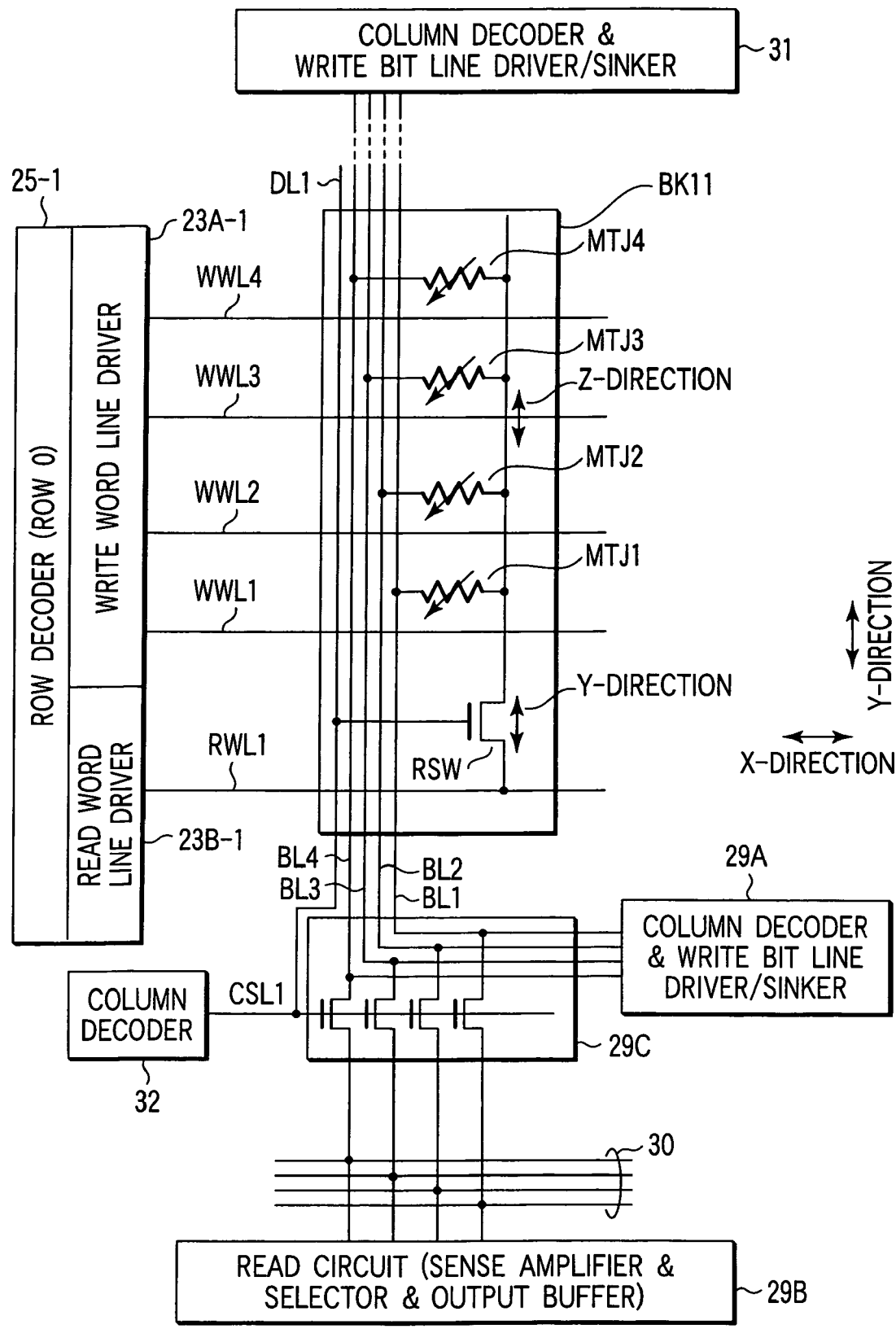
FIG. 14 is a circuit diagram related to the magnetic random access memory of Structural Example 3 of the present invention.

FIG. 13 shows main part of a magnetic random access memory as Structural Example 3 of the present invention. FIG. 14 shows an example of a column select switch shown in FIG. 13.

A memory cell array 11 has a plurality of TMR elements 12 arrayed in the X-, Y- and Z-directions. The Z-direction means a direction perpendicular to the X- and Y-directions, i.e., a direction perpendicular to the memory cell array plane.

The memory cell array 11 has a cell array structure formed from j TMR elements 12 arranged in the X-direction, n TMR elements 12 arranged in the Y-direction, and four TMR elements 12 stacked in the Z-direction. The number of TMR elements 12 stacked in the Z-direction is four. However, the number of TMR elements is not particularly limited as long as the number is two or more.

The four TMR elements 12 stacked in the Z-direction construct one read block BKik (i=1, 2, . . . , j, k=1, 2, . . . , n). In fact, the four TMR elements 12 in the read block BKik overlap one another in the direction (Z-direction) perpendicular to the memory cell array plane.

In this example, one row is constructed by j read blocks BKik arranged in the X-direction. The memory cell array 11 has n rows. In addition, one column is constructed by n read blocks BKik arranged in the Y-direction. The memory cell array 11 has j columns.

One terminal of each of the four TMR elements 12 in the block BKik is connected to a read word line RWLn (n=1, 2, . . . ) through a read select switch (block select switch or row select switch) RSW formed from, e.g., a MOS transistor. The read word line RWLn extends in the X-direction. For example, one read word line RWLn is arranged in one row.

The gate of the read select switch RSW is connected to a decode line DLi (i=1, 2, . . . .) The decode line DLi extends in the Y-direction. For example, one decode line is arranged in one column. One end of the decode line DLi is connected to a column decoder 32.

In this example, the decode line DLi is connected to the column decoder 32. That is, a column select switch and read select switches in read blocks, which are present on a single column, execute the same operation.

For example, when the column decoder 32 sets a column select signal CSL1 at "H" level, the column select switch of the column to which the read blocks BK11, . . . , BK1n belong is turned on. At the same time, the read select switches RSW in the read blocks BK11, . . . , BK1n are turned on.

In this example, both a column select switch 29C and the read select switch RSW in the read block BKik are controlled using a column select signal CSLi (i=1, 2, . . . ) output from the column decoder 32.

Figure 15:
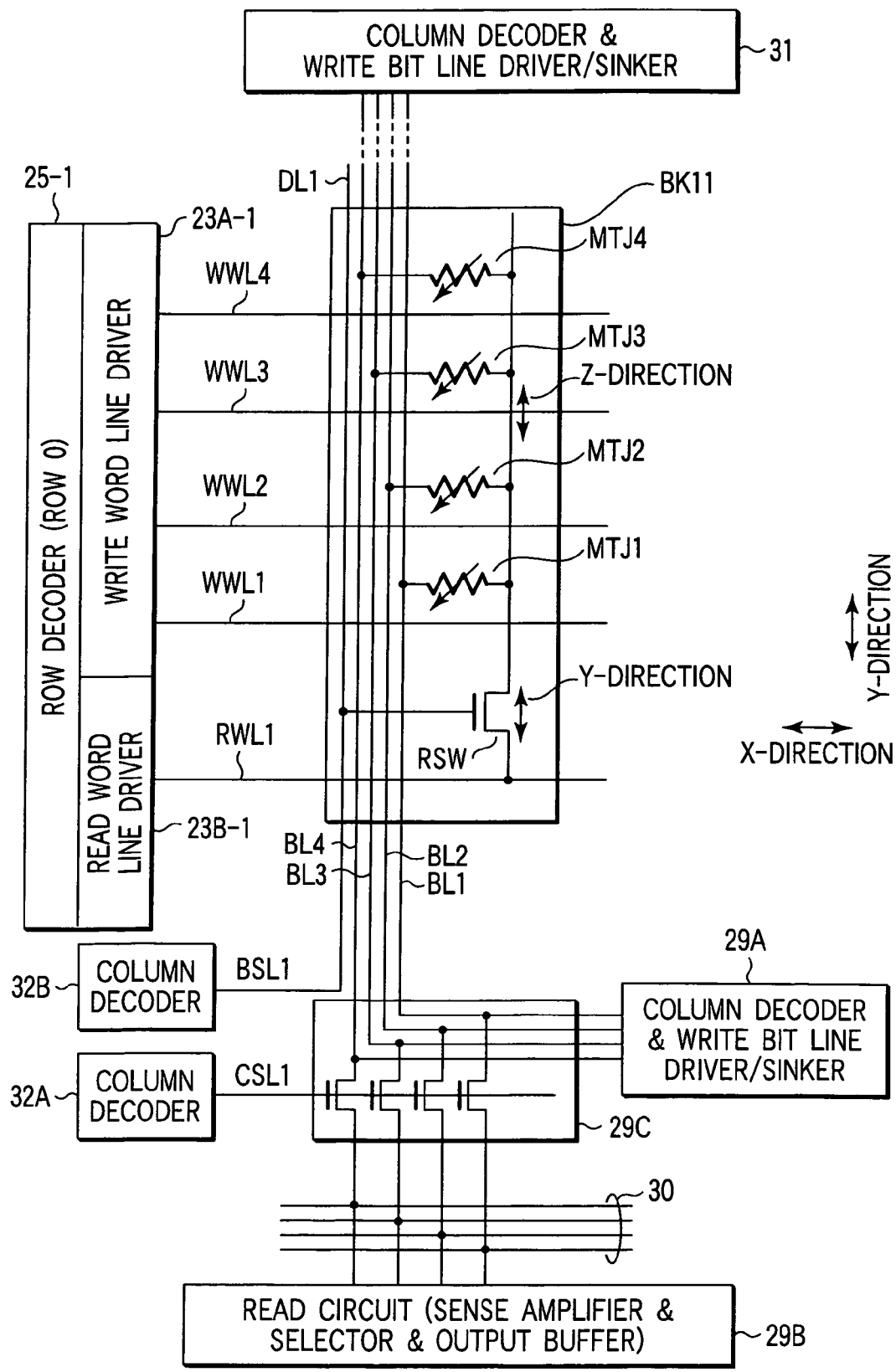
FIG. 15 is a circuit diagram related to a modification to the magnetic random access memory of Structural Example 3 of the present invention.

Instead, for example, as shown in FIG. 15, the column select switch 29C and the read select switch RSW in the read block BKik may be controlled by different signals.

That is, in the example shown in FIG. 15, the column select switch 29C is controlled by the column select signal CSL1 output from a column decoder 32A. The read select switch RSW in the read block BK11 is controlled by a block select signal BSL1 output from a column decoder 32B.

The column decoders 32A and 32B have identical structures, as will be described in the section about the read circuit.

In read operation, in the selected row, the potential of the read word line RWLn changes to "L" level. In the selected column, the read select switches RSW in the read blocks BKik are turned on, as described above.

Hence, a read current flows only to the TMR elements 12 in the read block BKik located at the intersection between the selected row and the selected column.

In the read mode, in an unselected column, the read select switches RSW in the read blocks BKik are OFF. Hence, the other terminal of each TMR element 12 in the read blocks BKik in an unselected column is short-circuited.

In this case, if read bit lines BL4(j−1)+1, BL4(j−1)+2, BL4(j−1)+3 and BL4(j−1)+4 in an unselected column have different potentials, they may influence the read operation. To prevent this, the read bit lines BL4(j−1)+1, BL4(j−1)+2, BL4(j−1)+3 and BL4(j−1)+4 in an unselected column are set at an equipotential level (e.g., ground potential).

In the read operation, in the selected column and unselected rows, for example, the read word lines RWLn are set in the floating state (fixed potential; it may be the same potential as that of the selected bit line). In this case, in the selected column and unselected rows, since the read select switches RSW in the read blocks BKik are ON, the other terminal of each TMR element 12 in the blocks BKik is short-circuited.

The short circuit between the TMR elements 12 in the read blocks BKik belonging to the selected column and unselected rows may influence the read operation of the TMR elements 12 in the selected read block BKik belonging to the selected row and column.

Hence, for example, as shown in FIG. 16, block select switches BSW each formed from a MOS transistor may be arranged in each read block BKik. The read bit lines BL4(j−1)+1, BL4(j−1)+2, BL4(j−1)+3 and BL4(j−1)+4 may be electrically connected only to the TMR elements 12 in the selected read block BKik belonging to the selected row and column. In addition, the read current may be supplied only to these TMR elements.

The other terminal of each of the four TMR elements 12 in the read block BKik is independently connected to a corresponding one of the read bit lines BL4(j−1)+1, BL4(j−1)+2, BL4(j−1)+3 and BL4(j−1)+4. Four read bit lines BL4(j−1)+1, BL4(j−1)+2, BL4(j−1)+3 and BL4(j−1)+4 are arranged in one column in correspondence with four TMR elements 12 in one read block BKik.

The read bit lines BL4(j−1)+1, BL4(j−1)+2, BL4(j−1)+3 and BL4(j−1)+4 extend in the Y-direction. One end of each read bit line is connected to a common data line 30 through the column select switch (MOS transistor) 29C. The common data line 30 is connected to a read circuit (including, e.g., a sense amplifier, selector and output buffer) 29B.

A column select line signal CSLi (i=1, 2, . . . , j) is input to the column select switch 29C. The column decoder 32 outputs the column select line signal CSLi.

In this example, the read bit lines BL4(j−1)+1, BL4(j−1)+2, BL4(j−1)+3 and BL4(j−1)+4 also function as write bit lines.

That is, one end of each of the write/read bit lines BL4(j−1)+1, BL4(j−1)+2, BL4(j−1)+3 and BL4(j−1)+4 is connected to a circuit block 29A including a column decoder and write bit line driver/sinker. The other end is connected to a circuit block 31 including a column decoder and write bit line driver/sinker.

In write operation, the circuit blocks 29A and 31 are set in an operative state. A write current flows to the write/read bit lines BL4(j−1)+1, BL4(j−1)+2, BL4(j−1)+3 and BL4(j−1)+4 in accordance with write data in a direction toward the circuit block 29A or 31.

A plurality of (in this example, four) write word lines WWL4(n−1)+1, WWL4(n−1)+2, WWL4(n−1)+3 and WWL4(n−1)+4 that extend in the X-direction and are stacked in the Z-direction are arranged near the four TMR elements 12 of the read block BKik. Here, n indicates a row number (n=1, 2, . . . .)

In this example, as for the write word lines extending in the X-direction, one write word line is arranged at one stage in one row. That is, one write word line corresponds to one TMR element in the selected read block BKik. In this case, the number of write word lines in one row extending in the X-direction is the same as the number of stages of the stacked TMR elements 12.

Figure 106:
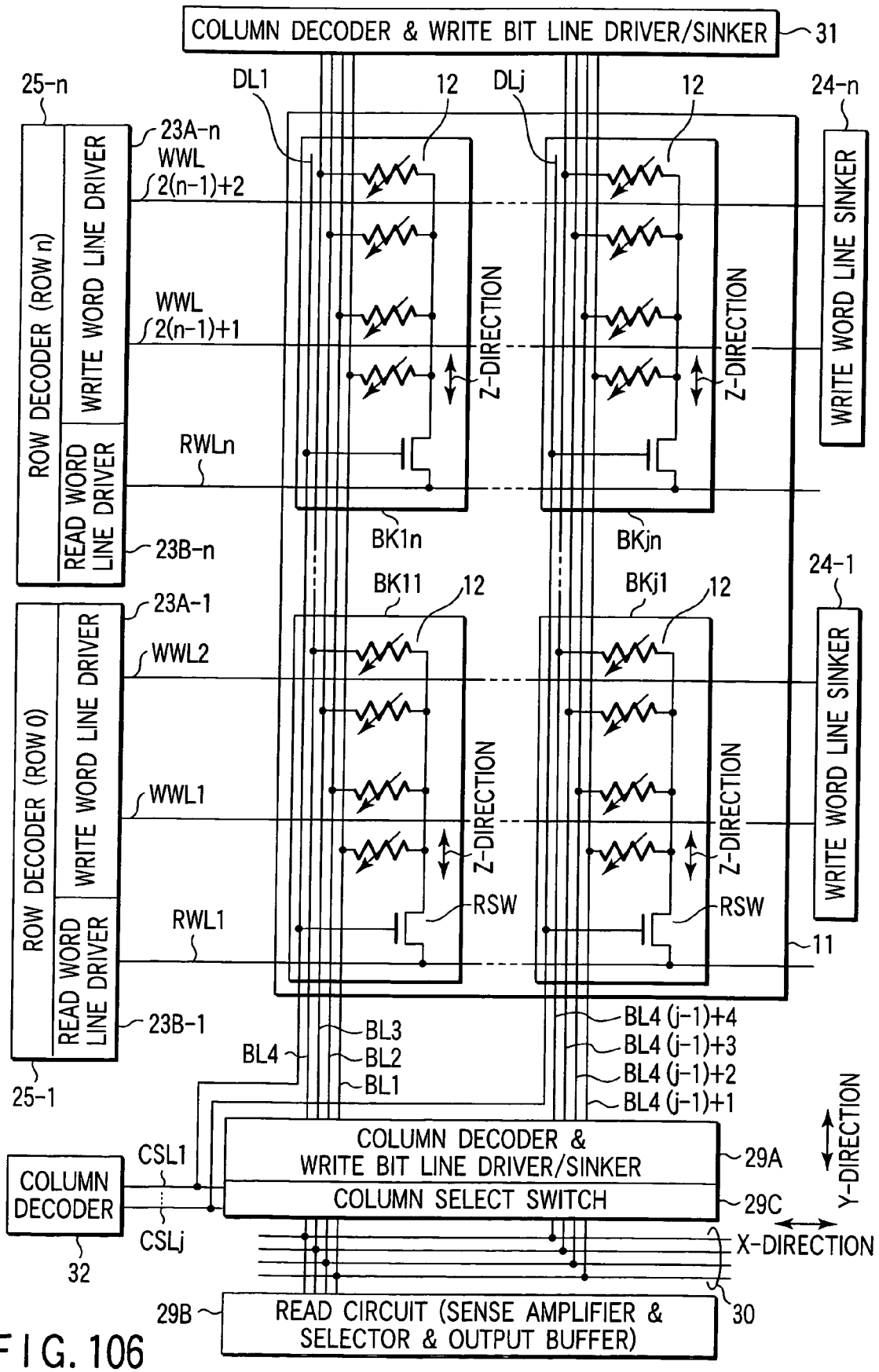
FIG. 106 is a circuit diagram showing a modification to Structural Example 3.

As shown in FIGS. 106 and 107, one write word line may be shared by a plurality of TMR elements (an upper TMR element and lower TMR element) in consideration of planarizing insulating films right under the TMR elements 12 or reducing the manufacturing cost.

The TMR element in the block and a detailed structure near it will be described in detail in the section about the device structure.

One end of each of the write word lines WWL4(n−1)+1, WWL4(n−1)+2, WWL4(n−1)+3 and WWL4(n−1)+4 is connected to a write word line driver 23A-n. The other end is connected to a write word line sinker 24-n.

The source of the read select switch (MOS transistor) RSW is connected to the read word line RWLn (n=1, 2, . . . .) One read word line RWLn is arranged in one row, i.e., shared by the plurality of blocks BKik arranged in the X-direction.

When one read block BKik has a circuit structure shown in FIG. 16, the read word line RWLn is also connected to the gates of the block select switches BSW (MOS transistors) through, e.g., an inverter.

That is, when the circuit structure shown in FIG. 16 is employed, the block select switches BSW in the blocks BKik on the selected row, i.e., the row for which the potential of the read word line RWLn is at "L" level, are turned on.

The potential of the read word line RWLn of the selected row changes to "L" level. In addition, the read select switches RSW in the read blocks BKik of the selected column are turned on. For this reason, the read bit lines BL4(j−1)+1, BL4(j−1)+2, BL4(j−1)+3 and BL4(j−1)+4 are electrically connected only to the TMR elements 12 in the selected read block BKik belonging to the selected row and column. In addition, the read current flows only to these TMR elements.

In the write operation, a row decoder 25-n selects one of the plurality of rows on the basis of row address signals. The write word line driver 23A-n supplies write currents to the write word lines WWL4(n−1)+1, WWL4(n−1)+2, WWL4(n−1)+3 and WWL4(n−1)+4 in the selected row. The write currents are absorbed by the write word line sinker 24-n.

In the read operation, the row decoder 25-n selects one of the plurality of rows on the basis of row address signals. The read word line driver 23B-n supplies a read voltage (="L") to the read word line RWLn in the selected row.

In the magnetic random access memory of the present invention, one column is constructed by a plurality of read blocks. A plurality of TMR elements in each read block are connected to different read bit lines, respectively. Hence, data of the plurality of TMR elements in the read block can be read at once by one read step.

The plurality of TMR elements in each read block are stacked to form a plurality of stages on a semiconductor substrate. Each read bit line also functions as a write bit line. That is, since no interconnection that functions only as a write bit line need be formed in the cell array, the cell array structure can be simplified.

In each read block, the read select switch RSW and block select switches (FIG. 16) are arranged. The read select switch is controlled by the output signal from the column decoder. The block select switch is controlled by the output from the row decoder. Hence, in the read operation, the TMR elements in an unselected read block do not influence the read operation. For this reason, the read operation stabilizes.

② Device Structure

The device structure will be described next.

Figure 18:
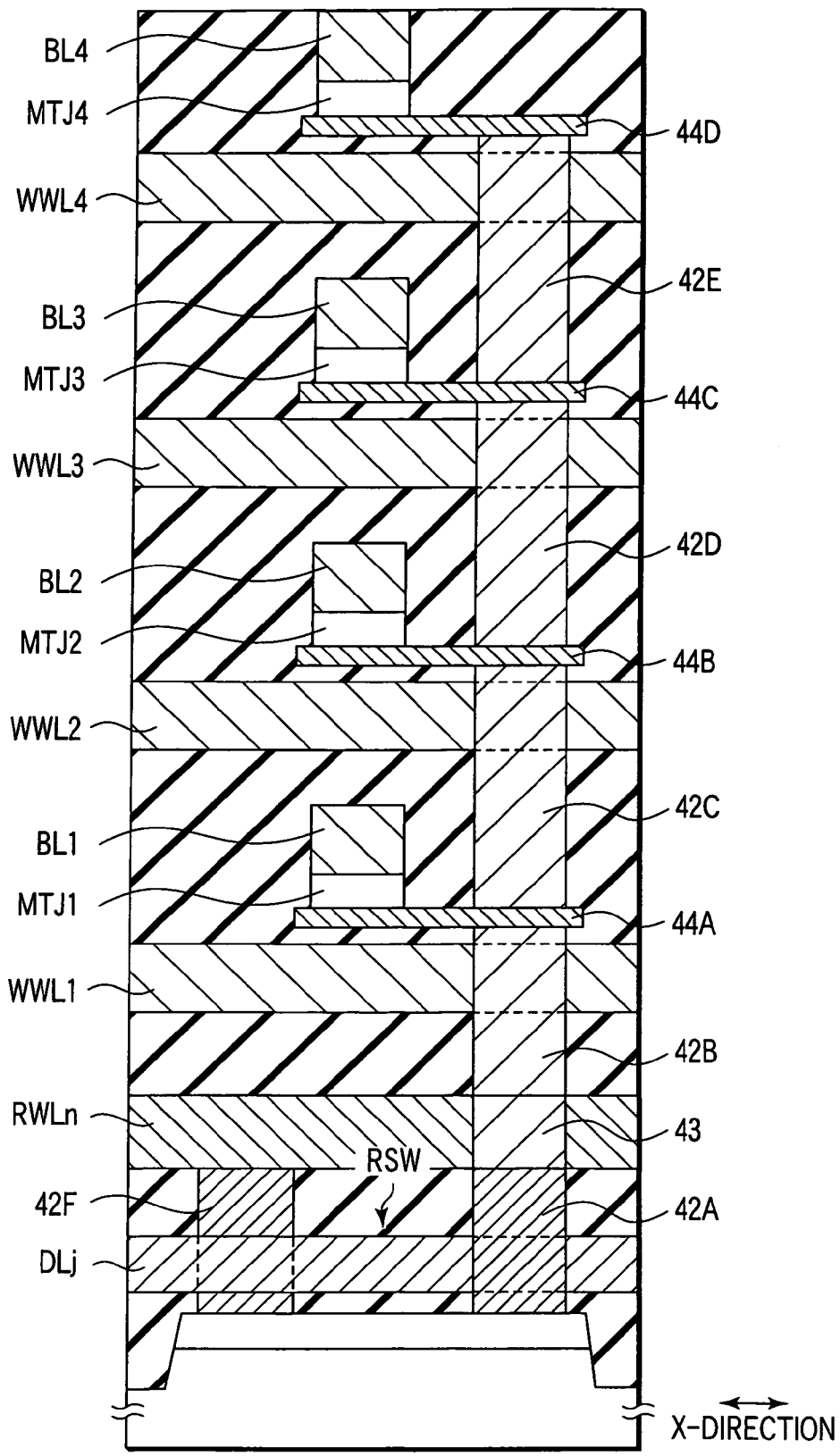
FIG. 18 is a sectional view related to the magnetic random access memory of Structural Example 3 of the present invention.

FIGS. 17 and 18 show the device structure of one block of the magnetic random access memory as Structural Example 3 of the present invention.

FIG. 17 shows the Y-direction section of one block of the magnetic random access memory. FIG. 18 shows the X-direction section of one block of the magnetic random access memory. The same reference numerals as in FIGS. 13 to 16 denote the same elements in FIGS. 17 and 18 to show the correspondence between the elements.

The read select switch (MOS transistor) RSW is arranged on the surface region of a semiconductor substrate 41. The source of the read select switch RSW is connected to the read word line RWLn through a contact plug 42F. The read word line RWLn extends straight, e.g., in the X-direction and is connected to the read word line driver arranged at the peripheral portion of the memory cell array region.

The gate of the read select switch (MOS transistor) RSW serves as a decode line DLj. The decode line DLj extends in the Y-direction at a portion other than the sections shown in FIGS. 17 and 18. The four TMR elements (MTJ (Magnetic Tunnel Junction) elements) MTJ1, MTJ2, MTJ3 and MTJ4 are stacked at a plurality of stages on the read select switch RSW.

One end (in this example, the lower end) of each of the TMR elements MTJ1, MTJ2, MTJ3 and MTJ4 is connected to a corresponding one of lower electrodes 44A, 44B, 44C and 44D. Contact plugs 42A, 42B, 42C, 42D and 42E and intermediate layer 43 electrically connect the lower electrodes 44A, 44B, 44C and 44D to each other and also electrically connect them to the drain of the read select switch RSW.

The other end (in this example, the upper end) of each of the TMR elements MTJ1, MTJ2, MTJ3 and MTJ4 is electrically connected to a corresponding one of read/write bit lines BL1, BL2, BL3 and BL4. The read/write bit lines BL1, BL2, BL3 and BL4 extend in the Y-direction.

The TMR elements MTJ1, MTJ2, MTJ3 and MTJ4 are independently connected to the read/write bit lines BL1, BL2, BL3 and BL4, respectively. That is, four read/write bit lines BL1, BL2, BL3 and BL4 are arranged in correspondence with four TMR elements MTJ1, MTJ2, MTJ3 and MTJ4.

Write word lines WWL1, WWL2, WWL3 and WWL4 are arranged immediately under the TMR elements MTJ1, MTJ2, MTJ3 and MTJ4 and near them. The write word lines WWL1, WWL2, WWL3 and WWL4 extend in the X-direction.

In this example, four write word lines WWL1, WWL2, WWL3 and WWL4 are arranged in correspondence with four TMR elements MTJ1, MTJ2, MTJ3 and MTJ4.

In this example, the read/write bit lines BL1, BL2, BL3 and BL4 extending in the Y-direction are arranged on the TMR elements. The write word lines WWL1, WWL2, WWL3 and WWL4 extending in the X-direction are arranged below the TMR elements.

However, the positional relationship of the read/write bit lines BL1, BL2, BL3 and BL4 and write word lines WWL1, WWL2, WWL3 and WWL4 with respect to the TMR elements is not limited to this.

For example, as shown in FIGS. 108 and 109, the read/write bit lines BL1, BL2, BL3 and BL4 extending in the Y-direction may be arranged under the TMR elements. The write word lines WWL1, WWL2, WWL3 and WWL4 extending in the X-direction may be arranged above the TMR elements.

Figure 110:
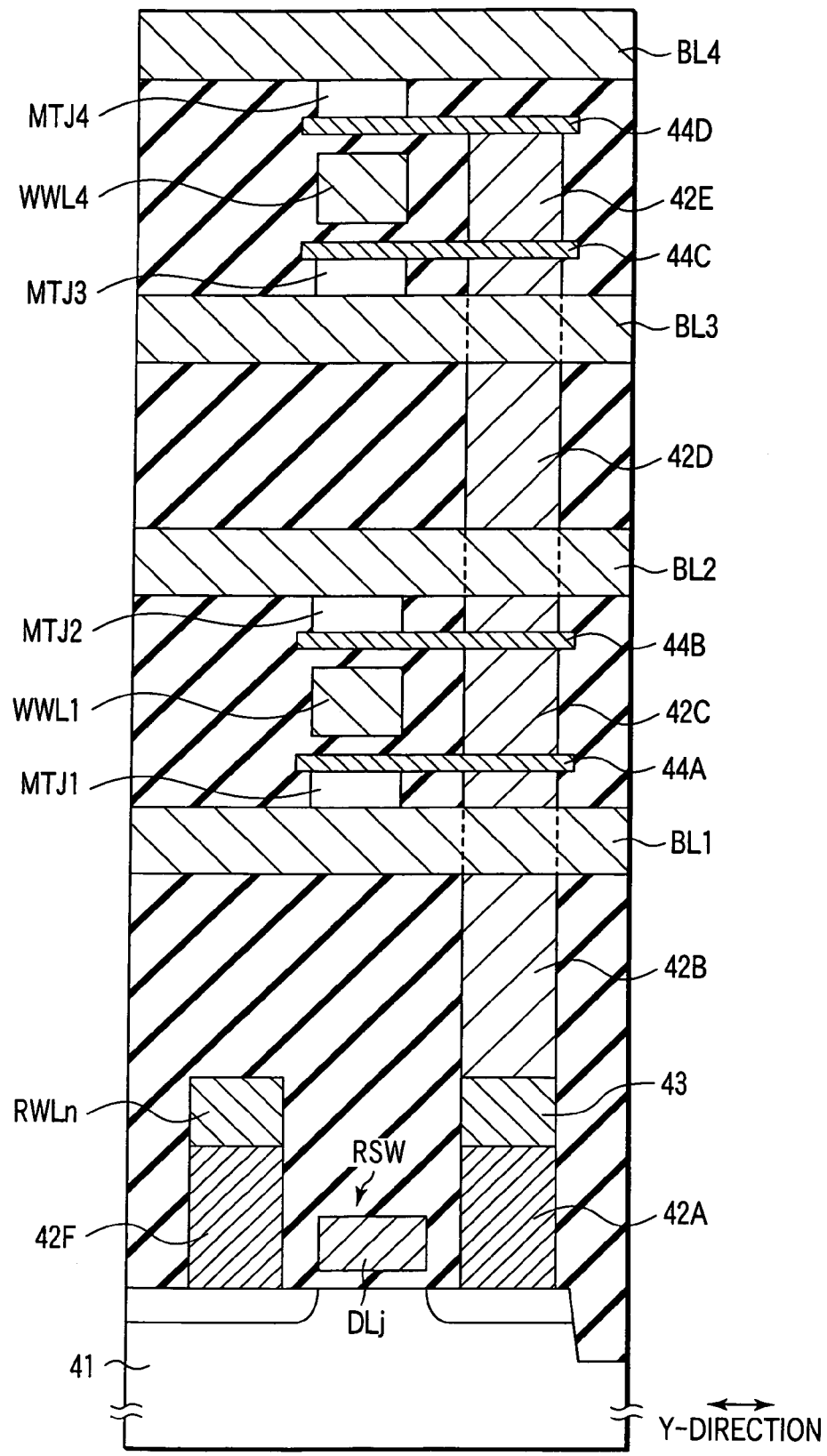
FIG. 110 is a sectional view showing a modification to Structural Example 3.
Figure 111:
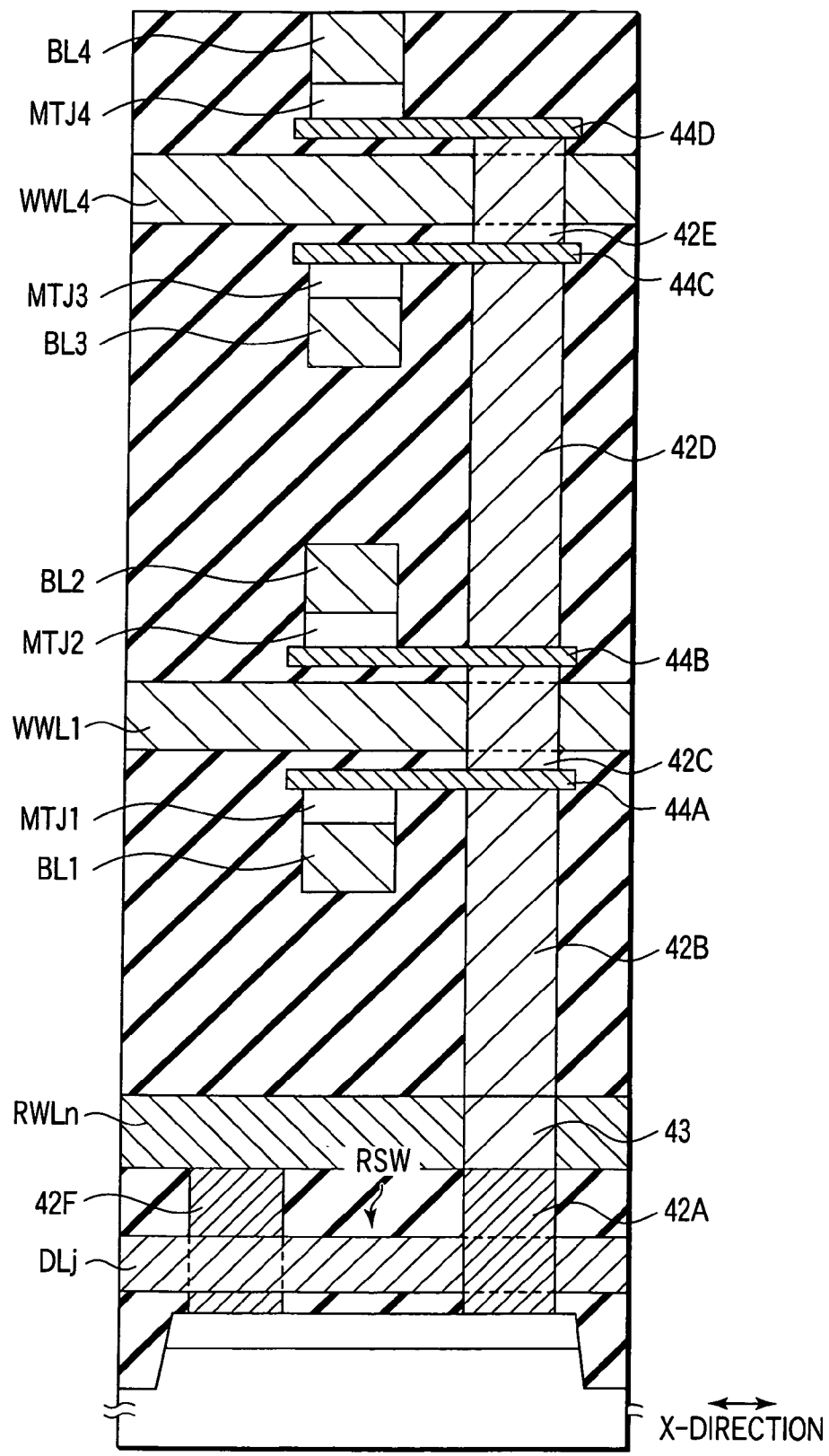
FIG. 111 is a sectional view showing a modification to Structural Example 3.

As shown in FIGS. 110 and 111, one write word line may be shared by a plurality of TMR elements (an upper TMR element and lower TMR element) in consideration of planarizing insulating films immediately under the TMR elements 12 or reducing the manufacturing cost.

According to such a device structure, the plurality of TMR elements MTJ1, MTJ2, MTJ3 and MTJ4 in the read block are connected to the different read/write bit lines BL1, BL2, BL3 and BL4, respectively. Hence, data of the plurality of TMR elements MTJ1, MTJ2, MTJ3 and MTJ4 in the read block can be read at once by one read step.

The plurality of TMR elements MTJ1, MTJ2, MTJ3 and MTJ4 in the read block are stacked at a plurality of stages on the semiconductor substrate 41. In addition, only the read/write bit lines BL1, BL2, BL3 and BL4 extend in the Y-direction. For this reason, even when the number of stacked TMR elements MTJ1, MTJ2, MTJ3 and MTJ4 is increased, the cell array structure is not complicated.

Figure 19:
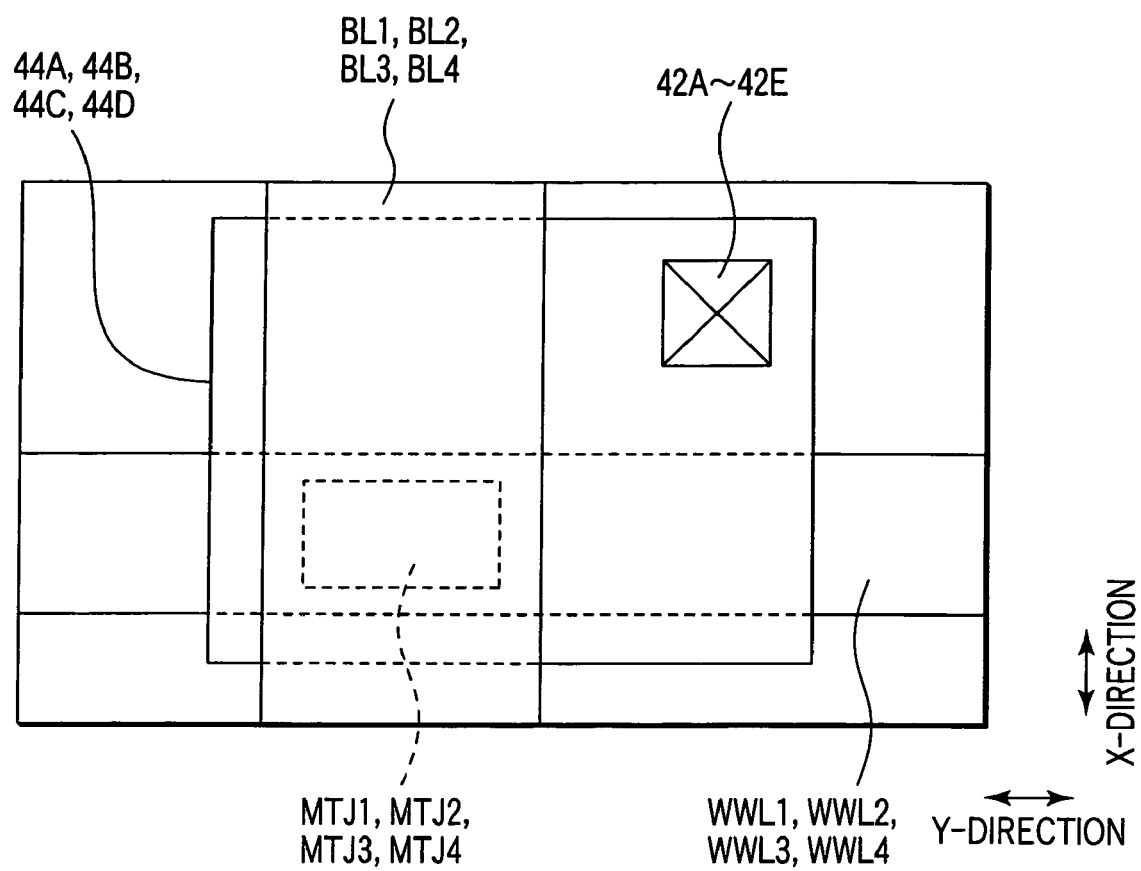
FIG. 19 is a plan view showing a TMR element of Structural Example 3 and the layout near the TMR element.

FIG. 19 shows the positional relationship between the TMR elements and the write word lines and read/write bit lines in the device structure shown in FIGS. 17 and 18.

In the device structure shown in FIGS. 17 and 18, the lower electrodes 44A, 44B, 44C and 44D, write word lines WWL1, WWL2, WWL3 and WWL4, and read/write bit lines BL1, BL2, BL3 and BL4 are arranged at the respective stages of the plurality of stacked TMR elements MTJ1, MTJ2, MTJ3 and MTJ4.

The layouts of, e.g., the stages of the TMR elements MTJ1, MTJ2, MTJ3 and MTJ4 are set to be identical.

The lower electrodes 44A, 44B, 44C and 44D have, e.g., a rectangular pattern. They have contact regions corresponding to the contact plugs 42A to 42E at partial portions. The lower electrodes 44A, 44B, 44C and 44D have the TMR elements MTJ1, MTJ2, MTJ3 and MTJ4 at the remaining portions.

The TMR elements MTJ1, MTJ2, MTJ3 and MTJ4 are arranged at the intersections between the write word lines WWL1, WWL2, WWL3 and WWL4 and the read/write bit lines BL1, BL2, BL3 and BL4.

(4) Structural Example 4

Structural Example 4 is a modification to Structural Example 3. A characteristic feature of Structural Example 4, which is different from Structural Example 3, is the direction of a read select switch. That is, in Structural Example 4, the read select switch of Structural Example 3 is rotated by 90°.

① Circuit Structure

The circuit structure will be described first.

FIG. 20 shows main part of a magnetic random access memory as Structural Example 4 of the present invention. The circuit diagram of FIG. 20 corresponds to that of FIG. 14. The outline of the memory cell array and its peripheral portion in Structural Example 4 is the same as in FIG. 13.

One terminal of each of four TMR elements MTJ1, MTJ2, MTJ3 and MTJ4 in a block BK11 is connected to a read word line RWL1 through a read select switch (block select switch or row select switch) RSW formed from, e.g., a MOS transistor. The read word line RWL1 extends in the X-direction.

The line that connects the source and drain of the read select switch RSW is parallel to the X-direction. That is, the channel length of the read select switch RSW is the X-direction length of the channel of the read select switch RSW. The channel width is the Y-direction width of the channel of the read select switch RSW.

The gate of the read select switch RSW is connected to a decode line DL1. The decode line DL1 extends in the Y-direction. The decode line DL1 is connected to a column decoder 32. That is, the read select switch RSW is controlled by a decode signal CSL1 obtained by decoding a column address signal.

Assume that the read block BK11 is selected in read operation. At this time, since CSL1 changes to "H", the read select switch RSW in the read block BK11 is turned on. In addition, the read word line RWL1 changes to "L (ground potential VSS)". Furthermore, a column select switch 29C is turned on.

Hence, a read current flows to the TMR elements MTJ1, MTJ2, MTJ3 and MTJ4 in the read block BK11.

The other terminal of each of the four TMR elements MTJ1, MTJ2, MTJ3 and MTJ4 in the read block BK11 is independently connected to a corresponding one of read bit lines BL1, BL2, BL3 and BL4. That is, four read bit lines BL1, BL2, BL3 and BL4 are arranged in correspondence with the four TMR elements MTJ1, MTJ2, MTJ3 and MTJ4 in the read block BK11.

The read bit lines BL1, BL2, BL3 and BL4 extend in the Y-direction. One end of each read bit line is connected to a common data line 30 through the column select switch (MOS transistor) 29C. The common data line 30 is connected to a read circuit (including, e.g., a sense amplifier, selector and output buffer) 29B.

A column select line signal CSL1 is input to the column select switch 29C. The column decoder 32 outputs the column select line signal CSL1.

In this example, the read bit lines BL1, BL2, BL3 and BL4 also function as write bit lines.

That is, one end of each of the read/write bit lines BL1, BL2, BL3 and BL4 is connected to a circuit block 29A including a column decoder and write bit line driver/sinker. The other end is connected to a circuit block 31 including a column decoder and write bit line driver/sinker.

In write operation, the circuit blocks 29A and 31 are set in an operative state. A write current flows to the read/write bit lines BL1, BL2, BL3 and BL4 in accordance with write data in a direction toward the circuit block 29A or 31.

A plurality of (in this example, four) write word lines WWL1, WWL2, WWL3 and WWL4 that extend in the X-direction and are stacked in the Z-direction are arranged near the four TMR elements MTJ1, MTJ2, MTJ3 and MTJ4 of the read block BK11.

In this example, as for the write word lines extending in the X-direction, one write word line is arranged at one stage in one row. That is, one write word line corresponds to one TMR element in the read block BK11. In this case, the number of write word lines in one row extending in the X-direction is the same as the number of stages of the stacked TMR elements MTJ1, MTJ2, MTJ3 and MTJ4.

Figure 112:
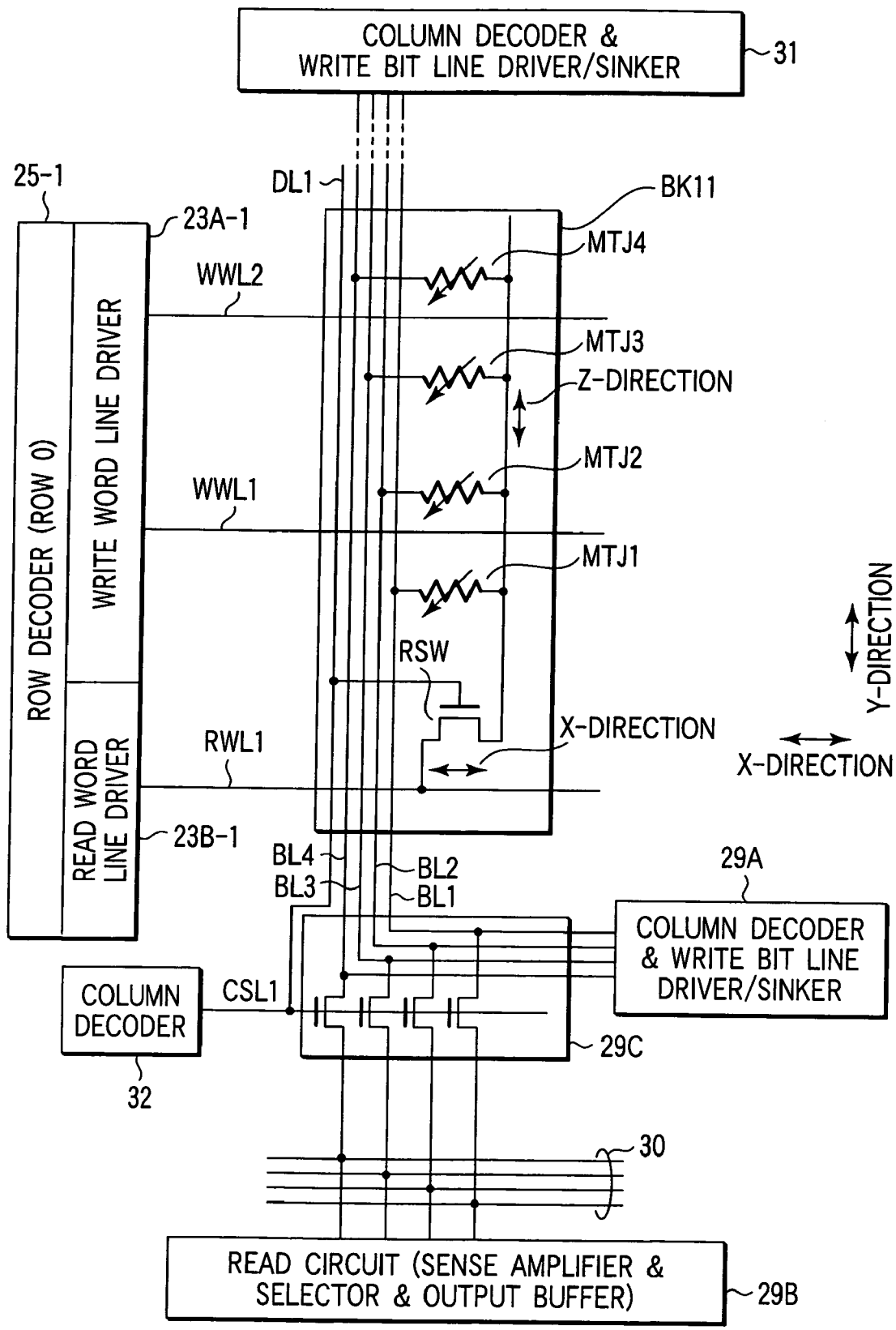
FIG. 112 is a circuit diagram showing a modification to Structural Example 4.

As shown in FIG. 112, one write word line may be shared by a plurality of TMR elements (an upper TMR element and lower TMR element) in consideration of planarizing insulating films right under the TMR elements MTJ1, MTJ2, MTJ3 and MTJ4 or reducing the manufacturing cost.

One end of each of the write word lines WWL1, WWL2, WWL3 and WWL4 is connected to a write word line driver 23A-n. The other end is connected to a write word line sinker 24-n.

The gate of the read select switch (MOS transistor) RSW is connected to the read word line RWL1. One read word line RWL1 is arranged in one row, i.e., shared by the plurality of blocks arranged in the X-direction.

In the write operation, a row decoder 25-1 selects one of the plurality of rows on the basis of row address signals. The write word line driver 23A-n supplies write currents to the write word lines WWL1, WWL2, WWL3 and WWL4 in the selected row. The write currents are absorbed by the write word line sinker.

In the read operation, the row decoder 25-1 selects one of the plurality of rows on the basis of row address signals. A read word line driver 23B-1 supplies a read voltage (="L") to the read word line RWL1 in the selected row.

In the magnetic random access memory of the present invention, one column is constructed by a plurality of read blocks. A plurality of TMR elements in each read block are connected to different read bit lines, respectively. Hence, data of the plurality of TMR elements in the read block can be read at once by one read step.

The plurality of TMR elements in each read block are stacked to form a plurality of stages on a semiconductor substrate. Each read bit line also functions as a write bit line. That is, since no interconnection that functions only as a write bit line need be formed in the cell array, the cell array structure can be simplified.

In each read block, the read select switch RSW is arranged. The read select switch RSW is controlled by the decode signal CSL1 obtained by decoding a column address signal. The source of the read select switch RSW is connected to the read word line. Hence, the read operation can be stably done with the simple arrangement.

② Device Structure

The device structure will be described next.

Figure 21:
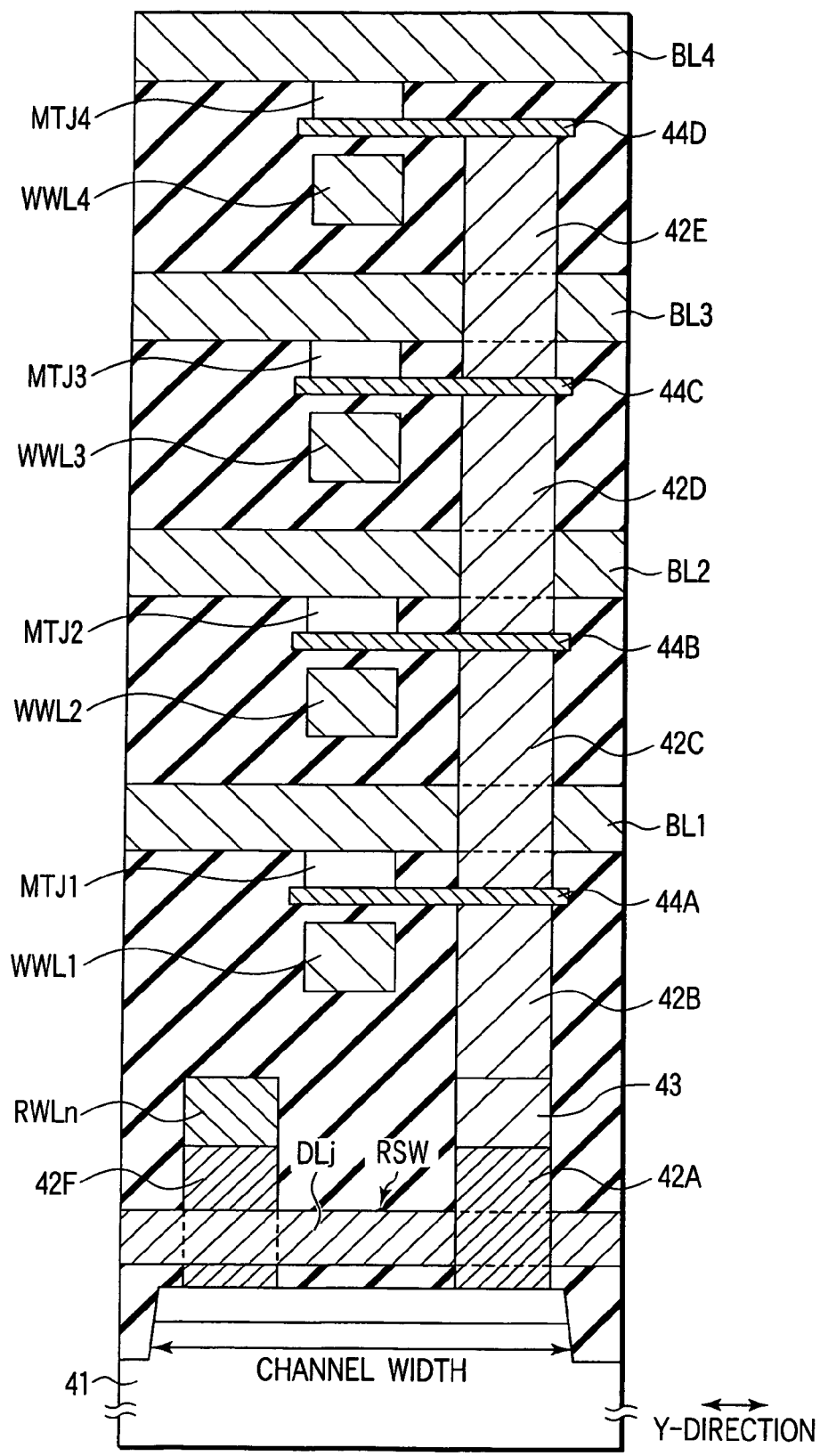
FIG. 21 is a sectional view related to the magnetic random access memory of Structural Example 4 of the present invention.
Figure 22:
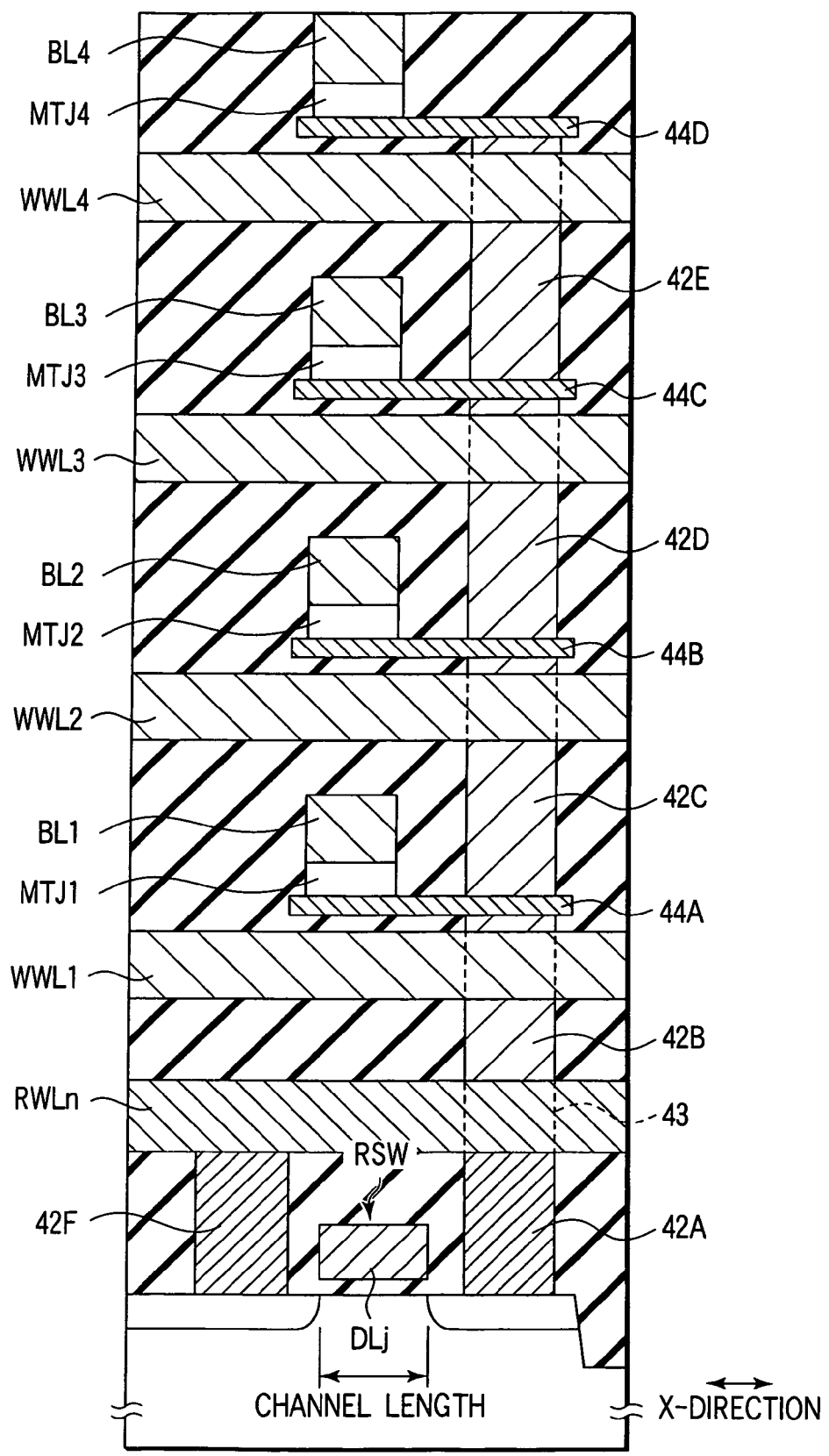
FIG. 22 is a sectional view related to the magnetic random access memory of Structural Example 4 of the present invention.

FIGS. 21 and 22 show the device structure of one block of the magnetic random access memory as Structural Example 4 of the present invention.

FIG. 21 shows the Y-direction section of one block of the magnetic random access memory. FIG. 22 shows the X-direction section of one block of the magnetic random access memory. The same reference numerals as in FIG. 20 denote the same elements in FIGS. 21 and 22 to show the correspondence between the elements.

The read select switch (MOS transistor) RSW is arranged on the surface region of a semiconductor substrate 41. The source of the read select switch RSW is connected to the read word line RWLn through a contact plug 42F. The read word line RWLn extends, e.g., in the X-direction and is connected to the read word line driver arranged at the peripheral portion of the memory cell array region.

The gate of the read select switch (MOS transistor) RSW serves as a decode line DLj. The decode line DLj extends in the Y-direction. The decode line DLj is connected to the column decoder arranged at the peripheral portion of the memory cell array region. The four TMR elements (MTJ (Magnetic Tunnel Junction) elements) MTJ1, MTJ2, MTJ3 and MTJ4 are stacked at a plurality of stages on the read select switch RSW.

One end (in this example, the lower end) of each of the TMR elements MTJ1, MTJ2, MTJ3 and MTJ4 is connected to a corresponding one of lower electrodes 44A, 44B, 44C and 44D. Contact plugs 42A, 42B, 42C, 42D and 42E and intermediate layer 43 electrically connect the lower electrodes 44A, 44B, 44C and 44D to each other and also electrically connect them to the drain of the read select switch RSW.

The other end (in this example, the upper end) of each of the TMR elements MTJ1, MTJ2, MTJ3 and MTJ4 is electrically connected to a corresponding one of the read/write bit lines BL1, BL2, BL3 and BL4. The read/write bit lines BL1, BL2, BL3 and BL4 extend in the Y-direction.

The TMR elements MTJ1, MTJ2, MTJ3 and MTJ4 are independently connected to the read/write bit lines BL1, BL2, BL3 and BL4, respectively. That is, four read/write bit lines BL1, BL2, BL3 and BL4 are arranged in correspondence with four TMR elements MTJ1, MTJ2, MTJ3 and MTJ4.

The write word lines WWL1, WWL2, WWL3 and WWL4 are arranged immediately under the TMR elements MTJ1, MTJ2, MTJ3 and MTJ4 and near them. The write word lines WWL1, WWL2, WWL3 and WWL4 extend in the X-direction.

In this example, four write word lines WWL1, WWL2, WWL3 and WWL4 are arranged in correspondence with four TMR elements MTJ1, MTJ2, MTJ3 and MTJ4.

In this example, the read/write bit lines BL1, BL2, BL3 and BL4 extending in the Y-direction are arranged on the TMR elements. The write word lines WWL1, WWL2, WWL3 and WWL4 extending in the X-direction are arranged below the TMR elements.

However, the positional relationship of the read/write bit lines BL1, BL2, BL3 and BL4 and write word lines WWL1, WWL2, WWL3 and WWL4 with respect to the TMR elements is not limited to this.

Figure 114:
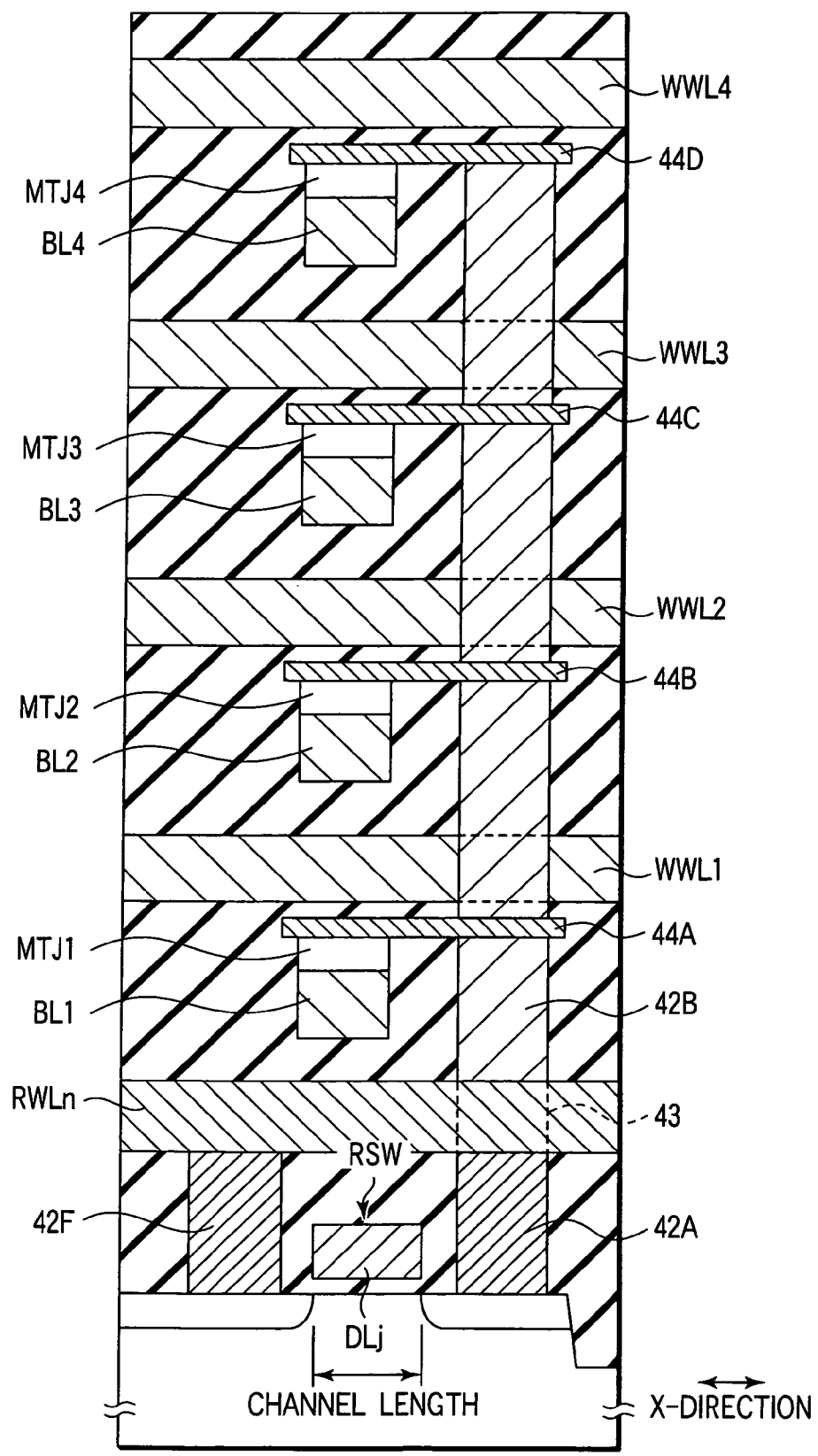
FIG. 114 is a sectional view showing a modification to Structural Example 4.

For example, as shown in FIGS. 113 and 114, the read/write bit lines BL1, BL2, BL3 and BL4 extending in the Y-direction may be arranged under the TMR elements. The write word lines WWL1, WWL2, WWL3 and WWL4 extending in the X-direction may be arranged above the TMR elements.

Figure 115:
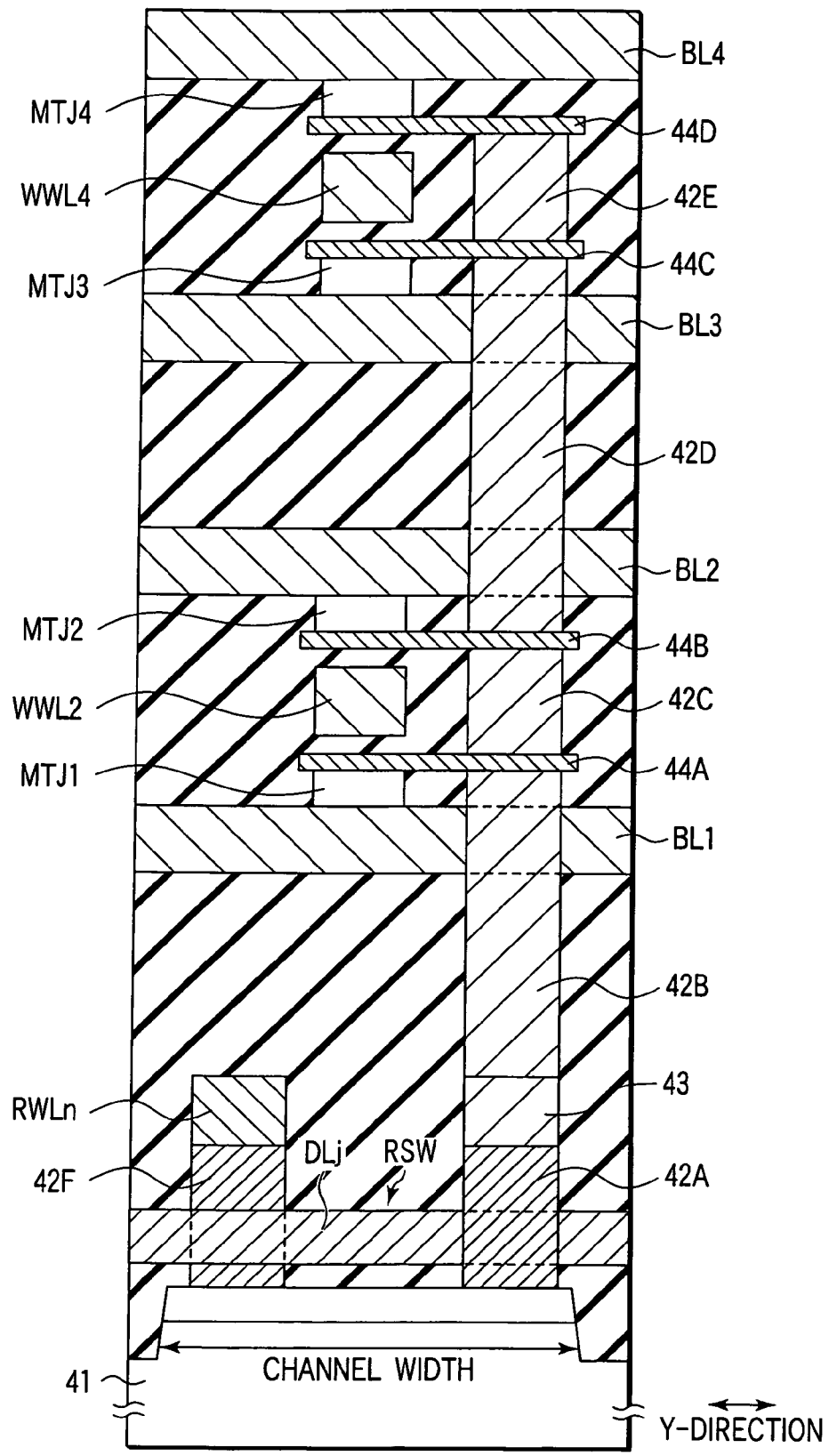
FIG. 115 is a sectional view showing a modification to Structural Example 4.

As shown in FIGS. 115 and 116, one write word line may be shared by a plurality of TMR elements (an upper TMR element and lower TMR element) in consideration of planarizing insulating films right under the TMR elements 12 or reducing the manufacturing cost.

According to such a device structure, the plurality of TMR elements MTJ1, MTJ2, MTJ3 and MTJ4 in the read block are connected to the different read/write bit lines BL1, BL2, BL3 and BL4, respectively. Hence, data of the plurality of TMR elements MTJ1, MTJ2, MTJ3 and MTJ4 in the read block can be read at once by one read step.

The plurality of TMR elements MTJ1, MTJ2, MTJ3 and MTJ4 in the read block are stacked at a plurality of stages on the semiconductor substrate 41. In addition, only the read/write bit lines BL1, BL2, BL3 and BL4 extend in the Y-direction. For this reason, even when the number of stacked TMR elements MTJ1, MTJ2, MTJ3 and MTJ4 is increased, the cell array structure is not complicated.

(5) Structural Examples 5, 6, 7 and 8

① Structural Example 5

Structural Example 5 is a modification to Structural Examples 1, 2, 3 and 4.

Figure 23:
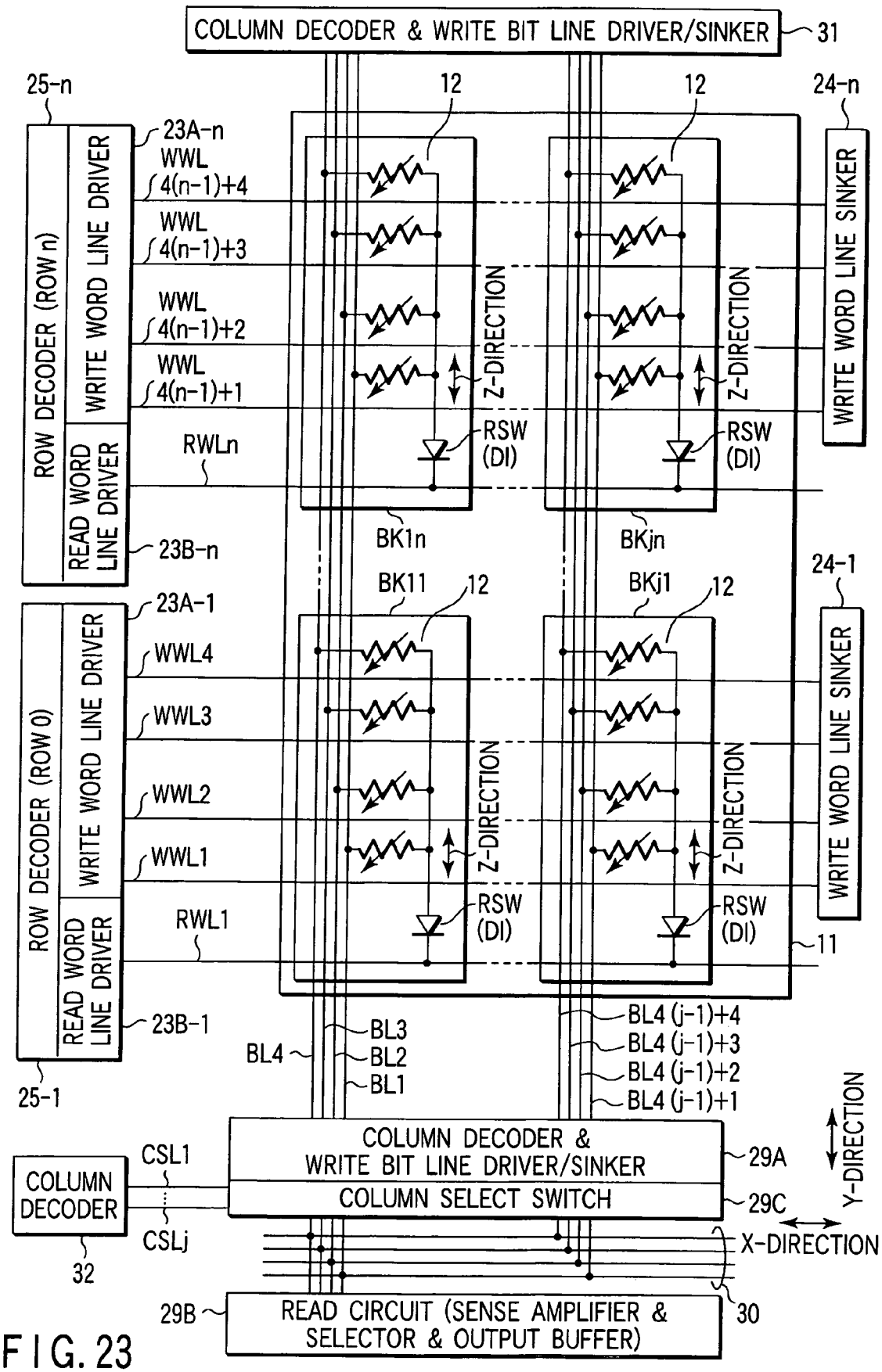
FIG. 23 is a circuit diagram related to a magnetic random access memory of Structural Example 5 of the present invention.
Figure 24:
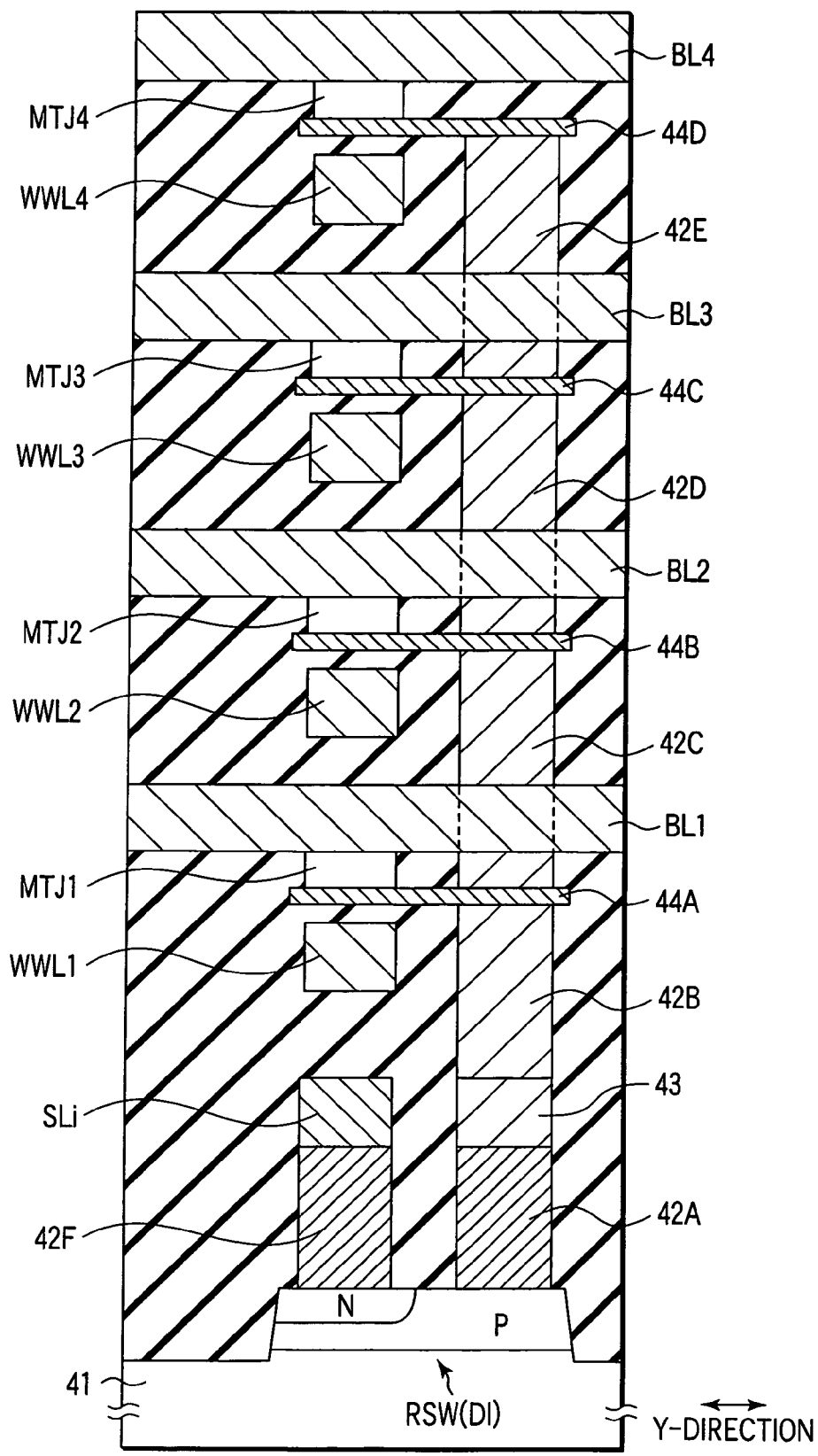
FIG. 24 is a sectional view related to the magnetic random access memory of Structural Example 5 of the present invention.

FIGS. 23, 24 and 25 show Structural Example 5.

The circuit diagram of FIG. 23 corresponds to that of FIG. 1 or 13. The sectional view of the device structure shown in FIG. 24 corresponds to that in FIGS. 4, 11, 17 and 21. The sectional view of the device structure shown in FIG. 25 corresponds to that in FIGS. 5, 12, 18 and 22.

Structural Example 5 is different from Structural Examples 1, 2, 3 and 4 in the element that implements the read select switch.

In Structural Examples 1, 2, 3 and 4, the read select switch is formed from a MOS transistor. In Structural Example 5, however, the read select switch is formed from a diode DI.

The anode of the diode DI is connected to one terminal of each of TMR elements MTJ1, MTJ2, MTJ3 and MTJ4 in a read block BKik. The cathode of the diode DI is connected to a read word line RWLn (n=1, 2, . . . .)

When the structure of this example is employed, in read operation, the read word line RWLn of the selected row is set at "L", i.e., the ground potential. With this operation, a read current can be supplied to the TMR elements MTJ1, MTJ2, MTJ3 and MTJ4 in the blocks of the selected row.

The device structure of Structural Example 5 can be regarded to be substantially the same as that of Structural Example 1, 2, 3 or 4 except that the element formed on the surface region of a semiconductor substrate 41 is the diode DI.

② Structural Example 6

Structural Example 6 is also a modification to Structural Examples 1, 2, 3 and 4.

Figure 26:
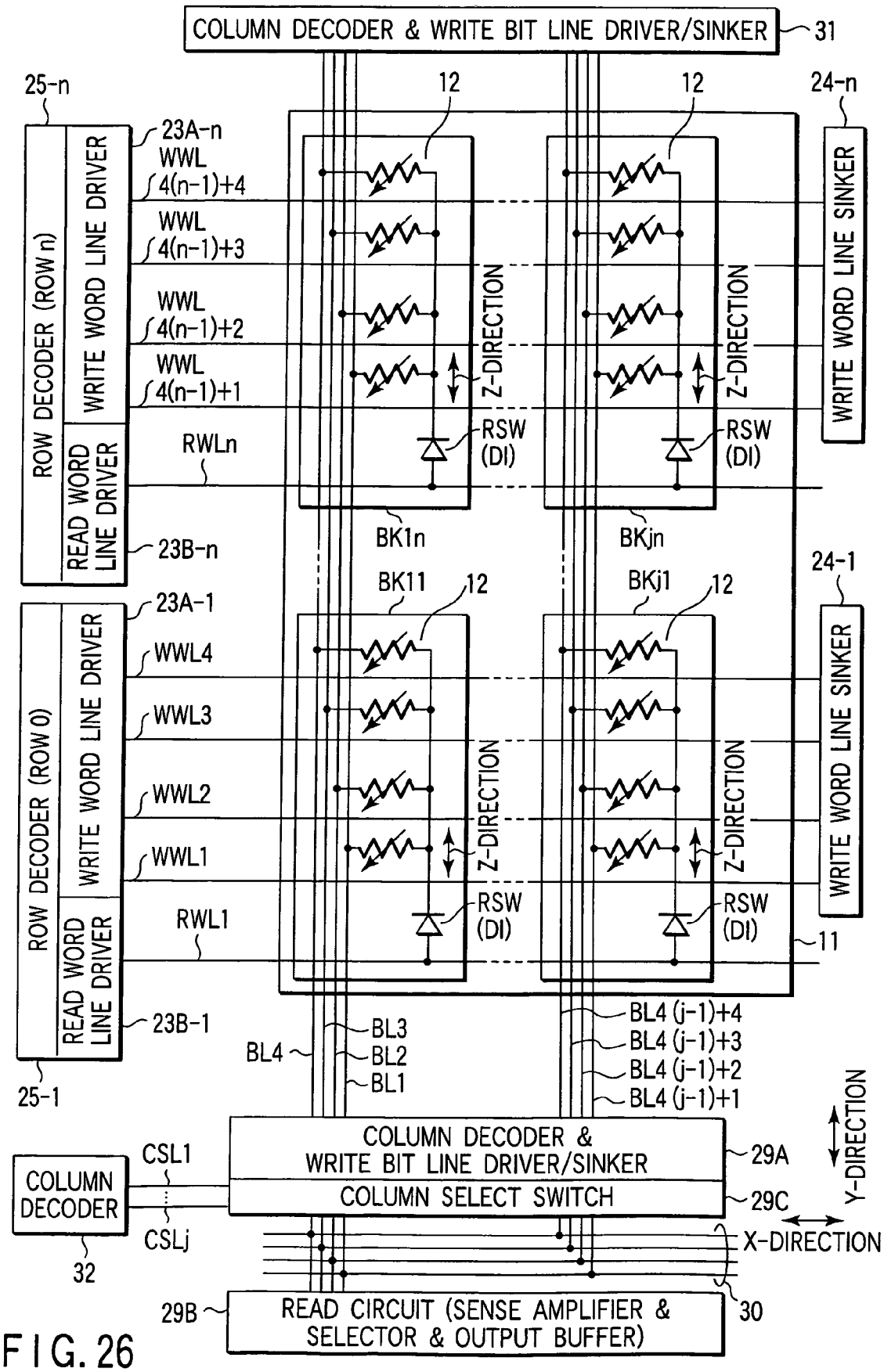
FIG. 26 is a circuit diagram related to a magnetic random access memory of Structural Example 6 of the present invention.

FIGS. 26, 27 and 28 show Structural Example 6.

The circuit diagram of FIG. 26 corresponds to that of FIG. 1 or 13. The sectional view of the device structure shown in FIG. 27 corresponds to that in FIGS. 4, 11, 17 and 21. The sectional view of the device structure shown in FIG. 28 corresponds to that in FIGS. 5, 12, 18 and 22.

As a characteristic feature of Structural Example 6, it is different from Structural Examples 1, 2, 3 and 4 in the element that implements the read select switch. More specifically, in Structural Example 6, the direction of a diode DI of Structural Example 5 is changed.

That is, in Structural Example 6, the cathode of the diode DI is connected to one terminal of each of TMR elements MTJ1, MTJ2, MTJ3 and MTJ4 in a read block BKik. The anode of the diode DI is connected to a read word line RWLn (n=1, 2, . . . .)

When the structure of this example is employed, in read operation, the read word line RWLn of the selected row is set at "H". With this operation, a read current can be supplied to the TMR elements MTJ1, MTJ2, MTJ3 and MTJ4 in the blocks of the selected row.

In Structural Example 5, the read current flows for a read circuit 29B to the diode DI through the TMR elements. In Structural Example 6, however, the read current flows from the diode DI to the read circuit 29B through the TMR elements.

In Structural Examples 1, 2, 3 and 4, the direction of the read current was not specifically described. This is because in these structural examples, the read current can be supplied either in the direction in which the current is output from the read circuit 29B or in the direction in which the current is absorbed by the read circuit 29B.

③ Structural Example 7

Structural Example 7 is a modification to Structural Examples 1 and 2.

Figure 29:
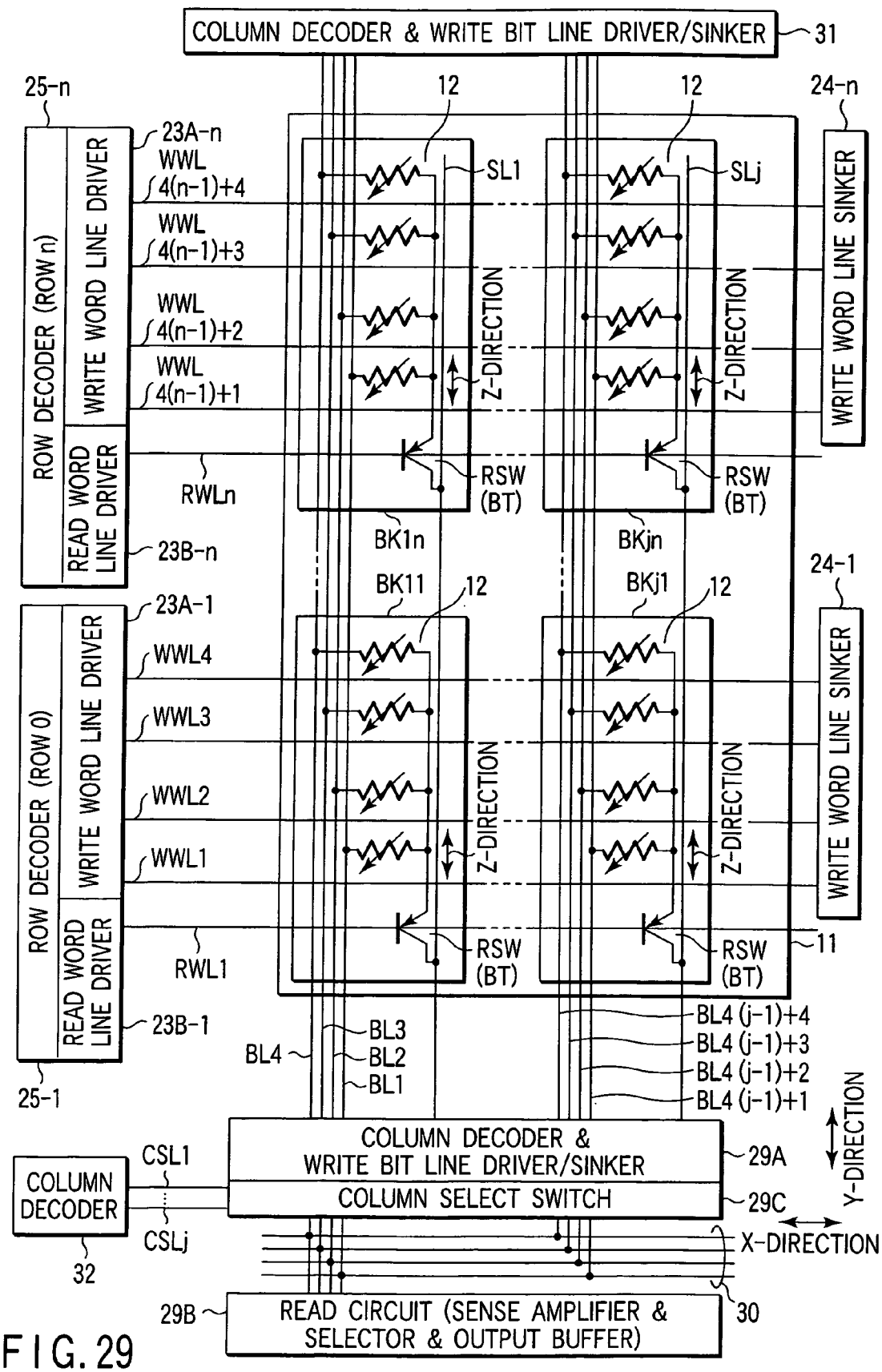
FIG. 29 is a circuit diagram related to a magnetic random access memory of Structural Example 7 of the present invention.
Figure 30:
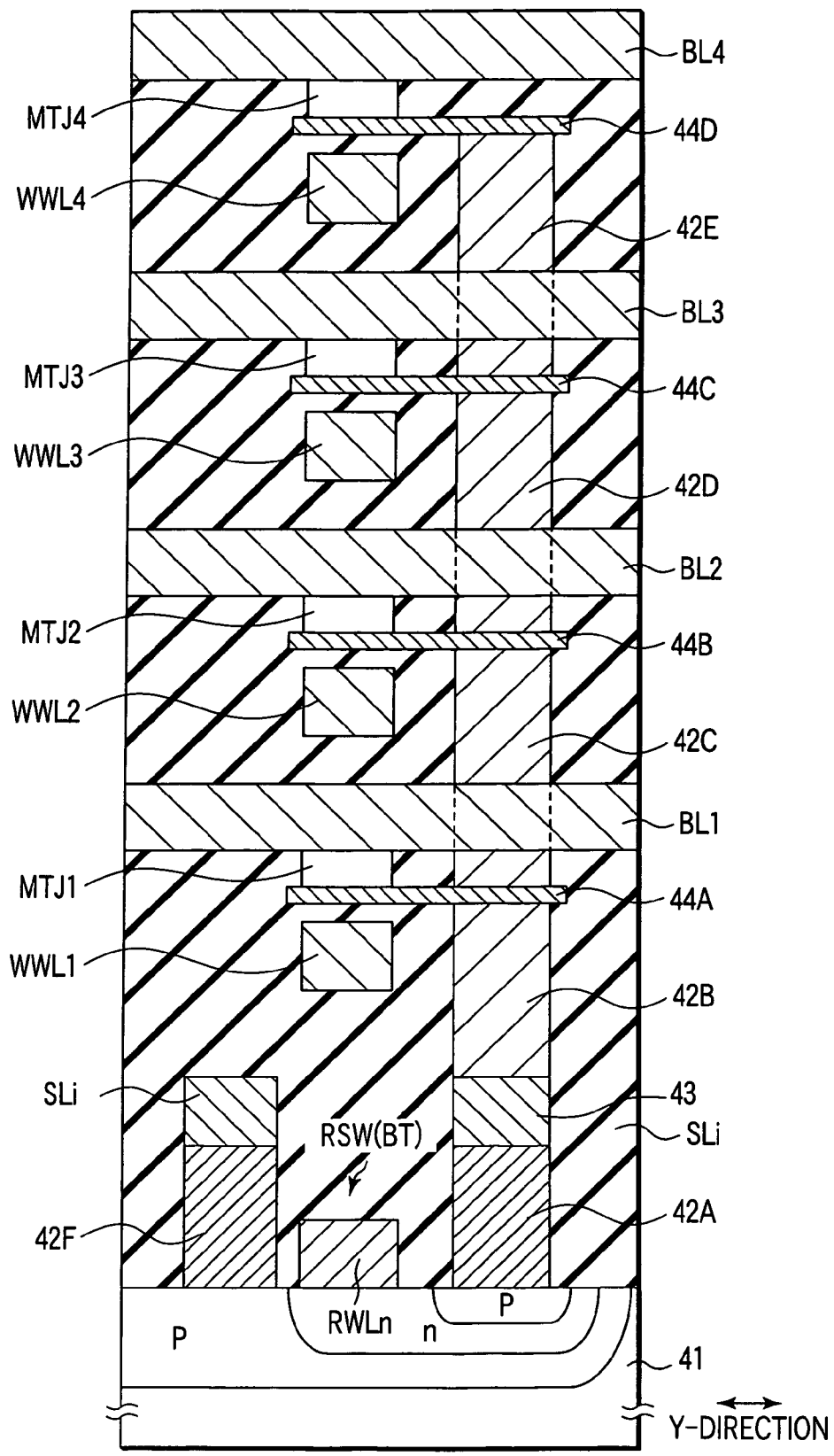
FIG. 30 is a sectional view related to the magnetic random access memory of Structural Example 7 of the present invention.

FIGS. 29 and 30 show Structural Example 7.

The circuit diagram of FIG. 29 corresponds to that of FIG. 1. The sectional view of the device structure shown in FIG. 30 corresponds to that in FIGS. 4 and 11.

As a characteristic feature of Structural Example 7, it is different from Structural Examples 1 and 2 in the element that implements the read select switch.

In Structural Examples 1 and 2, the read select switch is formed from a MOS transistor. In Structural Example 7, however, the read select switch is formed from a bipolar transistor BT.

In Structural Example 7, the collector of the bipolar transistor BT is connected to one terminal of each of TMR elements MTJ1, MTJ2, MTJ3 and MTJ4 in a read block BKik. The emitter of the bipolar transistor BT is connected to a source line SLi (i=1, 2, . . . , j). The base of the bipolar transistor BT is connected to a read word line RWLn (n=1, 2, . . . .)

When the structure of this example is employed, in read operation, the read word line RWLn of the selected row is set at "H". With this operation, a read current can be supplied to the TMR elements MTJ1, MTJ2, MTJ3 and MTJ4 in the blocks of the selected row.

The device structure of Structural Example 7 can be regarded to be substantially the same as that of Structural Example 1 and 2 except that the element formed on the surface region of a semiconductor substrate 41 is the bipolar transistor BT.

In the structure of this example, all transistors of a memory cell array 11 and its peripheral circuits may be bipolar transistors, or some of them may be bipolar transistors.

④ Structural Example 8

Structural Example 8 is a modification to Structural Examples 3 and 4.

Figure 31:
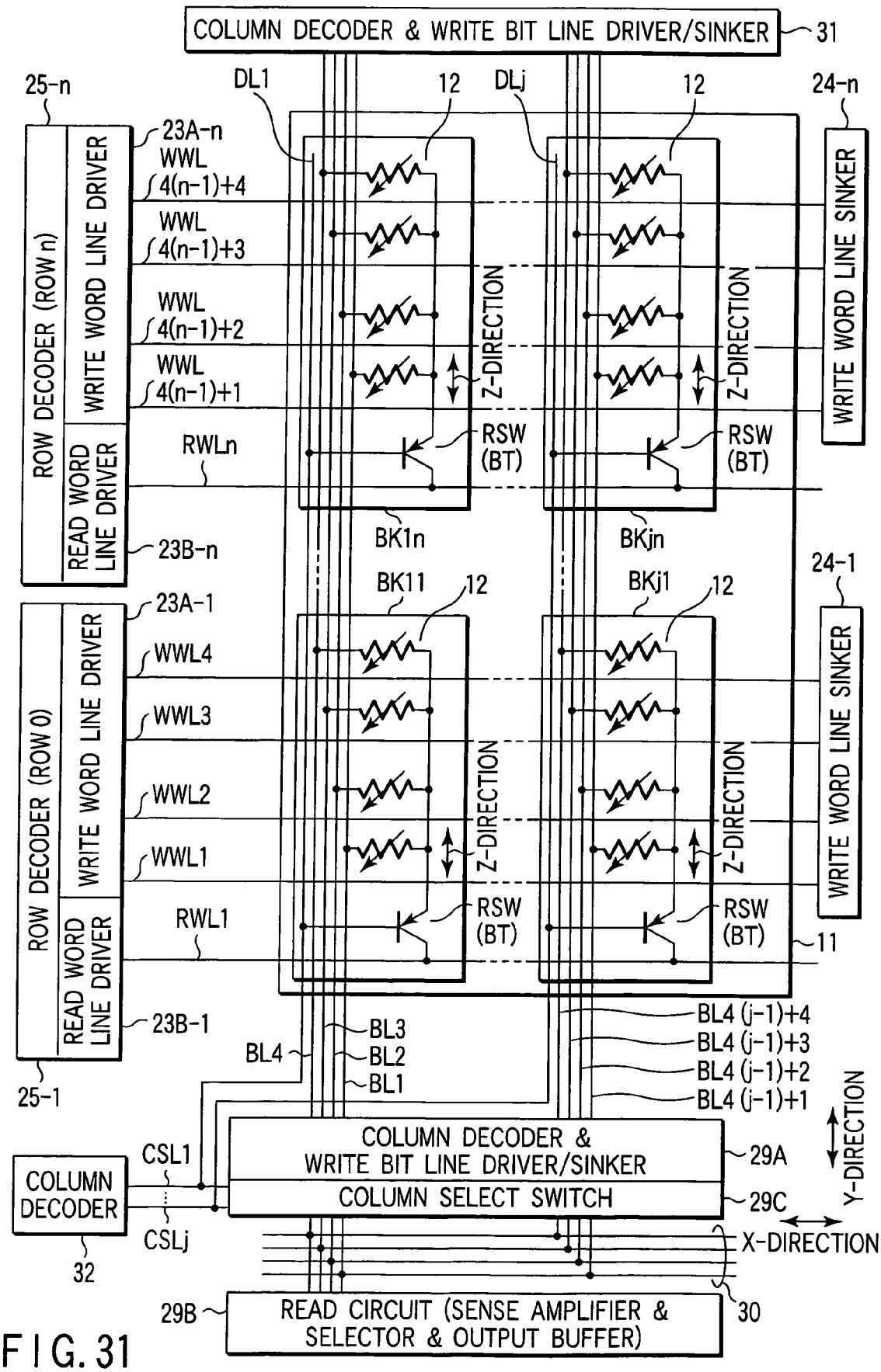
FIG. 31 is a circuit diagram related to a magnetic random access memory of Structural Example 8 of the present invention.
Figure 32:
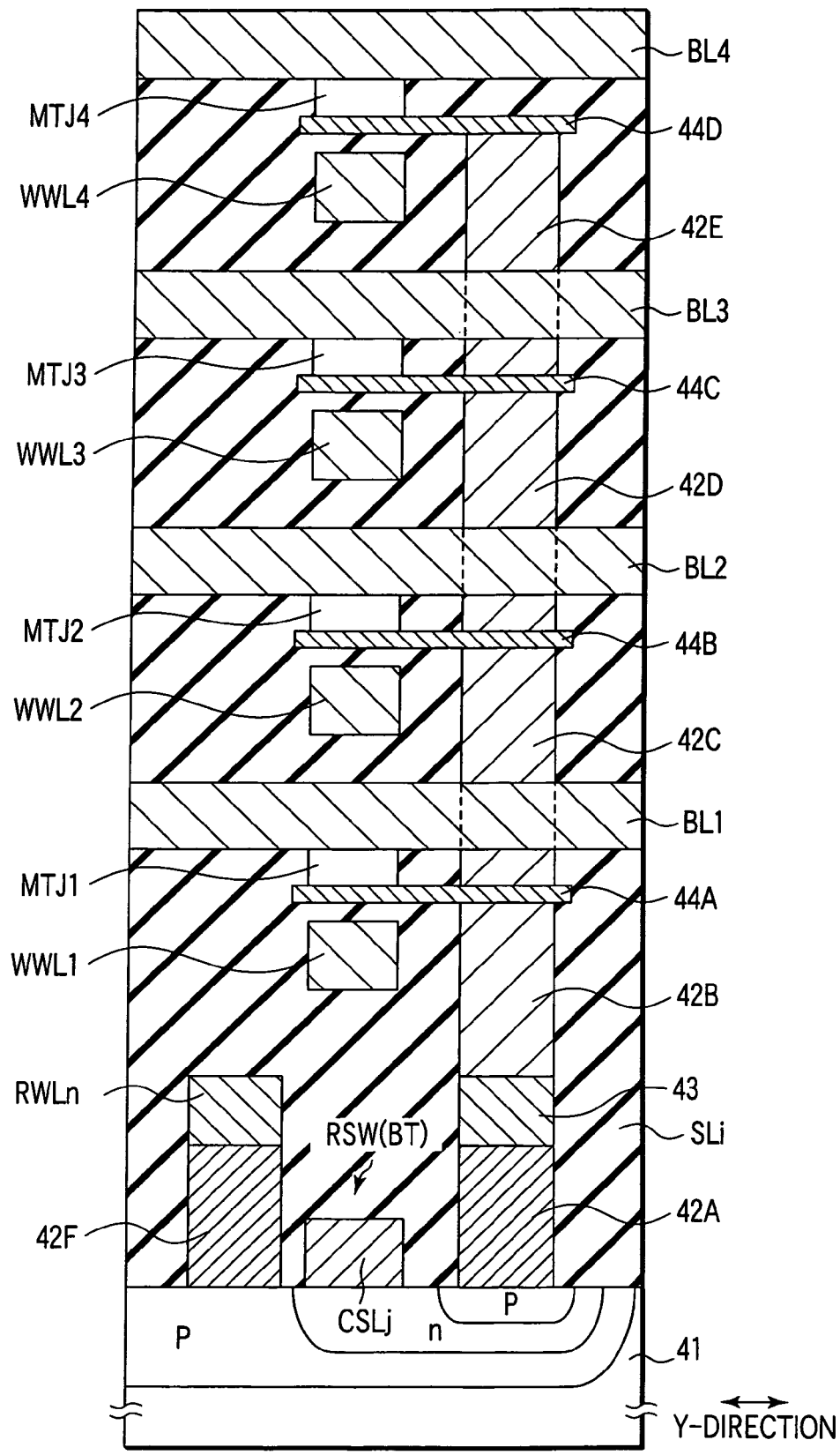
FIG. 32 is a sectional view related to the magnetic random access memory of Structural Example 8 of the present invention.

FIGS. 31 and 32 show Structural Example 7.

The circuit diagram of FIG. 31 corresponds to that of FIG. 13. The sectional view of the device structure shown in FIG. 32 corresponds to that in FIGS. 17 and 21.

As a characteristic feature of Structural Example 8, it is different from Structural Examples 3 and 4 in the element that implements the read select switch.

In Structural Examples 3 and 4, the read select switch is formed from a MOS transistor. In Structural Example 8, however, the read select switch is formed from a bipolar transistor BT.

In Structural Example 8, the collector of the bipolar transistor BT is connected to one terminal of each of TMR elements MTJ1, MTJ2, MTJ3 and MTJ4 in a read block BKik. The emitter of the bipolar transistor BT is connected to a read word line RWLn (n=1, 2, . . . .) The base of the bipolar transistor BT is connected to a decode line DLi (i=1, 2, . . . , j).

When the structure of this example is employed, in read operation, the read word line RWLn of the selected row is set at "L". With this operation, a read current can be supplied to the TMR elements MTJ1, MTJ2, MTJ3 and MTJ4 in the blocks of the selected row.

The device structure of Structural Example 8 can be regarded to be substantially the same as that of Structural Example 3 and 4 except that the element formed on the surface region of a semiconductor substrate 41 is the bipolar transistor BT.

In the structure of this example, all transistors of a memory cell array 11 and its peripheral circuits may be bipolar transistors, or some of them may be bipolar transistors.

(6) Others

In Structural Examples 1 to 8, read bit lines and write bit lines are put together into read/write bit lines. However, the present invention is not limited to this structure as long as TMR elements in a read block are connected to different read bit lines.

For example, in Structural Examples 1 to 8, read bit lines and write bit lines may be separately arranged. Alternatively, write word lines may be used as read word lines.

2. Write/Read Operation Mechanism

The write/read operation mechanism of the magnetic random access memory of the present invention will be briefly described.

(1) Write Operation Mechanism

A write in TMR elements is executed at random. For example, one row is selected by row address signals. One column is selected by high order column address signals. One of a plurality of TMR elements in read blocks in the selected row is selected by low order column address signals.

To write data in the selected TMR element, a write current is supplied to a write word line arranged right under the selected TMR element. In addition, the write current is also supplied to a read/write bit line arranged on the selected TMR element. The direction of write current to be supplied to the read/write bit line is determined in accordance with the write data.

The magnetizing direction in the free layer (storing layer) of the selected TMR element is determined by a synthesized magnetic field formed by the write current flowing to the write word line and the write current flowing to the read/write bit line, thereby storing "1"/"0" information in the TMR element.

(2) Read Operation Mechanism

A read from TMR elements is executed for each read block. For example, one row is selected by row address signals. One column is selected by high order column address signals.

To read data from a plurality of TMR elements in the selected read block that is present on the selected row and column, a read current is supplied to a plurality of read/write bit lines arranged in the selected column. The direction of read current to be supplied to the read/write bit lines is not particularly limited.

At this time, the plurality of read/write bit lines arranged on the selected column are preferably electrically connected only to the selected read block (for example, the circuit example shown in FIG. 3).

The potentials of the plurality of read/write bit lines have values corresponding to the data of the plurality of TMR elements in the read block. These potentials are sensed by a sense amplifier.

The data of the plurality of TMR elements in the selected read block are sensed by the sense amplifier and then output from the magnetic random access memory. The bit data of the plurality of TMR elements may be output one by one or simultaneously.

To sequentially output the bit data of the plurality of TMR elements one by one, one of the plurality of TMR elements is selected using, e.g., low order column address signals.

3. Examples of Peripheral Circuits

A circuit example of the write word line driver/sinker, a circuit example of the write bit line driver/sinker, circuit examples of the read word line driver, a circuit example of the column decoder, and a circuit example of a read circuit (including a sense amplifier) will be sequentially described below.

(1) Write Word Line Driver/Sinker

Figure 33:
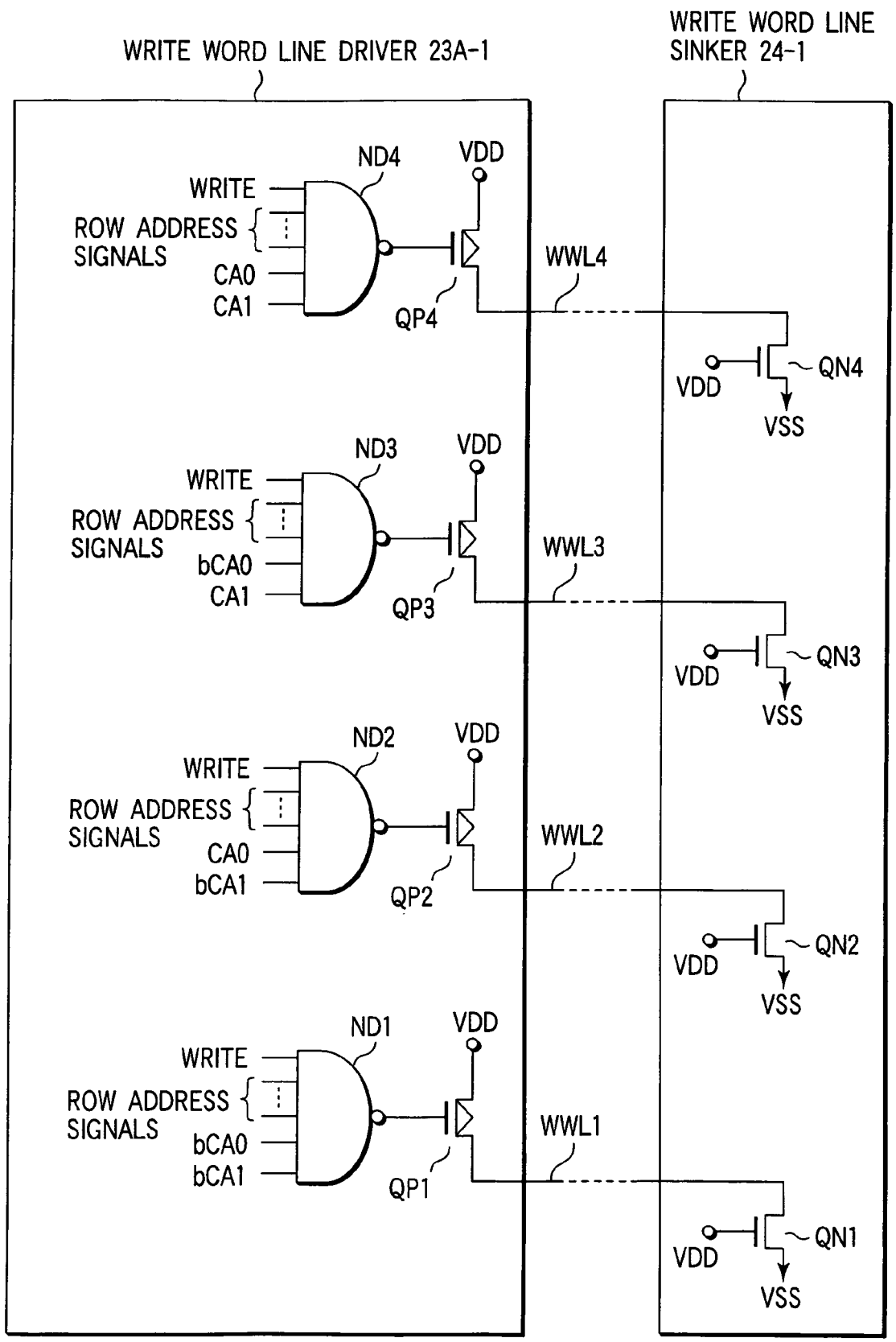
FIG. 33 is a view showing a circuit example of the write word line driver/sinker.

FIG. 33 shows a circuit example of the write word line driver/sinker.

In this example, assume that a read block is formed from four TMR elements that are stacked at four stages, and each of the four TMR elements in the read block is selected by CA0 and CA1 of low order column address signals. FIG. 33 shows a write word line driver/sinker of only one row.

The write word line driver 23A-1 includes PMOS transistors QP1, QP2, QP3 and QP4, and NAND gate circuits ND1, ND2, ND3 and ND4. The write word line sinker 24-1 is formed from NMOS transistors QN1, QN2, QN3 and QN4.

The PMOS transistor QP1 is connected between a power supply terminal VDD and one end of the write word line WWL1 at the lowermost stage (first stage). The output signal from the NAND gate circuit ND1 is supplied to the gate of the PMOS transistor QP1. The NMOS transistor QN1 is connected between the other end of the write word line WWL1 at the lowermost stage and the ground terminal VSS.

When the output signal from the NAND gate circuit ND1 is "0", a write current flows to the write word line WWL1.

The PMOS transistor QP2 is connected between the power supply terminal VDD and one end of the write word line WWL2 at the second stage. The output signal from the NAND gate circuit ND2 is supplied to the gate of the PMOS transistor QP2. The NMOS transistor QN2 is connected between the other end of the write word line WWL2 at the second stage and the ground terminal VSS.

When the output signal from the NAND gate circuit ND2 is "0", a write current flows to the write word line WWL2.

The PMOS transistor QP3 is connected between the power supply terminal VDD and one end of the write word line WWL3 at the third stage. The output signal from the NAND gate circuit ND3 is supplied to the gate of the PMOS transistor QP3. The NMOS transistor QN3 is connected between the other end of the write word line WWL3 at the third stage and the ground terminal VSS.

When the output signal from the NAND gate circuit ND3 is "0", a write current flows to the write word line WWL3.

The PMOS transistor QP4 is connected between the power supply terminal VDD and one end of the write word line WWL4 at the uppermost stage (fourth stage). The output signal from the NAND gate circuit ND4 is supplied to the gate of the PMOS transistor QP4. The NMOS transistor QN4 is connected between the other end of the write word line WWL4 at the uppermost stage and the ground terminal VSS.

When the output signal from the NAND gate circuit ND4 is "0", a write current flows to the write word line WWL4.

Since the write word lines WWL1, WWL2, WWL3 and WWL4 belong to the same row, the same row address signals is input to the NAND gate circuits ND1, ND2, ND3 and ND4. In the selected row, all bits of the row address signals are "H".

A write signal is input to the NAND gate circuits ND1, ND2, ND3 and ND4. In the write operation, the write signal changes to "H". In addition, different low order column address signals are input to the NAND gate circuits ND1, ND2, ND3 and ND4.

That is, in this example, column address signals bCA0 and bCA1 are used to select the write word line WWL1 at the lowermost stage (first stage) and input to the NAND gate circuit ND1.

The column address signals CA0 and bCA1 are used to select the write word line WWL2 at the second stage and input to the NAND gate circuit ND2. The column address signals bCA0 and CA1 are used to select the write word line WWL3 at the third stage and input to the NAND gate circuit ND3. The column address signals CA0 and CA1 are used to select the write word line WWL2 at the uppermost stage (fourth stage) and input to the NAND gate circuit ND4.

Note that the signals bCA0 and bCA1 are inverted signals with inverted levels of CA0 and CA1.

In this write word line driver/sinker, in the write operation, a write signal WRITE is "1". For example, one of the output signals from the four NAND gate circuits ND1, ND2, ND3 and ND4 changes to "L".

For example, when both CA0 and CA1 are "0", all input signals to the NAND gate circuit ND1 are "1". The output signal from the NAND gate circuit ND1 is "0". As a result, the PMOS transistor QP1 is turned on. The write current flows to the write word line WWL1.

When CA0 is "1" and CA1 is "0", all input signals to the NAND gate circuit ND2 are "1". The output signal from the NAND gate circuit ND2 is "0". As a result, the PMOS transistor QP2 is turned on. The write current flows to the write word line WWL2.

When CA0 is "0" and CA1 is "1", all input signals to the NAND gate circuit ND3 are "1". The output signal from the NAND gate circuit ND3 is "0". As a result, the PMOS transistor QP3 is turned on. The write current flows to the write word line WWL3.

When both CA0 and CA1 are "1", all input signals to the NAND gate circuit ND4 are "1". The output signal from the NAND gate circuit ND4 is "0". As a result, the PMOS transistor QP4 is turned on. The write current flows to the write word line WWL4.

(2) Write Bit Line Driver/Sinker

Figure 34:
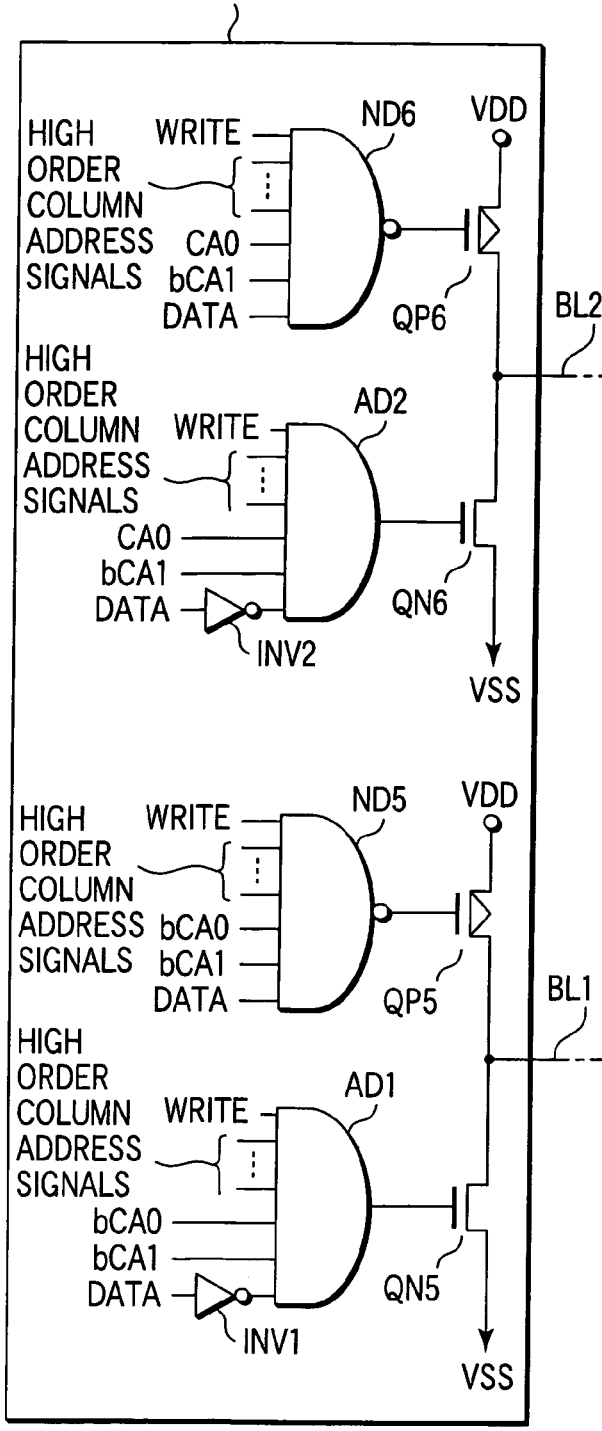
FIG. 34 is a view showing a circuit example of the write bit line driver/sinker.
Figure 34:
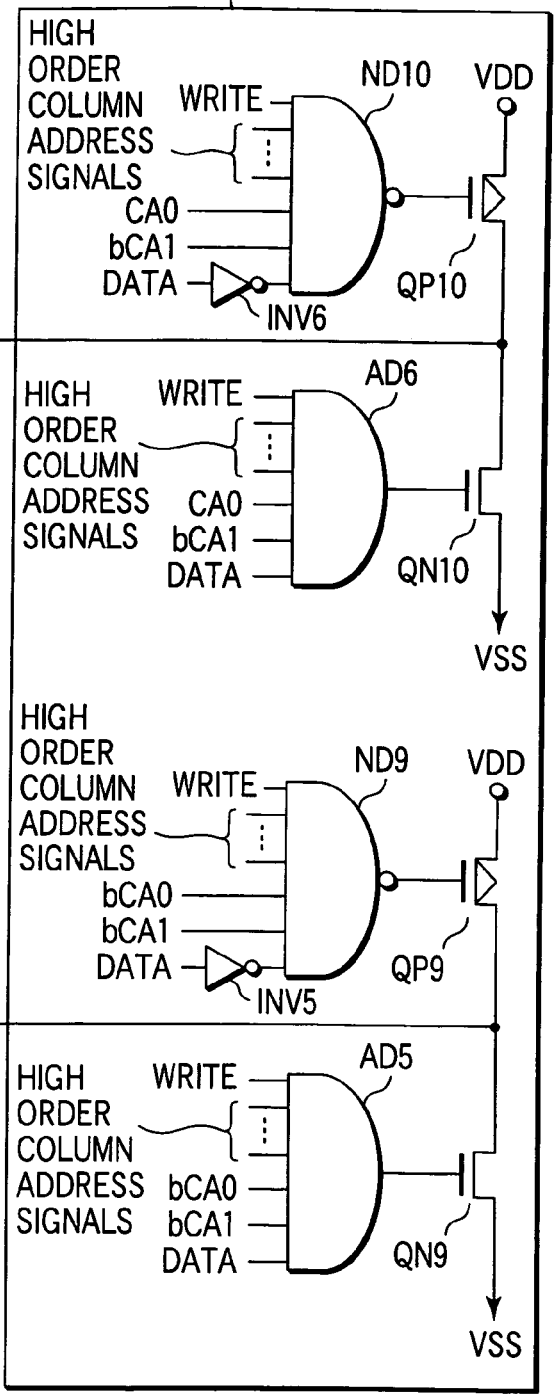

FIGS. 34 and 35 show a circuit example of the write bit line driver/sinker.

In this example, assume that a read block is formed from four TMR elements that are stacked at four stages, and each of the four TMR elements in the read block is selected by CA0 and CA1 of low order column address signals. In addition, a column of the memory cell array is selected by high order column address signals, i.e., column address signals except low order two column address signals.

FIGS. 34 and 35 show a write bit line driver/sinker of only one column.

The write bit line driver/sinker 29A is formed from PMOS transistors QP5, QP6, QP7 and QP8, NMOS transistors QN5, QN6, QN7 and QN8, NAND gate circuits ND5, ND6, ND7 and ND8, AND gate circuits AD1, AD2, AD3 and AD4, and inverters INV1, INV2, INV3 and INV4.

The PMOS transistor QP5 is connected between the power supply terminal VDD and one end of the write bit line BL1 at the lowermost stage (first stage). The output signal from the NAND gate circuit ND5 is supplied to the gate of the PMOS transistor QP5. The NMOS transistor QN5 is connected between one end of the write bit line BL1 at the lowermost stage and the ground terminal VSS. The output signal from the AND gate circuit AD1 is supplied to the gate of the NMOS transistor QN5.

The PMOS transistor QP6 is connected between the power supply terminal VDD and one end of the write bit line BL2 at the second stage. The output signal from the NAND gate circuit ND6 is supplied to the gate of the PMOS transistor QP6. The NMOS transistor QN6 is connected between one end of the write bit line BL2 at the second stage and the ground terminal VSS. The output signal from the AND gate circuit AD2 is supplied to the gate of the NMOS transistor QN6.

The PMOS transistor QP7 is connected between the power supply terminal VDD and one end of the write bit line BL3 at the third stage. The output signal from the NAND gate circuit ND7 is supplied to the gate of the PMOS transistor QP7. The NMOS transistor QN7 is connected between one end of the write bit line BL3 at the third stage and the ground terminal VSS. The output signal from the AND gate circuit AD3 is supplied to the gate of the NMOS transistor QN7.

The PMOS transistor QP8 is connected between the power supply terminal VDD and one end of the write bit line BL4 at the uppermost stage (fourth stage). The output signal from the NAND gate circuit ND8 is supplied to the gate of the PMOS transistor QP8. The NMOS transistor QN8 is connected between one end of the write bit line BL4 at the uppermost stage and the ground terminal VSS. The output signal from the AND gate circuit AD4 is supplied to the gate of the NMOS transistor QN8.

The write bit line driver/sinker 31 is formed from PMOS transistors QP9, QP10, QP11 and QP12, NMOS transistors QN9, QN10, QN11 and QN12, NAND gate circuits ND9, ND10, ND11 and ND12, AND gate circuits AD5, AD6, AD7 and AD8, and inverters INV5, INV6, INV7 and INV8.

The PMOS transistor QP9 is connected between the power supply terminal VDD and the other end of the write bit line BL1 at the lowermost stage (first stage). The output signal from the NAND gate circuit ND9 is supplied to the gate of the PMOS transistor QP9. The NMOS transistor QN9 is connected between the other end of the write bit line BL1 at the lowermost stage and the ground terminal VSS. The output signal from the AND gate circuit AD5 is supplied to the gate of the NMOS transistor QN9.

The PMOS transistor QP10 is connected between the power supply terminal VDD and the other end of the write bit line BL2 at the second stage. The output signal from the NAND gate circuit ND10 is supplied to the gate of the PMOS transistor QP10. The NMOS transistor QN10 is connected between the other end of the write bit line BL2 at the second stage and the ground terminal VSS. The output signal from the AND gate circuit AD6 is supplied to the gate of the NMOS transistor QN10.

The PMOS transistor QP11 is connected between the power supply terminal VDD and the other end of the write bit line BL3 at the third stage. The output signal from the NAND gate circuit ND11 is supplied to the gate of the PMOS transistor QP11. The NMOS transistor QN11 is connected between the other end of the write bit line BL3 at the third stage and the ground terminal VSS. The output signal from the AND gate circuit AD7 is supplied to the gate of the NMOS transistor QN11.

The PMOS transistor QP12 is connected between the power supply terminal VDD and the other end of the write bit line BL4 at the uppermost stage (fourth stage). The output signal from the NAND gate circuit ND12 is supplied to the gate of the PMOS transistor QP12. The NMOS transistor QN12 is connected between the other end of the write bit line BL4 at the uppermost stage and the ground terminal VSS. The output signal from the AND gate circuit AD8 is supplied to the gate of the NMOS transistor QN12.

In the write bit line drivers/sinkers 29A and 31 with the above structures, when the output signal from the NAND gate circuit ND5 is "0", and the output signal from the AND gate circuit AD5 is "1", a write current from the write bit line driver/sinker 29A to the write bit line driver/sinker 31 flows to the write bit line BL1.

When the output signal from the NAND gate circuit ND9 is "0", and the output signal from the AND gate circuit AD1 is "1", a write current from the write bit line driver/sinker 31 to the write bit line driver/sinker 29A flows to the write bit line BL1.

When the output signal from the NAND gate circuit ND6 is "0", and the output signal from the AND gate circuit AD6 is "1", a write current from the write bit line driver/sinker 29A to the write bit line driver/sinker 31 flows to the write bit line BL2.

When the output signal from the NAND gate circuit ND10 is "0", and the output signal from the AND gate circuit AD2 is "1", a write current from the write bit line driver/sinker 31 to the write bit line driver/sinker 29A flows to the write bit line BL2.

When the output signal from the NAND gate circuit ND7 is "0", and the output signal from the AND gate circuit AD7 is "1", a write current from the write bit line driver/sinker 29A to the write bit line driver/sinker 31 flows to the write bit line BL3.

When the output signal from the NAND gate circuit ND11 is "0", and the output signal from the AND gate circuit AD3 is "1", a write current from the write bit line driver/sinker 31 to the write bit line driver/sinker 29A flows to the write bit line BL3.

When the output signal from the NAND gate circuit ND8 is "0", and the output signal from the AND gate circuit AD8 is "1", a write current from the write bit line driver/sinker 29A to the write bit line driver/sinker 31 flows to the write bit line BL4.

When the output signal from the NAND gate circuit ND12 is "0", and the output signal from the AND gate circuit AD4 is "1", a write current from the write bit line driver/sinker 31 to the write bit line driver/sinker 29A flows to the write bit line BL4.

In the write bit line drivers/sinkers 29A and 31, in the write operation, the write signal WRITE is "1". In the selected column, high order column address signals, i.e., all of the column address signals except the low order two column address signals CA0 and CA1 are "1".

The low order column address signals CA0 and CA1 are used to select one of the four write bit lines BL1, BL2, BL3 and BL4 in the selected column. A write current having a direction corresponding to the value of write data DATA flows to the selected bit line.

The direction of write current flowing to the selected write bit line in the selected column is determined in accordance with the value of the write data DATA.

For example, when the write bit line BL1 is selected (when CA0="0" and CA1="0"), and the write data DATA is "1", the output signal from the NAND gate circuit ND5 is "0". The output signal from the AND gate circuit AD5 is "1". As a result, a write current from the write bit line driver/sinker 29A to the write bit line driver/sinker 31 flows to the write bit line BL1.

Conversely, when the write data DATA is "0", the output signal from the NAND gate circuit ND9 is "0". The output signal from the AND gate circuit AD1 is "1". As a result, a write current from the write bit line driver/sinker 31 to the write bit line driver/sinker 29A flows to the write bit line BL1.

When the write bit line BL2 is selected (when CA0="1" and CA1="0"), and the write data DATA is "1", the output signal from the NAND gate circuit ND6 is "0". The output signal from the AND gate circuit AD6 is "1". As a result, a write current from the write bit line driver/sinker 29A to the write bit line driver/sinker 31 flows to the write bit line BL2.

Conversely, when the write data DATA is "0", the output signal from the NAND gate circuit ND10 is "0". The output signal from the AND gate circuit AD2 is "1". As a result, a write current from the write bit line driver/sinker 31 to the write bit line driver/sinker 29A flows to the write bit line BL2.

When the write bit line BL3 is selected (when CA0="0" and CA1="1"), and the write data DATA is "1", the output signal from the NAND gate circuit ND7 is "0". The output signal from the AND gate circuit AD7 is "1". As a result, a write current from the write bit line driver/sinker 29A to the write bit line driver/sinker 31 flows to the write bit line BL3.

Conversely, when the write data DATA is "0", the output signal from the NAND gate circuit ND11 is "0". The output signal from the AND gate circuit AD3 is "1". As a result, a write current from the write bit line driver/sinker 31 to the write bit line driver/sinker 29A flows to the write bit line BL3.

When the write bit line BL4 is selected (when CA0="1" and CA1="1"), and the write data DATA is "1", the output signal from the NAND gate circuit ND8 is "0". The output signal from the AND gate circuit AD8 is "1". As a result, a write current from the write bit line driver/sinker 29A to the write bit line driver/sinker 31 flows to the write bit line BL4.

Conversely, when the write data DATA is "0", the output signal from the NAND gate circuit ND12 is "0". The output signal from the AND gate circuit AD4 is "1". As a result, a write current from the write bit line driver/sinker 31 to the write bit line driver/sinker 29A flows to the write bit line BL4.

(3) Read Word Line Driver

Figure 36:
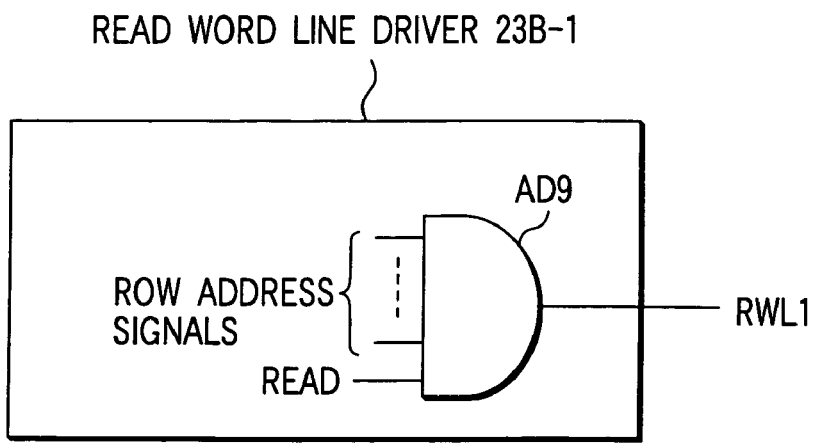
FIG. 36 is a view showing a circuit example of the read word line driver.
Figure 37:
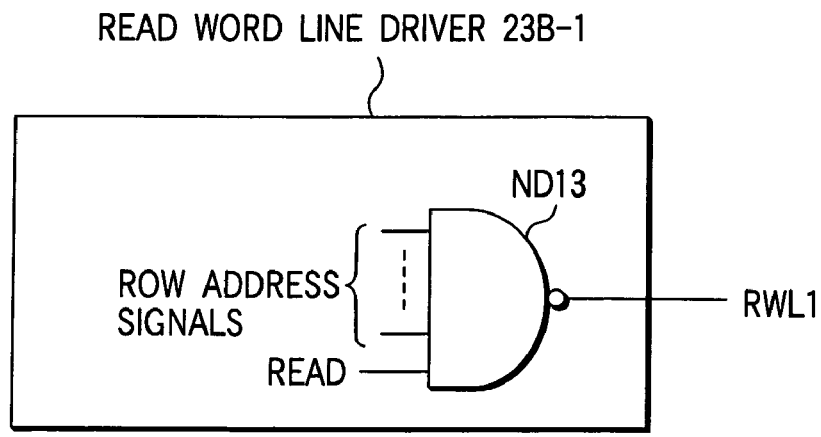
FIG. 37 is a view showing a circuit example of the read word line driver.

FIGS. 36 and 37 show circuit examples of the read word line driver.

The read word line driver applied to Structural Examples 1, 2, 6 and 7 has a circuit structure different from that of the read word line driver applied to Structural Examples 3, 4, 5 and 8.

FIG. 36 shows an example of the read word line driver applied to Structural Examples 1, 2, 6 and 7.

The read word line driver 23B-1 is formed from an AND gate circuit AD9. A read signal READ and row address signals are input to the AND gate circuit AD9.

In the read operation, the read signal is "1". The row address signals are the same as that in the write word line driver/sinker (FIG. 33).

In the read operation, in the selected row, all of the row address signals are "1". Hence, the potential of the read word line RWL1 is "1".

FIG. 37 shows an example of the read word line driver applied to Structural Examples 3, 4, 5 and 8.

The read word line driver 23B-1 is formed from a NAND gate circuit ND13. The read signal READ and row address signal are input to the NAND gate circuit ND13.

In the read operation, the read signal is "1". The row address signals are the same as that in the write word line driver/sinker (FIG. 33).

In the read operation, in the selected row, all of the row address signals are "1". Hence, the potential of the read word line RWL1 is "0".

(4) Column Decoder

Figure 38:
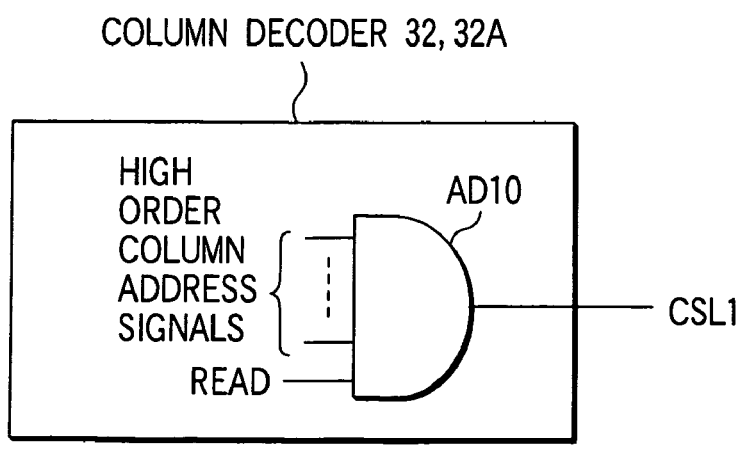
FIG. 38 is a view showing a circuit example of the column decoder.
Figure 39:
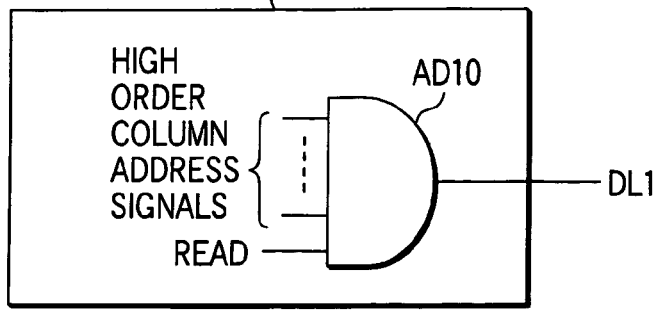
FIG. 39 is a view showing a circuit example of the column decoder.

FIGS. 38 and 39 show a circuit example of the column decoder.

Each of the column decoders 32, 32A and 32B is formed from an AND gate circuit AD10. The read signal READ and high order column address signals are input to the AND gate circuit AD10. In the read operation, the read signal is "1". In the selected column, all of the high order column address signals are "1".

Hence, in the column decoder 32 or 32A, the potential of the column select signal CSLj as its output signal is set to "1". In the column decoder 32B, the decode signal DL1 as its output signal is set to "1".

(5) Read Circuit

Figure 40:
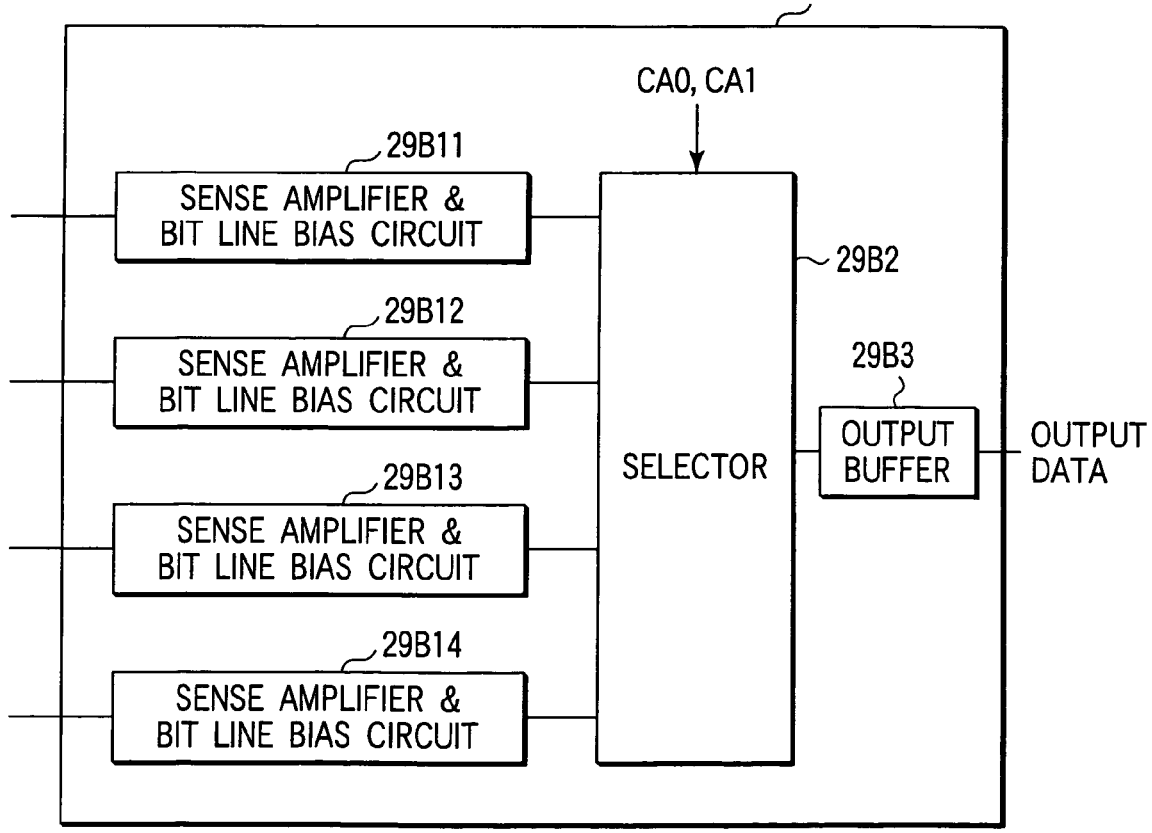
FIG. 40 is a block diagram of a circuit example of the read circuit.

FIG. 40 shows an example of the block diagram of the read circuit.

In this example, assume that, four TMR elements are arranged in one read block of one column, and the TMR elements are independently connected to read bit lines. That is, four read bit lines are arranged on one column. These read bit lines are connected to the read circuit 29B through the column select switch.

The read circuit 29B of this example is applied to a 1-I/O-type magnetic random access memory which outputs read data bits one by one.

Hence, the read circuit 29B has four sense amplifiers & bias circuits 29B11, 29B12, 29B13 and 29B14, a selector 29B2, and an output buffer 29B3.

In the read operation, read data are simultaneously read from four TMR elements in the selected read block. These four read data are input to and sensed by the sense amplifiers & bias circuits 29B11, 29B12, 29B13 and 29B14, respectively.

On the basis of the low order column address signal CA0 and CA1, the selector 29B2 selects one of the four read data output from the sense amplifiers & bias circuits 29B11, 29B12, 29B13 and 29B14. The selected read data is output from the magnetic random access memory as output data through the output buffer 29B3.

In this example, the read circuit 29B is applied to a 1-I/O-type magnetic random access memory.

However, when the read circuit 29B is applied to, e.g., a 4-I/O-type magnetic random access memory which outputs 4-bit read data, the selector 29B2 can be omitted. To the contrary, four output buffers 29B3 are required in correspondence with the sense amplifiers & bias circuits 29B11, 29B12, 29B13 and 29B14.

Figure 41:
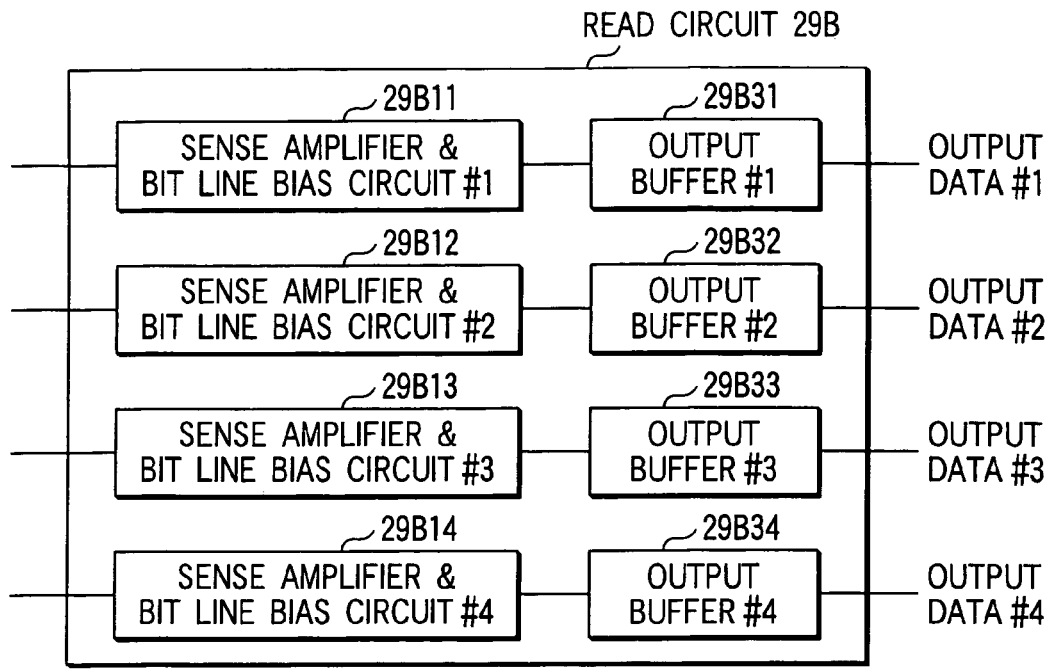
FIG. 41 is a block diagram of a circuit example of the read circuit.

FIG. 41 shows an example of the block diagram of the read circuit applied to a 4-I/O-type magnetic random access memory.

The read circuit 29B has four sense amplifiers & bias circuits 29B11, 29B12, 29B13 and 29B14 and four output buffers 29B31, 29B32, 29B33 and 29B34.

In the read operation, read data are simultaneously read from four TMR elements in the selected read block. These four read data are input to and sensed by the sense amplifiers & bias circuits 29B11, 29B12, 29B13 and 29B14, respectively.

The output data from the sense amplifiers & bias circuits 29B11, 29B12, 29B13 and 29B14 are output from the magnetic random access memory through the output buffers 29B31, 29B32, 29B33 and 29B34.

Figure 42:
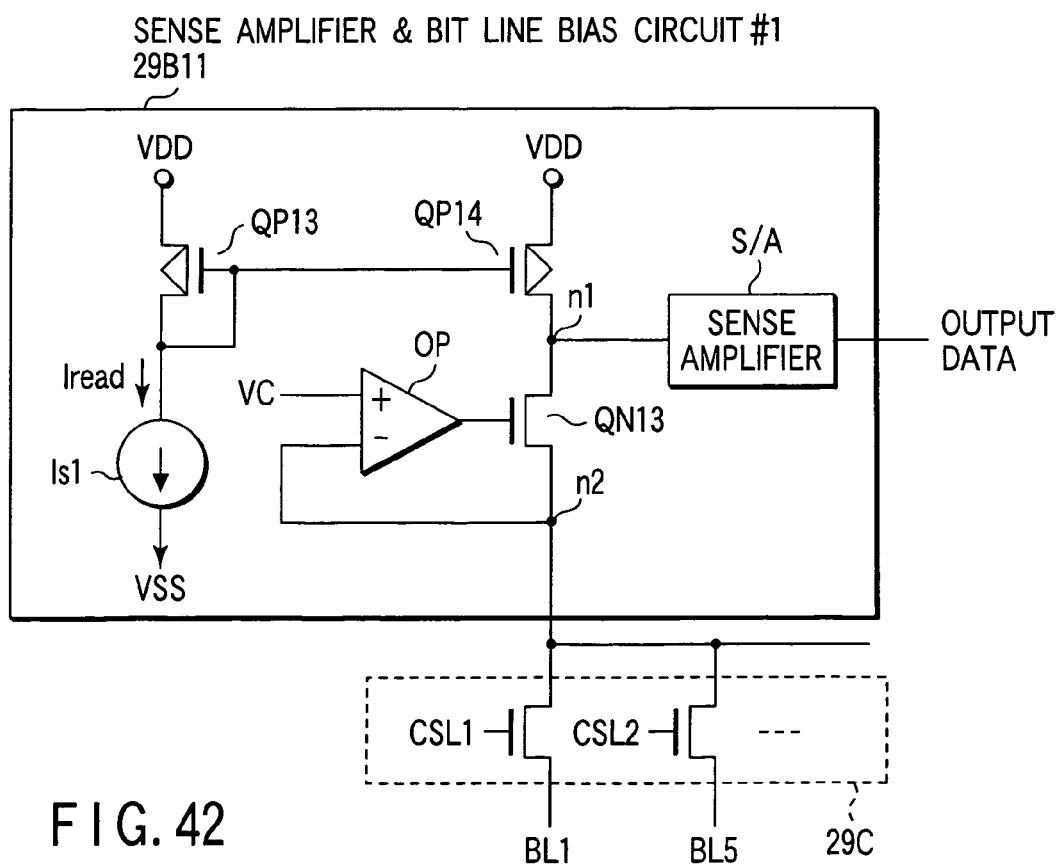
FIG. 42 is a view showing a circuit example of the sense amplifier & bias circuit.

FIG. 42 shows a circuit example of the sense amplifier & bias circuit.

This sense amplifier & bias circuit corresponds to one of the four sense amplifiers & bias circuits shown in FIG. 40 or 41.

A sense amplifier S/A is formed from, e.g., a differential amplifier.

A PMOS transistor QP14 and NMOS transistor QN13 are connected in series between the power supply terminal VDD and the column select switch 29C. The negative input terminal of a differential amplifier OP is connected to a node n2. The output terminal of the differential amplifier OP is connected to the gate of the NMOS transistor QN13. A clamp potential VC is input to the positive input terminal of the differential amplifier OP.

The differential amplifier OP equalizes the potential of the node n2 with the clamp potential VC. The clamp potential VC is set to a predetermined positive value.

A constant current source Is1 generates a read current Iread. The read current Iread flows to a bit line BLi through a current mirror circuit formed from a PMOS transistor QP13 and the PMOS transistor QP14. The sense amplifier formed from, e.g., a differential amplifier senses the data of a memory cell (TMR element) on the basis of the potential of a node n1 when the read current Iread is flowing.

FIG. 43 shows a circuit example of the sense amplifier. FIG. 44 shows a circuit example of the reference potential generating circuit of the sense amplifier.

The sense amplifier S/A is formed from, e.g., a differential amplifier shown in FIG. 45. The sense amplifier S/A compares a potential Vn1 of the node n1 with a reference potential Vref.

The reference potential Vref is generated by a TMR element which stores "1" data and a TMR element which stores "0" data.

A PMOS transistor QP16 and NMOS transistors QN14 and QN15 are connected in series between the power supply terminal VDD and the TMR element which stores "1" data. A PMOS transistor QP17 and NMOS transistors QN16 and QN17 are connected in series between the power supply terminal VDD and the TMR element which stores "0" data.

The drains of the PMOS transistors QP16 and QP17 are connected to each other. The drains of the NMOS transistors QN15 and QN17 are also connected to each other.

The differential amplifier OP equalizes the potential of a node n4 with the clamp potential VC. A constant current source Is2 generates the read current Iread. The read current Iread flows to the TMR element which stores "1" data and TMR element which stores "0" data through a current mirror circuit formed from the PMOS transistors QP15 and QP16.

The reference potential Vref is output from a node n3.

Assume that Is1=Is2, the transistors QP13, QP14, QP15, QP16 and QP17 have the same size, the transistors QN13, QN14 and QN16 have the same size, and the transistors QN15 and QN17 and NMOS transistors to which CSL1, CSL2, . . . are input have the same size. In this case, the reference potential Vref can be set to the intermediate value between the potential Vn1 when "1" data is output and that when "0" data is output.

FIG. 45 shows a circuit example of the differential amplifier OP shown in FIGS. 42 and 44.

The differential amplifier OP is formed from PMOS transistors QP18 and QP19 and NMOS transistors QN18, QN19 and QN20. When an enable signal Enable changes to "H", the differential amplifier OP is set in an operative state.

4. Manufacturing Method

The cell array structure, read operation mechanism, and read circuit of the magnetic random access memory of the present invention have been described above. Finally, a manufacturing method for implementing the magnetic random access memory of the present invention will be described.

The manufacturing method to be described below is related to Structural Example 1. Structural Examples 2 to 8 can also easily be formed using the following manufacturing method.

Structural Example 2 is different from Structural Example 1 only in the direction of read select switch. Structural Examples 3 and 4 are different from Structural Example 1 only in the type (purpose) of interconnection connected to the read select switch. Structural Examples 5 to 8 are different from Structural Example 1 only in the element that constructs the read select switch.

(1) Cell Array Structure to be Manufactured

The cell array structure completed by the manufacturing method of the present invention will be briefly described first. Then, the manufacturing method of the cell array structure will be described.

Figure 46:
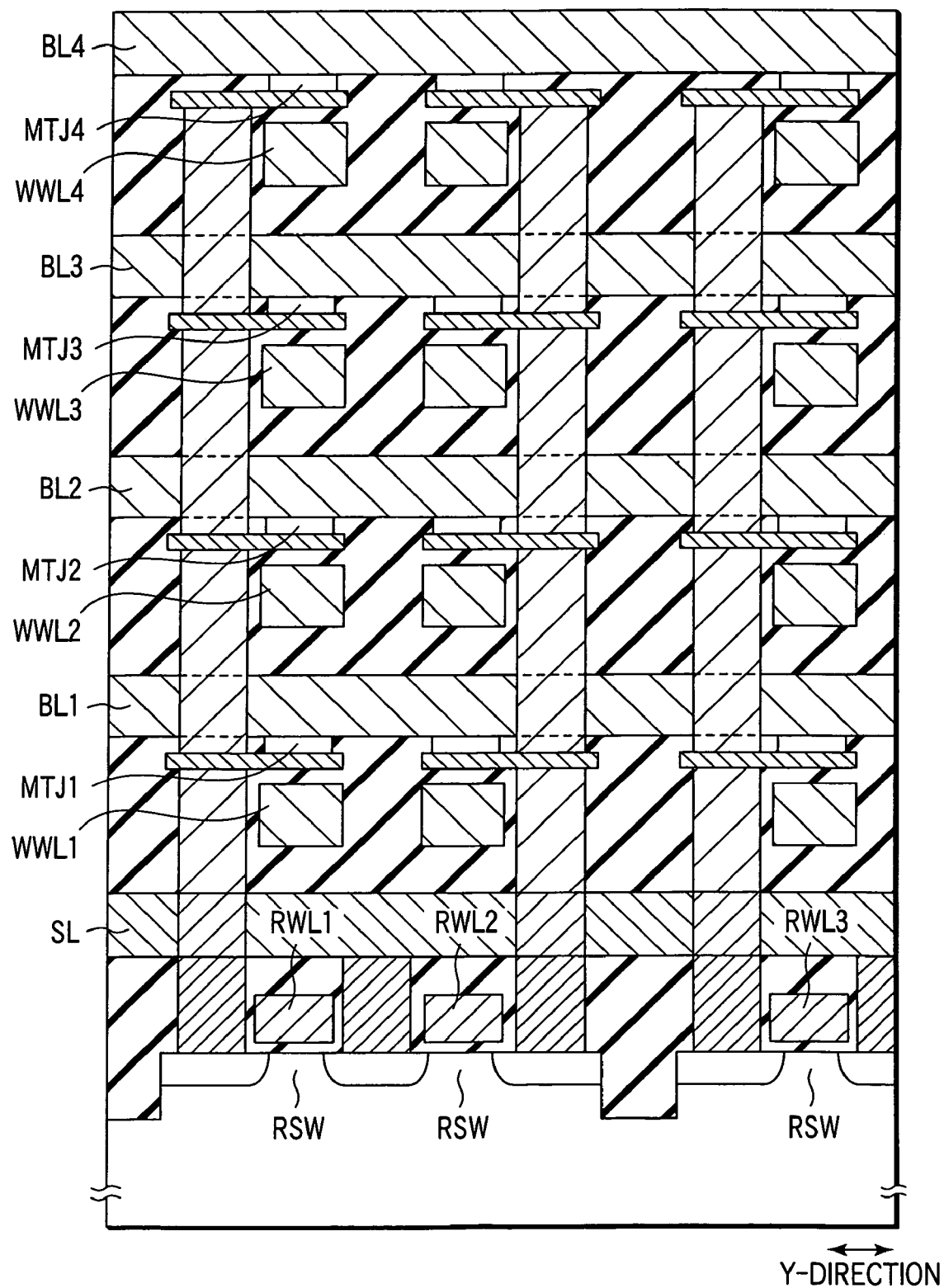
FIG. 46 is a view showing a device structure to which the manufacturing method of the present invention is applied.

FIG. 46 shows the cell array structure related to Structural Example 1.

In this cell array structure, one read block is formed by four TMR elements MTJ1, MTJ2, MTJ3 and MTJ4 that are vertically stacked.

Read select switches (MOS transistors) RSW are arranged on the surface region of a semiconductor substrate 51. The read select switches RSW in two read blocks adjacent in the Y-direction share one source. The source of the read select switch RSW is connected to a source line SL. The source line SL extends straight in, e.g., the Y-direction and is commonly connected to the read select switches RSW in a plurality of read blocks arranged in one column.

The gates of the read select switches (MOS transistors) RSW serve as read word lines RWL1, RWL2 and RWL3. The read word lines RWL1, RWL2 and RWL3 extend in the X-direction. The four TMR elements MTJ1, MTJ2, MTJ3 and MTJ4 are stacked on each read select switch RSW.

Each of the TMR elements MTJ1, MTJ2, MTJ3 and MTJ4 has, e.g., the structure shown in FIG. 7, 8 or 9. As for the vertical direction of the TMR elements MTJ1, MTJ2, MTJ3 and MTJ4, for example, the free layer (storing layer) is separated equidistantly from the write word line and read/write bit line as much as possible. Its axis of easy magnetization is set to be parallel to, e.g., the X-direction.

The lower surfaces of the TMR elements MTJ1, MTJ2, MTJ3 and MTJ4 are connected to lower electrodes. The lower electrodes are connected to the drain of the read select switch (MOS transistor) RSW through contact plugs.

Write word lines WWL1, WWL2, WWL3 and WWL4 extending in the X-direction are arranged right under the TMR elements MTJ1, MTJ2, MTJ3 and MTJ4, respectively. The upper surfaces of the TMR elements MTJ1, MTJ2, MTJ3 and MTJ4 are in contact with read/write bit lines BL1, BL2, BL3 and BL4 extending in the Y-direction.

When the cell array structure is viewed from the upper side of the semiconductor substrate 51, for example, the TMR elements MTJ1, MTJ2, MTJ3 and MTJ4 are laid out to overlap each other. The write word lines WWL1, WWL2, WWL3 and WWL4 are also laid out to overlap each other. The read/write bit lines BL1, BL2, BL3 and BL4 are also laid out to overlap each other.

The contact plugs for connecting the terminals of the TMR elements MTJ1, MTJ2, MTJ3 and MTJ4 to the drain of the read select switch RSW are laid out not to overlap the write word lines WWL1, WWL2, WWL3 and WWL4 and read/write bit lines BL1, BL2, BL3 and BL4.

(2) Steps in Manufacturing Method

The manufacturing method for implementing the cell array structure shown in FIG. 46 will be described below. A detailed manufacturing method (e.g., employment of a dual damascene process) will be described here. Hence, note that elements that are not illustrated in the cell array structure of FIG. 46 will be mentioned. However, the outline of the finally completed cell array structure is almost the same as that shown in FIG. 46.

[1] Active Region Isolation Step

First, as shown in FIG. 47, active areas are isolated by the shallow trench isolation (STI) method in the semiconductor substrate 51.

Field oxide films 52 are filled in shallow trenches, e.g., the following process.

A mask pattern (e.g., a silicon nitride film) is formed on the semiconductor substrate 51 by PEP (Photo Engraving Process). The semiconductor substrate 51 is etched by RIE (Reactive Ion Etching) using the mask pattern as a mask to form trenches in the semiconductor substrate 51. These trenches are filled with an insulating material (e.g., a silicon oxide) using, e.g., CVD (Chemical Vapor Deposition) and CMP (Chemical Mechanical Polishing).

After that, p-type impurities (e.g., B or $BF_2$) or n-type impurities (e.g., P or As) are doped into the semiconductor substrate by, e.g., the ion implantation technique, as needed, to form p-type well regions or n-type well regions.

[2] MOSFET Forming Step

Next, as shown in FIG. 48, MOS transistors including the read select switches are formed on the surface region of the semiconductor substrate 51.

The MOS transistors can be formed by, e.g., the following process.

Impurities for controlling the threshold value of the MOS transistors are ion-implanted into necessitate channel portions in active areas surrounding by field oxides 52. A gate insulating film (e.g., a silicon oxide film) 53 is formed in the active areas by thermal oxidation. A gate electrode material (e.g., polysilicon containing impurities) and cap insulating film (e.g., a silicon nitride film) 55 are formed on the gate insulating film 53 by CVD.

The cap insulating film 55 is patterned by PEP. Then, the gate electrode material and gate insulating film 53 are processed (etched) by RIE using the cap insulating film 55 as a mask. As a consequence, gate electrodes 54 extending in the X-direction are formed on the semiconductor substrate 51.

P- or n-type impurities is doped into the semiconductor substrate 51 by ion implantation using the cap insulating film 55 and gate electrodes 54 as a mask. Lightly-doped impurity regions (LDD regions or extension regions) are formed in the semiconductor substrate.

An insulating film (e.g., a silicon nitride film) is formed on the entire surface of the semiconductor substrate 51 by CVD. After that, the insulating film is etched by RIE to form sidewall insulating layers 57 on the side surfaces of the gate electrodes 54 and cap insulating films 55. P- or n-type impurities is doped into the semiconductor substrate 51 by ion implantation using the cap insulating films 55, gate electrodes 54, and sidewall insulating layers 57 as a mask. As a result, source regions 56A and drain regions 56B are formed in the semiconductor substrate 51.

After that, a dielectric interlayer (e.g., a silicon oxide layer) 58 that completely covers the MOS transistors is formed on the entire surface of the semiconductor substrate 51 by CVD. In addition, the surface of the dielectric interlayer 58 is planarized by CMP.

[3] Contact Hole Forming Step

Figure 49:
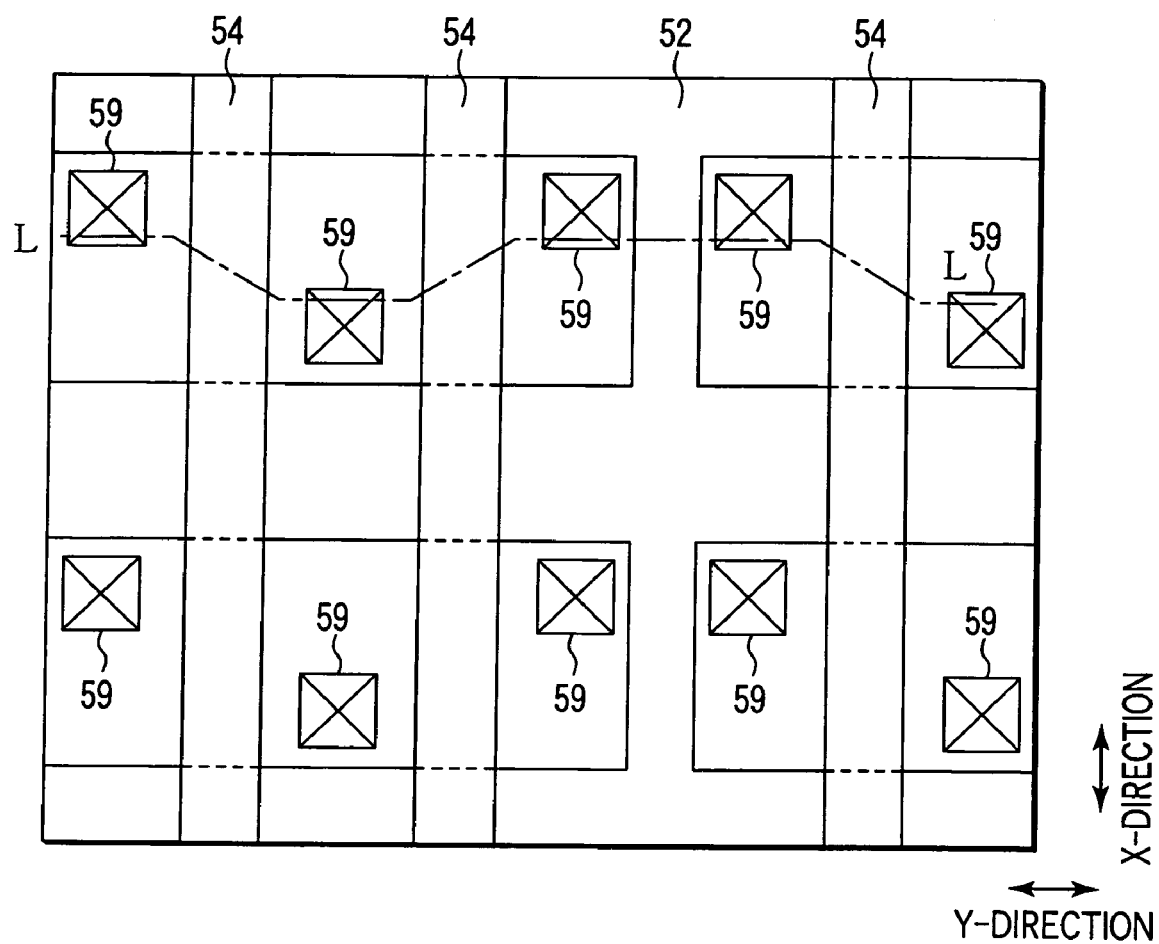
FIG. 49 is a plan view showing one step of the manufacturing method of the present invention.
Figure 50:
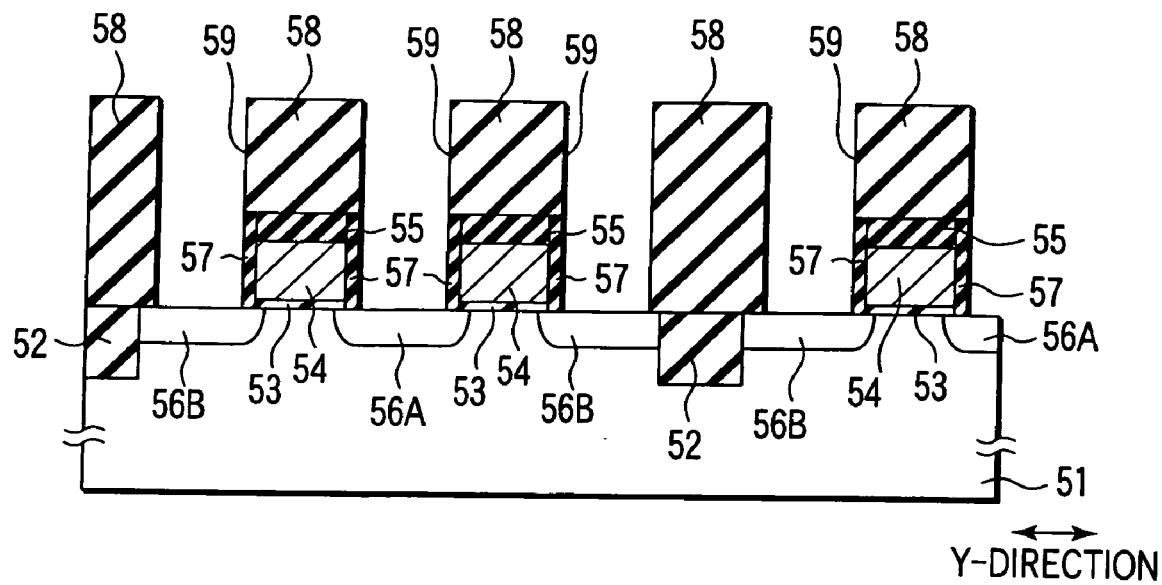
FIG. 50 is a sectional view taken along a line L—L in FIG. 49.

Next, as shown in FIGS. 49 and 50, contact holes 59 that reach the source regions 56A and drain regions 56B of MOS transistors are formed in the dielectric interlayer 58 on the semiconductor substrate 51.

The contact holes 59 can easily be formed by, e.g., forming a photoresist pattern on the dielectric interlayer 58 by PEP and etching the dielectric interlayer 58 by RIE using the photoresist pattern as a mark. After etching, the photoresist pattern is removed.

[4] Interconnection Trench Forming Step

Figure 51:
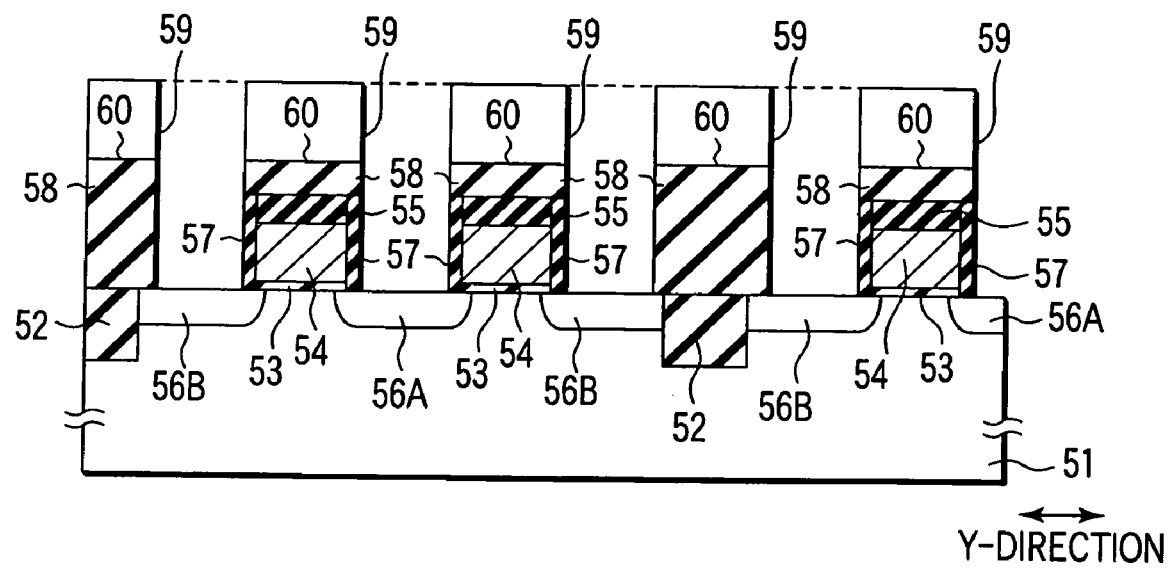
FIG. 51 is a sectional view showing one step of the manufacturing method of the present invention.

As shown in FIG. 51, interconnection trenches 60 are formed in the dielectric interlayer 58 on the semiconductor substrate 51. In this example, the interconnection trenches 60 extend in the Y-direction. The contact holes 59 on the source regions 56A, the contact holes 59 on the drain regions 56B, and the interconnection trenches 60 do not simultaneously appear in the same section (a section obtained by cutting the device along a straight line that extends in the Y-direction).

The interconnection trenches 60 are indicated by broken lines in FIG. 51.

The interconnection trenches 60 can easily be formed by, e.g., forming a photoresist pattern on the dielectric interlayer 58 by PEP and etching the dielectric interlayer 58 by RIE using the photoresist pattern as a mark. After etching, the photoresist pattern is removed.

[5] First Interconnection Layer Forming Step

Figure 52:
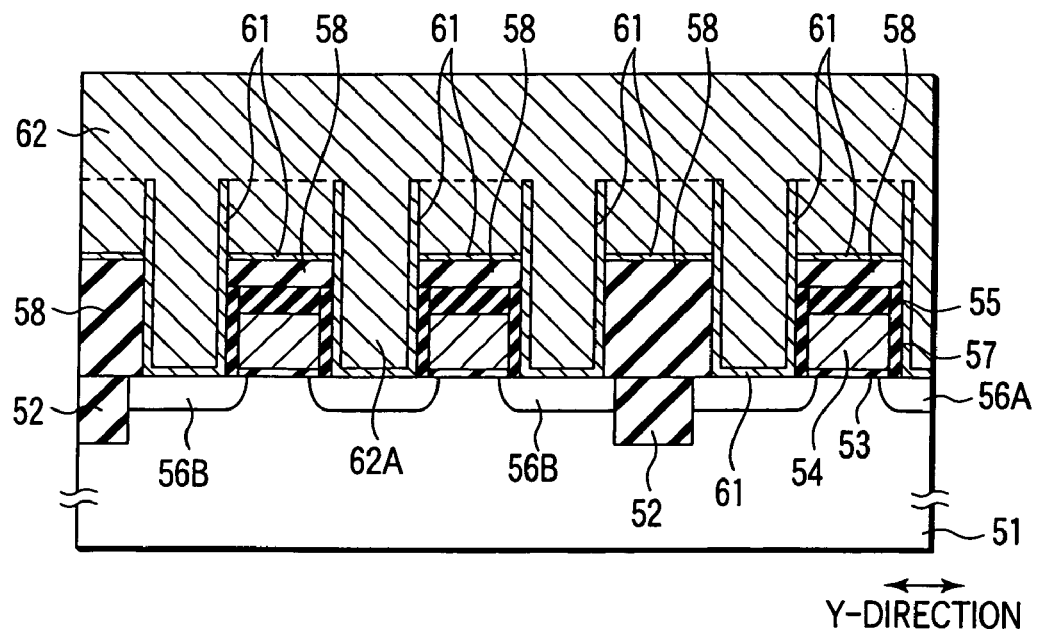
FIG. 52 is a sectional view showing one step of the manufacturing method of the present invention.

As shown in FIG. 52, a barrier metal layer (e.g., a multi-layer of Ti and TiN) 61 is formed on the dielectric interlayer 58, the inner surfaces of the contact holes 59, and the inner surfaces of the interconnection trenches 60 by, e.g., sputtering. Subsequently, a metal layer (e.g., a W layer) 62 that completely fills the contact holes 59 and interconnection trenches 60 is formed on the barrier metal layer 61 by, e.g., sputtering.

Figure 53:
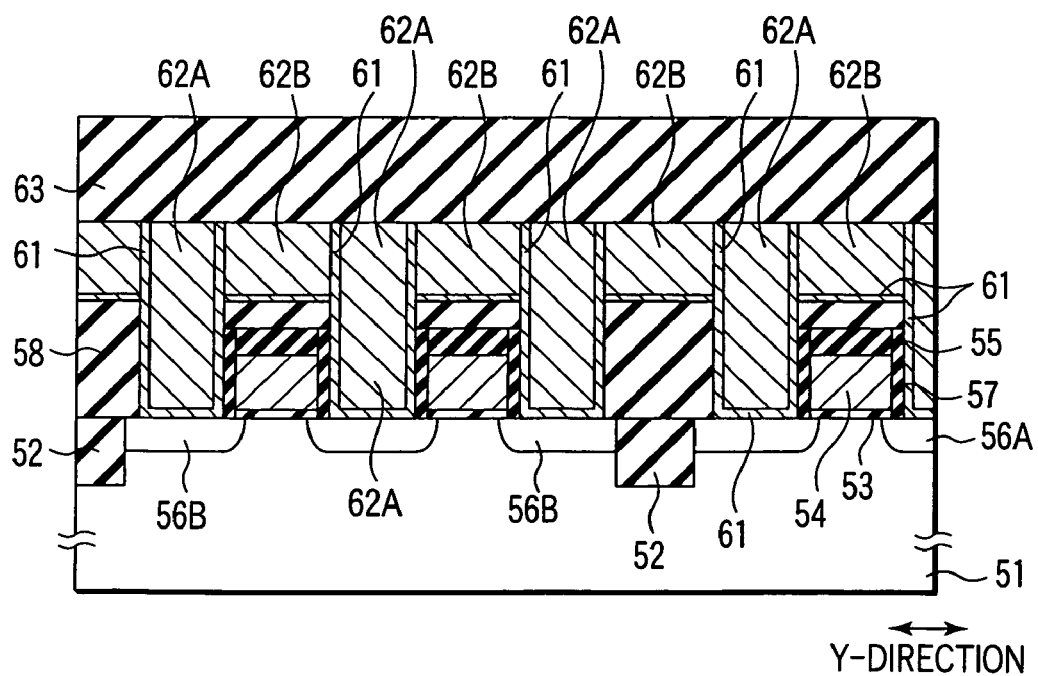
FIG. 53 is a sectional view showing one step of the manufacturing method of the present invention.

After that, as shown in FIG. 53, the metal layer 62 is polished by, e.g., CMP and left only in the contact holes 59 and interconnection trenches 60. The metal layer 62 remaining in each contact hole 59 forms a contact plug 62A. The metal layer 62 remaining in each interconnection trench 60 forms a first interconnection layer (source line or decode line) 62B. A dielectric interlayer (e.g., a silicon oxide layer) 63 is formed on the dielectric interlayer 58 by CVD.

The step comprising the contact hole forming step, the interconnection trench forming step, and the first interconnection layer forming step is called the dual damascene process.

Actually, the contact plugs 62A and first interconnection layers 62B do not simultaneously appear in the same section (a section obtained by cutting the device along a straight line that extends in the Y-direction). However, FIG. 53 and subsequent drawings from FIG. 54 (to be described below) show not only the contact plugs 62A but also the first interconnection layers 62B that do not actually appear as a section.

[6] Interconnection Trench Forming Step

Figure 54:
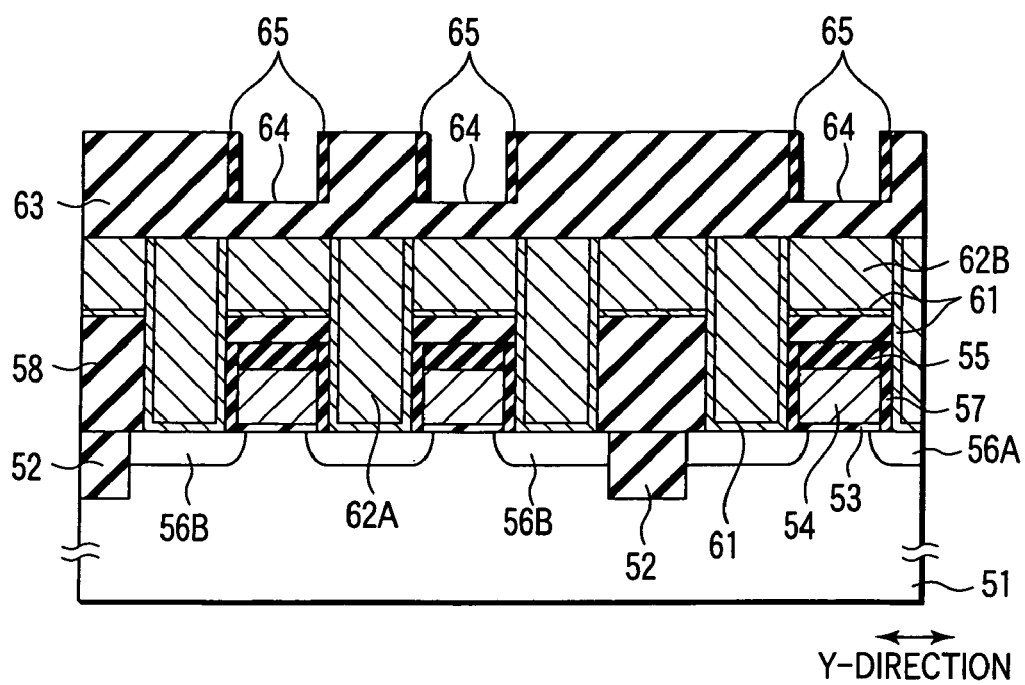
FIG. 54 is a sectional view showing one step of the manufacturing method of the present invention.

Next, as shown in FIG. 54, interconnection trenches 64 are formed in the dielectric interlayer 63. In this example, the interconnection trenches 64 serve as trenches used to form write word lines and extend in the X-direction. If the metal layer material is Cu, sidewall insulating layers (such as silicon nitride) are needed for preventing from Cu diffusion and corrosion are formed on the side surfaces of the interconnection trenches 64.

The interconnection trenches 64 can easily be formed by, e.g., forming a photoresist pattern on the dielectric interlayer 63 by PEP and etching the dielectric interlayer 63 by RIE using the photoresist pattern as a mask. After etching, the photoresist pattern is removed.

The sidewall insulating layers 65 can easily be formed by forming an insulating film (e.g., a silicon nitride film) on the entire surface of the dielectric interlayer 63 by CVD and etching the insulating film by RIE.

[7] Second Interconnection Layer Forming Step

Figure 55:
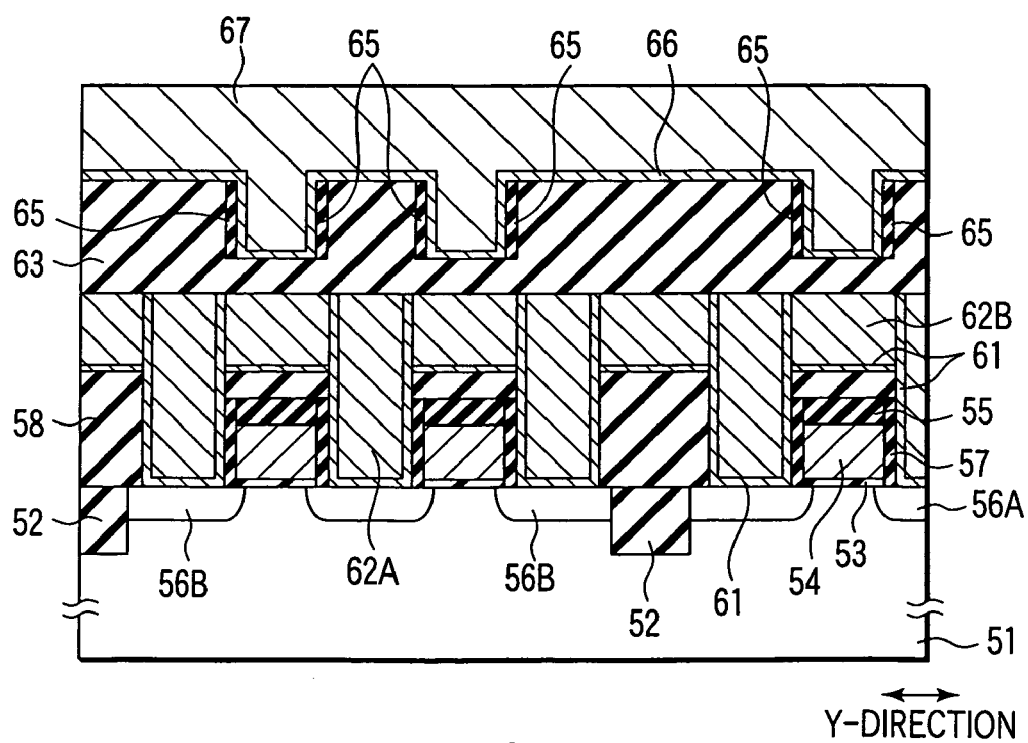
FIG. 55 is a sectional view showing one step of the manufacturing method of the present invention.

As shown in FIG. 55, a barrier metal layer (e.g., a multi-layer of Ta and TaN) 66 is formed on the dielectric interlayer 63, the inner surfaces of the interconnection trenches 64, and the sidewall insulating layers 65 by, e.g., sputtering. Subsequently, a metal layer (e.g., a Cu layer) 67 that completely fills the interconnection trenches 64 is formed on the barrier metal layer 66 by, e.g., sputtering or electroplating.

Figure 56:
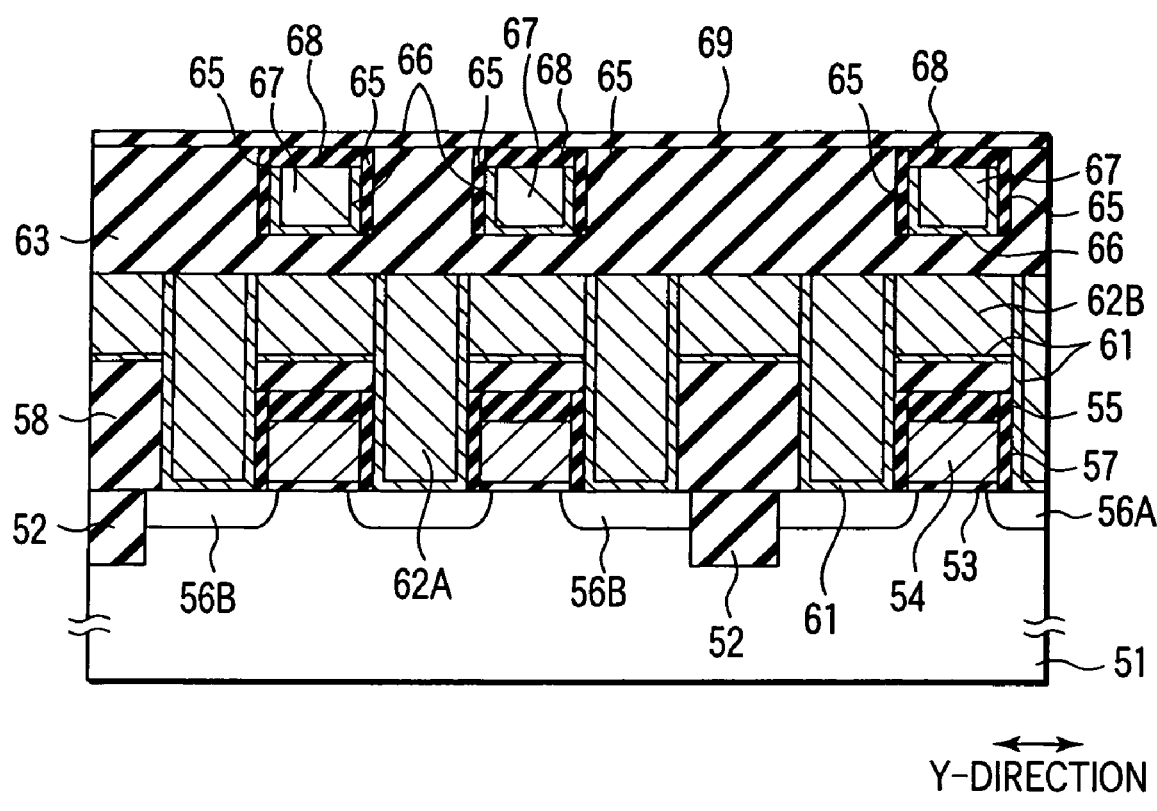
FIG. 56 is a sectional view showing one step of the manufacturing method of the present invention.

After that, as shown in FIG. 56, the metal layer 67 is polished by, e.g., CMP and left only in the interconnection trenches 64. The metal layer 67 remaining in each interconnection trench 64 forms a second interconnection layer that functions as a write word line.

An insulating layer (e.g., a silicon nitride layer) 68 is formed on the dielectric interlayer 63 by CVD. If needed, the insulating layer 68 is polished by CMP and left only on the metal layers 67 serving as the second interconnection layers. In addition, a dielectric interlayer (e.g., a silicon oxide layer) 69 that completely covers the metal layers 67 serving as the second interconnection layers is formed on the dielectric interlayer 63.

The step comprising the interconnection trench forming step and the second interconnection layer forming step is called the damascene process.

[8] Step of Forming Lower Electrode of First MTJ Element

Figure 57:
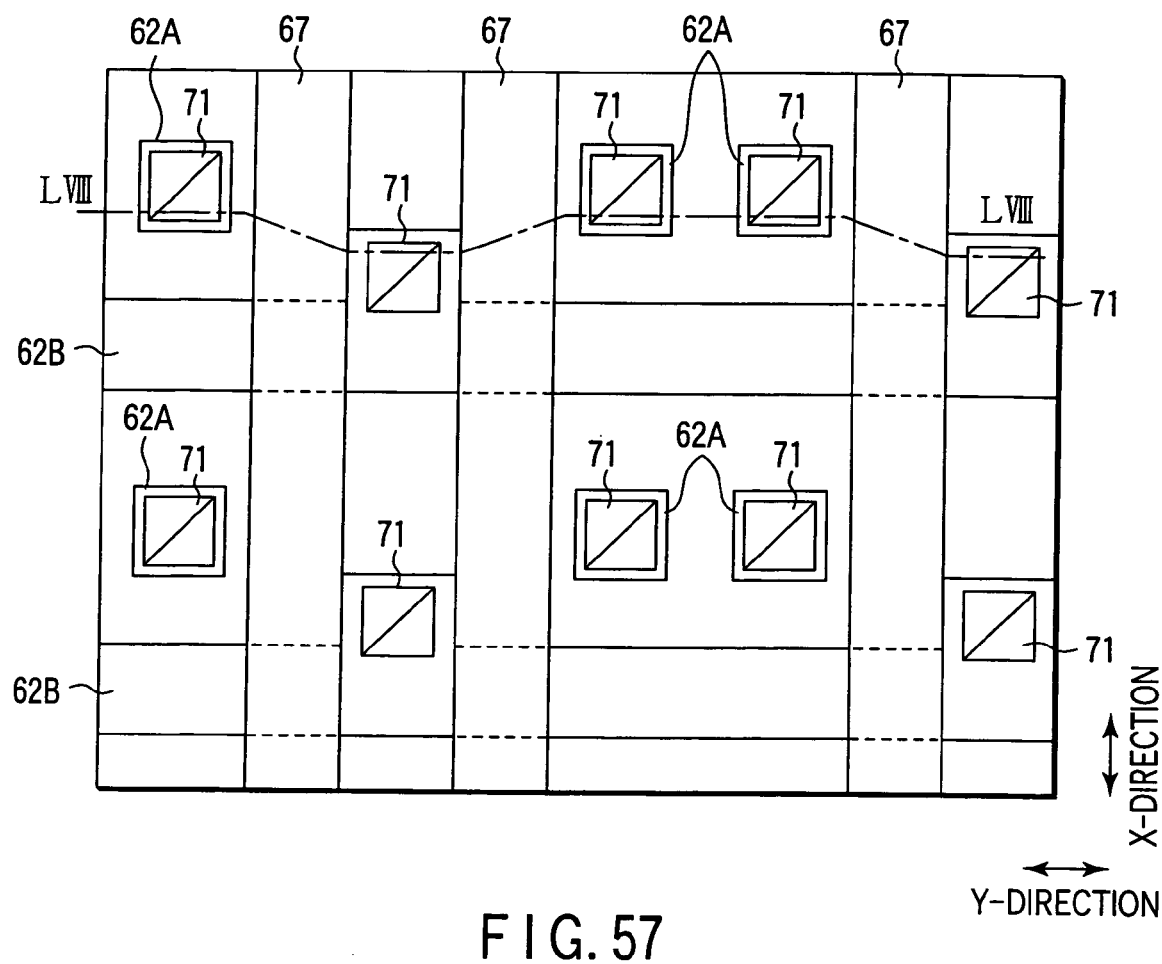
FIG. 57 is a plan view showing one step of the manufacturing method of the present invention.
Figure 58:
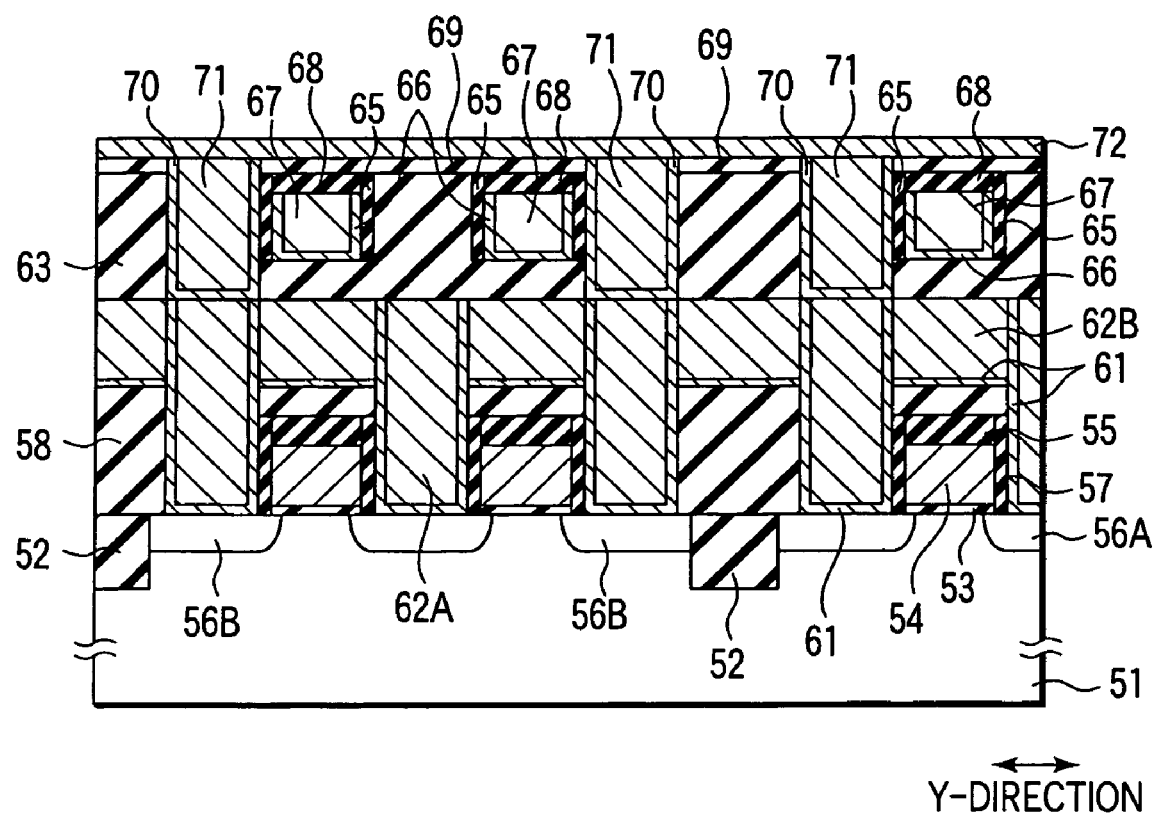
FIG. 58 is a sectional view taken along a line LVIII—LVIII in FIG. 57.

Next, as shown in FIGS. 57 and 58, contact holes that reach the metal layers 62A and 62B serving as the first interconnection layers are formed in the dielectric interlayer 69.

These contact holes can easily be formed by, e.g., forming a photoresist pattern on the dielectric interlayer 69 by PEP and etching the dielectric interlayers 63 and 69 by RIE using the photoresist pattern as a mask. After etching, the photoresist pattern is removed.

In addition, a barrier metal layer (e.g., a multi-layer of Ti and TiN) 70 is formed on the inner surfaces of the contact holes by, e.g., sputtering. Subsequently, a metal layer (e.g., a W layer) 71 that completely fills the contact holes is formed on the barrier metal layer 70 by, e.g., sputtering.

After that, the metal layer 71 is polished by, e.g., CMP and left only in the contact holes. The metal layer 71 remaining in each contact hole forms a contact plug. In addition, metal layers (e.g., Ta layers) 72 serving as the lower electrodes of the first MTJ elements are formed on the dielectric interlayer 69 by CVD.

[9] First MTJ Element Forming Step

Figure 59:
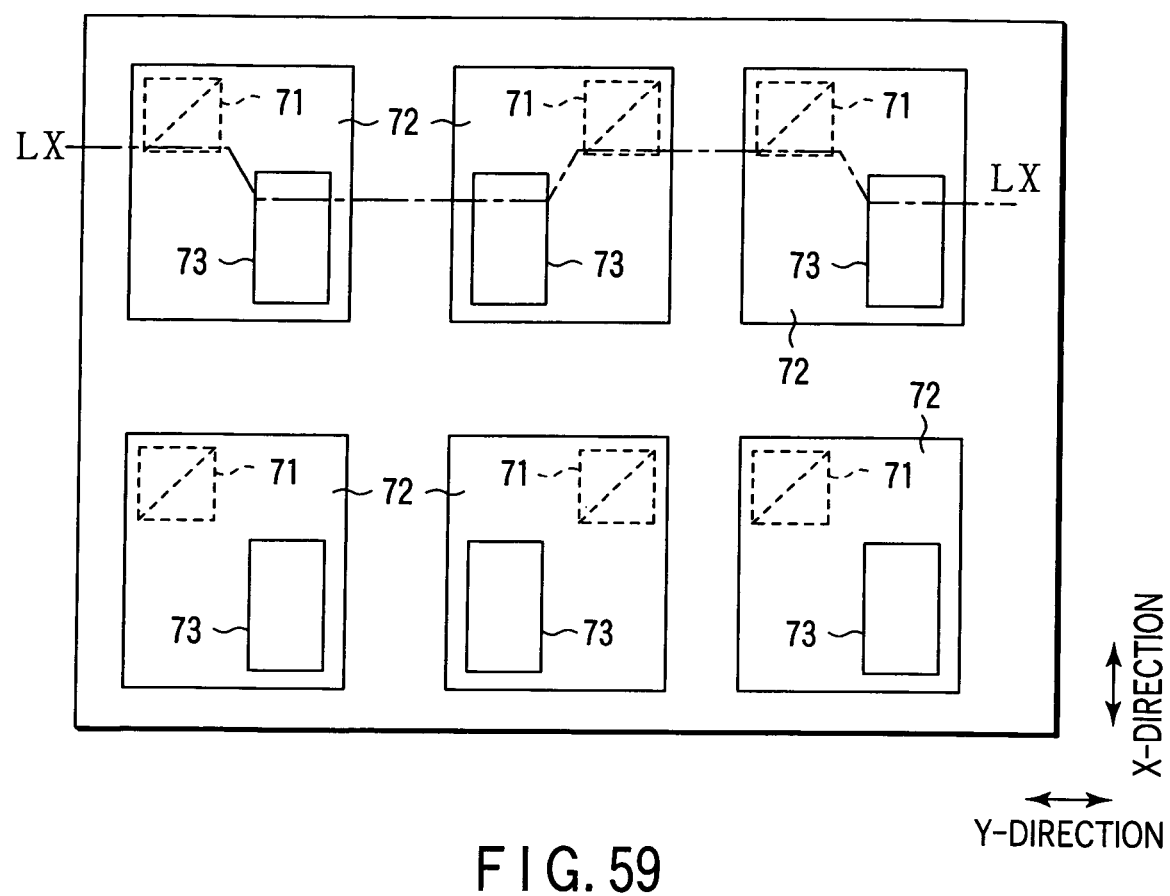
FIG. 59 is a plan view showing one step of the manufacturing method of the present invention.
Figure 60:
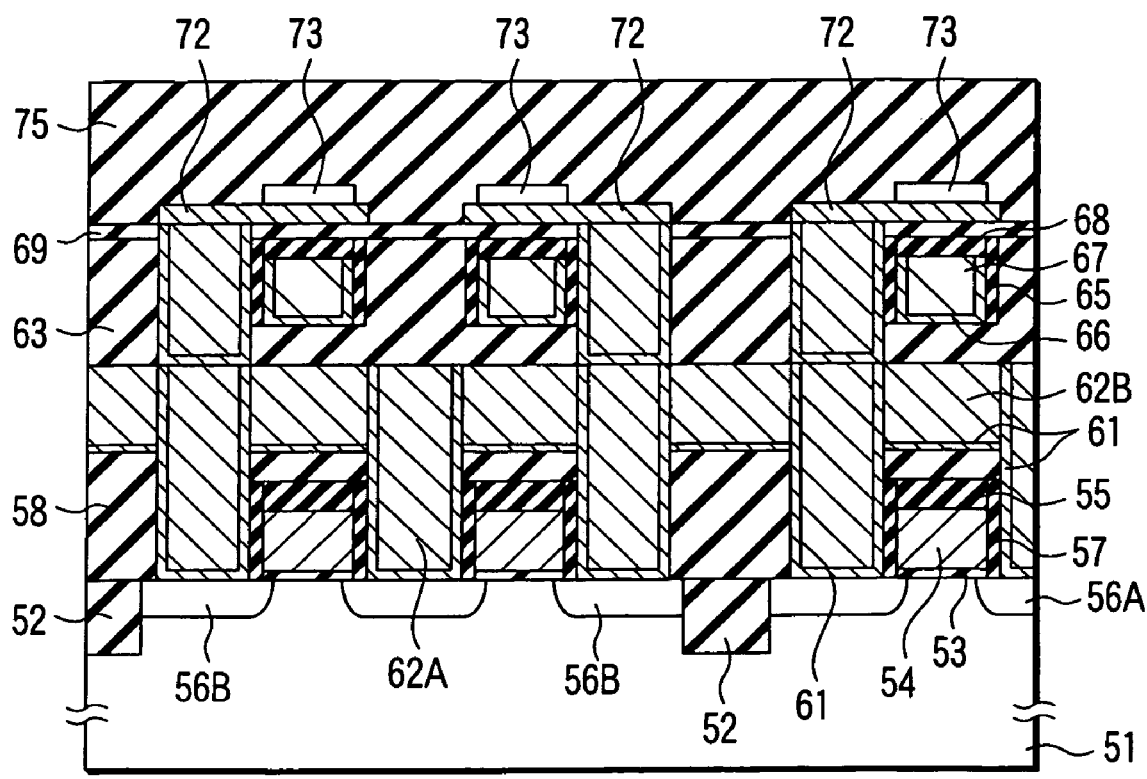
FIG. 60 is a sectional view taken along a line LX—LX in FIG. 59.

As shown in FIGS. 59 and 60, first MTJ elements 73 are formed on the metal layers 72. Each first MTJ element 73 has, as its main portion, a tunneling barrier and two ferromagnetic layers that sandwich the tunneling barrier, and has, e.g., the structure as shown in FIG. 7.

The lower electrodes 72 of the first MTJ elements 73 are patterned.

The lower electrodes 72 of the first MTJ elements 73 can easily be patterned by forming a photoresist pattern on the lower electrodes 72 by PEP and etching the lower electrodes 72 by RIE using the photoresist pattern as a mask. Then, the photoresist pattern is removed.

After that, a dielectric interlayer 75 that completely covers the first MTJ elements 73 is formed by CVD.

[10] Interconnection Trench Forming Step

Figure 61:
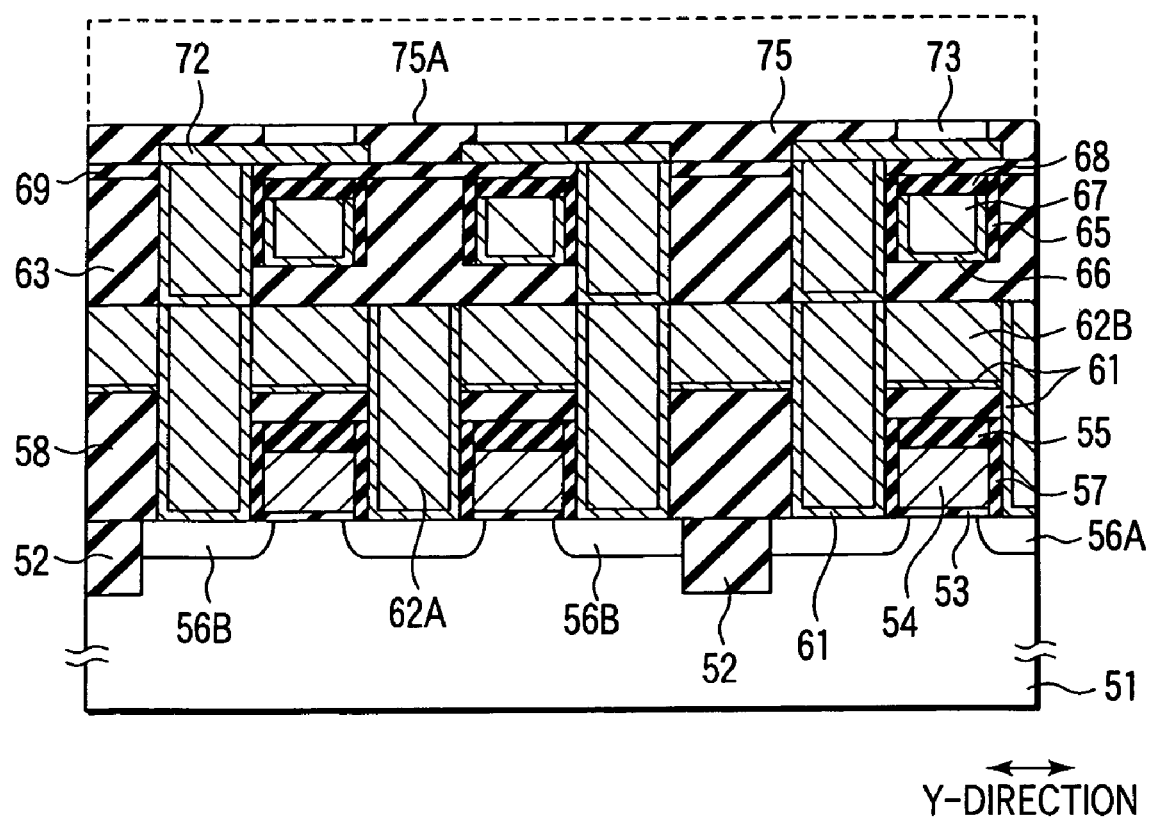
FIG. 61 is a sectional view showing one step of the manufacturing method of the present invention.

As shown in FIG. 61, interconnection trenches 75A are formed in the dielectric interlayer 75. In this example, the interconnection trenches 75A serve as trenches used to form read/write bit lines and extend in the Y-direction. If the metal layer material is Cu, sidewall insulating layers (such as silicon nitride) are needed for preventing from Cu diffusion and corrosion are formed on the side surfaces of the interconnection trenches 75A.

The interconnection trenches 75A can easily be formed by, e.g., forming a photoresist pattern on the dielectric interlayer 75 by PEP and etching the dielectric interlayer 75 by RIE using the photoresist pattern as a mask. After etching, the photoresist pattern is removed.

The sidewall insulating layers can easily be formed by forming an insulating film (e.g., a silicon nitride film) on the entire surface of the dielectric interlayer 75 by CVD and etching the insulating film by RIE.

[11] Third Interconnection Layer Forming Step

Figure 62:
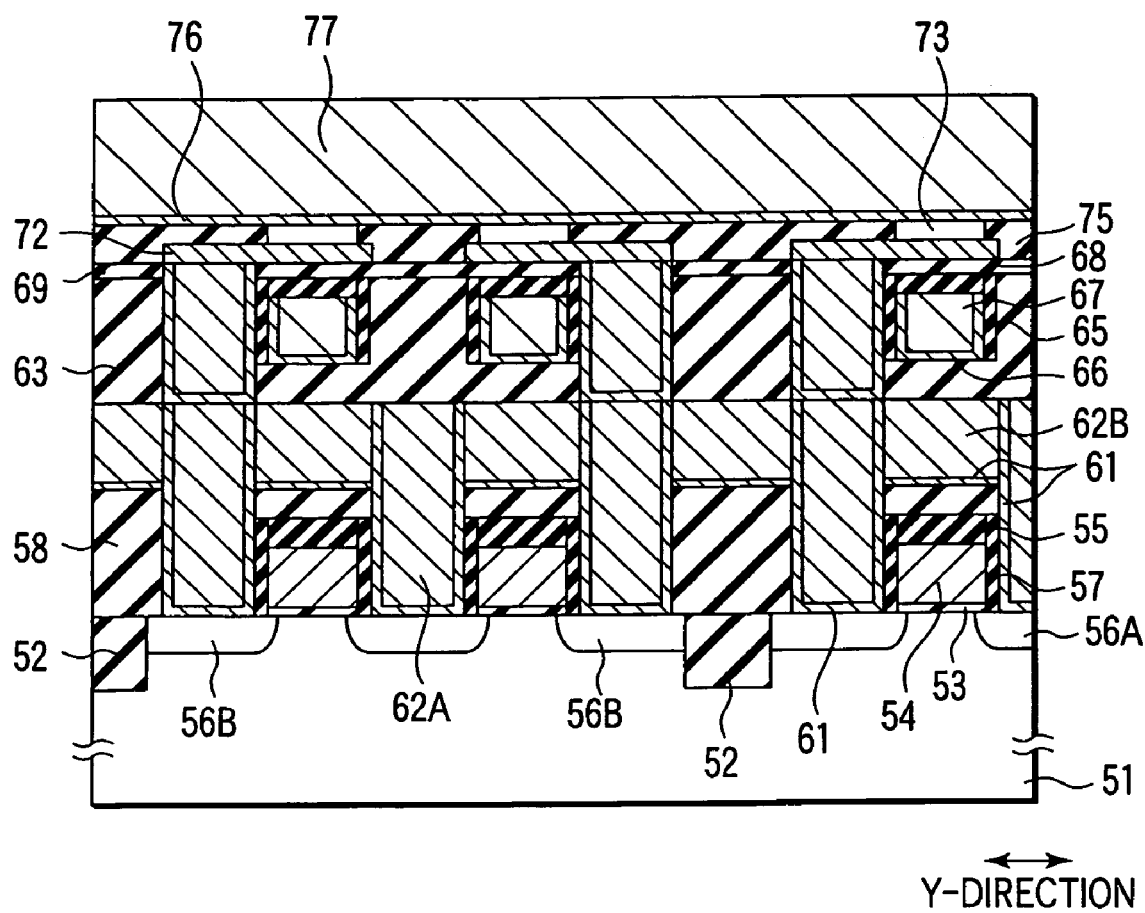
FIG. 62 is a sectional view showing one step of the manufacturing method of the present invention.

As shown in FIG. 62, a barrier metal layer (e.g., a multi-layer of Ta and TaN) 76 is formed on the dielectric interlayer 75, the inner surfaces of the interconnection trenches 75A, and the sidewall insulating layers by, e.g., sputtering. Subsequently, a metal layer (e.g., a Cu layer) 77 that completely fills the interconnection trenches 75A is formed on the barrier metal layer 76 by, e.g., sputtering or electroplating.

Figure 63:
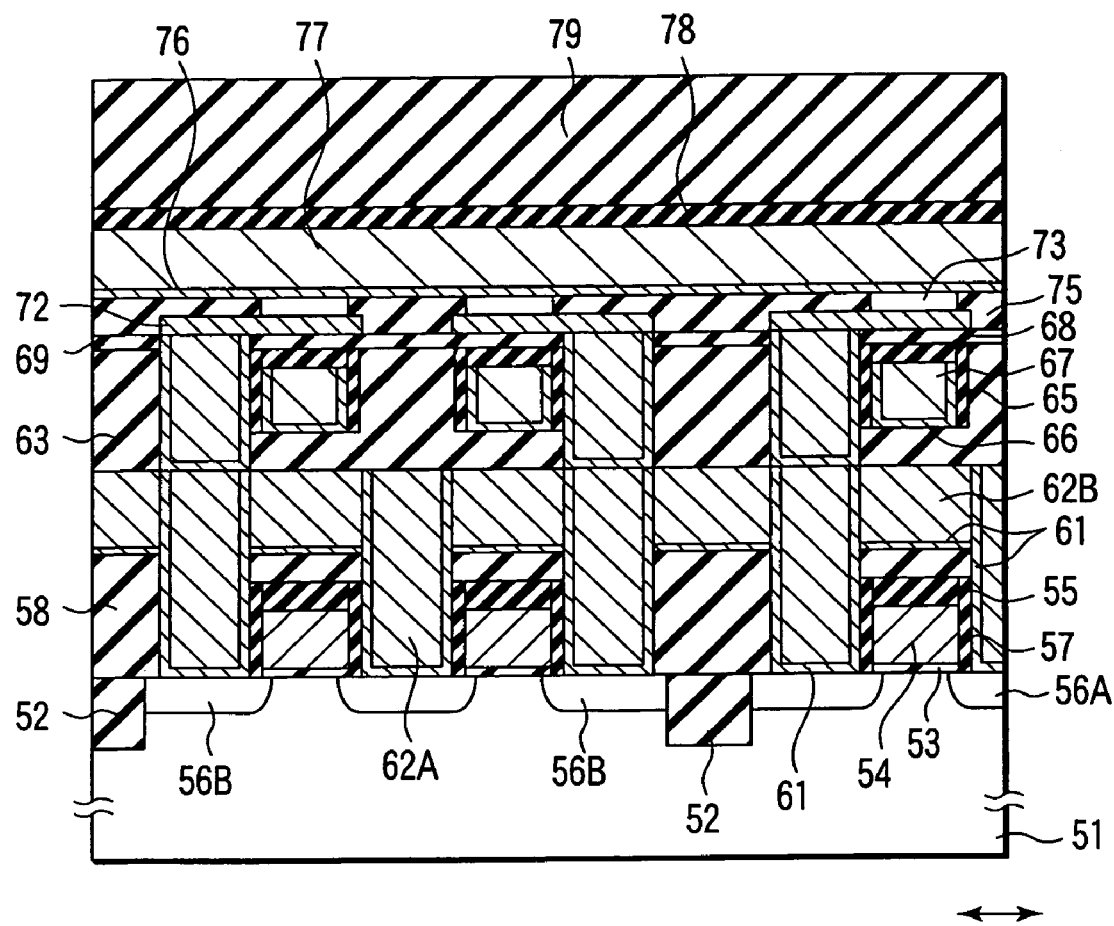
FIG. 63 is a sectional view showing one step of the manufacturing method of the present invention.

After that, as shown in FIG. 63, the metal layer 77 is polished by, e.g., CMP and left only in the interconnection trenches 75A. The metal layer 77 remaining in each interconnection trench 75A forms a third interconnection layer that functions as a read/write bit line.

An insulating layer (e.g., a silicon nitride layer) 78 is formed on the dielectric interlayer 75 by CVD. If needed, the insulating layer 78 is polished by CMP and left only on the metal layers 77 serving as the third interconnection layers.

In addition, a dielectric interlayer (e.g., a silicon oxide layer) 79 that completely covers the metal layers 77 serving as the third interconnection layers is formed on the dielectric interlayer 75.

[12] Interconnection Trench Forming Step

Figure 64:
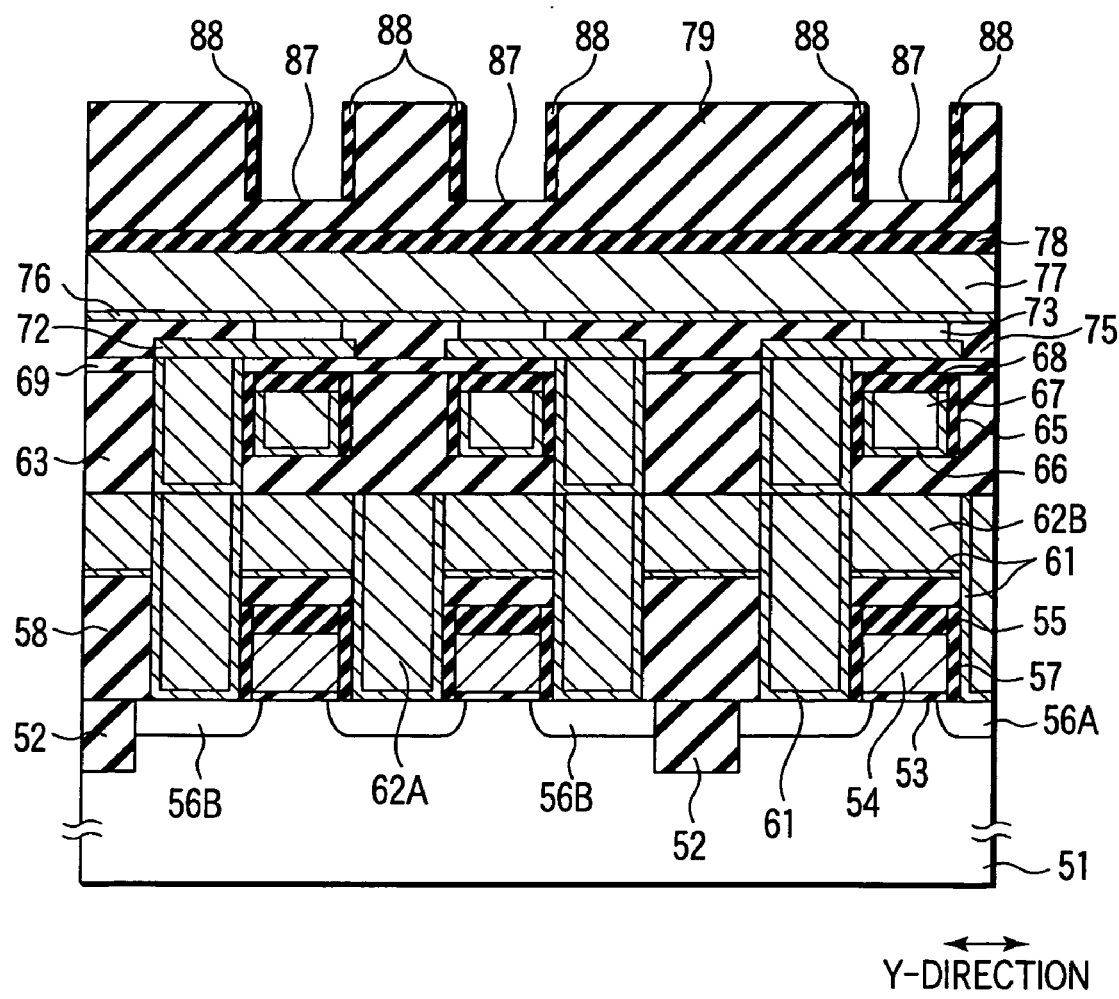
FIG. 64 is a sectional view showing one step of the manufacturing method of the present invention.

Next, as shown in FIG. 64, interconnection trenches 87 are formed in the dielectric interlayer 79. In this example, the interconnection trenches 87 serve as trenches used to form write word lines and extend in the X-direction. If the metal layer material is Cu, sidewall insulating layers (such as silicon nitride) are needed for preventing from Cu diffusion and corrosion are formed on the side surfaces of the interconnection trenches 87.

The interconnection trenches 87 can easily be formed by, e.g., forming a photoresist pattern on a dielectric interlayer 86 by PEP and etching the dielectric interlayer 86 by RIE using the photoresist pattern as a mask. After etching, the photoresist pattern is removed.

The sidewall insulating layers 88 can easily be formed by forming an insulating film (e.g., a silicon nitride film) on the entire surface of the dielectric interlayer 86 by CVD and etching the insulating film by RIE.

[13] Fourth Interconnection Layer Forming Step

Figure 65:
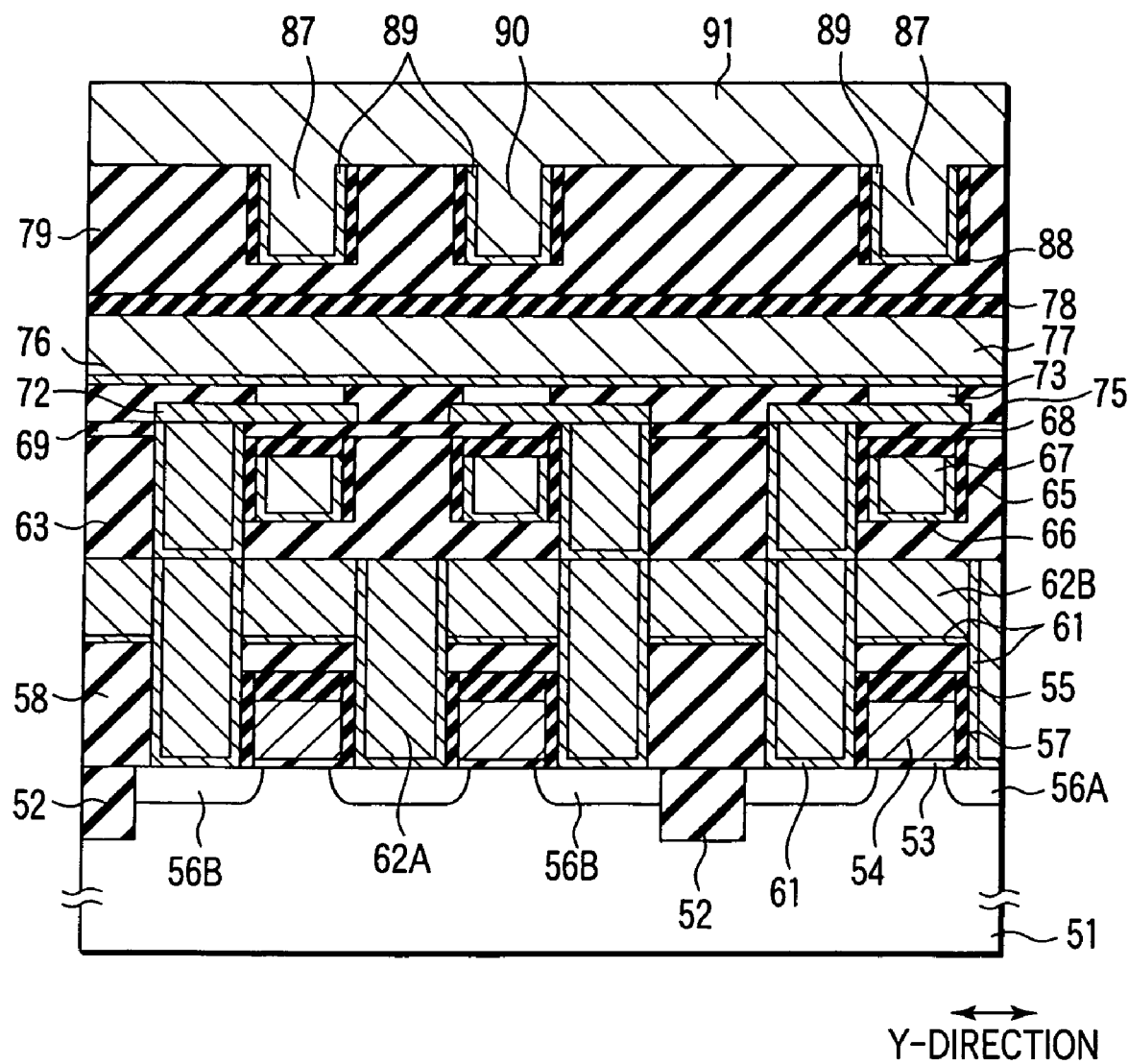
FIG. 65 is a sectional view showing one step of the manufacturing method of the present invention.

As shown in FIG. 65, a barrier metal layer (e.g., a multi-layer of Ta and TaN) 89 is formed on the dielectric interlayer 79, the inner surfaces of the interconnection trenches 87, and the sidewall insulating layers 88 by, e.g., sputtering. Subsequently, a metal layer (e.g., a Cu layer) 91 that completely fills the interconnection trenches 87 is formed on the barrier metal layer 89 by, e.g., sputtering or electroplating.

Figure 66:
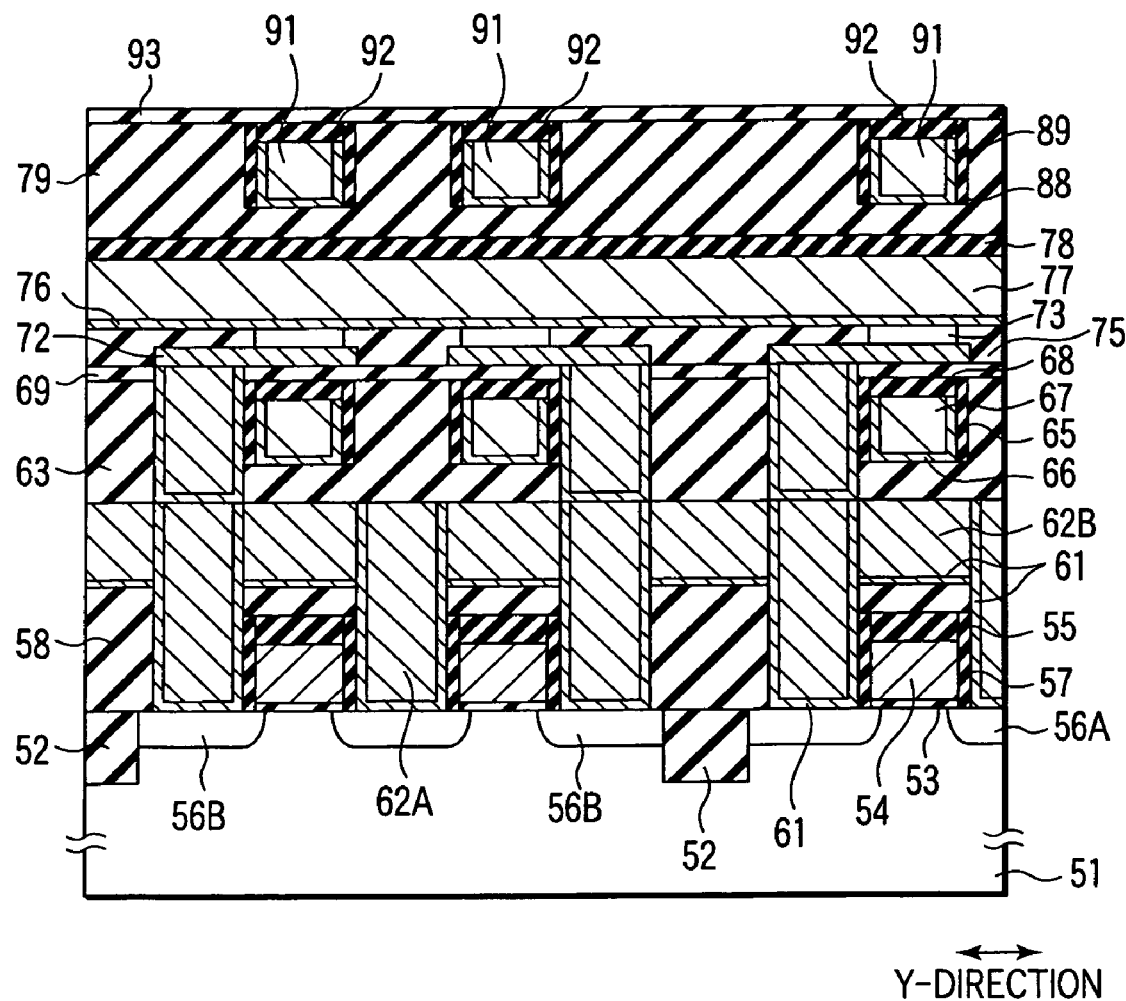
FIG. 66 is a sectional view showing one step of the manufacturing method of the present invention.

After that, as shown in FIG. 66, the metal layer 91 is polished by, e.g., CMP and left only in the interconnection trenches 87. The metal layer 91 remaining in each interconnection trench 87 forms a fourth interconnection layer that functions as a write word line.

An insulating layer (e.g., a silicon nitride layer) 92 is formed on the dielectric interlayer 86 by CVD. If needed, the insulating layer 92 is polished by CMP and left only on the metal layers 91 serving as the fourth interconnection layers. In addition, a dielectric interlayer (e.g., a silicon oxide layer) 93 that completely covers the metal layers 91 serving as the fourth interconnection layers is formed on the dielectric interlayer 86.

[14] Step of Forming Lower Electrode of Second MTJ Element

Figure 67:
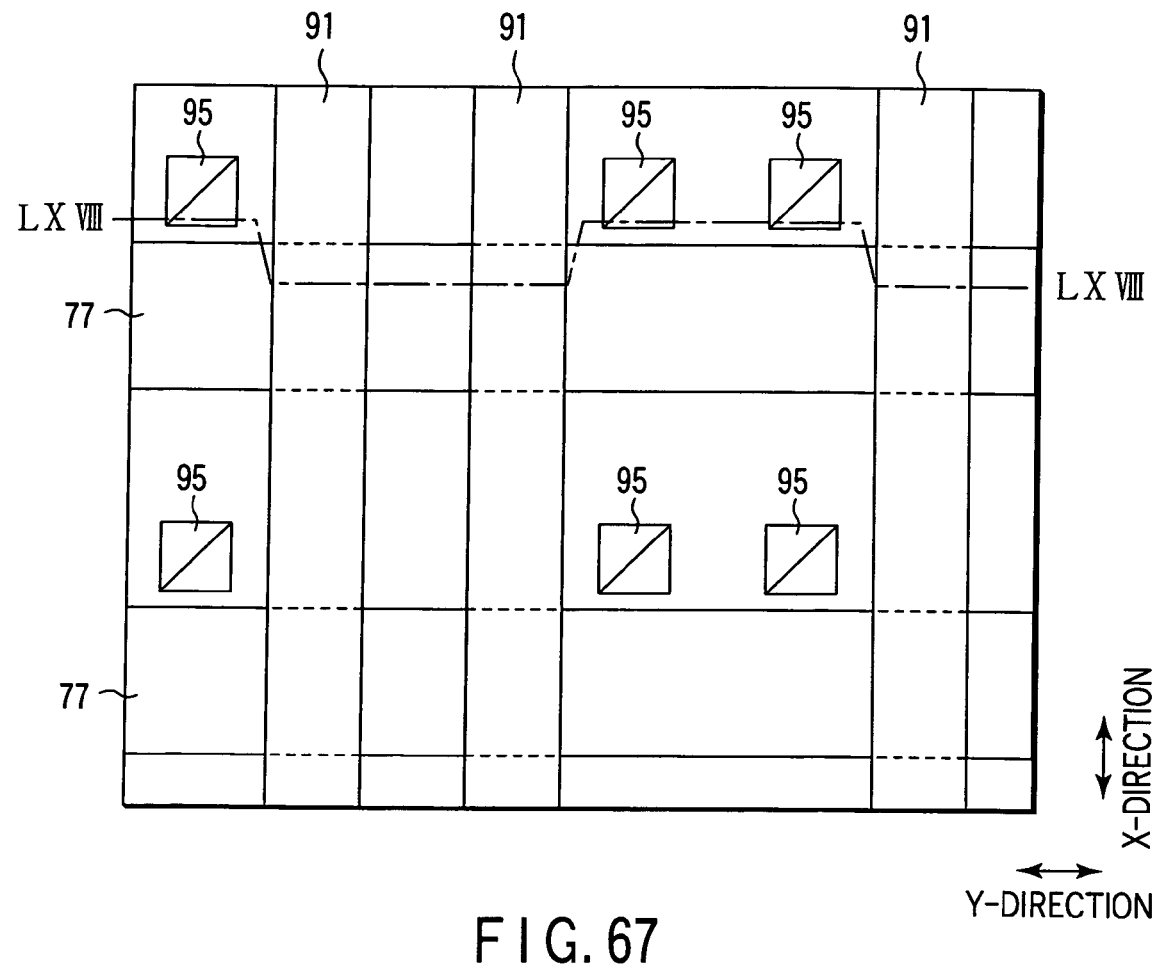
FIG. 67 is a plan view showing one step of the manufacturing method of the present invention.
Figure 68:
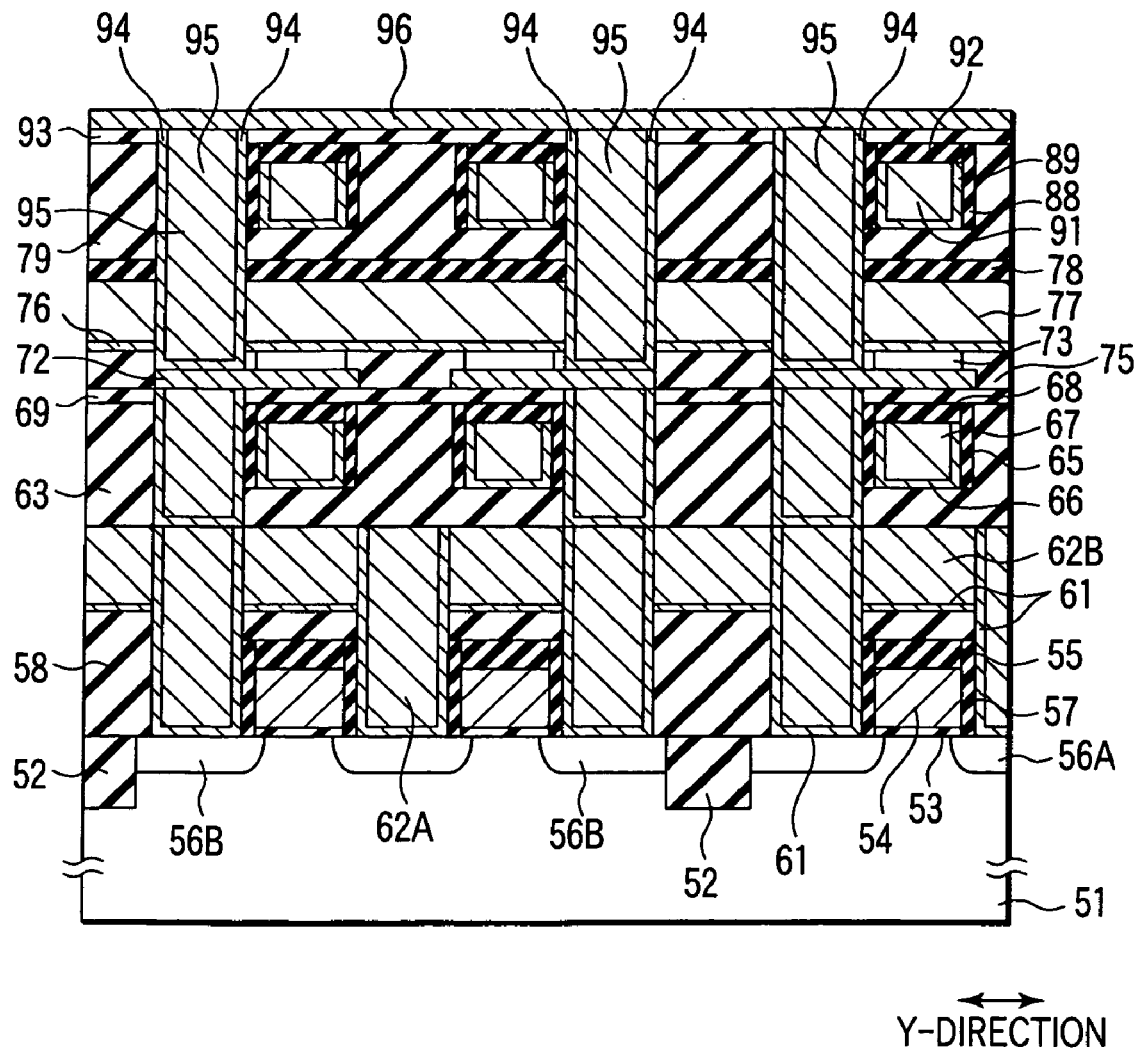
FIG. 68 is a sectional view taken along a line LXVIII—LXVIII in FIG. 67.

Next, as shown in FIGS. 67 and 68, contact holes that reach the lower electrodes 72 of the first MTJ elements are formed in the dielectric interlayers 79 and 93.

These contact holes can easily be formed by, e.g., forming a photoresist pattern on the dielectric interlayer 93 by PEP and etching the dielectric interlayers 79 and 93 by RIE using the photoresist pattern as a mask. After etching, the photoresist pattern is removed.

In addition, a barrier metal layer (e.g., a multi-layer of Ti and TiN) 94 is formed on the inner surfaces of the contact holes by, e.g., sputtering. Subsequently, a metal layer (e.g., a W layer) 95 that completely fills the contact holes is formed on the barrier metal layer 94 by, e.g., sputtering.

After that, the metal layer 95 is polished by, e.g., CMP and left only in the contact holes. The metal layer 95 remaining in each contact hole forms a contact plug. In addition, metal layers (e.g., Ta layers) 96 serving as the lower electrodes of the second MTJ elements are formed on the dielectric interlayer 93 by sputtering.

[15] Second MTJ Element Forming Step

Figure 69:
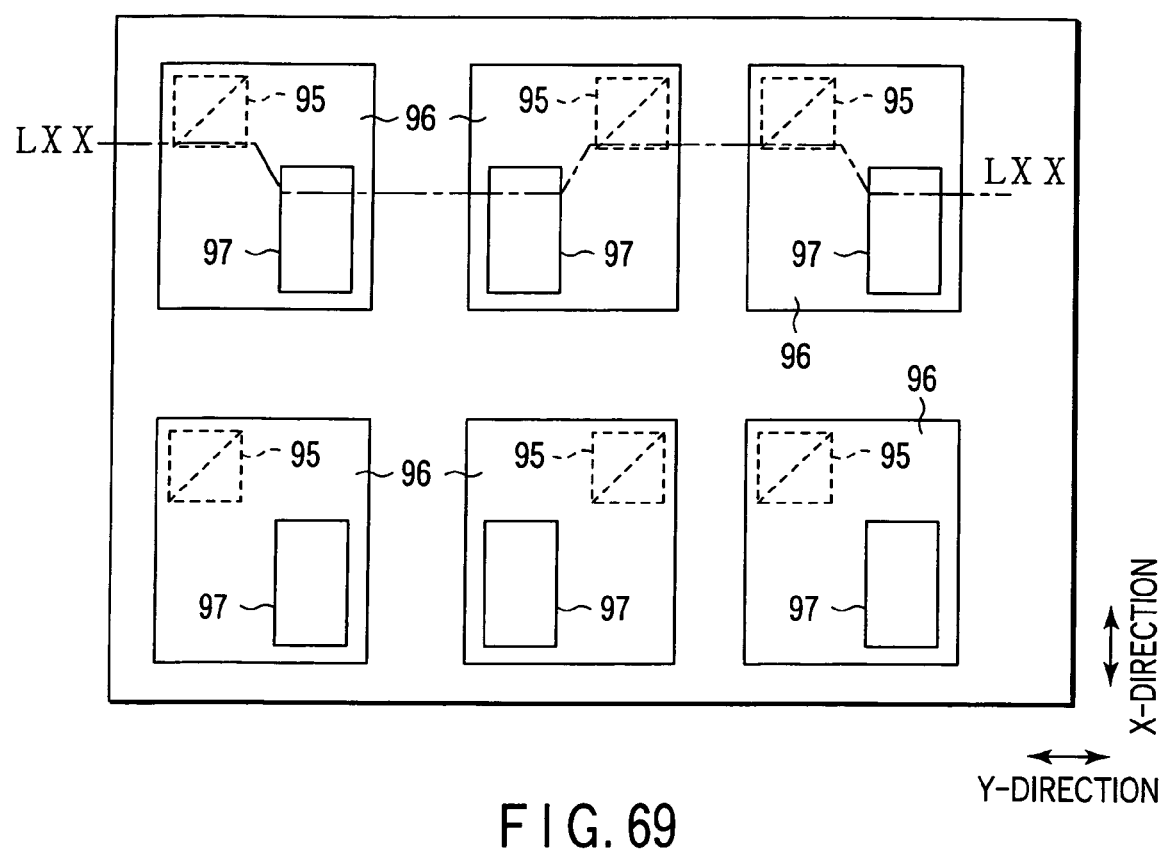
FIG. 69 is a plan view showing one step of the manufacturing method of the present invention.
Figure 70:
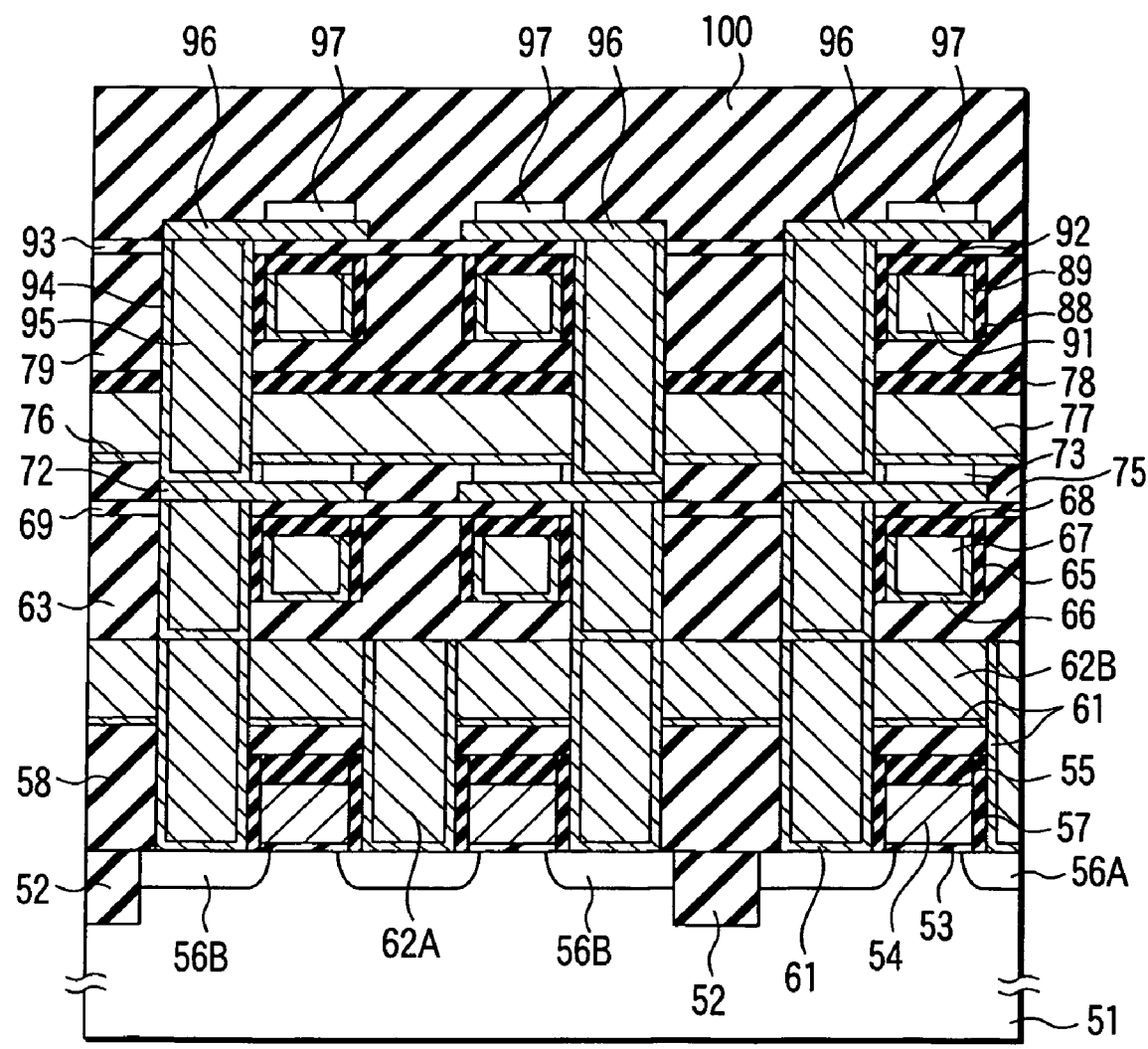
FIG. 70 is a sectional view taken along a line LXX—LXX in FIG. 69.

As shown in FIGS. 69 and 70, second MTJ elements 97 are formed on the metal layers 96. Each second MTJ element 97 has, as its main portion, a tunneling barrier and two ferromagnetic layers that sandwich the tunneling barrier, and has, e.g., the structure as shown in FIG. 7.

The lower electrodes 96 of the second MTJ elements 97 are patterned.

The lower electrodes 96 of the second MTJ elements 97 can easily be patterned by forming a photoresist pattern on the lower electrodes 96 by PEP and etching the lower electrodes 96 by RIE using the photoresist pattern as a mask. Then, the photoresist pattern is removed.

After that, a dielectric interlayer 100 that completely covers the second MTJ elements 97 is formed by CVD.

[16] Interconnection Trench Forming Step

Figure 71:
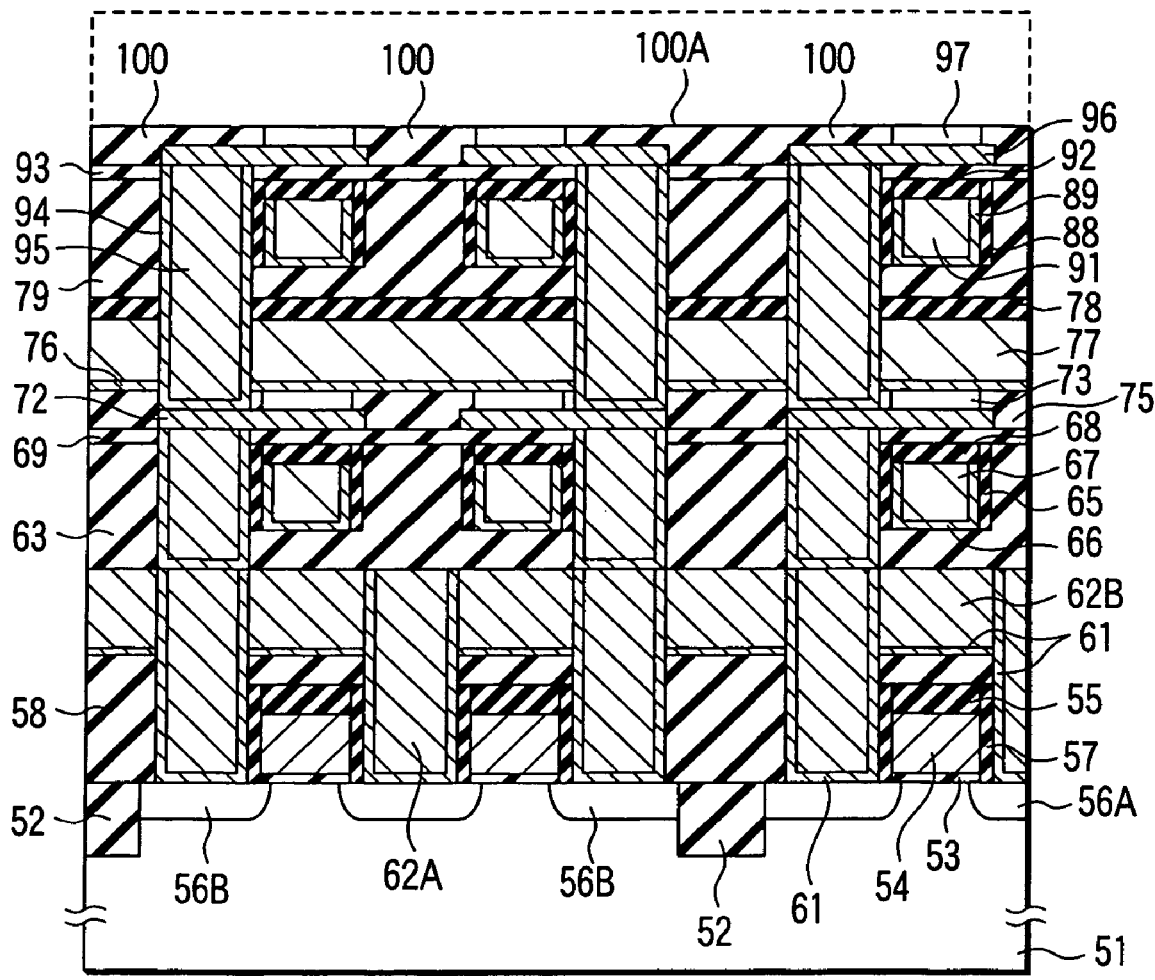
FIG. 71 is a sectional view showing one step of the manufacturing method of the present invention.

As shown in FIG. 71, interconnection trenches 100A are formed in the dielectric interlayer 100. In this example, the interconnection trenches 100A serve as trenches used to form read/write bit lines and extend in the Y-direction. If the metal layer material is Cu, sidewall insulating layers (such as silicon nitride) are needed for preventing from Cu diffusion and corrosion are formed on the side surfaces of the interconnection trenches 10A.

The interconnection trenches 100A can easily be formed by, e.g., forming a photoresist pattern on the dielectric interlayer 100 by PEP and etching the dielectric interlayer 100 by RIE using the photoresist pattern as a mask. After etching, the photoresist pattern is removed.

The sidewall insulating layers can easily be formed by forming an insulating film (e.g., a silicon nitride film) on the entire surface of the dielectric interlayer 100 by CVD and etching the insulating film by RIE.

[17] Fifth Interconnection Layer Forming Step

Figure 72:
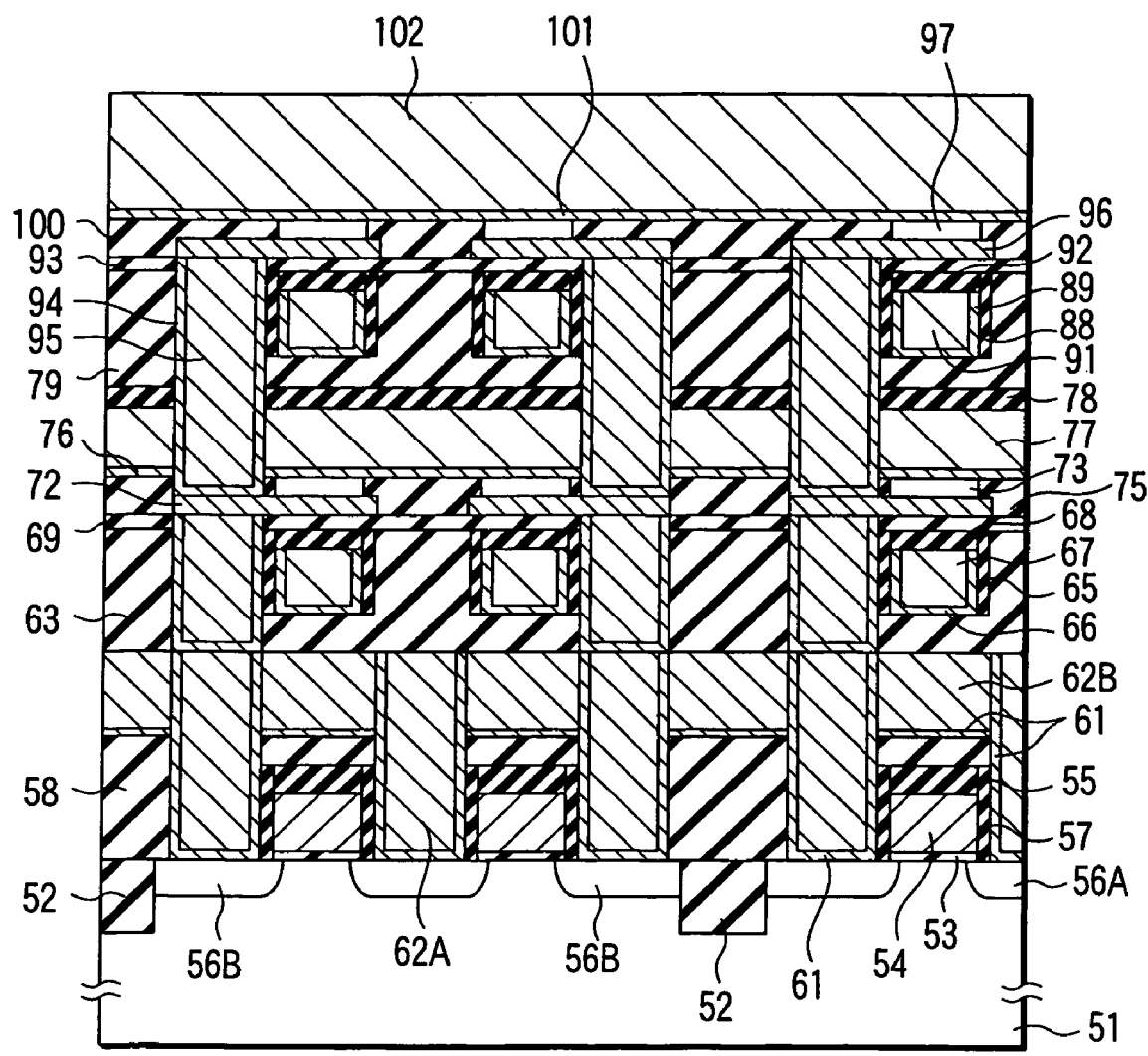
FIG. 72 is a sectional view showing one step of the manufacturing method of the present invention.

As shown in FIG. 72, a barrier metal layer (e.g., a multi-layer of Ta and TaN) 101 is formed on the dielectric interlayer 100, the inner surfaces of the interconnection trenches 100A, and the sidewall insulating layers by, e.g., sputtering. Subsequently, a metal layer (e.g., a Cu layer) 102 that completely fills the interconnection trenches 100A is formed on the barrier metal layer 101 by, e.g., sputtering or electroplating.

Figure 73:
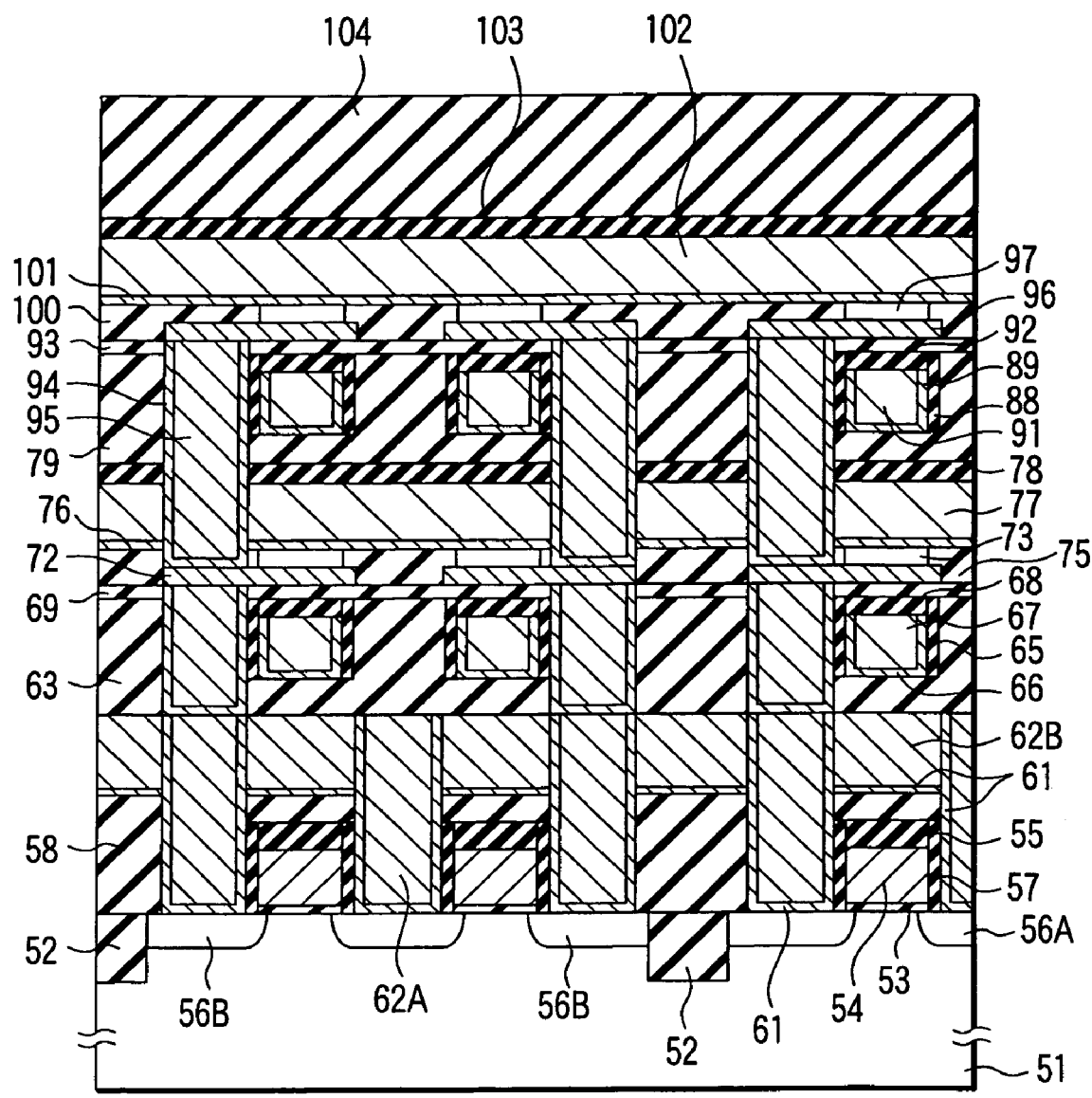
FIG. 73 is a sectional view showing one step of the manufacturing method of the present invention.

After that, as shown in FIG. 73, the metal layer 102 is polished by, e.g., CMP and left only in the interconnection trenches 100A. The metal layer 102 remaining in each interconnection trench 100A forms a fifth interconnection layer that functions as a read/write bit line.

An insulating layer (e.g., a silicon nitride layer) 103 is formed on the dielectric interlayer 100 by CVD. If needed, the insulating layer 103 is polished by CMP and left only on the metal layers 102 serving as the fifth interconnection layers. In addition, a dielectric interlayer (e.g., a silicon oxide layer) 104 that completely covers the metal layers 102 serving as the fifth interconnection layers is formed on the dielectric interlayer 100.

[18] Interconnection Trench Forming Step

Figure 74:
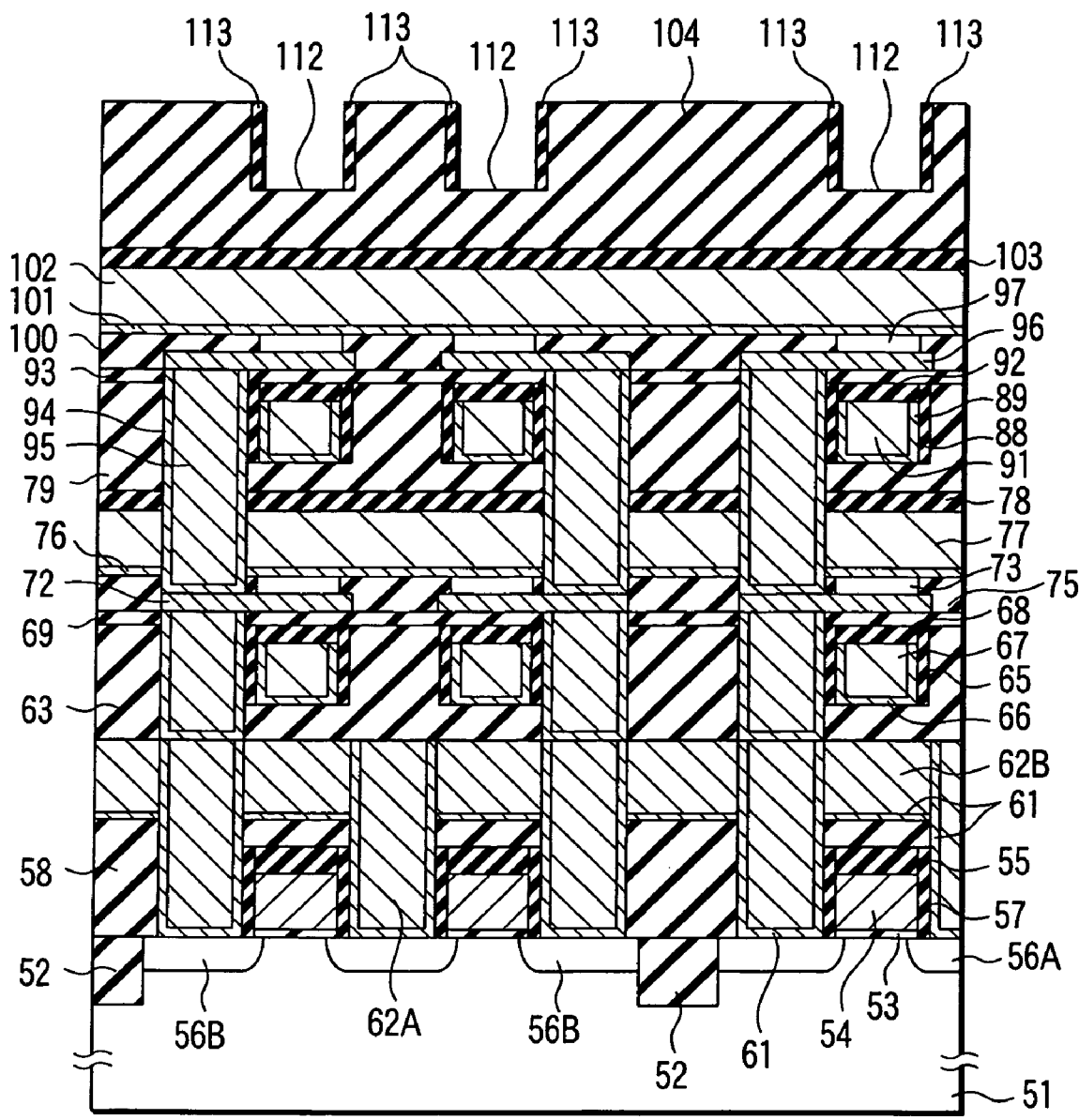
FIG. 74 is a sectional view showing one step of the manufacturing method of the present invention.

Next, as shown in FIG. 74, interconnection trenches 112 are formed in the dielectric interlayer 104. In this example, the interconnection trenches 112 serve as trenches used to form write word lines and extend in the X-direction. If the metal layer material is Cu, sidewall insulating layers (such as silicon nitride) are needed for preventing from Cu diffusion and corrosion are formed on the side surfaces of the interconnection trenches 112.

The interconnection trenches 112 can easily be formed by, e.g., forming a photoresist pattern on the dielectric interlayer 104 by PEP and etching the dielectric interlayer 104 by RIE using the photoresist pattern as a mask. After etching, the photoresist pattern is removed.

The sidewall insulating layers 113 can easily be formed by forming an insulating film (e.g., a silicon nitride film) on the entire surface of the dielectric interlayer 104 by CVD and etching the insulating film by RIE.

[19] Sixth Interconnection Layer Forming Step

Figure 75:
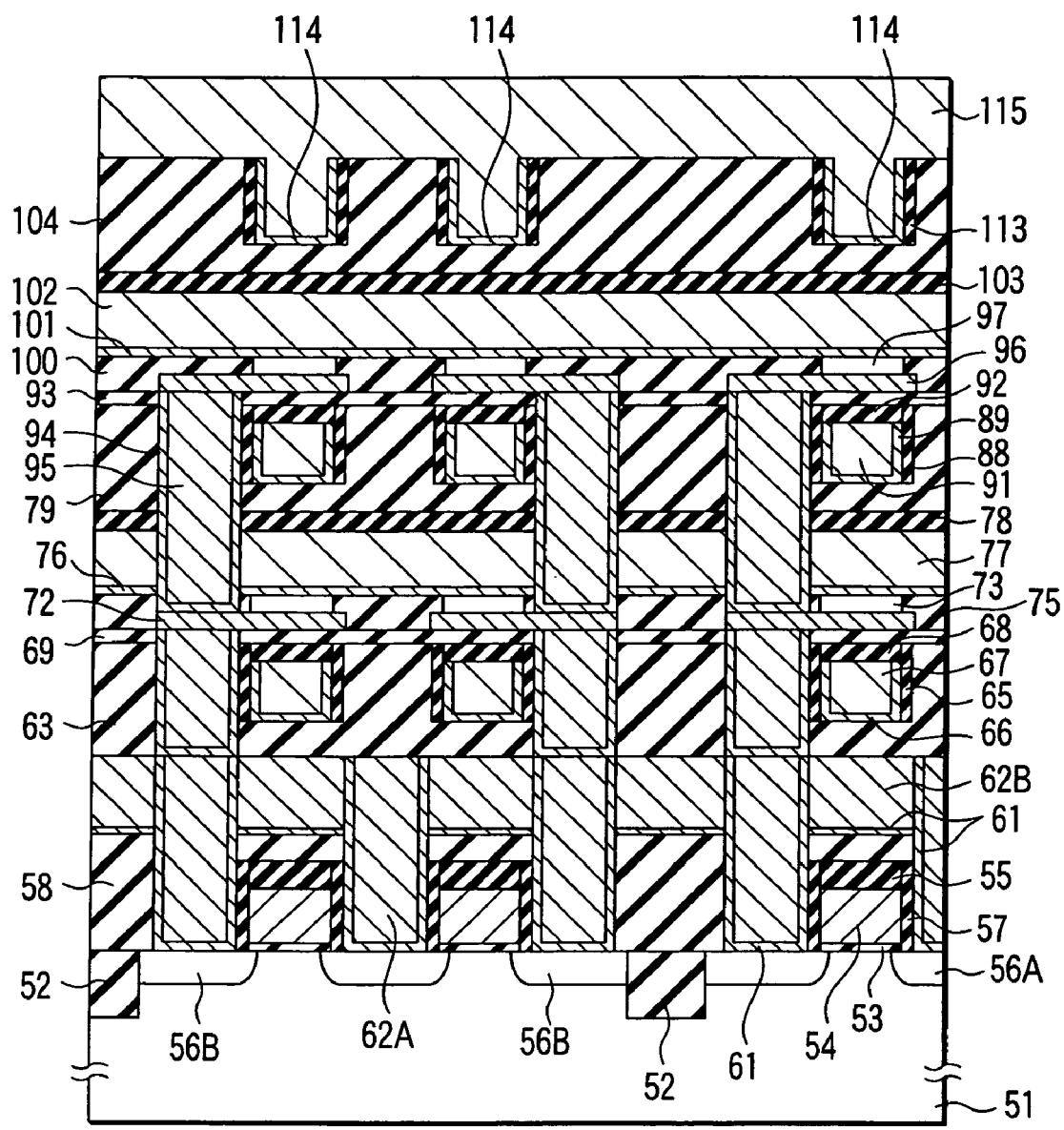
FIG. 75 is a sectional view showing one step of the manufacturing method of the present invention.

As shown in FIG. 75, a barrier metal layer (e.g., a multi-layer of Ta and TaN) 114 is formed on the dielectric interlayer 104, the inner surfaces of the interconnection trenches 112, and the sidewall insulating layers 113 by, e.g., sputtering. Subsequently, a metal layer (e.g., a Cu layer) 115 that completely fills the interconnection trenches 112 is formed on the barrier metal layer 114 by, e.g., sputtering or electroplating.

Figure 76:
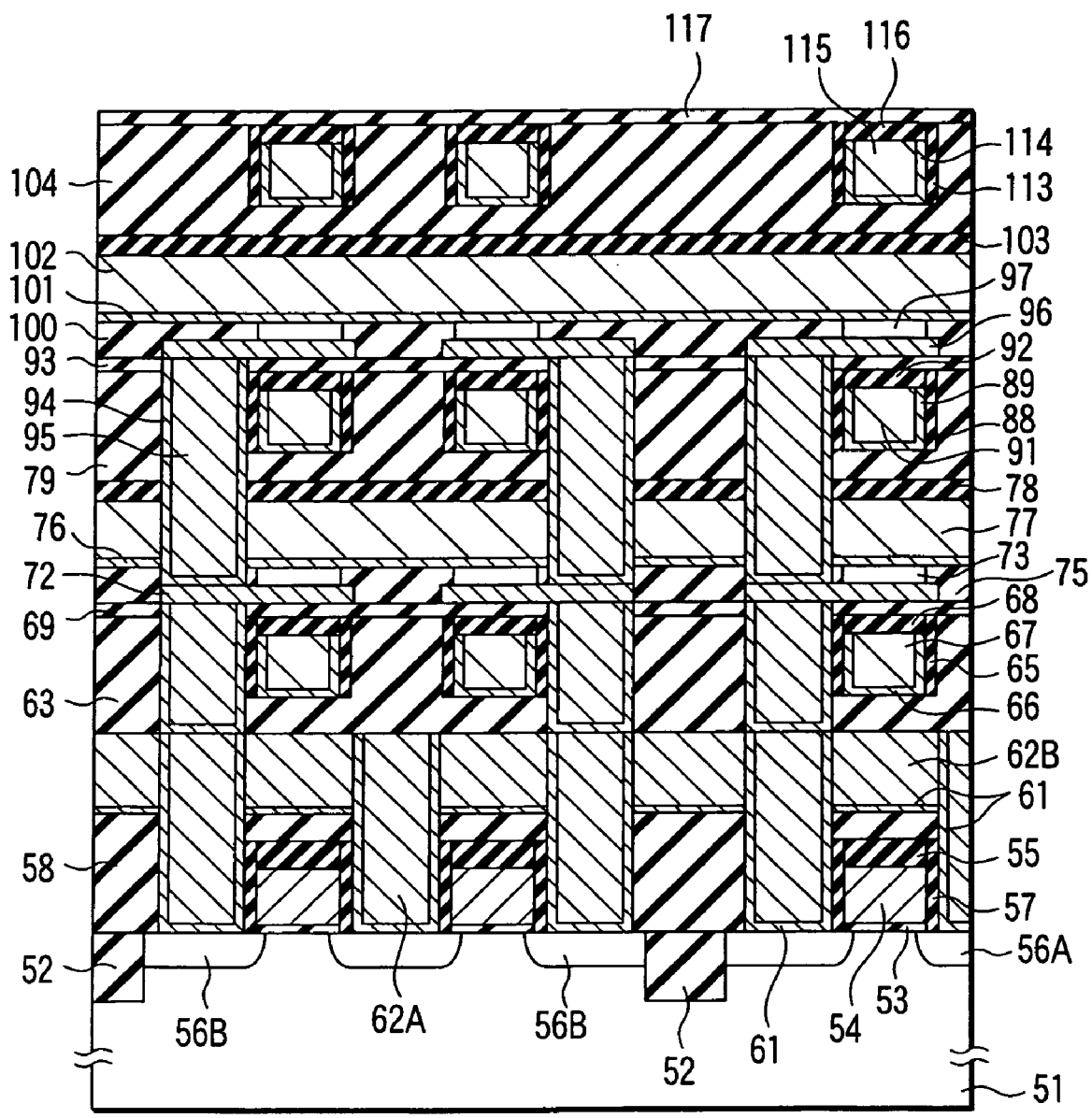
FIG. 76 is a sectional view showing one step of the manufacturing method of the present invention.

After that, as shown in FIG. 76, the metal layer 115 is polished by, e.g., CMP and left only in the interconnection trenches 112. The metal layer 115 remaining in each interconnection trench 112 forms a sixth interconnection layer that functions as a write word line.

An insulating layer (e.g., a silicon nitride layer) 116 is formed on the dielectric interlayer 104 by CVD. If needed, the insulating layer 116 is polished by CMP and left only on the metal layers 115 serving as the sixth interconnection layers. In addition, a dielectric interlayer (e.g., a silicon oxide layer) 117 that completely covers the metal layers 115 serving as the sixth interconnection layers is formed on the dielectric interlayer 104.

[20] Step of Forming Lower Electrode of Third MTJ Element

Figure 77:
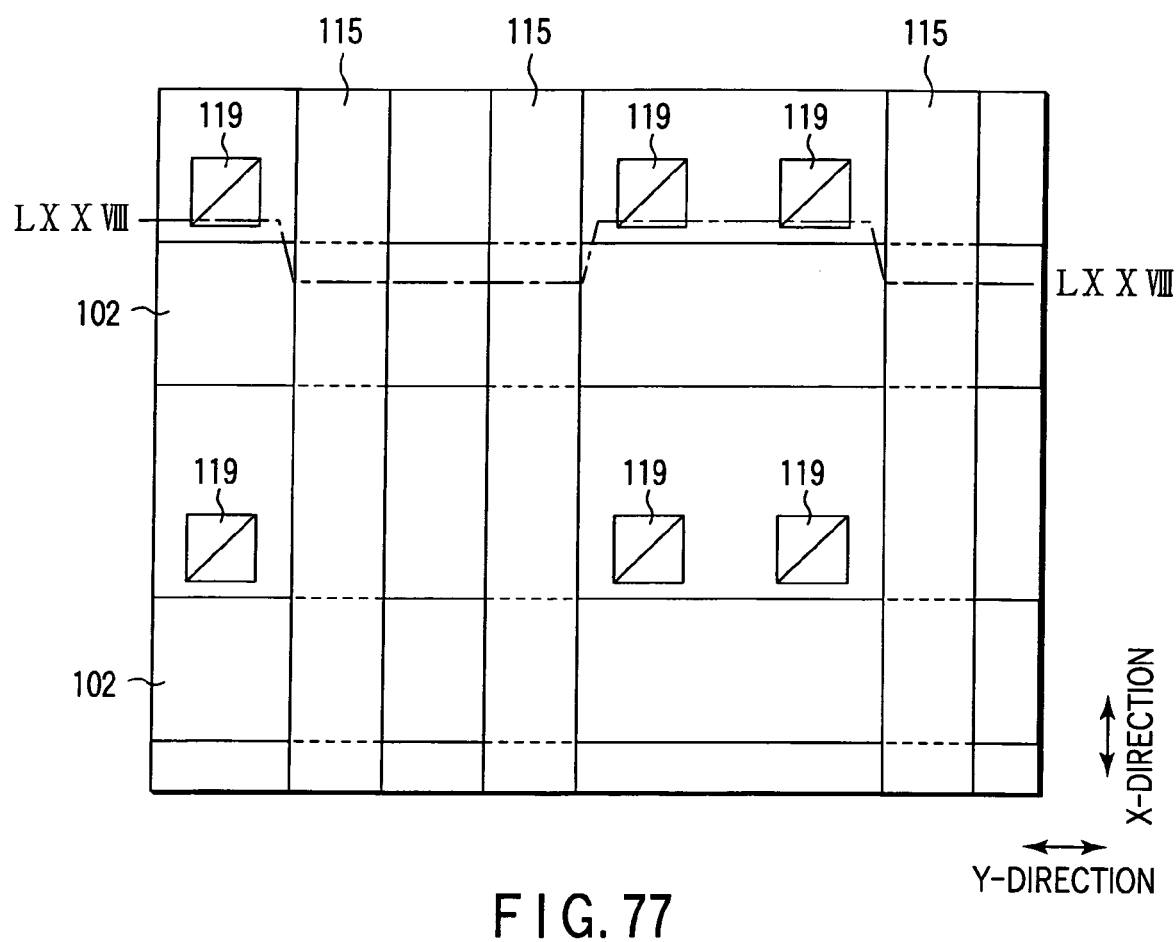
FIG. 77 is a plan view showing one step of the manufacturing method of the present invention.
Figure 78:
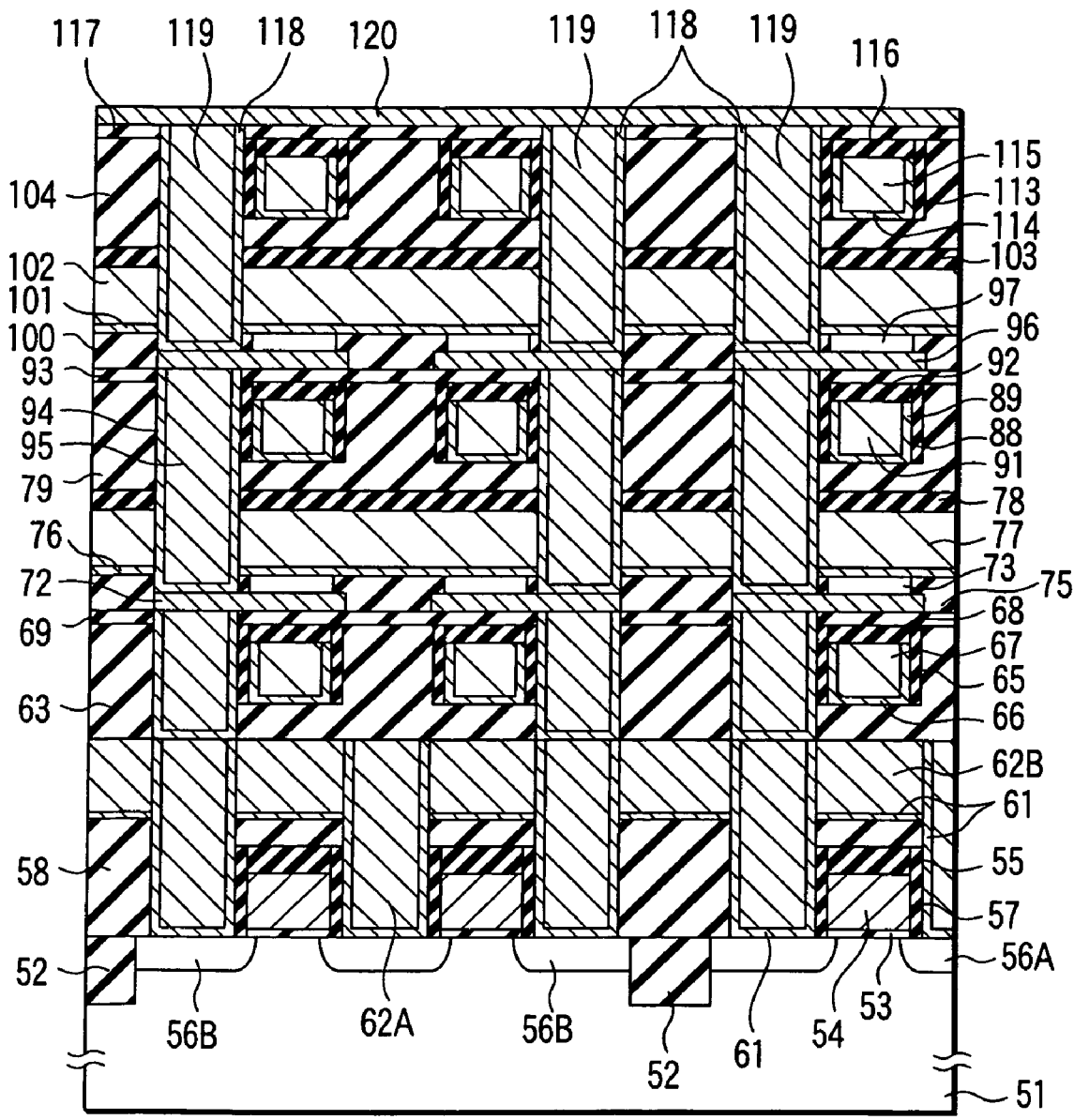
FIG. 78 is a sectional view taken along a line LXXVIII—LXXVIII in FIG. 77.

Next, as shown in FIGS. 77 and 78, contact holes that reach the lower electrodes 96 of the second MTJ elements are formed in the dielectric interlayers 100 and 104.

These contact holes can easily be formed by, e.g., forming a photoresist pattern on the dielectric interlayer 104 by PEP and etching the dielectric interlayers 100 and 104 by RIE using the photoresist pattern as a mask. After etching, the photoresist pattern is removed.

In addition, a barrier metal layer (e.g., a multi-layer of Ti and TiN) 118 is formed on the inner surfaces of the contact holes by, e.g., sputtering. Subsequently, a metal layer (e.g., a W layer) 119 that completely fills the contact holes is formed on the barrier metal layer 118 by, e.g., sputtering.

After that, the metal layer 119 is polished by, e.g., CMP and left only in the contact holes. The metal layer 119 remaining in each contact hole forms a contact plug. In addition, metal layers (e.g., Ta layers) 120 serving as the lower electrodes of the third MTJ elements are formed on the dielectric interlayer 117 by sputtering.

[21] Third MTJ Element Forming Step

Figure 79:
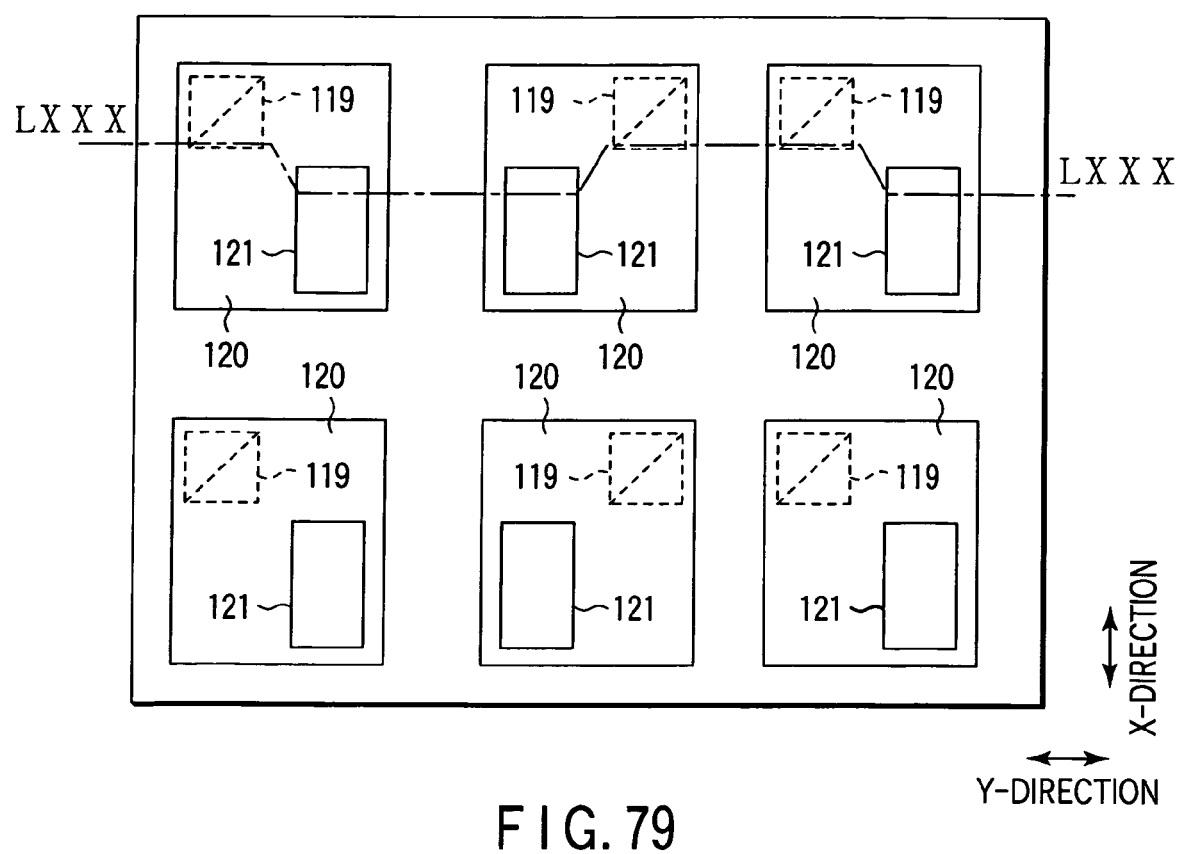
FIG. 79 is a plan view showing one step of the manufacturing method of the present invention.
Figure 80:
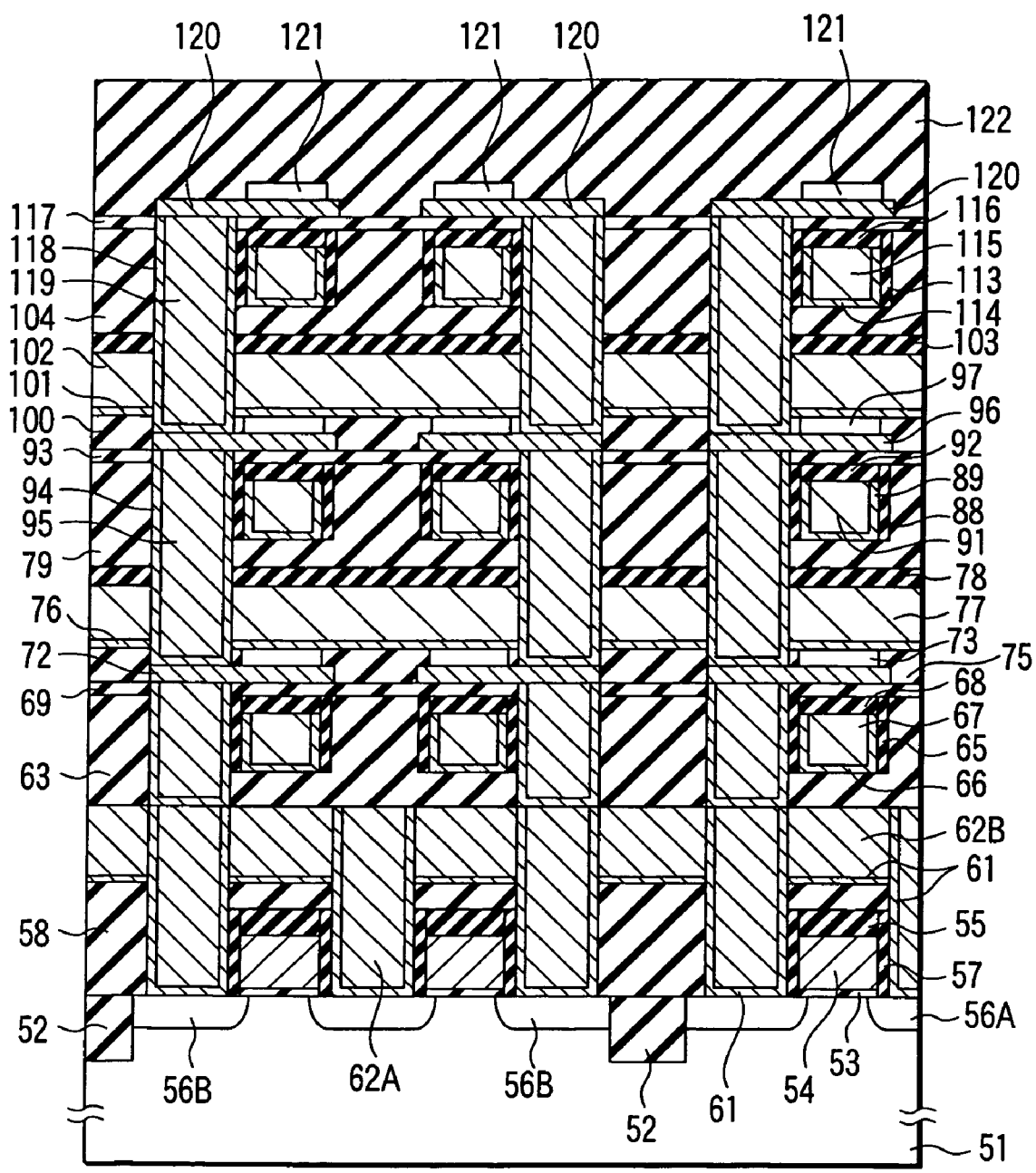
FIG. 80 is a sectional view taken along a line LXXX—LXXX in FIG. 79.

As shown in FIGS. 79 and 80, third MTJ elements 121 are formed on the metal layers 120. Each third MTJ element 121 has, as its main portion, a tunneling barrier and two ferromagnetic layers that sandwich the tunneling barrier, and has, e.g., the structure as shown in FIG. 7.

The lower electrodes 120 of the third MTJ elements 121 are patterned.

The lower electrodes 120 of the third MTJ elements 121 can easily be patterned by forming a photoresist pattern on the lower electrodes 120 by PEP and etching the lower electrodes 120 by RIE using the photoresist pattern as a mask. Then, the photoresist pattern is removed.

After that, a dielectric interlayer 122 that completely covers the third MTJ elements 121 is formed by CVD.

[22] Interconnection Trench Forming Step

Figure 81:
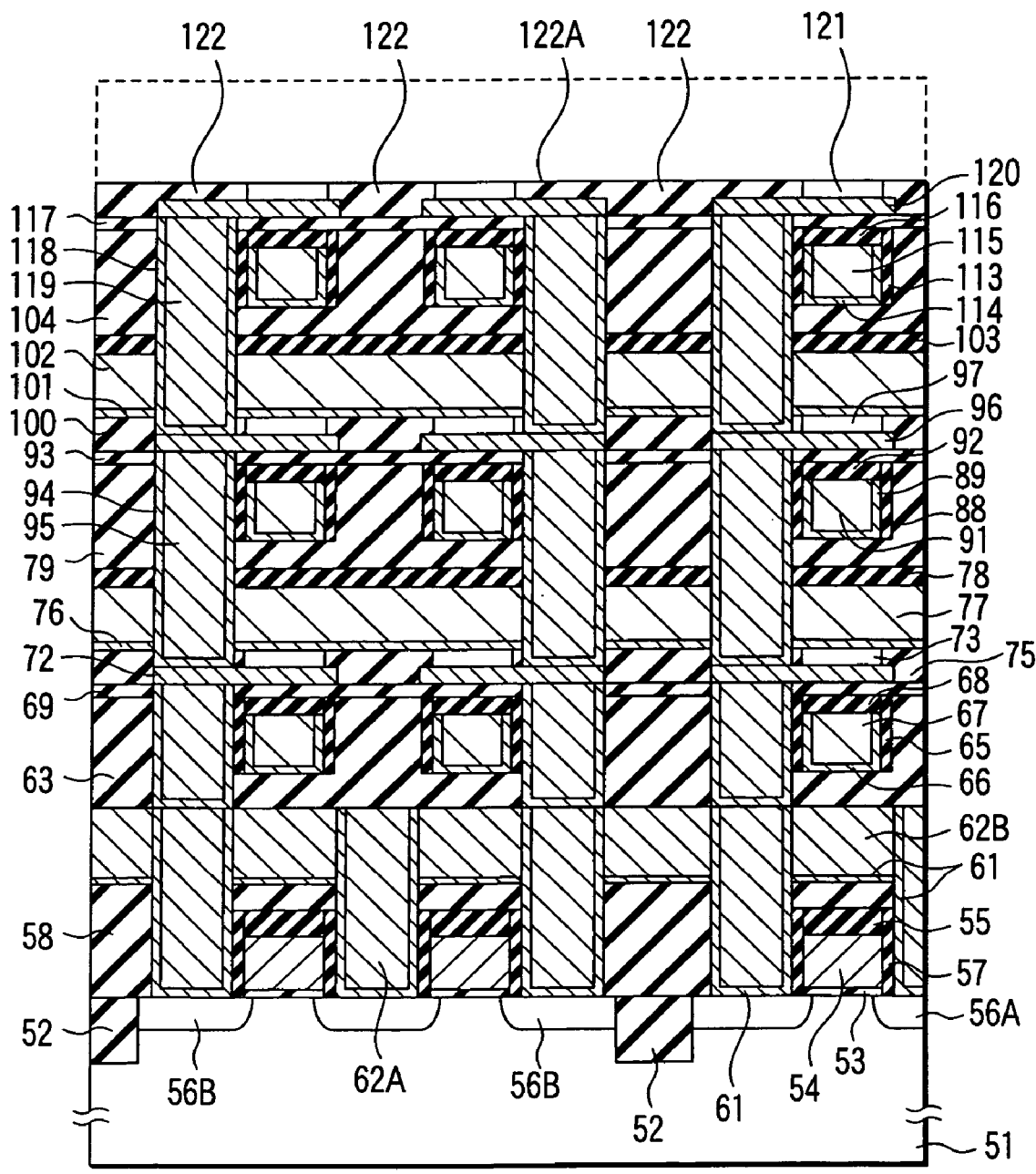
FIG. 81 is a sectional view showing one step of the manufacturing method of the present invention.

As shown in FIG. 81, interconnection trenches 122A are formed in the dielectric interlayer 122. In this example, the interconnection trenches 122A serve as trenches used to form read/write bit lines and extend in the Y-direction. If the metal layer material is Cu, sidewall insulating layers (such as silicon nitride) are needed for preventing from Cu diffusion and corrosion are formed on the side surfaces of the interconnection trenches 122A.

The interconnection trenches 122A can easily be formed by, e.g., forming a photoresist pattern on the dielectric interlayer 122 by PEP and etching the dielectric interlayer 122 by RIE using the photoresist pattern as a mask. After etching, the photoresist pattern is removed.

The sidewall insulating layers can easily be formed by forming an insulating film (e.g., a silicon nitride film) on the entire surface of the dielectric interlayer 122 by CVD and etching the insulating film by RIE.

[23] Seventh Interconnection Layer Forming Step

Figure 82:
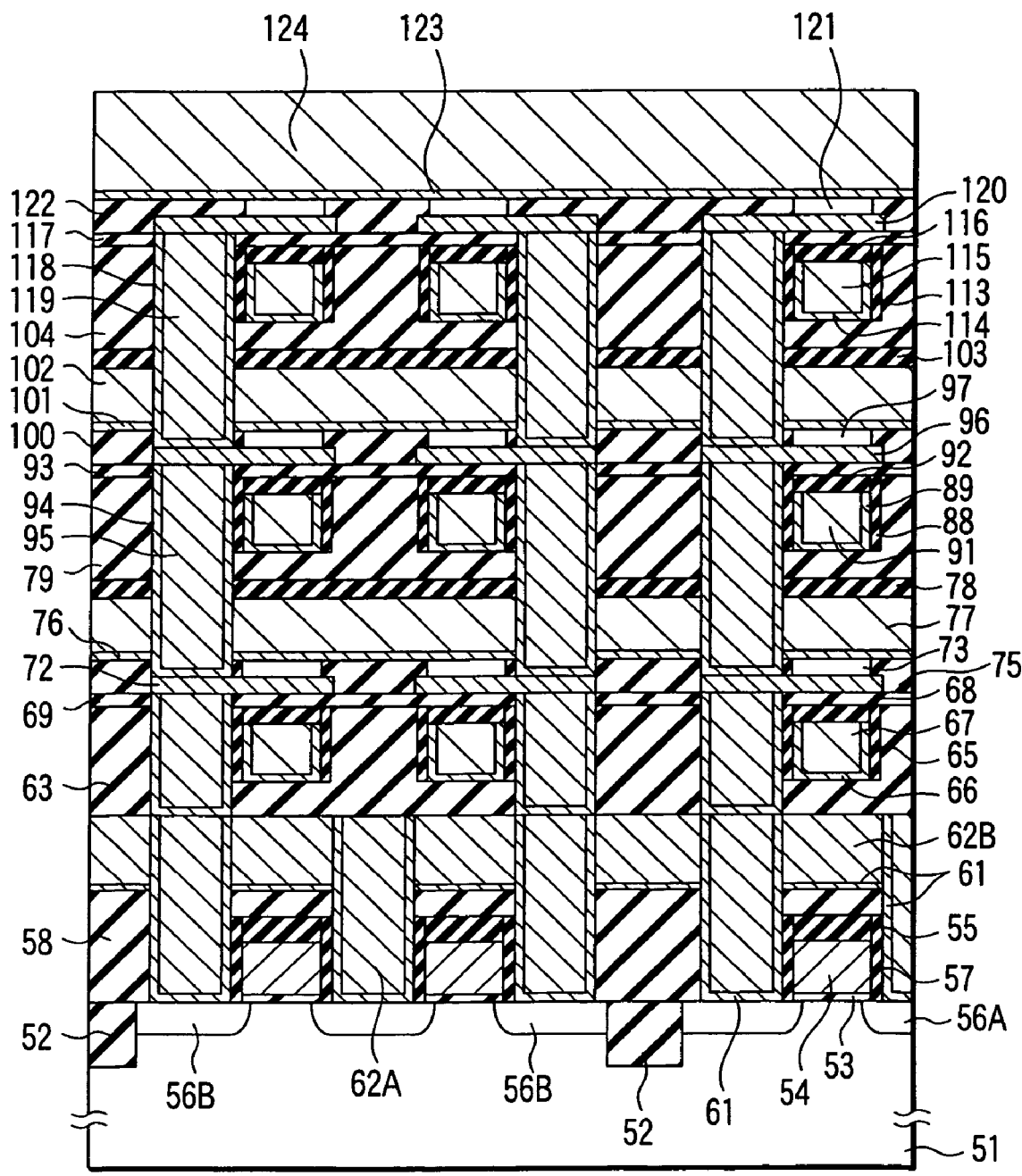
FIG. 82 is a sectional view showing one step of the manufacturing method of the present invention.

As shown in FIG. 82, a barrier metal layer (e.g., a multi-layer of Ta and TaN) 123 is formed on the dielectric interlayer 122, the inner surfaces of the interconnection trenches 122A, and the sidewall insulating layers by, e.g., sputtering. Subsequently, a metal layer (e.g., a Cu layer) 124 that completely fills the interconnection trenches 122A is formed on the barrier metal layer 123 by, e.g., sputtering or electroplating.

Figure 83:
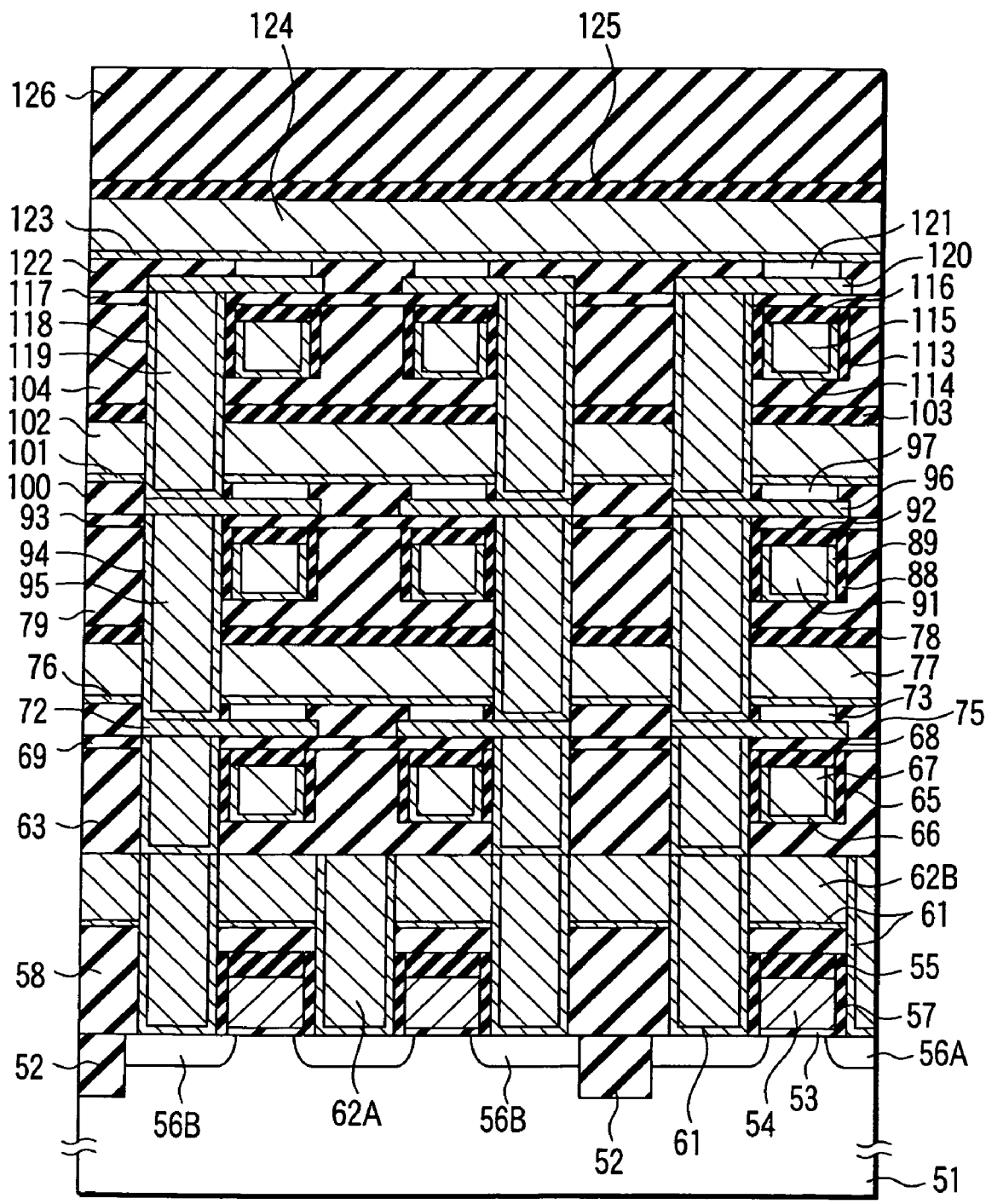
FIG. 83 is a sectional view showing one step of the manufacturing method of the present invention.

After that, as shown in FIG. 83, the metal layer 124 is polished by, e.g., CMP and left only in the interconnection trenches 122A. The metal layer 124 remaining in each interconnection trench 122A forms a seventh interconnection layer that functions as a read/write bit line.

An insulating layer (e.g., a silicon nitride layer) 125 is formed on the dielectric interlayer 122 by CVD. If needed, the insulating layer 125 is polished by CMP and left only on the metal layers 124 serving as the seventh interconnection layers. In addition, a dielectric interlayer (e.g., a silicon oxide layer) 126 that completely covers the metal layers 124 serving as the seventh interconnection layers is formed on the dielectric interlayer 122.

[24] Interconnection Trench Forming Step

Figure 84:
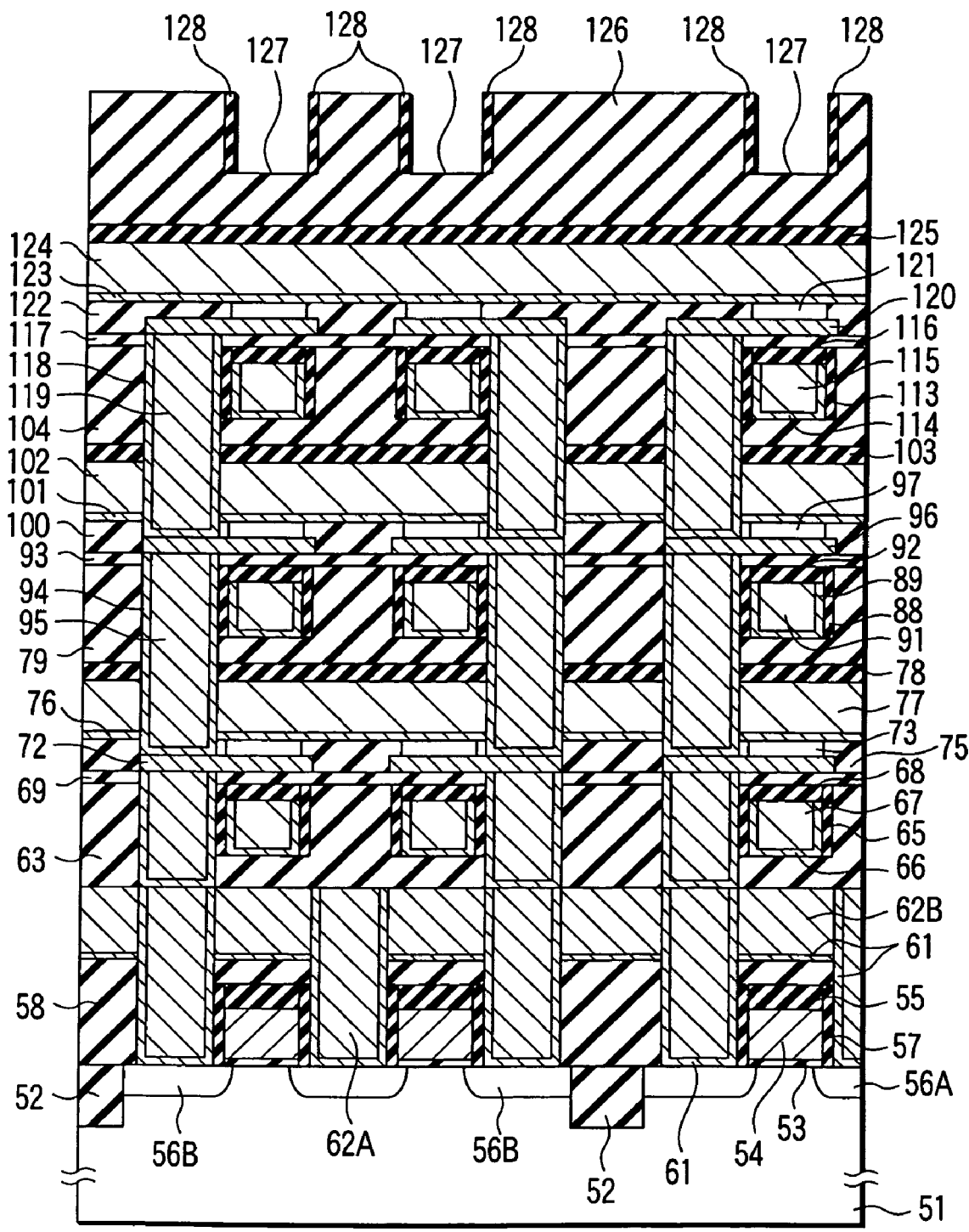
FIG. 84 is a sectional view showing one step of the manufacturing method of the present invention.

Next, as shown in FIG. 84, interconnection trenches 127 are formed in the dielectric interlayer 126. In this example, the interconnection trenches 127 serve as trenches used to form write word lines and extend in the X-direction. If the metal layer material is Cu, sidewall insulating layers (such as silicon nitride) are needed for preventing from Cu diffusion and corrosion are formed on the side surfaces of the interconnection trenches 127.

The interconnection trenches 127 can easily be formed by, e.g., forming a photoresist pattern on the dielectric interlayer 126 by PEP and etching the dielectric interlayer 126 by RIE using the photoresist pattern as a mask. After etching, the photoresist pattern is removed.

The sidewall insulating layers 128 can easily be formed by forming an insulating film (e.g., a silicon nitride film) on the entire surface of the dielectric interlayer 126 by CVD and etching the insulating film by RIE.

[25] Eighth Interconnection Layer Forming Step

Figure 85:
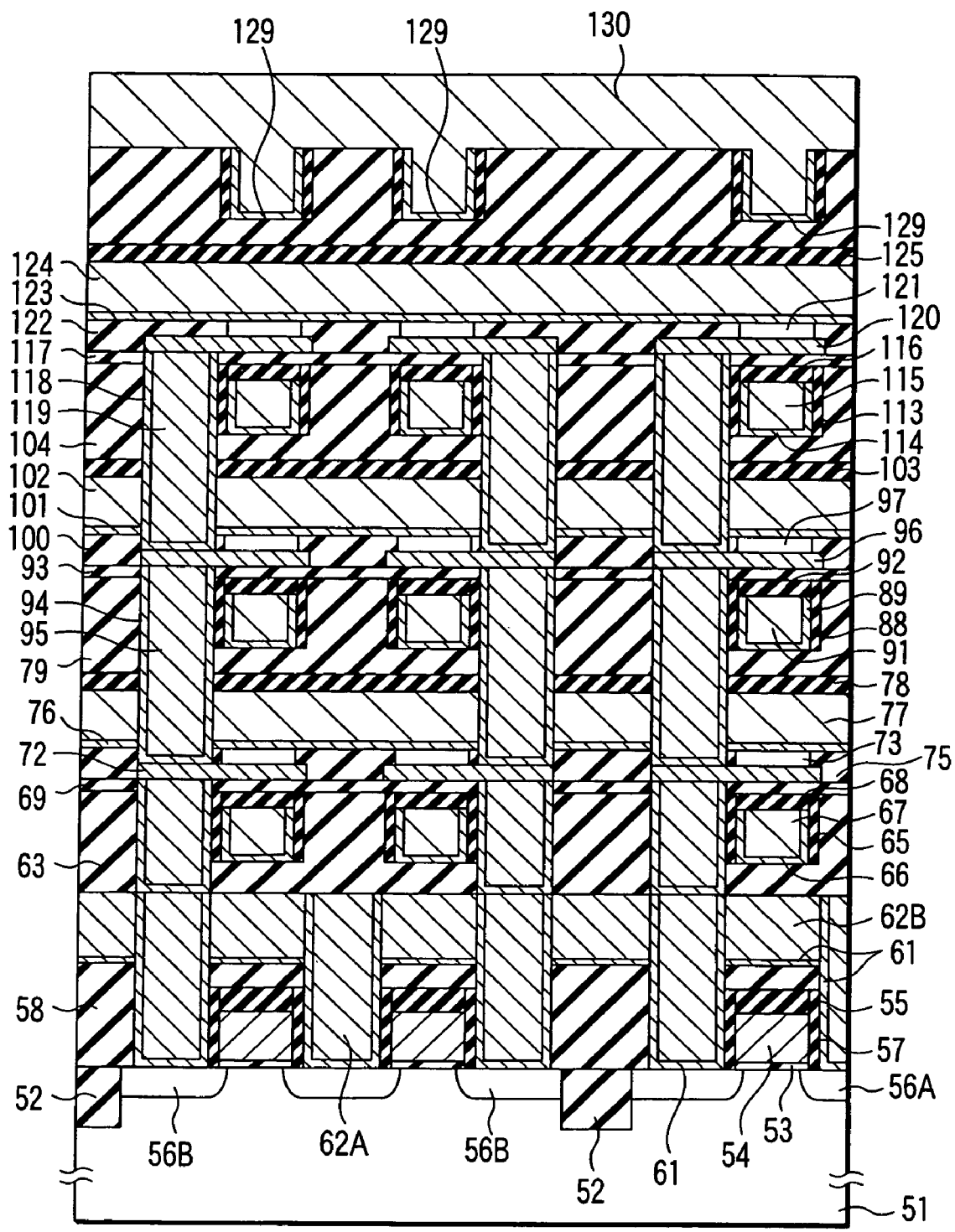
FIG. 85 is a sectional view showing one step of the manufacturing method of the present invention.

As shown in FIG. 85, a barrier metal layer (e.g., a multi-layer of Ta and TaN) 129 is formed on the dielectric interlayer 126, the inner surfaces of the interconnection trenches 127, and the sidewall insulating layers 128 by, e.g., sputtering. Subsequently, a metal layer (e.g., a Cu layer) 130 that completely fills the interconnection trenches 127 is formed on the barrier metal layer 129 by, e.g., sputtering or electroplating.

Figure 86:
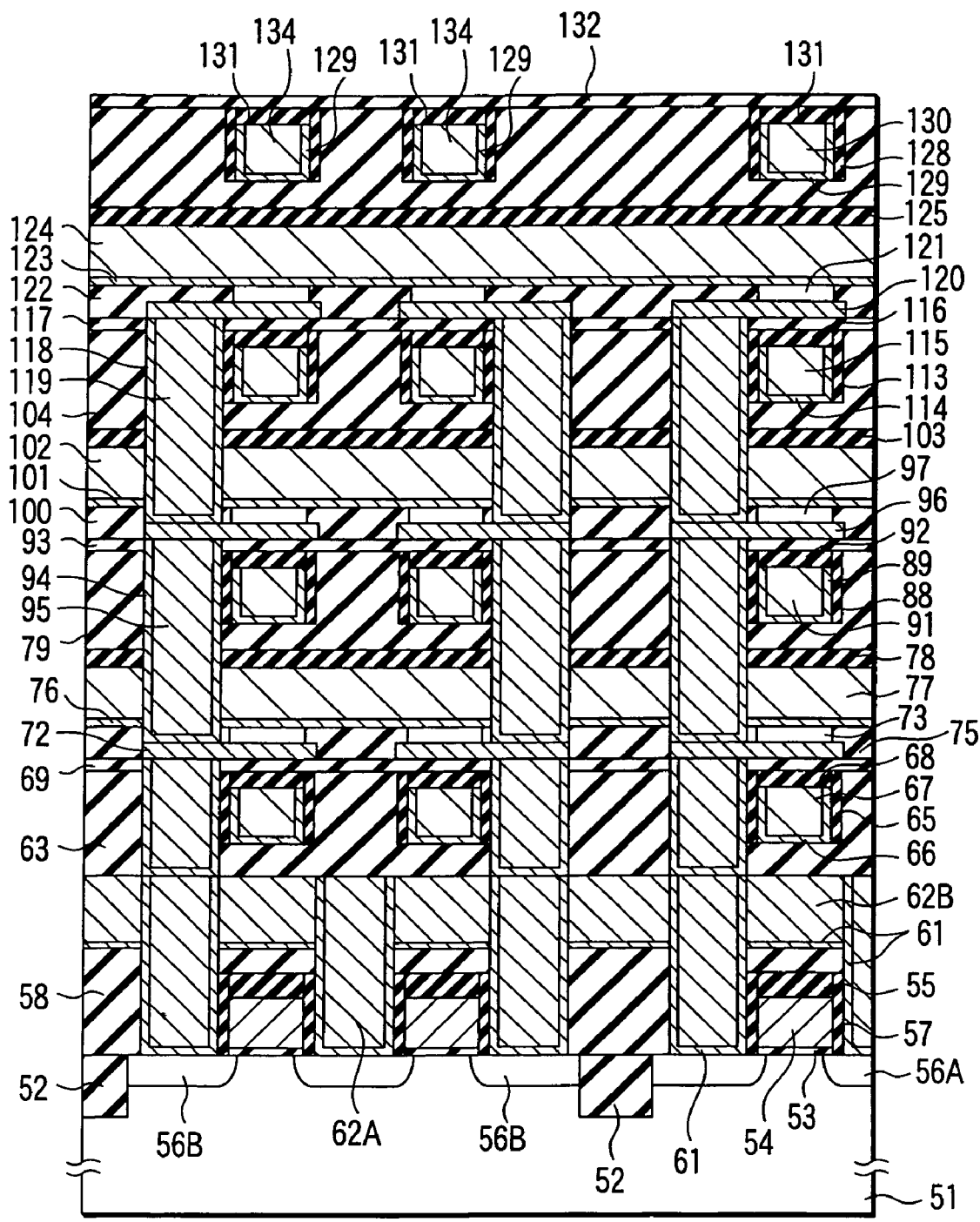
FIG. 86 is a sectional view showing one step of the manufacturing method of the present invention.

After that, as shown in FIG. 86, the metal layer 130 is polished by, e.g., CMP and left only in the interconnection trenches 127. The metal layer 130 remaining in each interconnection trench 127 forms an eighth interconnection layer that functions as a write word line.

An insulating layer (e.g., a silicon nitride layer) 131 is formed on the dielectric interlayer 126 by CVD. If needed, the insulating layer 131 is polished by CMP and left only on the metal layers 130 serving as the eighth interconnection layers. In addition, a dielectric interlayer (e.g., a silicon oxide layer) 132 that completely covers the metal layers 130 serving as the eighth interconnection layers is formed on the dielectric interlayer 126.

[26] Step of Forming Lower Electrode of Fourth MTJ Element

Figure 87:
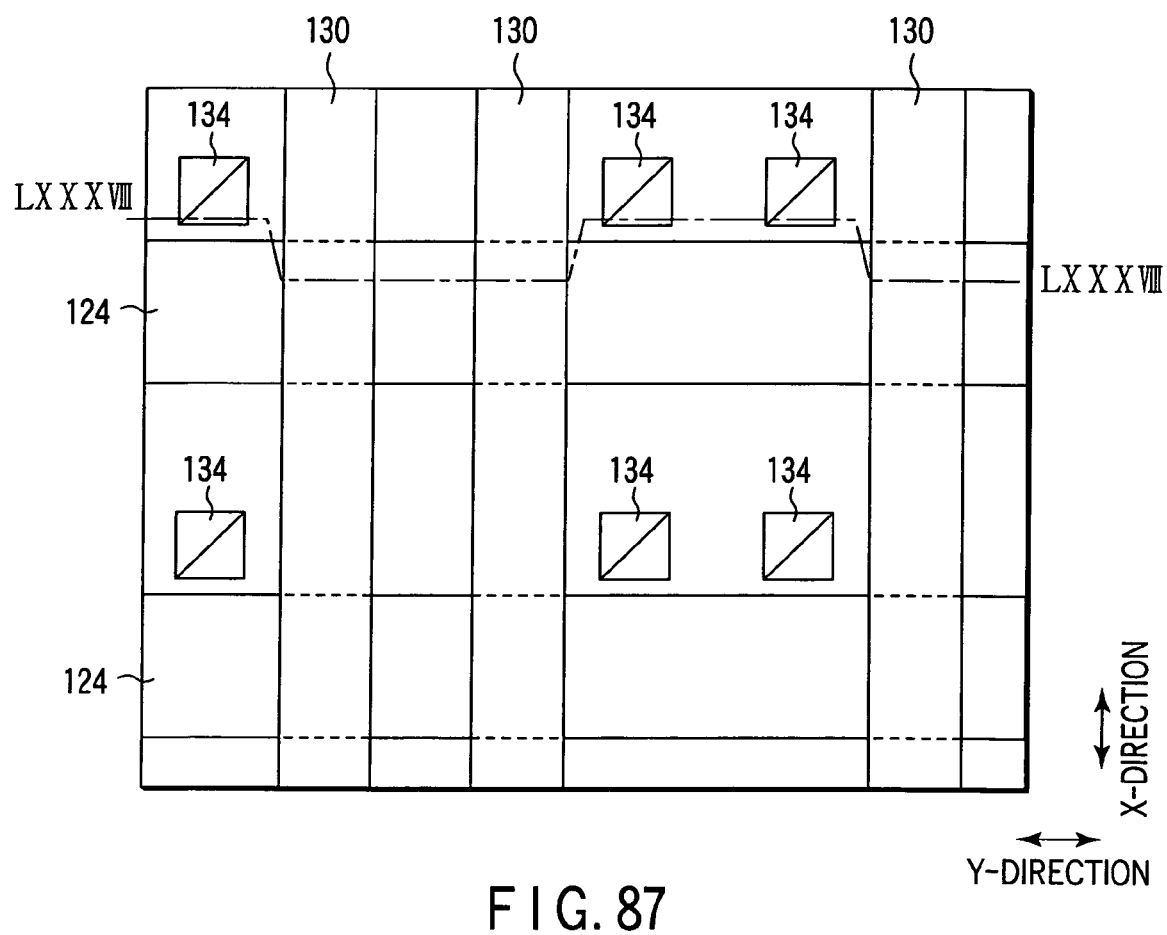
FIG. 87 is a plan view showing one step of the manufacturing method of the present invention.
Figure 88:
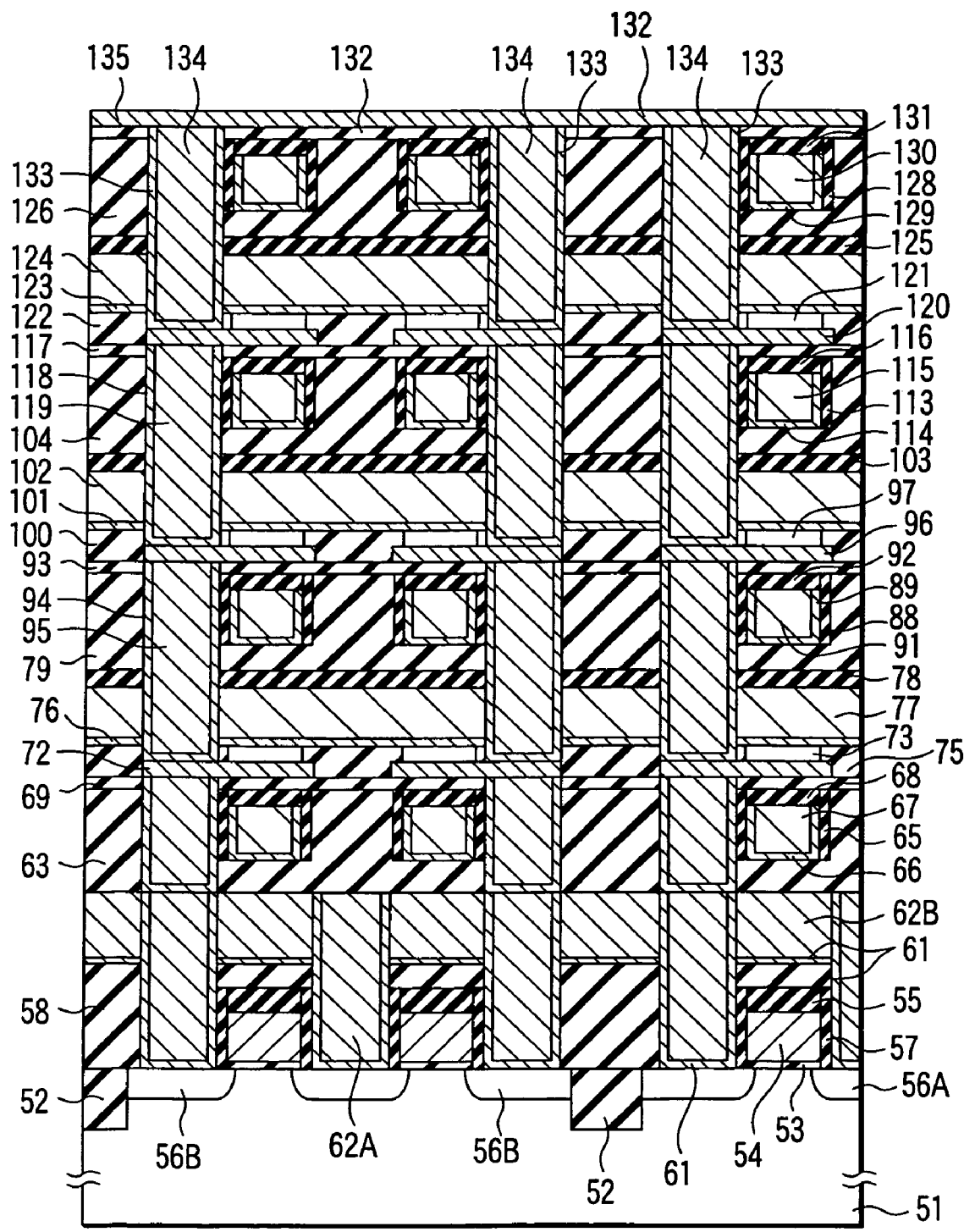
FIG. 88 is a sectional view taken along a line LXXXVIII—LXXXVIII in FIG. 87.

Next, as shown in FIGS. 87 and 88, contact holes that reach the lower electrodes 120 of the third MTJ elements are formed in the dielectric interlayers 122 and 126.

These contact holes can easily be formed by, e.g., forming a photoresist pattern on the dielectric interlayer 126 by PEP and etching the dielectric interlayers 122 and 126 by RIE using the photoresist pattern as a mask. After etching, the photoresist pattern is removed.

In addition, a barrier metal layer (e.g., a multi-layer of Ti and TiN) 133 is formed on the inner surfaces of the contact holes by, e.g., sputtering. Subsequently, a metal layer (e.g., a W layer) 134 that completely fills the contact holes is formed on the barrier metal layer 133 by, e.g., sputtering.

After that, the metal layer 134 is polished by, e.g., CMP and left only in the contact holes. The metal layer 134 remaining in each contact hole forms a contact plug. In addition, metal layers (e.g., Ta layers) 135 serving as the lower electrodes of the fourth MTJ elements are formed on the dielectric interlayer 132 by sputtering.

[27] Fourth MTJ Element Forming Step

Figure 89:
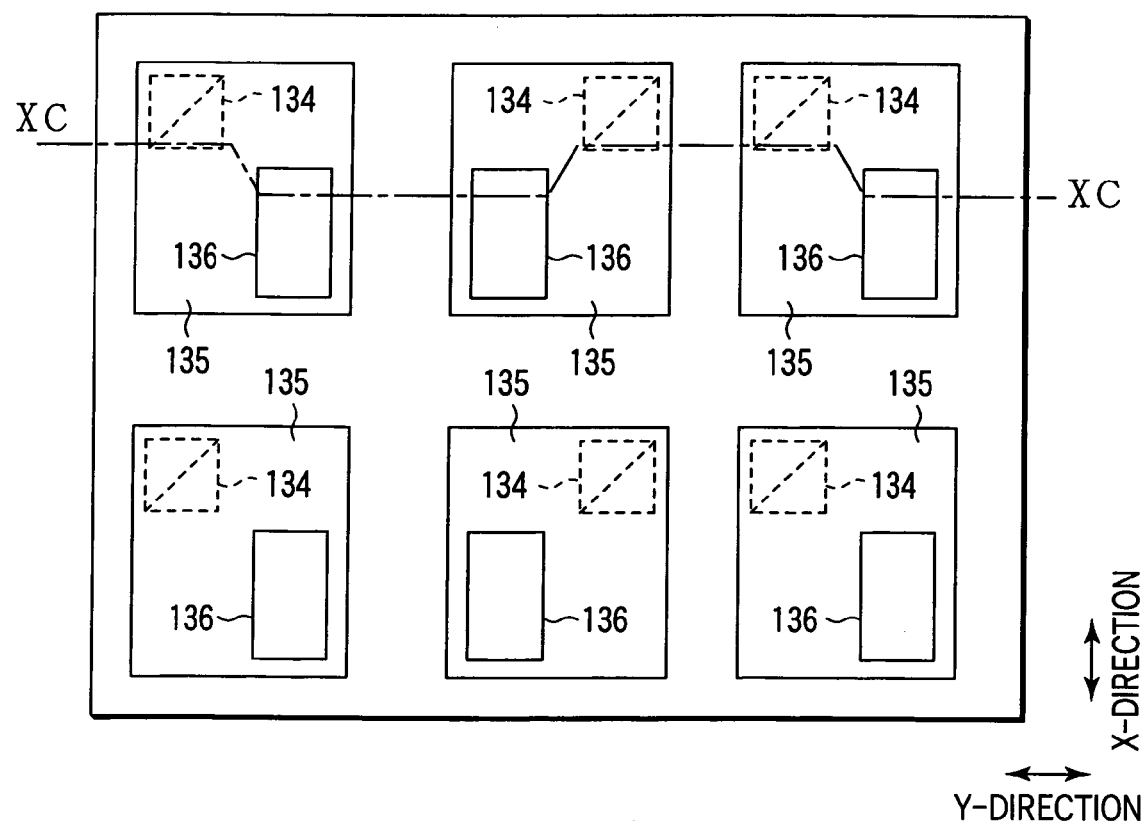
FIG. 89 is a plan view showing one step of the manufacturing method of the present invention.
Figure 90:
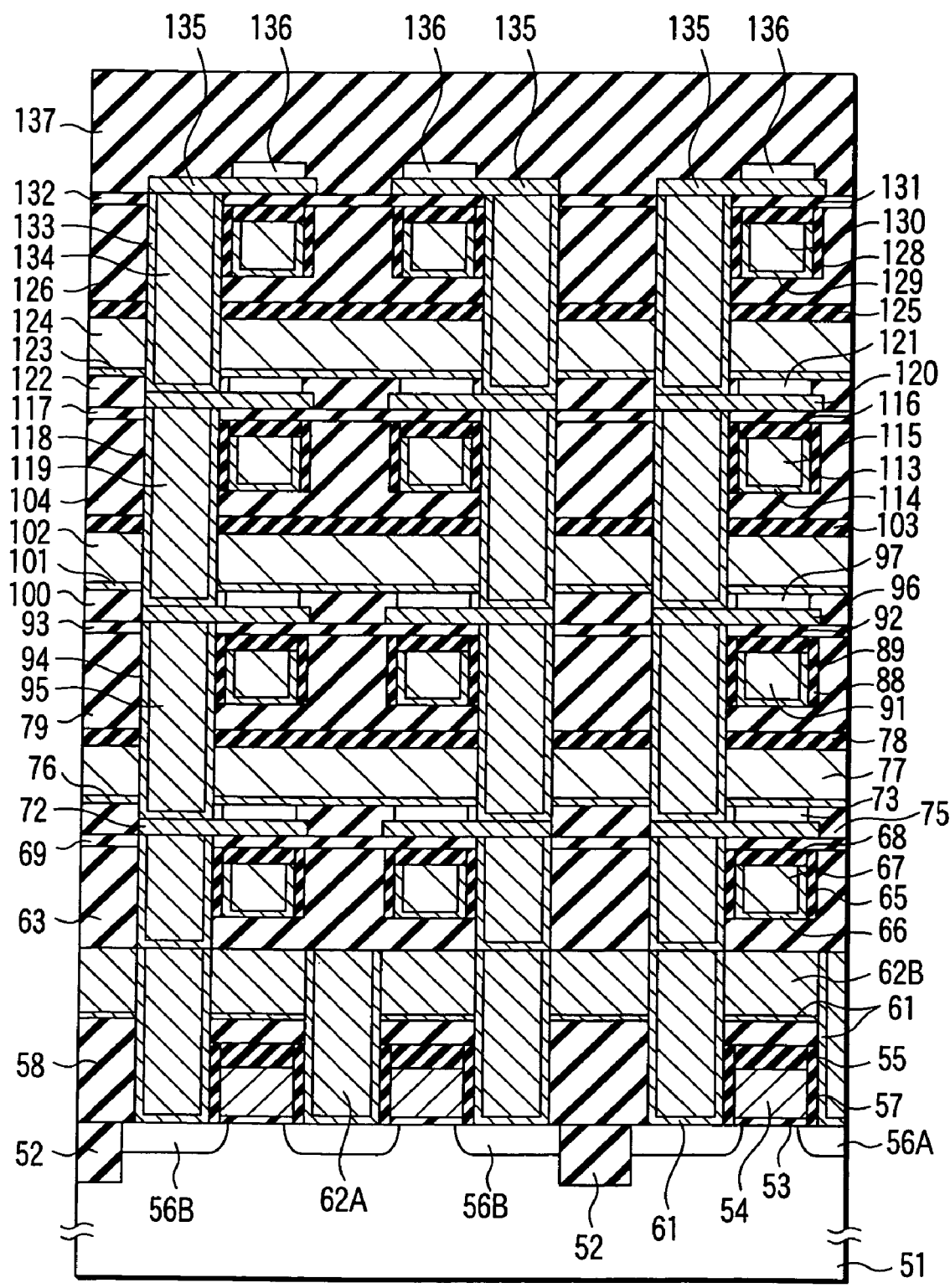
FIG. 90 is a sectional view taken along a line XL—XL in FIG. 90.

As shown in FIGS. 89 and 90, fourth MTJ elements 136 are formed on the metal layers 135. Each fourth MTJ element 136 has, as its main portion, a tunneling barrier and two ferromagnetic layers that sandwich the tunneling barrier, and has, e.g., the structure as shown in FIG. 7.

The lower electrodes 135 of the fourth MTJ elements 136 are patterned.

The lower electrodes 135 of the fourth MTJ elements 136 can easily be patterned by forming a photoresist pattern on the lower electrodes 135 by PEP and etching the lower electrodes 135 by RIE using the photoresist pattern as a mask. Then, the photoresist pattern is removed.

After that, a dielectric interlayer 137 that completely covers the fourth MTJ elements 136 is formed by CVD.

[28] Interconnection Trench Forming Step

Figure 91:
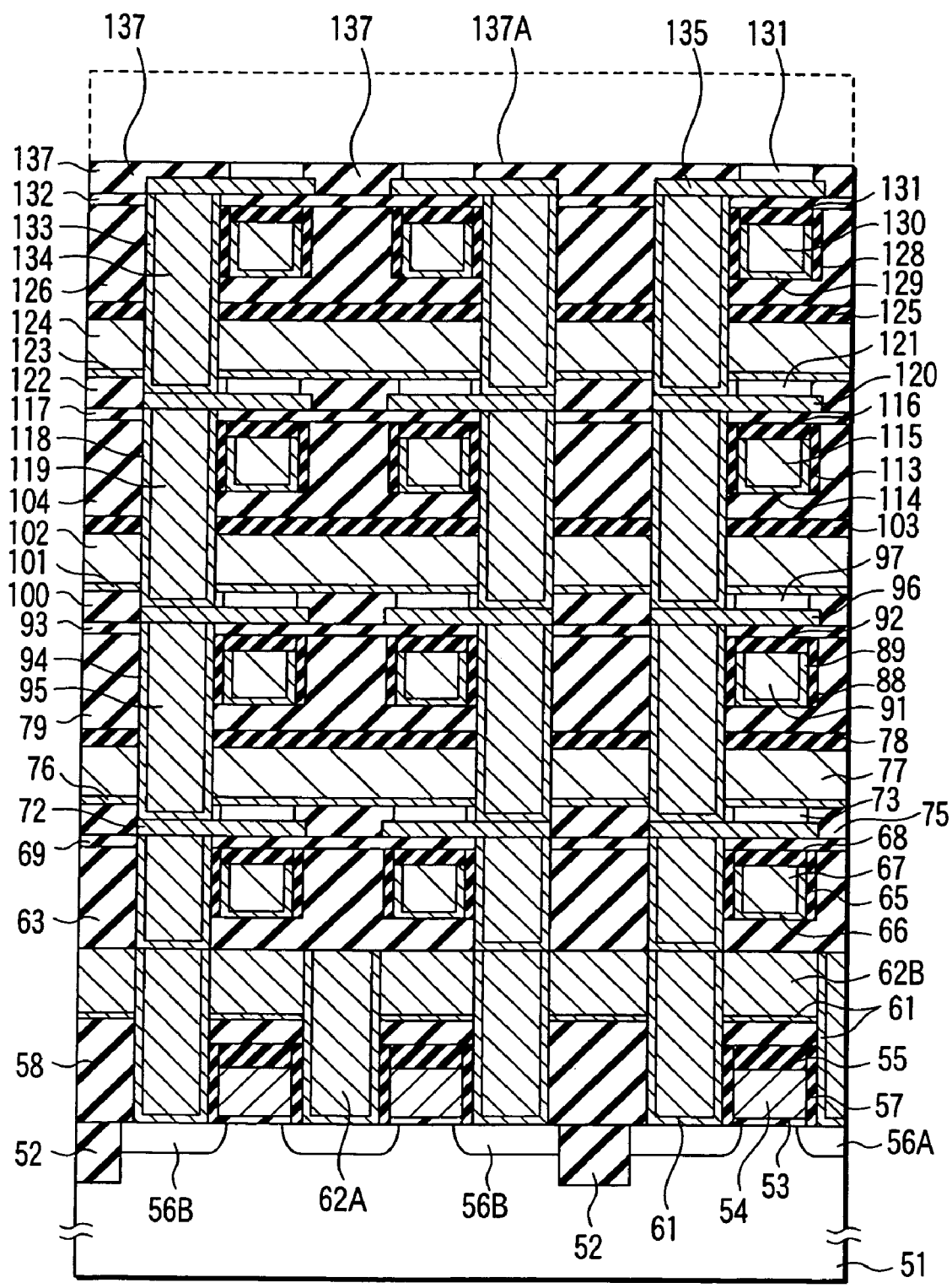
FIG. 91 is a sectional view showing one step of the manufacturing method of the present invention.

As shown in FIG. 91, interconnection trenches 137A are formed in the dielectric interlayer 137. In this example, the interconnection trenches 137A serve as trenches used to form read/write bit lines and extend in the Y-direction. If the metal layer material is Cu, sidewall insulating layers (such as silicon nitride) are needed for preventing from Cu diffusion and corrosion are formed on the side surfaces of the interconnection trenches 137A.

The interconnection trenches 137A can easily be formed by, e.g., forming a photoresist pattern on the dielectric interlayer 137 by PEP and etching the dielectric interlayer 137 by RIE using the photoresist pattern as a mask. After etching, the photoresist pattern is removed.

The sidewall insulating layers can easily be formed by forming an insulating film (e.g., a silicon nitride film) on the entire surface of the dielectric interlayer 137 by CVD and etching the insulating film by RIE.

[29] Ninth Interconnection Layer Forming Step

Figure 92:
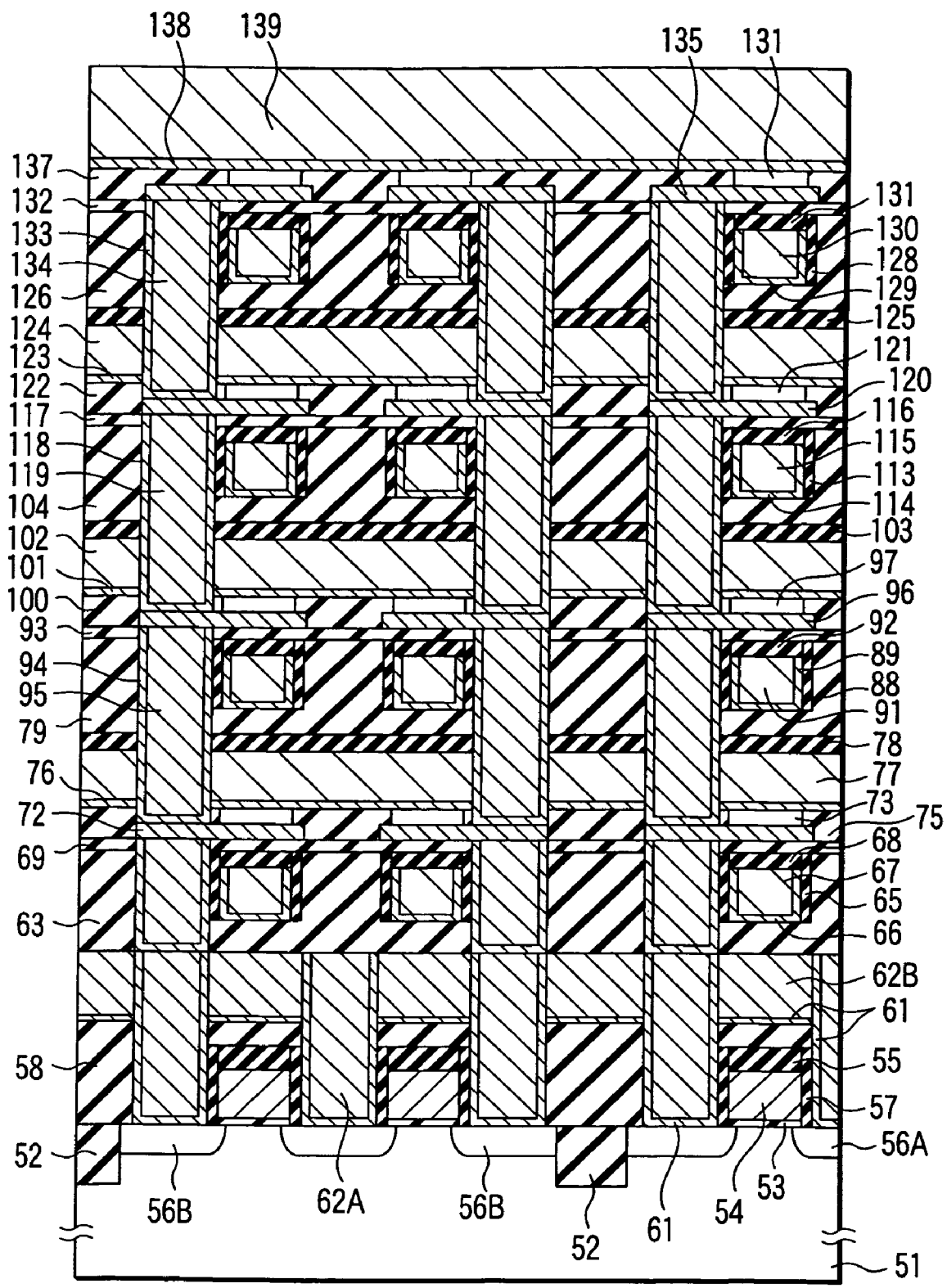
FIG. 92 is a sectional view showing one step of the manufacturing method of the present invention.

As shown in FIG. 92, a barrier metal layer (e.g., a multi-layer of Ta and TaN) 138 is formed on the dielectric interlayer 137, the inner surfaces of the interconnection trenches 137A, and the sidewall insulating layers by, e.g., sputtering. Subsequently, a metal layer (e.g., a Cu layer) 139 that completely fills the interconnection trenches 137A is formed on the barrier metal layer 138 by, e.g., sputtering or electroplating.

Figure 93:
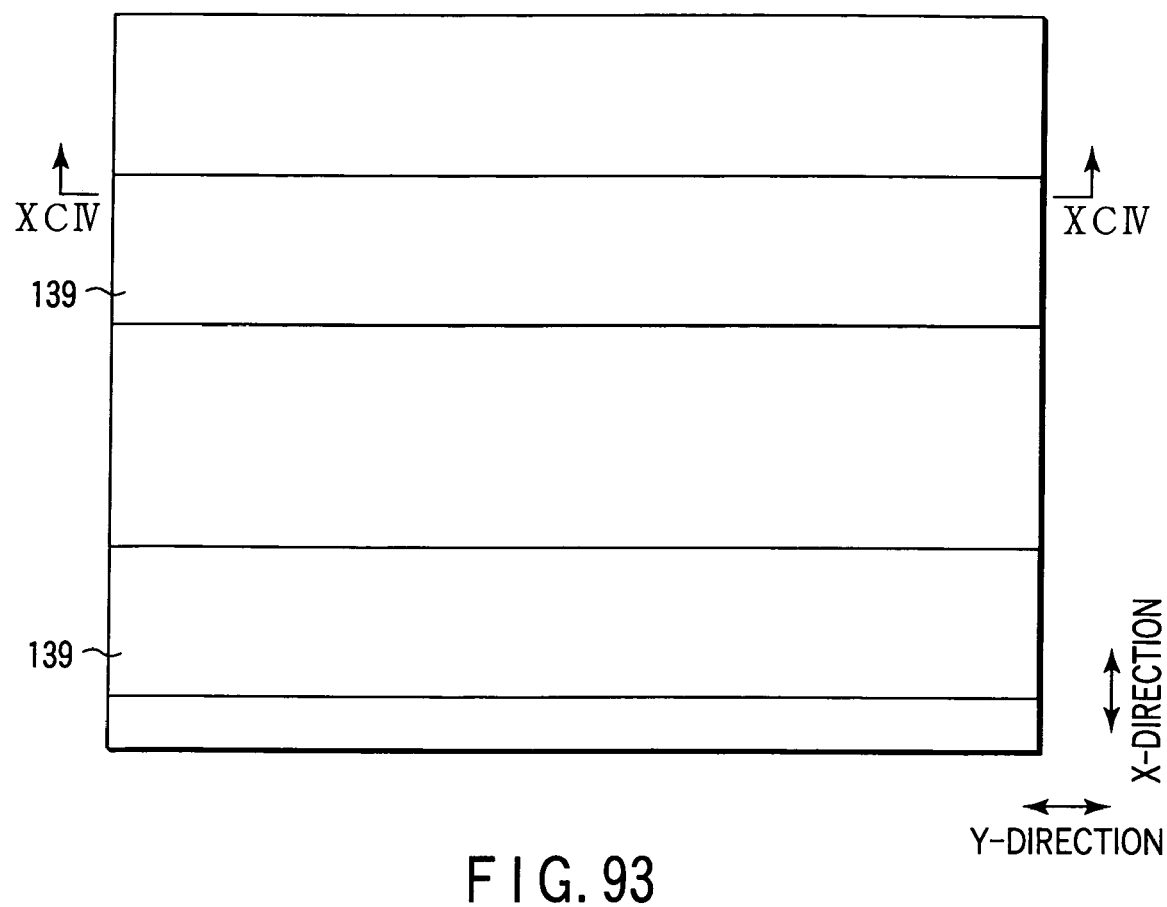
FIG. 93 is a plan view showing one step of the manufacturing method of the present invention.
Figure 94:
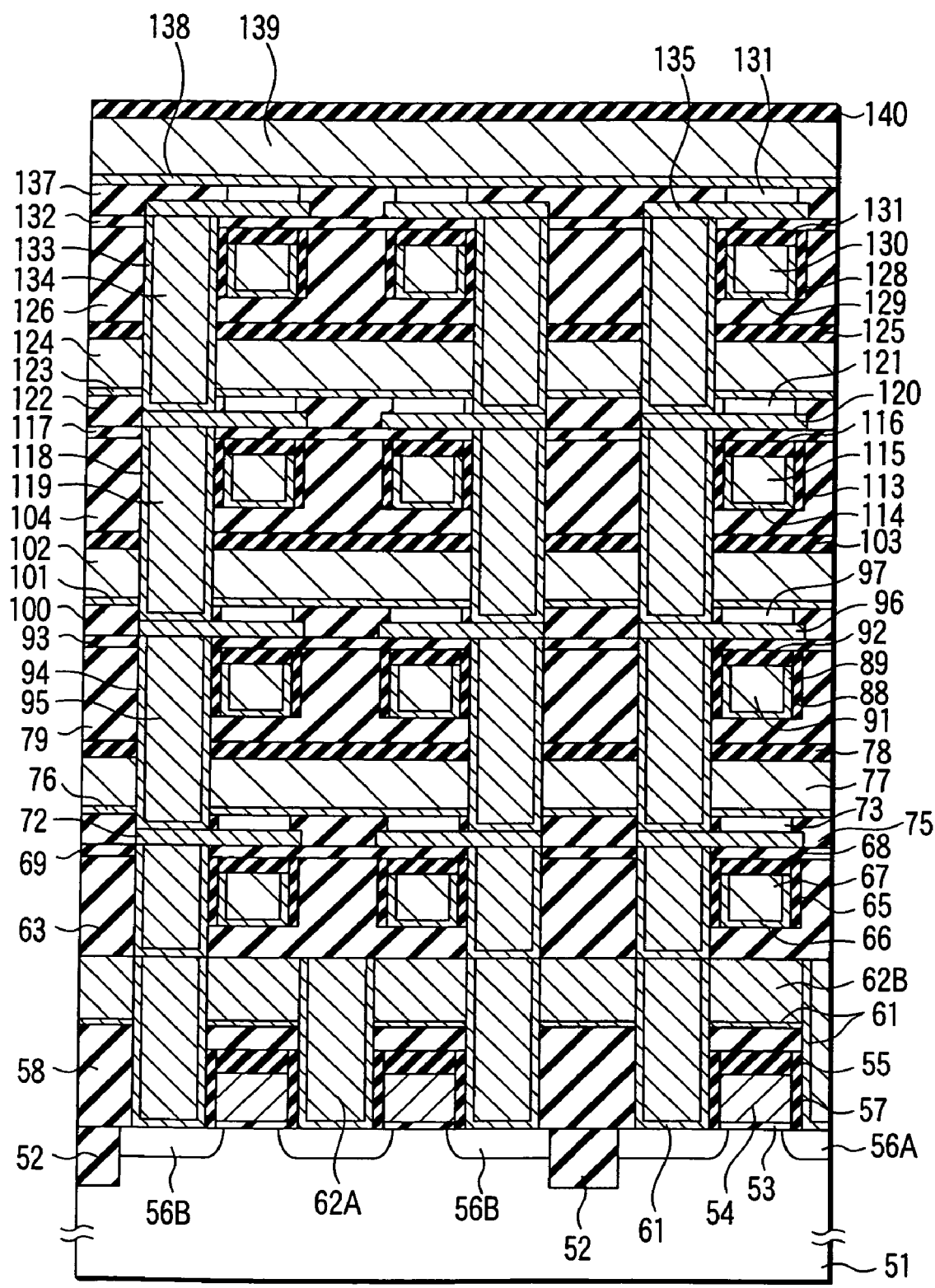
FIG. 94 is a sectional view taken along a line XCIV—XCIV in FIG. 93.

After that, as shown in FIGS. 93 and 94, the metal layer 139 is polished by, e.g., CMP and left only in the interconnection trenches 137A. The metal layer 139 remaining in each interconnection trench 137A forms a ninth interconnection layer that functions as a read/write bit line.

An insulating layer (e.g., a silicon nitride layer) 140 is formed on the dielectric interlayer 137 by CVD. If needed, the insulating layer 140 is polished by CMP and left only on the metal layers 139 serving as the ninth interconnection layers.

Finally, for example, a dielectric interlayer (e.g., a silicon oxide layer) that completely covers the metal layers 139 serving as the ninth interconnection layers is formed on the dielectric interlayer 137.

(3) Conclusion

According to this manufacturing method, a cell array structure (1-switch/n-MTJ structure) in which a read block is formed from a plurality of TMR elements stacked at a plurality of stages, and the plurality of TMR elements are independently connected to read bit lines can be realized.

In this example, to form an interconnection layer, the damascene process and dual damascene process are employed. Instead, for example, a process of forming an interconnection layer by etching may be employed.

5. Others

In the above description, a TMR element is used as a memory cell of the magnetic random access memory. However, even when the memory cell is formed from a GMR (Giant MagnetoResistance) element, the present invention, i.e., various kinds of cell array structures, the read operation mechanism, and the detailed example of the read circuit can be applied.

The structure of a TMR element or GMR element and the materials thereof are not particularly limited in applying the present invention. In this example, the number of TMR elements in one read block is four. However, the number of TMR elements in one read block is not limited to four and can freely be set.

As a read select switch of the magnetic random access memory, a MOS transistor, bipolar transistor, or diode is used. However, any other switch element such as a MIS (Metal Insulator Semiconductor) transistor (including a MOSFET), MES (Metal Semiconductor) transistor, or junction transistor can also be used as a read select switch.

According to the present invention, a magnetic random access memory having a new cell array structure suitable for an increase in memory capacity and a manufacturing method thereof can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory comprising:
   memory cells which are stacked at stages, using a magnetoresistive effect;
   a read select transistor which commonly connects to one terminal of each of said memory cells;
   bit lines which are arranged in correspondence with said memory cells and extend in a first direction;
   a read word line which is connected to a source/drain of said read select transistor and extends in a second direction perpendicular to the first direction; and
   a decode line which is connected to a gate of said read select transistor and extends in the first direction,
   wherein each of said memory cells has the other terminal independently connected to one of said bit lines, said bit lines are electrically isolated from each other in a read mode, the data is independently written into the memory cells, and an imaginary line extending from a source of the read select transistor to a drain thereof is orthogonal to a read word line connected to the gate of the read select transistor.

2. A memory according to claim 1, wherein said read select transistor is arranged right under said memory cells.

3. A memory according to claim 1, further comprising contact plugs each of which connects one terminal of one of said memory cells to said read select transistor, and said contact plugs are overlapped each other.

4. A memory according to claim 1, further comprising a source line that extends in the first direction and is connected to said read select transistor.

5. A memory according to claim 4, further comprising:
   a power supply terminal, and
   a column select switch connected between said source line and said power supply terminal.

6. A memory according to claim 4, further comprising a read word line which is connected to the gate of said read select transistor and extends in a second direction perpendicular to the first direction.

7. A memory according to claim 6, wherein said read select transistor is controlled by a row address signal.

8. A memory according to claim 2, wherein said read select transistor is controlled by a column address signal.

9. A memory according to claim 1, further comprising:
   a read circuit, and
   a column select switch connected between said bit lines and said read circuit.

10. A memory according to claim 9, wherein said read select transistor and said column select switch execute the same operation.

11. A memory according to claim 9, wherein said read circuit is constituted by sense amplifiers arranged in correspondence with said bit lines and output buffers arranged in correspondence with said sense amplifiers.

12. A memory according to claim 9, wherein said read circuit is constituted by sense amplifiers arranged in correspondence with said bit lines, an output buffer which outputs one data of said sense amplifiers, and a selector which is connected between said sense amplifiers and said output buffer.

13. A memory according to claim 1, further comprising a write bit line driver/sinker which is connected to two ends of each of said bit lines to flow, to said bit lines, a write current in a direction corresponding to write data.

14. A memory according to claim 1, wherein said bit lines function as read bit lines and write bit lines.

15. A memory according to claim 1, further comprising write word lines which are arranged in correspondence with said memory cells and extend in a second direction perpendicular to the first direction.

16. A memory according to claim 15, wherein each of said write word lines is arranged on one terminal side of a corresponding one of said memory cells.

17. A memory according to claim 1, further comprising block select switches each connected between the other terminal of a corresponding one of said memory cells and a corresponding one of said bit lines.

18. A memory according to claim 17, wherein said block select switch is controlled by a row address signal.

19. A memory according to claim 17, wherein said read select transistor and said block select switch execute the same operation.

20. A memory according to claim 1, wherein
said memory cells construct one read block, and
data of said memory cells are simultaneously read.

21. A memory according to claim 1, wherein each of said memory cells is formed from a magnetic memory element including a pinning layer having a fixed magnetizing direction, a storing layer whose magnetizing direction changes in accordance with write data, and a tunneling barrier layer arranged between said pinning layer and said storing layer.

22. A memory according to claim 21, wherein an axis of easy magnetization of said magnetic memory element is directed in a second direction perpendicular to the first direction.

23. A memory according to claim 1, wherein said read select transistor is formed from one of a MIS transistor, a MES transistor, and a junction transistor.

24. A memory according to claim 1, wherein storing data of said memory cells are decided with according to directions of currents which flow in said bit lines.

* * * * *